(12) United States Patent
Breed

(10) Patent No.: US 7,040,653 B1
(45) Date of Patent: May 9, 2006

(54) STEERING WHEEL ASSEMBLIES FOR VEHICLES

(75) Inventor: David S. Breed, Boonton Township, Morris County, NJ (US)

(73) Assignee: Automotive Technologies International, Inc., Denville, NJ (US)

( * ) Notice: Subject to any disclaimer, the term of this patent is extended or adjusted under 35 U.S.C. 154(b) by 0 days.

(21) Appl. No.: 10/974,919

(22) Filed: Oct. 27, 2004

(51) Int. Cl.
*B62D 1/11* (2006.01)

(52) U.S. Cl. ...................... 280/731; 280/777
(58) Field of Classification Search ........... 280/731, 280/775, 735, 777; 74/493
See application file for complete search history.

(56) References Cited

U.S. PATENT DOCUMENTS

| | | | |
|---|---|---|---|
| 3,675,505 A | | 7/1972 | Henning |
| 3,801,123 A | | 4/1974 | Jira |
| 3,910,597 A | * | 10/1975 | Seko ............... 280/731 |
| 4,123,948 A | | 11/1978 | Zeller |
| 4,167,276 A | | 9/1979 | Bell et al. |
| 4,368,454 A | | 1/1983 | Pilatzki |
| 4,552,381 A | * | 11/1985 | Schlanger ........... 280/752 |
| 4,580,810 A | | 4/1986 | Thuen |
| 4,625,578 A | | 12/1986 | Nishijima |
| 4,644,817 A | | 2/1987 | Albrecht et al. |
| 4,771,650 A | * | 9/1988 | Kerner ............... 74/498 |
| 4,962,947 A | | 10/1990 | Nagata et al. |
| 5,085,466 A | | 2/1992 | Nakatsuka et al. |
| 5,507,521 A | * | 4/1996 | Steffens, Jr. ........ 280/775 |
| 5,697,638 A | | 12/1997 | Port |
| 5,718,151 A | | 2/1998 | Parrish et al. |
| 5,871,233 A | * | 2/1999 | Tanaka et al. ....... 280/777 |
| 5,961,144 A | | 10/1999 | Desmarais |
| 5,964,478 A | | 10/1999 | Stanley et al. |
| 5,984,355 A | * | 11/1999 | Meidanis et al. ..... 280/777 |
| 6,142,504 A | | 11/2000 | Papandreou |
| 6,254,127 B1 | | 7/2001 | Breed et al. |
| 6,264,235 B1 | | 7/2001 | Battermann et al. |
| 6,312,011 B1 | | 11/2001 | Dohring et al. |
| 6,715,790 B1 | | 4/2004 | Breed |
| 6,893,044 B1 | | 5/2005 | Holmes et al. |
| 2003/0075004 A1 | | 4/2003 | Kerner et al. |
| 2003/0218319 A1 | | 11/2003 | Amamori |
| 2004/0026909 A1 | | 2/2004 | Rensinghoff |
| 2004/0150203 A1 | | 8/2004 | Cress |

FOREIGN PATENT DOCUMENTS

| | | |
|---|---|---|
| DE | 3013996 A1 | 10/1981 |
| DE | 4328562 C1 | 8/1994 |
| DE | 10020085 C1 | 7/2001 |
| GB | 2068314 A | 8/1981 |

\* cited by examiner

*Primary Examiner*—David R. Dunn
(74) *Attorney, Agent, or Firm*—Brian Roffe

(57) ABSTRACT

Steering wheel assembly including a steering column including an inner shaft adapted to be attached to a fixed part of the vehicle and an outer shaft arranged around and rotatable relative to the inner shaft. The outer shaft is connect with a steering mechanism which causes turning of tires of the vehicle. A steering wheel is connected to and for rotation with the outer shaft and an airbag module includes an airbag connected to the inner shaft. The airbag module does not rotate upon rotation of the outer shaft and the steering wheel. The airbag is thus stationary relative to the steering wheel and as a result, its shape is not constrained by any limitations which arise when the airbag must rotate along with the steering wheel as in conventional steering wheel-mounted airbag systems.

19 Claims, 67 Drawing Sheets

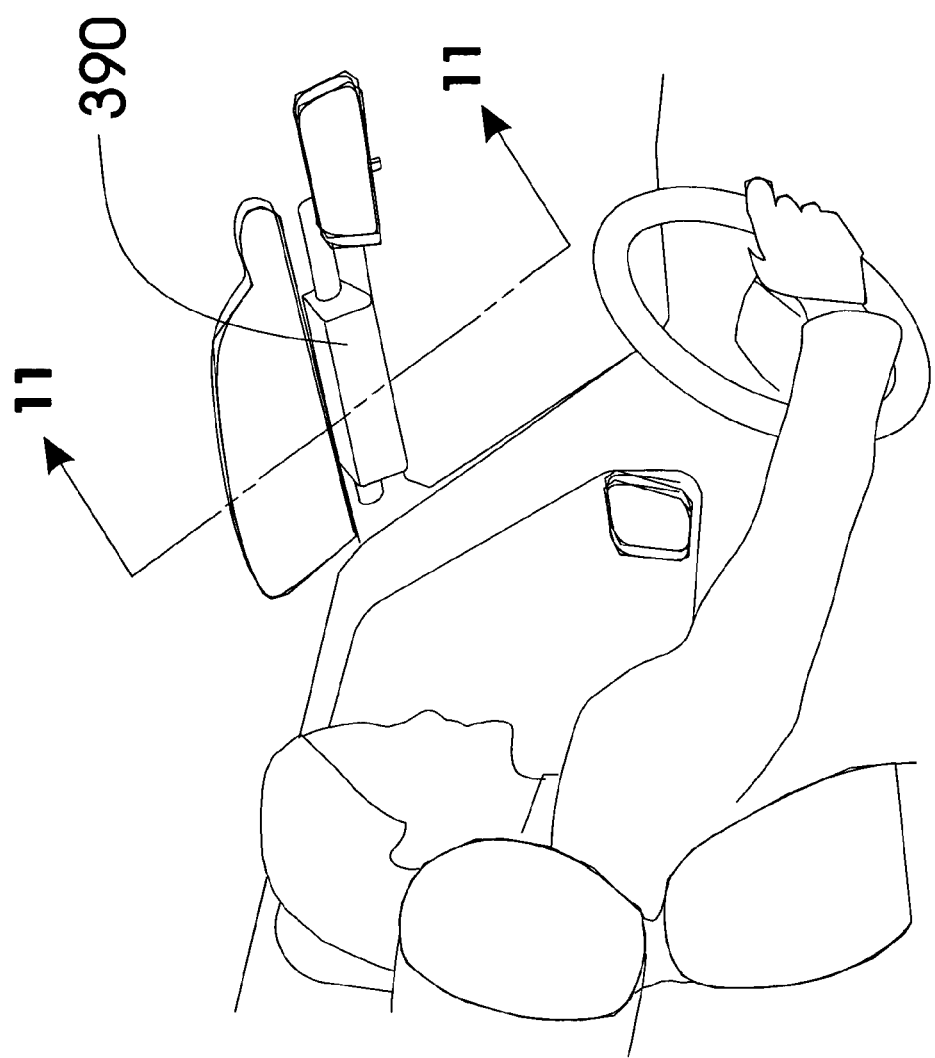

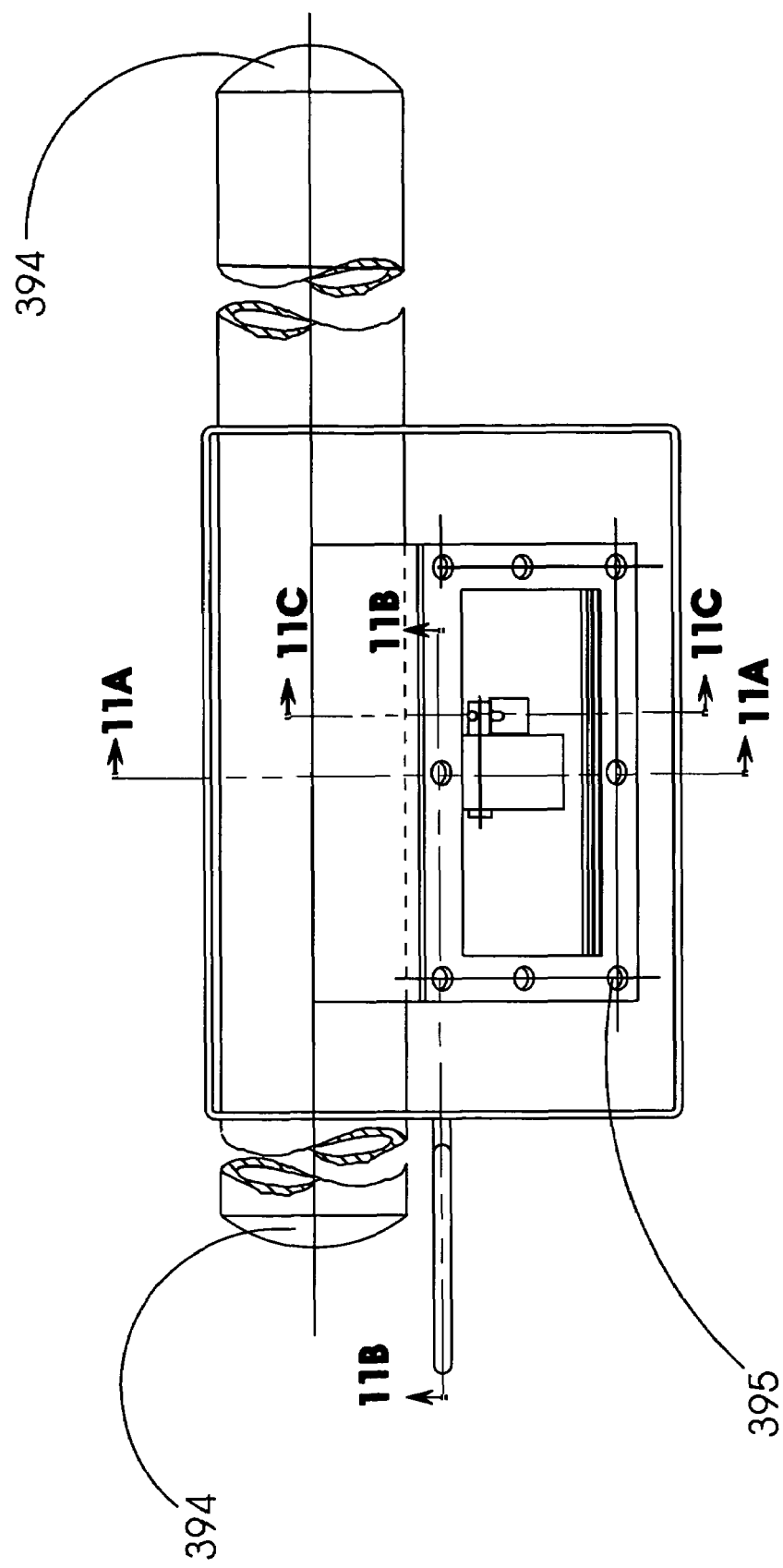

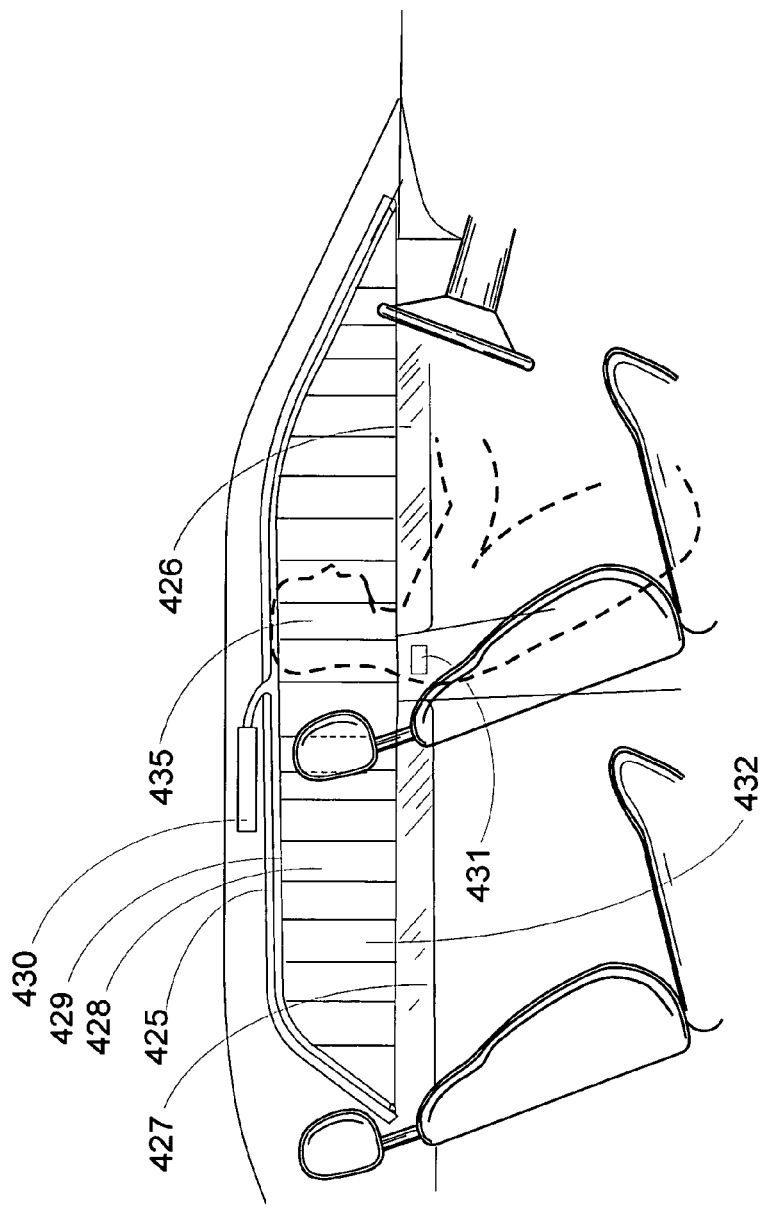
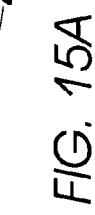
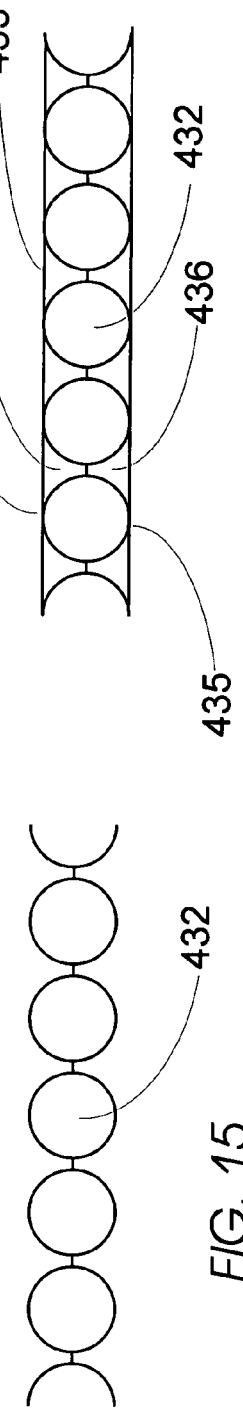
FIG. 14
FIG. 15A
FIG. 15

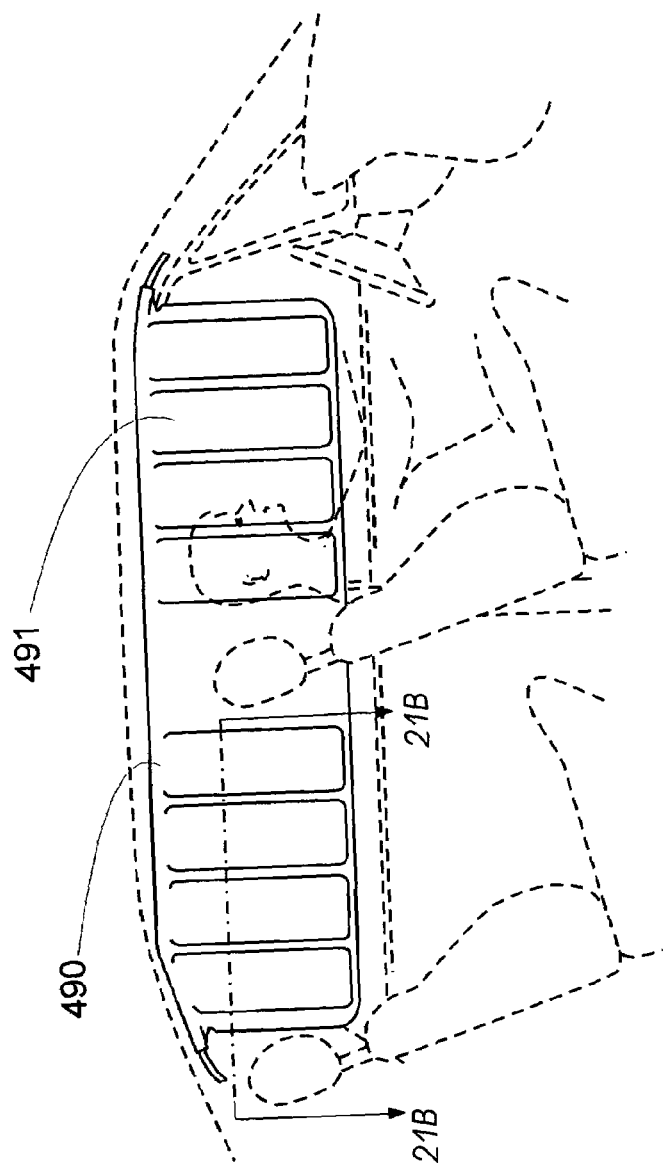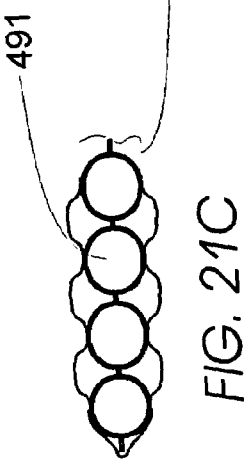

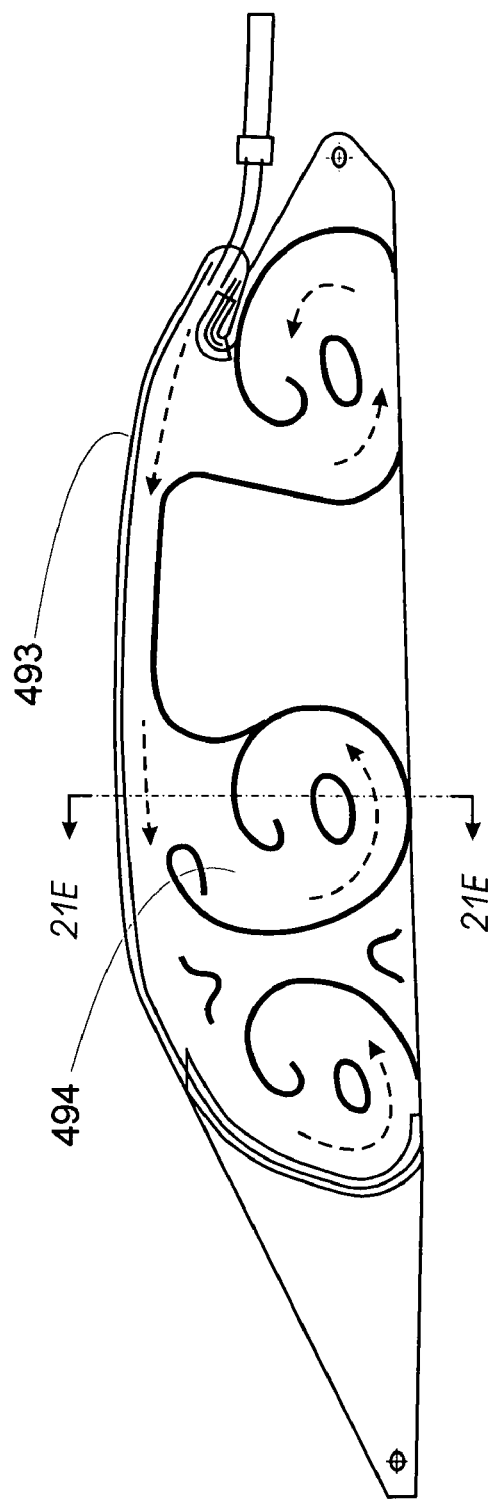
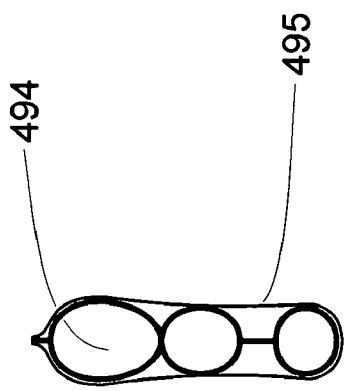
FIG. 21D
FIG. 21E

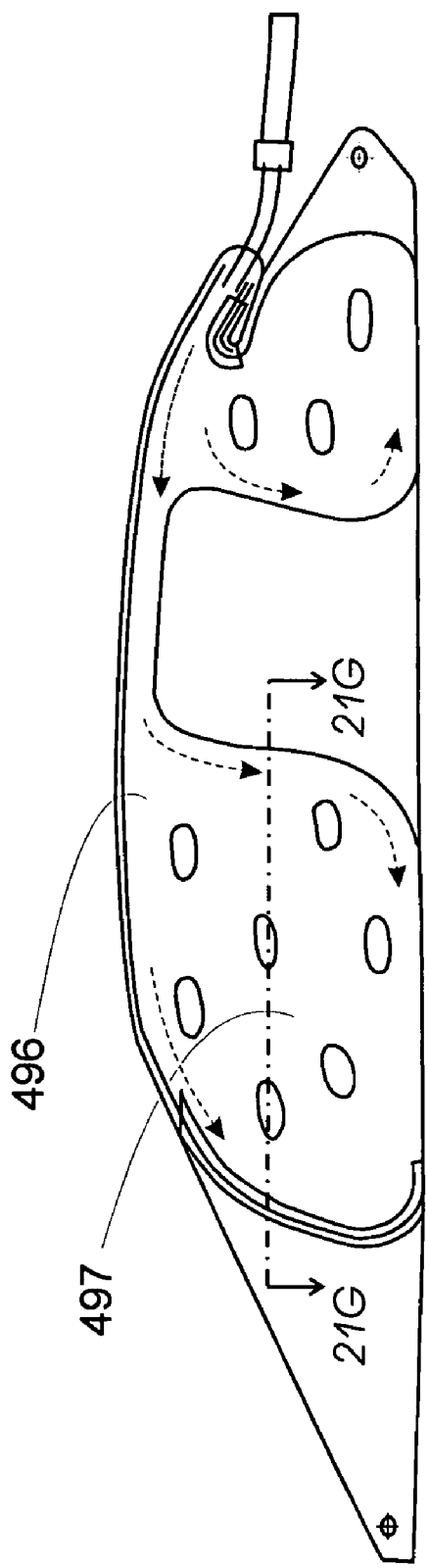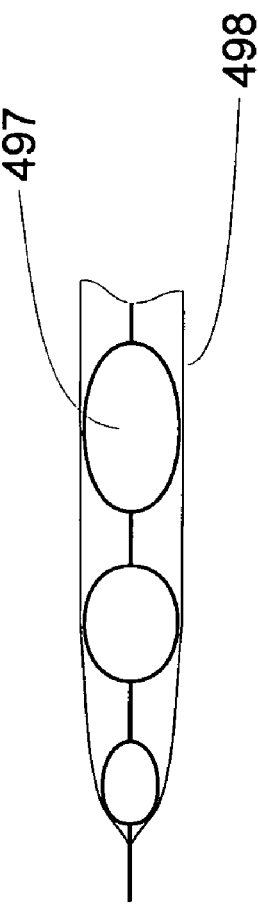
FIG. 21F
FIG. 21G

STEERING WHEEL ASSEMBLIES FOR VEHICLES

CROSS-REFERENCE TO RELATED APPLICATIONS

This application contains disclosure also appearing in U.S. patent application Ser. No. 10/817,379 filed Apr. 2, 2004, U.S. patent application Ser. No. 10/413,318 filed Apr. 14, 2003, U.S. patent application Ser. No. 09/888,575 filed Jun. 25, 2001, now U.S. Pat. No. 6,715,790, U.S. patent application Ser. No. 09/535,198 filed Mar. 27, 2000, now U.S. Pat. No. 6,250,668, U.S. patent application Ser. No. 09/071,801, filed May 4, 1998, now U.S. Pat. No. 6,149,194, U.S. patent application Ser. No. 08/795,418, filed Feb. 4, 1997, now U.S. Pat. No. 5,863,068, U.S. patent application Ser. No. 08/626,493, filed Apr. 2, 1996, now U.S. Pat. No. 5,746,446, U.S. patent application Ser. No. 08/571,247, filed Dec. 12, 1995, now U.S. Pat. No. 5,772,238, U.S. patent application Ser. No. 08/539,676, filed Oct. 5, 1995, now U.S. Pat. No. 5,653,464 and U.S. patent application Ser. No. 08/247,763, filed May 23, 1994, now U.S. Pat. No. 5,505,485. All of these patent applications are incorporated by reference herein.

FIELD OF THE INVENTION

All of the patents, patent applications, technical papers and other references referenced below are incorporated herein by reference in their entirety.

The present invention relates generally to steering wheel assemblies for vehicles and vehicles including the same and more particularly to steering wheel assemblies which interact with an occupant protection system to improve the deployment of the occupant protection system.

The present invention also relates to a side curtain airbag system which deploys to prevent injury to vehicle occupants in a side impact or rollover accident.

The present invention also relates to airbags made from plastic film such as a side curtain airbag arranged to deploy along the side of a vehicle to protect occupants during a crash involving the vehicle, including a rollover. The side curtain airbag may even wrap around a front-seated occupant, i.e., have a frontal portion designed to deploy between a front-seated occupant and the dashboard. Also there may be a plurality plastic film airbags that deploy in the event of a vehicle accident. In some cases, such plastic film airbags may deploy to fill substantially all of the front passenger compartment of an automotive or truck vehicle.

The present invention also generally relates to an airbag having interconnected compartments for use in vehicular crashes whereby the airbag deploys before or during the crash to cushion the occupant of the vehicle and prevent injury to the occupant. The present invention also relates generally to a method for making an airbag having interconnected compartments and an occupant protection system including an airbag with interconnected compartments.

The present invention also relates to a vehicular airbag having a low mass and made substantially from thin plastic film which is designed to deploy in a collision involving the vehicle so that if it impacts the occupant of the vehicle wherever he/she is located, it will not cause significant injury to the occupant. In order to make a film airbag of sufficiently low mass so as not to injure the occupant, it has been recognized that the film airbag should be designed to arrest the propagation of a tear so that a small hole or break in the film does not result in a catastrophic failure, i.e., cause the airbag to burst like a balloon or otherwise prevent the airbag from deploying properly. One particular method of arresting the propagation of a tear of this invention is to use a combination of an elastomeric film and a reinforcement structure which in certain embodiments may be the elastomeric material itself constructed in a variable thickness pattern, i.e., have thinner and thicker sections, or in a manner so that it has strategically placed thicker sections, i.e., relative to remaining portions of the material, in view of stress considerations during deployment. Another particular method of arresting the propagation of a tear is to formulate the plastic film so that it exhibits the property of blunting, as described below. One method of achieving this property is to laminate two or more plastic films having different properties together. Typically, one of the films is more rigid and the other more elastic. One example is a lamination comprising NYLON 6,6® and polyurethane films.

The present invention also relates to airbags including barrier coatings which provide reductions in gas, chemical and vapor permeability, especially side curtain airbags.

The present invention also relates to methods for manufacturing airbag modules including an airbag having a barrier coating and an associated inflator.

BACKGROUND OF THE INVENTION

Various patents, patent applications, patent publications and other published documents are discussed below as background of the invention. No admission is made that any or all of these references are prior art and indeed, it is contemplated that they may not be available as prior art when interpreting 35 U.S.C. §102 in consideration of the claims of the present application.

1. Plastic Film Airbags

Plastic films have not previously been used to make airbags with the exception of perforated films as disclosed in U.S. Pat. No. 4,963,412 to Kokeguchi, which is discussed below.

U.S. Pat. No. 3,451,693 (Carey) describes the presence of a variable exhaust orifice in an airbag which maintains constant pressure in the airbag as the occupant is thrown into the airbag but does not disclose plastic film, merely plastic. The distinguishable properties of film are numerically described in the instant specification and basically are thinner and less weight. The material of Carey is not plastic film which is capable of arresting the propagation of a tear. In fact, it is unclear in Carey as to whether the orifice can be varied in a repeatable/reusable manner and no mention is made as to whether the stretching of the orifice area is permanent or temporary.

U.S. Pat. No. 5,811,506 (Slagel) describes a thermoplastic, elastomeric polyurethane for use in making vehicular airbags. The polyurethane is extrudable so that airbags of various shapes and sizes can be formed therefrom.

Recently issued U.S. Pat. No. 6,627,275 (Chen) describes the use of crystal gels to achieve tear resistance for airbags. This is a particular example of the teachings herein for the use of the thermoplastic elastomers to achieve tear resistance through the use of a particular subclass of such polymers. No mention is made, however, to laminate these materials with a film with a higher elastic modulus as is taught herein. Although interesting materials, they may not be practical for airbags due to their high cost. In particular, the crystal gel described in Chen is part of a class of thermoplastic elastomer (TPE) and in particular of polyester elastomers such as HYTREL™ which are discussed elsewhere herein and in the parent applications listed above. It is important to note that the particular formulations listed in Chen are probably poor choices for the blunting film portion of a laminated film used to make film airbags. This is due to their very high elasticity of $10^4$ to $10^6$ dynes per cm$^2$ (see Chen at col. 21, line 4). This corresponds to the liquid crystal polymers which have an elastic modulus of above $10^{10}$ dynes per cm$^2$. Thus, they will provide little resistance to the propagation of a tear in the higher modulus component of the laminated film and would be poor as the blunting layer.

It is important to note that liquid crystal polymers of a different sort than disclosed in Chen having quite the opposite properties would be ideal candidates for the high modulus component of a laminated film due to their inelastic nature, that is their high modulus of elasticity. Although these materials are considerably more expensive than NYLON®, for example, they are about twice as strong and therefore only half as much would be required. This would render the inner layer, for example, of a lamination with perhaps urethane as the outer layers, half the thickness and thus one eighth of the bending stiffness of NYLON®. Thus, the laminated airbag made in this manner would be considerably easier to fold and when folded, it would occupy substantially less space.

Another advantage of the more rigid liquid crystal polymers is that they can be laminated to polyurethane or other blunting materials without the need for an adhesive. This results in a significant cost saving for the laminated film and thus partially offsets the higher cost of the material compared with NYLON®, for example. Naturally, they can also be laminated to a more elastic liquid crystal polymer.

Note also that the "soft, safe, hugging, enveloping inflatable restraint cushions" described in Chen are not applicable in the form disclosed because, if used in a thin film version, it would blow up like a balloon permitting the occupant to easily displace the gas and penetrate far into the airbag. If used in a thick film version so that it does not stretch, then the advantages of the material are lost and the airbag would be similar in weight to a fabric airbag. However, if it is laminated to a more rigid material or a net as disclosed herein and in the previous patents of the current assignee, then again many of the advantages of the material are lost since the main material providing the strength to the airbag is the more rigid film or net layer. Nevertheless, providing there is not too much of a cost penalty the "elastic-crystalline gels" described in Chen might be advantageously used in the practice of the teachings of the inventions described herein for some applications. Chen is thus incorporated herein in its entirety as if it were reproduced and placed herein. Some other patents assigned to the assignee of Chen that may be relevant to the invention herein are: U.S. Pat. No. 6,552,109, U.S. Pat. No. 6,420,475, U.S. Pat. No. 6,333,374, U.S. Pat. No. 6,324,703, U.S. Pat. No. 6,148,830, U.S. Pat. No. 6,117,176, U.S. Pat. No. 6,050,871, U.S. Pat. No. 5,962,572, U.S. Pat. No. 5,884,639, U.S. Pat. No. 5,868,597, U.S. Pat. No. 5,760,117, U.S. Pat. No. 5,655,947, U.S. Pat. No. 5,633,286, U.S. Pat. No. 5,508,334, U.S. Pat. No. 5,336,708, U.S. Pat. No. 5,334,646, U.S. Pat. No. 5,324,222, U.S. Pat. No. 5,262,468 and U.S. Pat. No. 4,369,284.

Although airbags are now installed in all new vehicles and each year an increasing number of airbags are making their way into new vehicle designs, they are still basically the same design as originally invented about 40 years ago. Generally, each driver and passenger side airbag is a single chamber or at most two chambers, they are made from fabric that has sufficient mass as to cause injury to an occupant that is in the deployment path and they are positioned so that a forward-facing occupant will be protected in a substantially frontal impact. In contrast, many occupants are out-of-position and many real world crashes involved highly angular impacts, spinouts, rollovers etc. where the occupant is frequently injured by the deploying airbag and impacts other objects in the vehicle compartment in addition to the airbag.

In the out-of-position case, occupant sensors are now being considered to prevent or control the deployment of the airbag to minimize deployment induced injuries. These occupant sensors will significantly reduce the number of deaths caused by airbags but in doing so, they can deprive the occupant of the protection afforded by a softer airbag if the deployment is suppressed. Side and side curtain airbags are being installed to give additional protection to occupants in side impacts and rollovers. However, there still will be many situations where occupants will continue to be injured in crashes where airbags could have been a significant aid. What is needed is an airbag system that totally surrounds the occupant and holds him or her in the position that he or she is prior to the crash. The airbag system needs to deploy very rapidly, contact the occupant without causing injury and prevent his or her motion until the crash is over. This is a system that fills up the passenger compartment in substantially the same way that packaging material is used to prevent breakage of a crystal glass during shipment.

To accomplish this self-adjusting airbag system, the airbags must be made of very light material so that when they impact the occupant, they do not cause injury. They also must be inflated largely with the gas that is in the passenger compartment or else serious ear injuries may result and the doors and windows may be blown out. Thus, an airbag system comprised of many mini-airbags all connected together and inflated with one or more aspirated inflators that limit the pressure within each mini-airbag is needed. This is one focus of this invention. As it is accomplished, the inflators will get smaller and simpler since there will be no need for dual stage inflators. Since out-of-position occupants will not be injured by the deploying airbags, there will be no need for occupant sensors and children can safely ride in the front seat of a vehicle. The entire system will deploy regardless of the direction of the impact and the occupants will be frozen in their pre-crash positions until the crash is over.

Anticipatory crash sensors based on pattern recognition technology are disclosed in several of current assignee's patents and pending patent applications. See, for example, U.S. Pat. No. 6,343,810, U.S. Pat. No. 6,209,909, U.S. Pat. No. 6,623,033, U.S. Pat. No. 6,746,078 and US20020166710. The technology now exists to allow the identification and relative velocity determination to be made for any airbag-required accident prior to the accident occurring (anticipatory sensing). This achievement now allows airbags to be reliably deployed prior to the accident. The implications of this are significant. Prior to this achievement, the airbag system had to wait until an accident started before a determination could be made whether to deploy the airbags. The result is that the occupants, especially if unbelted, would frequently achieve a significant velocity relative to the vehicle passenger compartment before the airbags began to interact with the occupant and reduce his or her relative velocity. This would frequently subject the occupant to high accelerations, in some cases in excess of 40 Gs, and in many cases result in serious injury or death to the occupant. On the other hand, a vehicle typically undergoes less than a maximum of 20 Gs during even the most severe crashes. Most occupants can withstand 20 Gs with little or no injury. Thus, as taught herein, if the accident severity could be forecast prior to impact and the vehicle filled with plastic film airbags that freeze the occupants in their pre crash positions, then many lives will be saved and many injuries will be avoided.

The main argument against anticipatory sensors is that the mass of the impacting object remains unknown until the accident commences. However, through using a camera, or other imaging technology based on, for example, radar or terahertz generators and receivers, to monitor potentially impacting objects and pattern recognition technologies such as neural networks, the object can be identified and in the case of another vehicle, the mass of the vehicle when it is in the unloaded condition can be found from a stored table in the vehicle system. If the vehicle is a commercial truck, then whether it is loaded or not will have little effect on the severity of an accident. Also if the relative velocity of the impacting vehicles is above some threshold, then again the mass of the impacting vehicle is not important to the deployment decision. Pickup trucks and vans are thus the main concern because as loaded, they can perhaps weigh 50 percent more than when unloaded. However, such vehicles are usually within 10% of their unloaded-plus-one-passenger weight almost all of the time. Since the decision to be made is whether or not to deploy the airbag, in all severe cases and most marginal cases, the correct decision will be made to deploy the airbag regardless if there is additional weight in the vehicle. If the assumption is made that such vehicles are loaded with no more than 10% additional weight, then only in a few marginal crashes, a no deployment decision will be made when a deployment decision is correct. However, as soon as the accident commences, the traditional crash sensors will detect the accident and deploy the airbags, but for those marginal cases the occupants will have obtained little relative forward velocity anyway and probably not be hurt and certainly not killed by the deploying plastic film airbags which stop deploying as soon as the occupant is contacted. Thus, the combination of anticipatory sensor technology and plastic film airbags as disclosed herein results in the next generation self adapting safety system that maximizes occupant protection, both technologies preferably but not required to be those implemented or developed by the current assignee.

Another feature of plastic film airbags discussed below is the ability of film to be easily joined together to form structures that would be difficult or impossible to achieve with fabric such as the addition of a sheet of film to span the chambers of a side curtain airbag. It is well known that side curtain airbags are formed with chambers in order to limit the thickness of the curtain. This results in a curtain with reduced stiffness to resist the impact of the head of an occupant, for example, and to also form areas where the protection is less than other areas due to the presence of seams. Using film, these seam sections can be easily spanned without running the risk of introducing additional leakage paths in the airbag. This spanning of the chambers can produce additional chambers that can also be pressurized or the additional chambers can be left open to the atmosphere.

An analysis of a driver airbag made from two flat sheets of inelastic film shows that the maximum stresses occur in the center of the airbag where the curvature is at a minimum. Thus, the material strength and not the seal or seam strength limits the pressure that causes the airbag to fail. On the other hand, analysis of some conventional side curtain airbags has shown that the maximum stress can occur in the seams and thus the maximum pressure that the airbag can hold without bursting is limited by the material strength in the seams. This fact is at least partially the cause of excessive gas leakage at the seams of some fabric airbags necessitating the lamination of a polymer film onto the outside of the airbag. This problem is even more evident when the bag is made by continuous weaving where the chambers are formed by weaving two sheets of material together. A solution to this problem as discussed below is to first optimize the design of the seam area to reduce stresses and then to form the airbag by joining the sheets of material by heat sealing, for example, where an elastic material forms the seam that joins the sheets together. Such a joint permits the material to stretch and smooth the stresses, eliminating the stress concentrations and again placing the maximum stresses in the material at locations away from the seam. This has the overall effect of permitting the airbag to be constructed from thinner material permitting a more rapid deployment and causing less injury to an out-of-position occupant. This technique also facilitates the use of plastic film as an airbag material. Such a film can comprise a relatively inelastic, biaxially oriented layer for maximum tensile strength and a relatively elastic, polyurethane film, or equivalent, where the polyurethane film is substantially thicker than the Nylon®. This combination not only improves the blunting property discussed above but also substantially reduces the stresses in the seams (see Appendix 1).

U.S. Pat. No. 6,355,123 to Baker et al. uses reinforcement material to make the seams stronger so as to compensate for the increased stresses discussed above rather than using elastic material to smooth out the stresses as disclosed herein. Similarly, in U.S. Pat. No. 6,712,920, Masuda et al. add reinforcing strips to the inside of a seam which are attached by adhesive to the airbag beyond the sewn seam.

2. Driver side airbag

A conventional driver side airbag (also referred to herein as a driver airbag) is made from pieces of either NYLON® or polyester fabric that are joined together, e.g., by sewing. The airbag is usually coated on the inside with neoprene or silicone for the purposes of (i) capturing hot particles emitted by the inflator in order to prevent holes from being burned in the fabric, and (ii) sealing the airbag to minimize the leakage of an inflating gas through the fabric. Although such coatings are films, they differ significantly from the films disclosed herein in that they do not significantly modify the properties of the fabric airbags to which they are applied since they are thin and substantially more elastic than fabric. These airbags are conventionally made by first cutting two approximately circular sections of a material having a coating on only one side and which will form a front panel and a back panel, and sewing them together with the coated side facing out. The back panel is provided with a hole for attachment to an inflator. Fabric straps, called tethers, are then sewn to the front panel. Afterwards, the airbag is turned inside out by pulling the fabric assembly through the inflator attachment hole placing the coated side on the inside. Assembly is completed by sewing the tethers to the back panel adjacent the inflator attachment hole.

If a conventional driver airbag is inflated without the use of tethers, the airbag will usually take an approximately spherical shape. Such an inflated airbag would protrude significantly into the passenger compartment from the steering wheel and, in most cases, impact and injure the driver. To prevent this possible injury, the tethers are attached to the front and rear panels of the airbag to restrict the displacement of the front panel relative to the back panel. The result of the addition of such tethers is an airbag that has the shape of a flat ellipsoid with a ratio of the thickness of the airbag to its diameter of approximately 0.6. In the conventional airbag, the tethers are needed since the threads that make up the airbag fabric are capable of moving slightly relative to each other. The airbag is elastic for stresses that are not aligned with the warp or woof of the fabric. As a result, the fabric would distort to form an approximate sphere in the absence of such tethers.

Moreover, the above-mentioned method of manufacturing an airbag involves a great deal of sewing and thus is highly labor intensive and, as a result, a large percentage of all driver airbags are presently manufactured in low labor cost countries such as Mexico.

Many people are now being injured and some killed by interaction with the deploying airbag (See, e.g., "Warning: Too Much Safety May Be Hazardous", New York Times, Sunday, Dec. 10, 1995, Section F, Page 8). One of the key advantages of the film airbag described herein and in the current assignee's above-referenced patents and patent applications is that, because of its much lower mass than conventional NYLON® or polyester fabric airbags, the injury caused by this interaction with the deploying airbag is substantially reduced. In accordance with the teachings of those patents and patent applications mentioned above, the driver airbag system can be designed to permit significant interaction with the driver. In other words, the film airbag can be safely designed to intrude substantially further into the passenger compartment without fear of injuring the driver. Nevertheless, in some cases, as described in U.S. Pat. No. 5,653,464, it may be desirable to combine the properties of a film airbag, which automatically attains the conventional driver airbag shape, with a fabric airbag. In such cases, interaction with the driver needs to be minimized.

Airbag systems today are designed so that ideally the airbag is fully inflated before the occupant moves into the space that is occupied by the airbag. However, most occupants are not positioned at the ideal location assumed by the airbag system designer, and also may not have the dimensions, e.g., size and weight, in the range considered for optimum airbag deployment by the airbag system designer. Many occupants sit very close to the airbags, or at least closer than expected by the airbag system designer, and as mentioned above, are injured by the airbag deployment. On the other hand, others sit far from the airbag, or at least farther away from the airbag than expected, and therefore must travel some distance, achieving a significant relative velocity, before receiving the benefit of the airbag. See for example "How People Sit in Cars: Implications For Driver and Passenger Safety in Frontal Collisions—The Case for Smart Restraints.", Cullen, E., et al 40$^{th}$ Annual Proceedings, Association For the Advancement of Automotive Medicine, pp. 77–91.

With conventionally mounted airbags such as those mounted in the steering wheel or instrument panel, severe out-of-position occupant situations, for example where the occupant is resting against the airbag when deployment begins, can be handled using an occupant position sensor, such as disclosed in the current assignee's U.S. Pat. No. 5,653,462 (corresponding to published WO 94/22693) which prevents an airbag from deploying if an occupant is more likely to be seriously injured by the airbag deployment than from the accident itself. In many less severe accidents, the occupant will still interact with the deploying airbag and sustain injuries ranging from the mild to the severe. In addition, as mentioned above, some occupants sit very far from the steering wheel or instrument panel and, with conventional airbags, a significant distance remains between the occupant and the inflated airbag. Such occupants can attain a significant kinetic energy relative to the airbag before impacting it, which must be absorbed by the airbag. This effect serves to both increase the design strength requirements of the airbag and increase the injury induced in the occupant by the airbag. For these reasons, it is desirable to have an airbag system that adjusts to the location of the occupant and which is designed so that the impact of the airbag causes little or no injury to the occupant.

It is conventional in the art that airbags contain orifices or vent holes for exhausting or venting the gas generated by the inflation means. Thus, typically for frontal impact airbags within one second after the bag is inflated (and has provided its impact absorbing function), the gas has been completely exhausted from the bag through the vent holes. This imposes several limitations on the restraint system that encompasses the airbag system. Take for example the case where an occupant is wearing a seatbelt and has a marginal accident, such as hitting and severing a small tree, which is sufficient to deploy the airbag, but where it is not really needed since the driver is being restrained by his seatbelt. If the driver has lost control of the car and is traveling at 30 MPH, for example, and has a secondary impact one second or about 50 feet later, this time with a large tree, the airbag will have become deflated and thus is not available to protect the occupant in this secondary, life threatening impact.

In other situations, the occupant might be involved in an accident that exceeds the design capability of the restraint system. These systems are typically designed to protect an average-size male occupant in a 30-MPH barrier impact. At higher velocities, the maximum chest deceleration experienced by the occupant can exceed 60 G's and become life threatening. This is particularly a problem in smaller vehicles, where airbag systems typically only marginally meet the 60-G maximum requirement, or with larger or frailer occupants.

There are many cases, particularly in marginal crashes, where existing crash sensors will cause the airbag to deploy late in the crash. This can also result in an "out-of-position occupant" for deployment of the airbag that can cause injuries and possibly death to the occupant. Other cases of out-of-position occupants include standing children or the forward motion of occupants during panic braking prior to impact especially when they are not wearing seatbelts. The deploying airbag in these situations can cause injury or death to the out-of-position occupant. It is estimated that more than one hundred people have now been killed and countless more seriously injured by the deployment of the airbag due to being out-of-position.

It is recognized in the art that the airbag must be available to protect an occupant for at least the first 100–200 milliseconds of the crash and longer for rollover events. Since the airbag usually contains large vents, the inflator must continue to supply gas to the airbag to replace the gas flowing out of these vents. As a result, inflators are usually designed to produce about twice as much gas than is needed to fill the airbag for frontal impacts. This, of course, increases the cost of the airbag system as well as its size, weight, pressure in the passenger compartment and total amount of contaminants resulting from the gases that are exhausted into the automobile environment.

This problem is compounded when the airbag becomes larger, which is now possible using the film materials of this invention, so as to impact with the occupant wherever he/she is sitting, without causing significant injury, as in a preferred implementation of the design of this invention. This then requires an even larger inflator which, in many cases, cannot be accommodated in conjunction with the steering wheel, if conventional inflator technology, rather than an aspirated inflator, is utilized.

Furthermore, there is a great deal of concern today for the safety of a child in a rear facing child seat when it is used in the front passenger seat of a passenger airbag equipped vehicle. Currently used passenger side airbags have sufficient force to cause significant injury to a child sitting in such a seat and parents are warned not to use child seats in the front seat of a vehicle having a passenger side airbag. Additionally, several automobile companies are now experimenting with rear seat airbags in which case, the child seat problem would be compounded.

Airbags made of plastic film are described in the patents and patent applications referenced above. Many films are quite inelastic under typical stresses associated with an airbag deployment. If an airbag is made from a pair of joined flat circular sections of such films and inflated, instead of forming a spherical shape, it automatically forms the flat ellipsoidal shape required for driver airbags as described in U.S. Pat. No. 5,653,464. This unexpected result vastly simplifies the manufacturing process for driver airbags since tethers are not required, i.e., the film airbag is made from two pieces of film connected only at their peripheral edges. Furthermore, since the airbag can be made by heat- sealing two flat circular sections together at their peripheral edges without the need for tethers, the entire airbag can be made without sewing, thereby reducing labor and production costs. In fact, the removal of the requirement for tethers permits the airbag to be made by a blow molding or similar process. Indeed, this greatly reduces the cost of manufacturing driver airbags. Thus, the use of film for making an airbag has many advantages that are not obvious.

Films having this inelastic quality, that is films with a high modulus of elasticity and low elongation at failure, tend to propagate tears easily and thus when used alone are not suitable for airbags. This problem can be solved through the addition of reinforcement in conjunction with the inelastic films such as a net material as described in the above-referenced patents and patent applications. Other more elastic films such as those made from the thermoplastic elastomers, on the other hand, have a low modulus of elasticity and large elongation at failure, sometimes 100%, 200% or even 400%, and naturally resist the propagation of tears. Such films, on the other hand, do not form the flat ellipsoidal shape desired for steering wheel-mounted driver side airbags. As discussed in greater detail below, the combination of the two types of film through attachment using lamination, successive casting or coating, or through the use of adhesives, which can be applied in a pattern, can produce a material having both the self shaping and the resistance to tear propagation properties.

In addition to the above-referenced patents and patent applications, film material for use in making airbags is described in U.S. Pat. No. 4,963,412 to Kokeguchi. The film airbag material described in Kokeguchi is considerably different in concept from that disclosed in the current assignee's above-referenced patents and patent applications or the instant invention. The prime feature of Kokeguchi is that the edge tear resistance, or notch tear resistance, of the airbag film material can be increased through the use of holes in the plastic films, i.e., the film is perforated. Adding holes, however, reduces the tensile strength of the material by a factor of two or more due to the stress concentration effects of the hole. It also reduces the amount of available material to resist the stress. As such, it is noteworthy that the Kokeguchi steering wheel mounted airbag is only slightly thinner than the conventional driver side fabric airbag (320 micrometers vs. the conventional 400 micrometers) and is likely to be as heavy as or perhaps heavier than the conventional airbag. Also, Kokeguchi does not disclose any particular shapes of film airbags or even the airbag itself for that matter. Since his airbag has no significant weight advantage over conventional airbags, there is no teaching in Kokeguchi of perhaps the most important advantage of thin film airbags of the present invention, that is, in reducing injuries to occupants who interact with a deploying airbag. In some implementations of the film airbag of the present invention, the concept of "blunting" is used to achieve the property of arresting the propagation of a tear. See, for example, Weiss, Peter "Blunt Answer: Cracking the puzzle of elastic solids' toughness", Science News, Week of Apr. 26, 2003 Vol. 163, No. 17. As discussed in detail below, the airbags constructed in accordance with the present teachings attain particular shapes based on the use of the inelastic properties of particular film materials and reduce tear propagation through a variety of novel methods including the use of elastic films and blunting that is achieved by combinations of films with different elastic moduli. It is also noteworthy that Kokeguchi discloses that vacuum methods can be used to form the airbag into the desired shape and thus fails to realize that the properties of inelastic film results in the airbag automatically forming the correct shape upon deployment. Also noteworthy is that Kokeguchi states that polymeric films do not have sufficient edge tear resistance and thus fails to realize that films can be so formulated to have this property, particularly those made incorporating elastomers. These limitations of Kokeguchi results in a very thick airbag that although comprised of film layers, no longer qualifies as a true film airbag as defined herein.

A "film airbag" for the purposes herein is one wherein the film thickness is generally less than about 250 micrometers, and preferably even below about 100 micrometers, for use as a driver protection airbag. As the size of the airbag increases, the thickness must also increase in order to maintain an acceptable stress within the film. A film airbag so defined may also contain one or more sections that are thicker than about 250 micrometers and which are used primarily to reinforce the thinner film portion(s) of the airbag. A film airbag as defined herein may also include a layer or layers of inelastic material and a layer or layers of elastic material (for example thermoplastic elastomers).

The neoprene or silicone coating on conventional driver airbags, as mentioned above, serves to trap hot particles that are emitted from some inflators, such as a conventional sodium azide inflator. A film airbag may be vulnerable to such particles, depending on its design, and as a result, cleaner inflators that emit fewer particles are preferred over most sodium azide inflators. It is noteworthy, however, that even if a hole is burned through the film by a hot particle, the use of an elastomer in the film material prevents this hole from propagating and causing the airbag to fail, that is by blunting the crack or tear propagation. Also, new inflators using pyrotechnic, hybrid, aspirated or stored gas technologies are now available which do not produce hot particles and produce gases which are substantially cooler than gases produced by sodium azide inflators. Also, not all sodium azide inflators produce significant quantities of hot particles.

One interesting point that also is not widely appreciated by those skilled in the art previously, is that the gas temperature from the inflator is only an issue in the choice of airbag materials during the initial stages of the inflation. The total thermal energy of the gas in an airbag is, to a first order approximation, independent of the gas temperature which can be shown by application of the ideal gas laws. When the gas initially impinges on the airbag material during the early stages of the inflation process, the temperature is important and, if it is high, care must be taken to protect the material from the gas. Also, the temperature of the gas in the airbag is important if the vent holes are located where the outflowing gas can impinge on an occupant. The average temperature of the airbag itself, however, will not be affected significantly by the temperature of the gas in the airbag.

In certain conventional airbag deployments, the propellant which is used to inflate the airbag also is used to force open a hole in the vehicle trim, called the deployment door, permitting the airbag to deploy. Since the mass of a film airbag is substantially less than the mass of a conventional fabric airbag, much less energy is required to deploy the airbag in time. However, substantial pressure is still required to open the deployment door. Also, if the pressure now used to open the deployment door is used with film airbags, the airbag velocity once the door has been opened may be substantially higher than conventional airbags. This rapid deployment can put excessive stresses on the film airbag and increases the chance that the occupant will be injured thereby. For most implementations of the film airbag, an alternate less energetic method of opening the deployment door may be required.

One such system is described in Barnes et al. (U.S. Pat. No. 5,390,950) entitled "Method and arrangement for forming an airbag deployment opening in an auto interior trim piece". This patent describes a method " . . . of forming an airbag deployment opening in an interior trim piece having a vinyl skin overlying a rigid substrate so as to be invisible prior to operation of the airbag system comprising an energy generating linear cutting element arranged in a door pattern beneath the skin acting to degrade or cut the skin when activated."

The goal of Barnes et al. is to create an invisible seam when the deployment door is located in a visible interior trim panel. This permits greater freedom for the vehicle interior designer to create the particular aesthetic effect that he or she desires. The invisible seam of Barnes et al. is thus created for aesthetic purposes with no thought toward any advantages it might have to reduce occupant injury or advantages for use with a film airbag, or to reduce injuries at all for that matter. One unexpected result of applying the teachings of this patent is that the pressure required to open the deployment door, resulting from the force of the inflating airbag, is substantially reduced. When used in conjunction with a film airbag, this result is important since the inflator can be designed to provide only sufficient energy to deploy and inflate the very light film airbag thereby significantly reducing the size of the inflator. The additional energy required to open a conventional deployment door, above that required to open a deployment door constructed in accordance with the teachings of Barnes et al., is not required to be generated by the inflator. Furthermore, since a film airbag can be more vulnerable to being injured by ragged edges on the deployment door than a conventional fabric airbag, the device of Barnes et al. can be used to pyrotechnically cut open the deployment door permitting it to be easily displaced from the path of the deploying airbag, minimizing the force of the airbag against the door and thus minimizing the risk of damage to the film airbag from the deployment door. Since Barnes et al. did not contemplate a film airbag, advantages of its use with the pyrotechnically opening deployment door could not have been foreseen. Although Barnes et al. describes one deployment door opening method which is suitable for use with an airbag made from plastic film as disclosed herein, i.e., one which requires substantially less force or pressure to open than conventional deployment doors, other methods can be used in accordance with the invention without deviating from the scope and spirit thereof.

The discussion of the self-shaping airbag thus far has been limited to film airbags. An alternate approach is to make an airbag from a combination of fabric and film. The fabric provides the tear resistance and conventional airbag appearance. The film forces the airbag to acquire the flat ellipsoidal shape desired for driver airbags without the use of tethers and permits the airbag to be assembled without sewing using heat and/or adhesive sealing techniques. Such a hybrid airbag is made from fabric and film that have been laminated together prior to the cutting operation. Naturally, the combination of a film and net, as described in the above referenced patents and patent applications, is equally applicable for the airbag described here and both will be referred to herein as hybrid airbags and belong to the class of composite airbags. The combinations of a film and fabric in this invention differ from previous neoprene or silicone coated fabric airbags in that in the prior art cases, the coating does not materially effect either the elastic modulus, stiffness, strength or tear resistance of the airbag where in the case of the invention disclosed herein, the film contributes significantly to one or more of these properties.

A finite element analysis of conventional driver side airbags (made of fabric) shows that the distribution of stresses is highly unequal. Substantial improvements in conventional airbag designs can be made by redesigning the fabric panels so that the stresses are more equalized (See, for example, Appendix 1 herein which describe inventive designs of airbags with fabric panels and relatively more equalized stresses and Appendices 1–6 of U.S. patent application Ser. No. 10/817,379 filed Apr. 2, 2004 incorporated by reference herein). Today, conventional airbags are designed based on the strength required to support the maximum stress regardless of where that stress occurs. The entire airbag must then be made of the same thickness material as that selected to withstand maximum stress condition. Naturally, this is wasteful of material and attempts have been made to redesign the airbag to optimize its design in order to more closely equalize the stress distribution and permit a reduction in fabric strength and thus thickness and weight. However, this optimization process when used with conventional fabric airbags can lead to more complicated assembly and sewing operations and more expensive woven materials and thus higher overall manufacturing costs. An example of such an airbag is that marketed by Precision Fabrics of Greensboro, NC. Thus, there is a tradeoff between manufacturing cost and airbag optimization.

As discussed in the above-referenced patents and patent applications as well as below and in Appendix 1 herein and Appendices 1–6 of the '379 application, with a film airbag manufactured using blow molding or casting techniques, for example, greater freedom is permitted to optimize the airbag vis-à-vis equalization of the stress. First, other than tooling cost, the manufacturing cost of an optimized airbag is no greater than for a non-optimized airbag and in fact frequently less since less material is required. Furthermore, the thickness of the film can be varied from one part of the airbag to another to permit the airbag to be thicker where the stresses are greater and thinner where the stresses are less. A further advantage of blow molding or casting is that the film can be made of a single constituent material. When the airbag is fabricated from sheet material, the outside layer of the material needs to be heat sealable, such as is the case with polyurethane, polyethylene or other polyolefin, or else a special adhesive layer is required where the sealing occurs.

As discussed in greater detail below in connection with the description of the invention, when the film for the airbag is manufactured by casting or coating methods, techniques familiar to those skilled in the art of plastics manufacturing are also available to produce a film where the thickness varies from one part to another in a predetermined pattern. This permits a film to be made that incorporates thicker sections in the form of a lattice, for example, which are joined together with thin film. Thus, the film can be designed so that reinforcing ribs, for example, are placed at the optimum locations determined by mathematical stress analysis.

One example of an inflatable film product which partially illustrates the self-shaping technology of this invention is the common balloon made from metalized MYLAR® plastic film found in many stores. Frequently these balloons are filled with helium. They are made by heat-sealing two flat pieces of film together as described in U.S. Pat. No. 5,188,558 (Barton), U.S. Pat. No. 5,248,275 (McGrath), U.S. Pat. No. 5,279,873 (Oike) and U.S. Pat. No. 5,295,892 (Felton). Surprisingly, the shape of these balloons, which is circular in one plane and elliptical in the other two planes, is very nearly the shape that is desired for a driver side airbag. This shape is created when the pressure within the balloon is sufficiently low such that the stresses induced into the film are much smaller than the stresses needed to significantly stretch the film. The film used is relatively rigid and has difficulty adjusting to form a spherical shape. In contrast, the same airbag made from woven material more easily assumes an approximate spherical shape requiring the use of tethers to create the shape which comes naturally with the Mylar™ balloons.

One problem with film balloons is that when a hole is formed in the balloon, it fails catastrophically. One solution to this problem is to use the combination of a film and net as described in the current assignee's above- referenced patents and patent applications. Such materials have been perfected for use as sail material for lightweight high performance sails for sailboats. One example is marketed under the trade name Bainbridge Sailcloth SL Series™, and in particular SL 500-P™, 1.5 mill. This material is a laminate of a film and a net. Such materials are frequently designed to permit heat-sealing thereby eliminating threads and the stress concentrations associated therewith. Heat-sealing also simplifies the manufacturing process for making sails. Another preferred solution is to make the airbags from a film material which naturally resists tears, that is, one which is chemically formulated to arrest a tear which begins from a hole, for example. Examples of films which exhibit this property are those from the thermoplastic elastomer (TPE) families such as polyurethane, Ecdel elastomer from Eastmen, polyester elastomers such as HYTREL™ and some metallocene-catalyzed polyolefins. For the purposes herein, a thermoplastic elastomer will include all plastic films which have a relatively low modulus of elasticity and high elongation at failure, including but not limited to those listed above. As discussed below, in many implementations, the elastomers can be laminated with NYLON® (NYLON 6,6 for example) or other more rigid film to form a composite film having the blunting property.

Applications for the self shaping airbag described herein include all airbags within the vehicle which would otherwise required tethers or complicated manufacturing from several separate panels. Most of these applications are more difficult to solve or unsolvable using conventional sewing technology. The invention described herein solves some of the above problems by using the inelastic properties of film, and others by using the elastic properties of thermoplastic elastomers plus innovative designs based on analysis including mathematical modeling plus experimentation (see Appendix 1 herein and Appendices 1–6 of the '379 application). In this manner, the problems discussed above, as well as many others, are alleviated or solved by the airbags described in the paragraphs below. Films for airbags which exhibit both the self-shaping property and also formulated to resist the propagation of a tear are made by combining a layer of high modulus material with a layer of a thermoplastic elastomer. Then, if a tear begins in the combined film, it will be prevented from propagating by the elastomer, yet the airbag will take the proper shape due to the self-shaping effect of the high modulus film. Such materials frequently exhibit blunting.

Japanese Patent No. 89-090412/12 describes fabricated cloths that are laminated in layers at different angles to each other's warp axis to be integrated with each other. Strength and isotropy are improved. The cloth is stated as being useful for automotive airbags for protecting the passenger's body. It is possible that such an airbag may have some of the self shaping properties of a driver side film airbag disclosed herein but such is not disclosed in this patent.

U.S. Pat. No. 6,607,796 and U.S. Pat. No. 6,180,044 (Hirai) describe a plastic film driver side airbag referred to as a Resin airbag and a method of making it. One layer of the film airbag is actually molded in place resulting in a variation in material thickness at the seams. This variation in thickness has also been disclosed in the current assignee's patents as listed above. The resulting bag has a variation in the shape caused by the variable width of the seam. In the current assignee's patents, a similar effect is achieved by varying the geometry of the seam as illustrated herein in FIG. 4D.

Consider now a driver side airbag that does not rotate with the steering wheel. Self-contained driver side airbag systems, such as U.S. Pat. No. 4,167,276 to Bell and U.S. Pat. No. 4,580,810 to Thuen, are designed to mount on and rotate with the steering wheel of vehicles. Such designs have the advantage of being modular so that they can be installed on many different vehicles with a modification of the steering wheel. However, because the airbag module rotates with the steering wheel, the shape of a driver side airbag must be axis-symmetrical with respect to the axis of steering wheel, as is the case with conventional driver airbags. This configuration allows the airbag to deploy and provide a uniform protection at any steering position. Usually a driver side airbag is made of two circular pieces of coated nylon cloth sewn together with tethers and becomes an approximation of an ellipsoid when inflated.

An airbag absorbs the energy of an occupant when the occupant moves forward and impacts with the airbag and the airbag deforms to wrap around the occupant. The efficiency of an airbag cushion depends not only on the stiffness and damping of the bag (which is a function of the pressure inside the bag and the exit orifices or exit valves), but also on the relative orientation and penetration of the occupant and the bag. If a large portion of the occupant torso is in contact with the bag in the early stage of a crash, a considerable amount of occupant energy can be dissipated. On the other hand, if only a small portion of the body, such as the head, is in contact with the bag, it can result in significant penetration into the bag and delay the absorption of kinetic energy. Airbags of axis-symmetrical shapes may not be optimal for occupant protection because the interaction between an airbag and an occupant is a function of the distance and the relative angle between the steering wheel and the occupant's upper torso. Another concern is that the steering wheel angle can change significantly from driver to driver.

Another problem of an ellipsoidal driver side bag is the tendency of the driver to slide off edges of the bag particularly in angle crashes. This is mainly due to the geometry of the bag and the fact that the central portion of the bag is frequently stiffer than the periphery. A solution is to have a larger airbag, like a passenger side airbag, to embrace the driver as much as possible to prevent the tendency to slide off the airbag. Such improvements can not be achieved by a driver side airbag fixed to the steering wheel because the space and the geometry are both limited.

Some vehicles, such as buses and trucks, have a very steep steering column angle. When an accident occurs and the driver moves forward, the lower part of the steering wheel close to the driver makes contact with the driver first and a great deal of abdomen or chest penetration occurs. If a conventional airbag module attached to the steering wheel is deployed, the protection of driver is limited until the upper torso of the driver bends fully forward and lands on the air cushion. This problem could be solved by modifying the angle of the steering wheel or column, but it requires a change of the structure of the steering mechanism or the installation of an additional joint in the steering column.

Inside a self-contained airbag module, the sensor is arranged so that its axis is aligned to the axis of the steering wheel. Here, the axis of the sensor is defined as the sensitive axis of the accelerometer or sensing mass. However, a ball-in-tube sensor or an accelerometer-based satellite crush zone mounted sensor used to detect frontal impacts has a sensitive axis parallel to the longitudinal axis of the vehicle. With such an arrangement, the sensor is most sensitive in the desired detecting direction. In the self-contained module mounted on the steering wheel, on the other hand, the sensitivity of the sensor to the frontal velocity change is reduced because the sensor is inclined at an angle from the crushing direction. Even though the calibration of a sensor can be selected to compensate the steering column angle, this makes the sensor more sensitive to vertical accelerations which may be undesirable.

In many cases, the driver side airbag module located on the steering wheel is large and frequently blocks the driver's view of the instrument panel behind the steering wheel. When this is the case, the addition of an airbag system to a vehicle can require modification of the steering column or the instrument panel to compensate for this reduced visibility.

The steering column of some vehicles may collapse or shift in a high-speed crash or under a tremendous crush of the front end of a vehicle. If the driver side airbag is designed to operate under normal conditions, the unexpected movement of the steering column could change the location of a deployed airbag and thus alter the relative positions of the occupant and the airbag cushion. This can result in a partial loss of airbag protection for the driver.

A recent patent application US20040026909 to Rensingoff illustrates an auxiliary airbag coming from the dashboard to support the steering wheel and provide additional protection to the driver through this supplemental airbag. Such an airbag is not disclosed to aid in supporting a much lighter steering wheel steering column as might be used in a drive-by-wire system.

3. Passenger Side Airbag

There is no known related art specifically covering passenger airbags made from plastic film.

4. Inflatable Knee Bolster

This aspect of the invention relates to a knee bolster safety apparatus for protecting the legs and lower torso of the occupant of a motor vehicle to reduce the extent and severity of injuries sustained during a crash. This invention more specifically relates to using an inflatable bolster to restrain the occupant's legs and lower torso during a survivable crash.

During a frontal impact, the occupant moves forward due to the inertia and kinematics of the crash while the front components of the vehicle structure (bumper, hood, engine cavity) begin to collapse. Knee and leg injuries occur when the body of an occupant slides or submarines forward and/or downward and the occupant's knees hit the instrument panel or structure beneath the panel. Further injuries occur when the occupant's lower torso and legs move forward such that the knees are trapped in or beneath the instrument panel just before the foot well begins to collapse. As the foot well collapses, it pushes the occupant's feet backward, causing the knees to elevate and become further trapped. As the foot well continues to crush, the loads on the trapped legs increase and cause foot, ankle, and tibia injuries. These injuries are common even with fixed knee bolsters designed to meet present knee injury criteria requirements.

Abdominal and lower torso injuries can be inflicted by the lap and lower part of the torso belts as they ride upward on the soft tissue of the occupant's torso when he or she slides forward and downward due to the forces of the frontal crash. Knee bolsters are designed to attempt to eliminate or minimize these injuries.

Airbag apparatus are generally designed under the assumption that the occupant is riding in the vehicle in a forward-facing, seated position with both feet on the vehicle floor. When an occupant is not in this position, the occupant or occupant's body part is said to be "out-of-position". As most occupants are sometimes out-of-position, airbag apparatus which effectively restrain the occupant regardless of the occupant's position are advantageous.

During a front end collision with a standard airbag, if the occupant is restrained by a seat belt, the occupant's upper torso bends at the waist and hits the primary airbag. However, depending on the design of the vehicle seat and force of the collision, there is a tendency for an occupant to slide forward along the seat and slip below the primary airbag, sometimes even entering into leg compartment of the vehicle. Alternatively, the legs and knees of the occupant may slide or shift to one side of the seat or the other. The tendency is pronounced when the occupant is not properly restrained by a seat belt. This tendency may be referred to as "submarining". Submarining often causes the occupant's upper torso to bend at the waist but not in a direction perpendicular to the primary airbag. When the occupant submarines, the primary airbag is less effective in protecting the occupant.

Submarining is more prevalent in vehicles which have large leg room compartments. Vehicles which have restricted leg room, such as sports cars, have a lower submarining tendency. In vehicles like sports cars, the distance between the legs and knees of the occupant and the instrument panel is shorter than the distance in vehicles like sport utility vehicles or trucks. In an accident in a sports car, the knees of the occupant often strike the instrument panel. The instrument panel then prevents submarining. Generally, the material of the sports car instrument panel deforms to some degree to help protect the legs and knees of the occupant. The area of the instrument panel which is impacted is called the knee bolster.

In order to prevent submarining in vehicles with large leg room compartments, a knee airbag system is sometimes used. A knee airbag system is generally positioned in the lower portion of the instrument panel. Knee airbag systems allow vehicle manufacturers to design vehicles with more leg room and still have safety comparable to that of vehicles with less leg room.

The knee airbag system includes an inflator, a housing, an airbag, and a trim cover panel. The housing is a conventional enclosure for securing the knee airbag components to the vehicle. The housing stores the knee airbag system components while the airbag is deflated and not in use.

The airbag provides the main structure for protecting the occupant. The bag is generally made of flexible fabric material. The material is generally a weave of NYLON® and/or polyester. Generally, multiple pieces of fabric are sewn together to form an airbag. Alternatively, the material may be woven to create a one piece airbag. Preferably, as taught herein, the airbag is formed into cells and made from plastic film.

The trim cover panel is a panel which covers the airbag and inflator within the housing and presents an aesthetic trim surface to the vehicle occupant. The trim cover panel is connected to the housing such that the pressure of the inflating airbag pushes the trim cover panel out of the way.

The inflator, once triggered, uses compressed gas, solid fuel, or their combination to produce rapidly expanding gas to inflate the airbag. As with conventional airbag systems, a knee airbag can be a large textile bag which the gas inflates like a balloon. The conventional prior art inflated knee airbag occupies some of the volume of the vehicle leg compartment. The knee airbag system may also include a fixed panel, called a load distribution panel or knee bolster panel. This panel can be made of foam and hard plastic surrounding a metal substrate. This panel can provide support to prevent submarining.

Generally, two designs are used in knee airbag systems. The first design concentrates on moving a piece of rigid material, similar to the material of the instrument panel in a sports car, close to the occupant's knees and legs thereby creating leg and knee support. This is known as a load distribution plate. The second design does not use a support plate. This design relies on the knee airbag to provide the necessary knee and leg support. Traditional designs of the knee airbag without the load distribution plate have been less successful in preventing submarining. This is due to the fact that the airbag only partially fills the volume surrounding the knees and legs of the occupant and thus the airbag can easily deform and provides less support. On the other hand, it is possible for the knees of the occupant to slip off of the load distribution plate thereby defeating its purpose. Also, if the load distribution plate is at a significant distance from the occupant's knees, the occupant can attain a significant velocity before striking the plate resulting in knee and femur injuries.

These problems are generally solved by the cellular knee bolster design described in detail herein.

It is known in the art to make an inflatable fabric single chamber knee bolster airbag without a load distribution panel. U.S. Pat. No. 3,642,303 and U.S. Pat. No. 5,240,283, for example are two of many such patents. It is also known to use an airbag to move a load distribution panel closer to the occupant. See, for example, U.S. Pat. No. 6,345,838, U.S. Pat. No. 6,471,242 and European Patent EP00684164B1.

U.S. Pat. No. 4,360,223 (Kirchoff) describes a low-mount, airbag module for the passenger side of an automobile that uses two bags that are folded within a housing that is open at one end. One of the bags is for restraining the knees of the passenger to prevent forward sliding in the event of a crash, the other bag being for restraining the torso. The knee bag is inside the torso bag and they are both attached directly to the inflator, the knee bag being arranged to be inflated first. The torso bag then is inflated to prevent forward rotation of the passenger from the hips.

Further, in accordance with Kirchoff, a pressure responsive orifice is provided in a second opening in the wall of the knee bag. This orifice controls the flow of gas through the opening in the wall of the knee bag thereby to insure a predetermined gas pressure within the knee bag, while permitting subsequent inflation of the torso bag by gases passing into the torso bag through the orifice. Thus, a knee bolster airbag is described but it is positioned inside of the main torso airbag and inflated by the same inflator.

U.S. Pat. No. 5,458,366 describes a compartmentalized airbag after the filing of current assignee's parent patent of this application, U.S. Pat. No. 5,505,485. Nevertheless, the '366 patent describes a compartmentalized airbag that functions to move a knee bolster or load distribution plate to the knees of the occupant. The occupant's knees do not contact directly the compartmentalized airbag as is the case in a preferred embodiment of the current invention as described herein below. The '366 patent correctly points out that a knee bolster airbag, referred to in the '366 patent as a reactive type knee bolster, functions on the principle of a single compartment airbag and has the disadvantage that on impact of the knees with the airbag, the airbag loses rigidity in the impact area. This is due to the gas flowing from the impact area to other parts of the airbag.

U.S. Pat. No. 6,092,836 also describes an airbag that moves a load distribution plate toward the occupant's knees. This patent points out that using known knee bolsters, the knees of an improperly seated occupant can slide off the knee bolster potentially increasing the tendency of the occupant to submarine under the instrument panel. It is important that the knee bolster capture the knees to prevent this problem, as is an object of the present invention.

Another problem pointed out by the '836 patent is the tendency, due to the point loading, for the knees in many airbag knee bolsters to penetrate too far into the bolster and therefore lose some of the energy absorbing effects. Thus, most knee bolsters use a load distribution plate for the contact point with the occupant's knees. This will also be addressed in the description of the invention below.

U.S. Pat. No. 6,170,871 describes the use of an unworkable elastic film airbag as a knee bolster. The fact that an elastic film is used results in the air flowing from the point of contact to another unloaded section which then expands as a balloon. There is also a danger that if punctured the '871 knee bolster will pop as a balloon since it will not exhibit blunting as described below. One properly designed film knee bolster, as disclosed below, makes use of a laminated film material including a layer of a high modulus of elasticity film with one or more layers of film having a low elastic modulus. The combination does not expand as a balloon as in the case of the '871 patent and thus its shape is accurately controlled. Also, if it should get punctured, the hole or tear does not propagate.

U.S. Pat. No. 6,336,653 (Yaniv et al.) describes an inflatable tubular bolster that is meant to reduce leg and knee injuries and prevent the occupant from submarining under the instrument panel. Again this design suffers from the tendency of the occupant's knees to slide off of the bolster if the accident is from an angle or if the occupant is not properly seated.

US20020149187 (Holtz et al.) describes a soft knee bolster which is basically composed of cells of fabric airbag material positioned in front of a load distribution plate. The knee bolster of the present invention also provides for a soft knee bolster but usually does not require a special load distribution or reaction plate. This patent application correctly points out that, it would advance the art to provide a soft-surface inflatable knee bolster airbag system which prevents submarining while providing a soft surface for contacting a vehicle occupant's legs and knees. It would be another advancement in the art to provide a soft-surface inflatable knee bolster airbag system which functions even though the occupant's legs and knees are "out-of-position". A further advancement in the art would be to provide a soft-surface inflatable knee bolster airbag system which is compact, simple, and has fewer parts. The present invention provides these advancements in a novel and useful way. All of these advancements are available in the cellular bolster as first described in the current assignee's patent U.S. Pat. No. 5,505,485.

U.S. Pat. No. 6,685,217 describes a flat mattress like airbag, similar to those disclosed in assignee's prior patents, for use as a knee restraint.

Thus, there are no known knee bolster airbags that are made from plastic film or that are made from interconnecting compartments that predate those disclosed by the assignee.

5. Ceiling-Deployed Airbags

U.S. Pat. No. 5,322,326 (Ohm) describes a small, limited protection airbag manufactured in Korea. Although not disclosed in the patent, it appears to use a plastic film airbag material made from polyurethane. It is a small airbag and does not meet the United States standards for occupant protection (FMVSS-208). The film has a uniform thickness and if scaled to the size necessary for meeting U.S. Standards, it would likely become of comparable thickness and weight as the current fabric airbags.

Of particular interest, FIG. 6 shows an airbag having a shape that conforms to the human body by forming a two-fold pocket bag. Junction points are provided such that after inflation, the head of a passenger is protected by an inflated part around the upper junction point while the upper part of the passenger is covered with the other inflated part around the middle junction points and a U-shaped junction line. In contrast to some pertinent inventions disclosed below, the junction points and lines do not enable the formation of an airbag having a plurality of substantially straight or elongate compartments, or even a multiplicity of cells, which can be deploy along the side of a vehicle in order to protect the occupant(s) from injury. Rather, the junction points and lines result in the formation of a limited-use airbag which will conform only to the human body, i.e., having a section for engaging the head and a section for engaging the upper body. Other applications of junction points and lines are not contemplated by Ohm.

5.1 Side Curtain Airbag

U.S. Pat. No. 5,439,247 describes a fabric hose and quilt type airbag that is meant to protect front seat occupants in side impacts. The construction has a rectangular peripheral tube with an inner section formed by stitching the fabric together to form cells or tubes. Aside from the fact that this is made from fabric, there is no discussion as to how this airbag is supported during a crash and it appears likely that the bag will be pushed out the window by the head of the occupant. Although it is mentioned that the airbag can be deployed from either the door or the ceiling, it does not extend into the rear section of the vehicle passenger compartment. There appears to be no prior art side curtain airbags made from fabric that predate the disclosure in the current assignee's parent patents listed above. There also is no prior art for making a side curtain airbag from plastic film.

U.S. Pat. No. 6,457,745 (Heigl) is an interesting patent describing how to achieve the effects of tethers without actually having them. In this case, loose threads are used as if they were a seam to permit the weaving of a fabric airbag and at the same time to achieve control over the shape of the resulting airbag. In particular, for side curtain airbags, it is desirable to have a roughly uniform thickness across the entire front and rear seat span except where the seat back would interfere. However, to achieve this ideal would require many tethers since left to its own, the airbags would tend to form spherical-like chambers. As reported in the current assignee's patents on film airbags, this is by nature less of a problem with film since the tendency of inelastic film is to form ellipsoids rather than spheres which is the tendency of fabric. However, this is not the only advantage of film in this arena as will be seen below. Since sheets of plastic film can be easily manufactured in any thickness and since they can be easily joined using either heat or adhesive sealing, the opportunities for controlling film geometry greatly exceed that of fabric. Thus, by practicing the teachings of this invention, very substantial benefits accrue as will be shown below.

5.2 Frontal Curtain Airbags

With the exception of U.S. Pat. No. 5,322,326 discussed above, there appears to be no other prior art on ceiling-mounted airbags for frontal crash protection and none whatsoever that extend so as to offer protection for multiple occupants.

5.3 Other Compartmentalized Airbags

U.S. Pat. No. 3,511,519 (Martin) describes a large fabric airbag which is shown impacting the occupant. It does not discuss the problem of injury to the occupants due to the impact of the airbag which would certainly be the case with this design.

U.S. Pat. No. 4,262,931 (Strasser) describes two airbags joined together to cover right and center seating positions. These airbags are not mounted on the vehicle ceiling.

U.S. Pat. No. 3,638,755 (Sack) describes a two-bag airbag combination, however, one bag is contained within the other.

U.S. Pat. No. 3,752,501 (Daniel) describes an inflatable cushion device for protective interposition between a vehicle operator and the rim and hub of a vehicle steering wheel assembly. The cushion is compartmented to provide, when inflated, peripheral ring compartmentation in juxtaposition to the steering wheel rim and center compartmentation in overlying juxtaposition to the steering wheel hub. The peripheral ring compartmentation, when pressurized, provides greater resistance to collapse than the center compartmentation, whereby the peripheral ring compartmentation is adapted to guide the vehicle operator upon contact of the latter with the cushion toward the center compartmentation thereby maintaining the vehicle operator in substantially centered cushioned relationship to the steering wheel assembly under vehicle impact conditions. This airbag contains two compartments; an outer, donut-shaped ring or torus, and an inner compartment of somewhat larger volume. This is an example of a bag within a bag where an outer bag is connected to an inner bag by flapper valves.

U.S. Pat. No. 4,227,717 (Bouvier) describes a novel method of protecting a motorcycle operator with a plurality of tubular plastic or fabric airbags. These tubes deploy upward from a housing mounted on the motorcycle.

6. Rear-of-Seat Mounted Airbags

There is minimal, if any, prior art for rear-of-seat mounted airbags of the type described herein.

7. Exterior Airbags

There is minimal, if any, prior art for exterior mounted airbags made from plastic film.

8. Variable Vent

U.S. Pat. No. 3,573,885 (Brawn) describes a blowout patch assembly but not variable exhaust orifices.

U.S. Pat. No. 3,820,814 (Allgaier) describes variable exhaust vents located within the fabric airbag material.

U.S. Pat. No. 3,888,504 (Bonn) describes an inflatable occupant restraint airbag which is comprised at least in part of a woven stretch fabric which is permeable to fluid used to inflate the bag, the bag having a variable porosity which increases and decreases in relation to the fluid pressure within the bag.

U.S. Pat. No. 4,394,033 (Goetz) describes a temperature compensation system. The inflatable occupant-restraint system in a vehicle includes a generator for producing fluid under pressure placed such that a portion of the generator is outside the cushion and has a resilient venting structure for dumping increasing fractions of gas volume outside the cushion at increasing operating temperatures.

U.S. Pat. No. 4,805,930 (Takada) describes another temperature compensation system. Further, it describes stitched thread seams between fabric elements of the envelope of a vehicle safety airbag which induce localized distension and opening up of the envelope fabrics along the seams, thereby causing the film coatings of the envelope fabric to rupture along the seam and allow gas to escape and maintain a substantially constant overall maximum pressure, regardless of variations in ambient temperature.

U.S. Pat. No. 3,675,942 (Huber) describes a unidirectional valve which permits air to enter the bag, but prevents its escape in the event the pressure within the bag exceeds that of the atmosphere within the vehicle, such as by the impact of a person with the bag.

U.S. Pat. No. 4,964,652 (Karlow) describes a system for venting excessively high pressure gas incident to deployment of an airbag including a diaphragm that is rupturable upon the occurrence of a threshold pressure internally of the airbag to instantaneously release the pressure. This is a pressure relief system through the center of the module.

9. Coated Fabric Airbags

Barrier coatings which prevent, or reduce, contact of a selected substrate with a gas, vapor, chemical and/or aroma have been widely described. A recent improvement in barrier coatings is described in U.S. Pat. No. 6,087,016 and U.S. Pat. No. 6,232,389.

To date, barrier coatings have not been commercially applied in airbags made of fabric and in particular side curtain airbags made of fabric which is often permeable. It would thus be desirable to improve the impermeability of the fabric of the airbags.

In contrast to frontal impact driver and passenger airbags which only are required to retain the inflation gas or other fluid for typically a fraction of a second, the side curtain airbag must retain the inflation fluid for several seconds in order to offer protection for rollover events, for example. Also, the side curtain or ceiling-mounted airbag must deploy rapidly and pack into a small space.

It is disadvantageous that current polymer coatings used on such airbags are relatively thick thereby increasing the mass of the airbag making it difficult to pack into a ceiling space and delay the deployment of the airbag in an accident, thereby increasing the chance that an occupant will not receive the full benefit of the airbag. As a result of these disadvantages, such coatings are not optimal for use on side curtain airbags.

Much of the leakage in side curtain airbags occurs through the seams where the front and rear panels forming the side curtain airbag are joined. This is due to the methods of joining such panels which include sewing and interweaving. Thus, although the barrier coatings of this invention will reduce the leakage through the panel surfaces, and reduce the cost and mass of the airbag, alternative treatments for the seam area are also desirable as described and disclosed herein.

10. Definitions

A composite airbag is any airbag comprised of a film and a fabric, two or more films, a film and a net or other combination of two or more materials or layers such that each material contributes to the structural or tear properties of the composite. This is in contrast to the combinations of a film and fabric used previously in neoprene or silicone coated fabric airbags in that, in the prior art cases, the coating does not materially effect either the elastic modulus, stiffness, strength or tear resistance of the airbag where in the case of the composite airbag disclosed herein, the film contributes significantly to one or more of these properties. Note that the two or more layers may or may not be joined together including cases where the layers are joined during an extrusion processing step such as in co-extrusion, by a casting process, progressive coating process, or where a film layer is combined with another reinforcing material such as fibers or a woven or molded net in addition to the most common method of joining layers by adhesive.

As used herein, the term "mixture" or "coating mixture" is interpreted to include true liquid solutions, as well as colloidal dispersions, suspensions, emulsions and latexes as they are conventionally defined. For example, by "colloidal dispersion or latex", it is meant any dispersion or suspension of particles in liquid, the particles being of a size greater than molecular scale, e.g., about 0.001 to about 0.1 micron. An emulsion generally contains particles of about 0.05 to 1.0 microns, in liquid. A "suspension" generally contains particles of greater than 1.0 micron in liquid.

A "barrier coating mixture" as used herein is meant a liquid containing dissolved or suspended solids, which is used to apply the solids to a substrate. A novel aspect of the present invention is that the barrier coating mixtures provide a better dispersion of platelet fillers in liquid at an unusually low solids content, e.g., between about 1% to about 30% solids as described in more detail below. According to this invention, once the "coating mixture" is dried, it is referred to as a "dried coating" or a "film". The term "vapor barrier" implies a barrier to a liquid and its vapor. Conventionally, a vapor is the gas in equilibrium with a liquid at atmospheric pressure. For simplicity, as used herein, the term "vapor barrier" can be interpreted to mean a barrier to gases and chemicals as well as traditionally defined vapors, as well as a barrier to moisture, generally water or water vapor.

The term "gas barrier" includes a barrier to oxygen, nitrogen, carbon dioxide and other gases. The term "chemical barrier" includes a barrier to the migration or blooming of a molecule from one substrate to another or out of one substrate to that substrate's surface.

The term "aspect ratio" is a characteristic of every platelet material in solid form. Aspect ratio is a lateral dimension of a platelet filler particle, e.g., mica flake, divided by the thickness of the platelet. The term "high aspect ratio" refers to a platelet filler whose lateral dimension divided by thickness is greater than 25. The aspect ratio of any filler is an inherent property of the selected filler. For example, MICROLITE® 963++ aqueous vermiculite solution [W. R. Grace] has a characteristic aspect ratio of about 10,000 or dimensions of 10–30 μm×10 Å.

Intercalation is defined as the state of a coating composition in which polymer is present between each layer of a platelet filler. Intercalation can be defined by the detection of an X-ray line, indicating a larger spacing between vermiculite layers than in the original mineral. The term "exfoliation" is defined for layered fillers as the complete separation of individual layers of the original particle, so that polymer completely surrounds each particle. Preferably, so much polymer is present between each platelet, that the platelets are randomly spaced. No X-ray line appears because of the random spacing of exfoliated platelets. In some circumstances, the filler can exfoliate when dispersed in an aqueous or non-aqueous medium. This would result in a higher aspect ratio than that of a solid particle before dispersion.

The term "effective aspect ratio" relates to the behavior of the platelet filler when incorporated into a binder. The platelet may not exist in a single platelet formation, but in many forms, such as a bundle of 10–50 platelets or hundreds of platelets, referred to as agglomerates. If the platelets are not in the single layer form, the aspect ratio of the entire bundle or agglomerate is much lower than that of the single layer particle. Therefore, the aspect ratio of the particles in a binder is referred to as an effective aspect ratio. The effective aspect ratio is determined by plotting the experimental data versus theoretical model, such as described by E. L. Cussler et al, J. Membrane Sci., 38:161–174 (1988). A graph of reduction in permeability versus the volume % of filler in the binder generates theoretical curves for each effective aspect ratio. The graph predicts an effective aspect ratio for the experimental data (see FIG. 26).

It is important in the understanding of the effects of the coatings of this invention to differentiate between "effective aspect ratio" and "aspect ratio". The aspect ratio is characteristic of a platelet material in the solid form or one platelet and can be determined by light scattering techniques or microscopy. The term "effective aspect ratio" is much different in that it relates to the behavior of the platelet when incorporated into a binder. It may no longer be a single platelet but instead bundles of platelets referred to as agglomerates. This value is determined using experimental permeability data plotted versus theoretical behavior of the platelet. For example, experimental data when plotted versus the theoretical model of the platelet in the binder [see E. L. Cussler et al, J. Membrane S., 38:161–174 (1988)] is directly related to the barrier improvement of the coating through Cussler's theoretical model.

Most commercially available fillers have aspect ratios ranging from 25 up to 10,000. However, the effective aspect ratio of these fillers is much lower when incorporated into a binder and is directly related to the barrier improvement due to the platelet filler, generally resulting in reduced barrier properties. It is important to distinguish between these terms for barrier coatings containing platelet fillers.

Much of the disclosure above and below involving particular barrier coatings is based on U.S. Pat. No. 6,087,016 and U.S. Pat. No. 6,232,389. However, the invention is not limited to airbags including the barrier coatings described in these patents and encompasses airbags including any comparable barrier coatings and any barrier coatings encompassed by the claims.

OBJECTS AND SUMMARY OF THE INVENTION

Objects and advantages of one or more of the inventions disclosed herein include:

1. To provide an airbag which can be manufactured without the use of sewing or other manually intensive operations.
2. To provide an airbag that is considerably lighter and smaller, when folded in the inoperative condition, than current fabric airbags.
3. To provide a driver airbag that does not require the use of tethers.
4. To provide a driver side airbag module which does not rotate with the steering wheel.
5. To provide a driver side airbag having an arbitrary shape.
6. To provide an airbag design to prevent the driver from sliding off the airbag.
7. To provide an airbag that has been optimized to substantially equalize the stresses in the material thereof.
8. To provide a substantially conventional driver fabric airbag which can be manufactured without the use of tethers.
9. To provide an airbag that can be manufactured using a low cost blow molding or similar technology.
10. To provide an airbag that has been optimized to substantially equalize the stresses in the material thereof.
11. To provide a very low cost airbag, with respect to the fabrication thereof.
12. To provide a method of manufacturing an airbag permitting any desired shape airbag to be manufactured from flat panels.
13. To provide an airbag where at least one layer is made from a thermoplastic elastomer which is substantially lighter than conventional fabric airbags.
14. To provide a very low cost airbag, with respect to the fabrication thereof.
15. To provide a method of manufacturing an airbag permitting any desired shape airbag to be manufactured from flat panels.
16. To provide an airbag where at least one layer is made from a thermoplastic elastomer which is substantially lighter than conventional fabric airbags.
17. To provide an airbag system that automatically adjusts to the presence of a child seat.
18. To utilize thin film airbags in a manner that eliminates the catastrophic bursting of the film in the event of an inadvertent puncture.
19. To provide an airbag module utilizing the combination of an airbag made substantially of film and a pyrotechnically opening deployment door.
20. To provide an airbag system that comprises a plurality of airbags.
21. To reduce the injury potential to an out-of-position occupant from the deploying airbag.
22. To provide an airbag system which exhausts back through the inflator structure thereby eliminating the need for vent holes in the airbag.
23. To provide a method of containing a plurality of airbags.
24. To provide an airbag system for the protection of an occupant which automatically adjusts to the occupant's seating position.

25. To provide a simple construction method for an airbag composed of several airbags.
26. To provide a method of containing a plurality of airbags through the use of a net structure.
27. To retain gas in an airbag for a substantial period of time until it is impacted by an occupant.
28. To provide a simple construction method for an airbag composed of several airbags.
29. To provide an airbag having a plurality of interconnected gas-receiving compartments.
30. To retain gas in an airbag for a substantial period of time until it is impacted by an occupant.
31. To minimize the total amount of gas and contaminants produced by all of the inflators in the vehicle.
32. To provide an airbag having a plurality of interconnected gas-receiving compartments.
33. To provide an airbag designed to inflate in the passenger compartment alongside a side door of the vehicle.
34. To provide an airbag designed to inflate in the passenger compartment across the front of the vehicle.
35. To provide an airbag which provides front-to-side coverage for a front-seated vehicle occupant that would prevent the occupant from impacting the A-pillar in a crash.
36. To enable the implementation of driver side airbags for vehicles with a steep steering column angle, which is unsuitable for conventional airbag modules attached to the steering wheel.
37. To provide the flexibility in the orientation of the sensor, the airbag, and the steering column.
38. To implement an airbag on a soft steering wheel or column, which will align the bag in contact with the occupant according to the forces exerted by the occupant, and to provide a steering wheel assembly with such an airbag.
39. To design airbag systems independent of the steering wheel and the column responses for vehicles that need an airbag module not moving with the steering wheel and column, and to provide steering wheel assemblies with airbag systems designed as such.
40. To direct the exhaust gases of an airbag away from the occupant or the passenger compartment.
41. To control the vent hole of an airbag system so that the airbag can be retained inflated for an extended period.
42. To use an aspirated airbag inflator system for the driver side of a vehicle.
43. To provide better viewing for the driver to the dashboard or the instrument panel.

In order to achieve at least some of these objects, a steering wheel assembly for a vehicle in accordance with the invention includes a steering column including an inner shaft adapted to be attached to a fixed part of the vehicle and an outer shaft arranged around the inner shaft and rotatable relative to the inner shaft, the outer shaft being connected with a steering mechanism which causes turning of tires of the vehicle, a steering wheel connected to and for rotation with the outer shaft and an airbag module including an airbag connected to the inner shaft such that the airbag module does not rotate upon rotation of the outer shaft and the steering wheel. The airbag is thus stationary relative to the steering wheel and as a result, its shape is not constrained by any limitations which arise when the airbag must rotate along with the steering wheel as in conventional steering wheel-mounted airbag systems.

A supporting bracket may be provided for mounting the steering column to the vehicle, and includes a passage through which the inner and outer shafts pass. Bearings rotatably support the outer shaft on the supporting bracket. Additional bearings may also be provided between the inner and outer shafts for rotatably supporting the outer shaft on the inner shaft. The steering wheel may be provided with a central cavity centered about a rotation axis thereof with the airbag module being arranged in the cavity.

In a related embodiment of a vehicle, the vehicle includes a steering mechanism which causes turning of the tire(s) of the vehicle, a steering column including an inner shaft attached to a stationary part of the vehicle chassis and an outer shaft arranged around the inner shaft and being rotatable relative to the inner shaft, the outer shaft being connected to the steering mechanism, a steering wheel connected to and for rotation with the outer shaft, and an airbag module including an airbag connected to the inner shaft such that the airbag module does not rotate upon rotation of the outer shaft and the steering wheel. The same modifications described above can be applied in this embodiment as well.

Another embodiment of a vehicle in accordance with the invention includes a dashboard, a windshield, a firewall arranged behind the dashboard, a steering column projecting away from the dashboard, a steering wheel mounted to the steering column, and an occupant protection system for protecting a driver of the vehicle in front of the steering wheel. The occupant protection system includes an airbag module arranged at least partially in the dashboard and which includes an airbag arranged to deploy between a ceiling of a passenger compartment of the vehicle, the steering wheel, the dashboard and the windshield. The airbag is arranged in or on the dashboard to deploy in a direction at least partially upward from an upper surface of the dashboard and rearward over the steering wheel into a position to protect the driver from injury in the event of a crash. A mechanism may be provided to selectively enable movement of the steering wheel in a direction toward the dashboard and away from the driver in the event of a crash involving the vehicle to thereby provide additional space for deployment of the airbag. To this end, a crash sensor may be provided to sense an impending or actual crash involving the vehicle and direct the mechanism to allow movement of the steering wheel. One embodiment of such a mechanism comprises one or more releasable pins having a first position locking the steering column in a fixed position and a second, released position enabling movement of the steering column and thus movement of the steering wheel toward the dashboard.

In another embodiment of the vehicle, the airbag module includes an elongate inflator arranged in the dashboard and extending across a length of the dashboard. The inflator has multiple inflation ports leading to the airbag. If the airbag includes one or more vents, a vent control mechanism is provided to control the flow of gas through the vent(s). For example, one or more valves may be associated with the vent(s) and a torsional spring used to control opening of the valve(s). Alternatively or additionally, the upper surface of the dashboard includes one or more vents.

Another embodiment of a steering wheel assembly for a vehicle in accordance with the invention includes a steering column having first and second opposite ends, the first end being adapted to be mounted to the vehicle, a steering wheel mounted at the second end of the steering column which is pivotable relative to the first end of the steering wheel, and an airbag mounted at the second end of the steering wheel. To enable the pivotal movement of the second end relative to the first end, the steering column has a first part defining the first end and a second part defining the second end, and possibly a joint pivotally connecting the first and second parts. An actuating mechanism may be provided to pivot the second part about the joint relative to the first part. This actuating mechanism could be coupled to a crash sensor and arranged to receive a signal from the crash sensor indicative of an impending or actual crash and pivot the second part to adjust a position of the steering wheel.

Another important object of one or more of the inventions disclosed herein is to form a tubular airbag from flat sheets of film or composite material, or by blow molding or a similar process in order to create an airbag for use to protect occupants in the event of a crash of the vehicle, which may be substantially larger than current airbags and which may be designed to interact with the occupant regardless of where he/she is positioned without causing significant injury and thereby to improve the protection provided by the airbag. One of the materials for the airbag can be selected from the class of plastic materials known as thermoplastic elastomers which includes, among others, polyurethane, polyester elastomer and metallocene-catalyzed polyolefin. A plastic material is called an elastomer when its elongation prior to failure is large, sometimes as large as 100%, 200%, 400% or more. The driver airbag version can use the inelastic properties of a layer of the film material to cause the airbag to attain the desired shape without requiring the use of tethers. As a driver side airbag, for example, it can be substantially elliptical in two orthogonal planes and circular in a third orthogonal plane. If a composite material composed of film and a net, an inelastic film and an elastic film, or film and a fabric, is used to form a hybrid design, the relatively inelastic properties of the film are used to create the desired flat elliptical shape, for example, while the net, elastic film or fabric is used to provide other desirable features including tear resistance sometimes known as blunting.

Another important object of one or more of the inventions disclosed herein is to create a plurality of airbags each composed of tubes, compartments or cells made from plastic film which are designed to impact with a vehicle occupant without causing injury and to hold the occupant in his or her pre-crash position during the crash of the vehicle. The inflation of such airbags is accomplished with an inflator system that provides sufficient gas to inflate the airbags without over-inflating them, thus rendering the airbag system self-adjusting to the occupancy state of the compartment.

The present invention when applied to knee bolsters can take the form of a cellular knee bolster that preferably is made from plastic film. It protects the knees, femurs and lower torso as well as the feet, ankles, and lower legs of the occupant by creating an inflatable restraint that deploys in front and around the occupant's knees and legs, restrains the occupant from all directions and/or inhibits the forward and downward movement by the occupant during a frontal crash. It protects the knees by preventing the knees from becoming trapped in or underneath the dashboard. Further, by transferring energy from the lower torso of the occupant through the femur and knees to the bolster, this invention reduces the severity of injuries to those body parts as well. This invention also reduces the severity of lower torso injuries due to seat belt pressure by stabilizing the lower body and preventing the knees and legs from moving forward, thus allowing the seat belt to remain in its preferred position on the occupant.

This embodiment of the present invention improves egress and extraction of the occupant from a vehicle after a crash because it prevents the occupant from becoming wedged into or underneath the interior structure. Since this invention is small in size prior to being deployed, it does not intrude into or occupy significant space within the occupant compartment as does a conventional fixed knee bolster. This is a major advantage from not only the entry, egress and overall comfort viewpoints, but also from an aesthetic design consideration.

This embodiment of the invention can be installed beneath or as part of the lower face of the dashboard. It then deploys downward as a plurality of independent cells that can be in the form of tubes that can be joined together at their ends with a sheet that then conforms and wraps around the knees and legs of the occupant. Support is achieved since virtually the entire volume is filled with small cellular airbags that are supported by each other and by the vehicle structure.

The gas generator which inflates the unit can be mounted remotely in a convenient location, such as forward in the dashboard, using a flexible or combination rigid/flexible gas conduit.

In the event of a crash, a crash sensor signals the gas generator to ignite and discharge gas at a high mass flow rate into the gas conduit leading to a manifold and to the bolster. The bolster cells inflate until the pressure rises above a design value which then chokes off further flow to the cells and individual valves in each of the cells then close thereby preventing the gas from exhausting from the cells. Thus, within about 10 to 25 ms after impact, the cellular cushion positions itself in front and around the occupant's legs and knees, restrains forward and downward occupant movement, cushions the occupant from impact, and functions as a barrier between the occupant's knees and legs and the vehicle's structure. The bolster expands to meet the occupant and thus there is no impact of the occupant with the bolster during the crash. The restraining forces on the occupant are transferred to the vehicle's structure through this bolster. When the impact has passed and the occupant is at rest, he or she relaxes the load on the bolster and is very close to his or her initial position.

Another important difference between this invention and prior art is that the present invention can be installed without any reactive surface behind the invention. Most prior art restraint devices of this type require the dashboard to extend low enough to provide a reactive surface for either the knees or a conventional airbag. This invention does not require this additional surface area protruding from the dashboard since it is supported by the filling of the entire volume with airbags which are effective to transfer the reaction to whatever vehicle structure is available, such as the firewall. This invention therefore allows more leg room for the occupant in its non-inflated condition, increasing occupant comfort and reducing the possibility that the occupant will be trapped beneath the dashboard during a crash. Since prior art restraint devices require strong reactive surfaces, the total system (module and support structure) can be heavy and/or bulky. The present invention does not include nor require a heavy support structure since it employs the already existing vehicle side structure and/or tunnel.

Fixed bolsters cannot provide optimal protection for both small and large occupants because seat positions vary. A small occupant, for example, sitting in a rearward seat position, as commonly occurs on the passenger side, will come off the seat prior to contacting a fixed bolster. The occupants can thus be injured by hitting the rigid padding or structure of the bolster. Since the present invention is a non-rigid structure that can be designed to meet the occupant wherever he or she is sitting, no injuries should result from hitting the bolster.

Lastly, the airbags of the present invention may be inflated to a range of volumes depending on the particular vehicle installation. The typical airbag inflation completely fills the space between the knees and the foot well. The present invention, therefore, is an important contribution to vehicular crashworthiness and occupant leg and torso protection in frontal impacts and is particularly a substantial improvement in inflatable vehicular knee bolsters.

In order to achieve other objects of the invention, a vehicle is provided with a knee protection airbag which has a storage position and a deployed position and an inflator which inflates the airbag from the storage position to the deployed position so that the airbag substantially fills a space between the knees of the occupant when seated on the front seat and an instrument panel in the deployed position. By filling the space between the knees and the instrument panel, injury to the knees, and other body parts, is prevented.

Inflation of the airbag is caused by a determination by a crash sensor system of an actual or expected crash involving the vehicle and may include an anticipatory crash sensor which forecasts a crash between the vehicle and another object prior to impact of the vehicle by the other object. In this manner, the airbag is inflated prior to the crash.

Various constructions of the airbag are possible. In one construction, the airbag includes at least two pieces of substantially flat inelastic plastic film having peripheral edges, one of which has an inlet port for inflow of inflating fluid, and the pieces of inelastic plastic film are attached together at least at peripheral edges to form a substantially sealed airbag. The airbag may have interconnected chambers formed by attaching the pieces of inelastic plastic film together. In another construction, the airbag includes inelastic plastic film, an inlet port for inflow of inflating fluid and a variable outlet vent which is designed to open variably in response to pressure in the airbag. In another construction, the airbag includes a single piece of inelastic plastic film having an inlet port for inflow of inflating fluid. In yet another construction, the airbag includes an outer airbag made of at least one layer of plastic film and an inner airbag made of at least one layer of plastic film and arranged to fill an interior volume of the outer airbag when inflated.

In still another embodiment, the airbag includes a first sheet of film and a member arranged in connection therewith for arresting the propagation of a tear therein. The member may be (a) a network of multi-directional material strips; (b) a second sheet of film having substantially anisotropic tear properties with the direction of tear resistance thereof being different than a direction of tear resistance of the first sheet of film; and (c) a thermoplastic elastomeric material arranged at specific locations such that the locations are thicker in comparison to an average thickness of the first sheet of film.

In still another embodiment, the airbag includes a composite airbag having at least one layer of inelastic plastic film attached to a layer of a more elastic plastic film, the second layer serving to blunt the propagation of a tear.

In another embodiment, the airbag includes a plurality of material sections defining a plurality of interconnected cells, each of which has a width less than a width of the occupant's knees. Optionally, the airbag includes one-way valves arranged in the material sections between the cells to control flow of inflating fluid between the cells. One or more of the valves leads to each cells and the valves are arranged to close once a predetermined pressure prevails in the respective one of the cells to prevent fluid outflow from the cell.

In yet another embodiment, a net surrounds the airbag during and after deployment of the airbag.

The inflator may include a gas generator for producing pressurized gas to inflate the airbag and an aspiration system which combines gas from the passenger compartment of the vehicle with pressurized gas from the gas generator and directs the combined flow of gas into the airbag.

Another knee bolster airbag system for protecting the knees of an occupant of a vehicle includes an airbag having a plurality of cells, an inflator arranged to inflate the airbag and a housing for storing the airbag, the housing being mounted in the vehicle in a position in which the airbag engages lower extremities of the occupant upon inflation. Preferably, the airbag is dimensioned to occupy a space between the occupant's legs and structural components of an instrument panel of the vehicle when inflated.

Another knee bolster airbag system for a vehicle includes an airbag having a plurality of chambers and an inflator arranged to inflate the airbag such that the airbag engages the lower extremities of a vehicle occupant upon inflation and distribute impact force imposed by the lower extremities over the chambers. The airbag provides a soft surface adapted to engage the lower extremities of an occupant. Optionally, the airbag is arranged such that when inflated, it occupies a space between the occupant's legs and the vehicle instrument panel such that the instrument panel provides support for the airbag. In one embodiment, the inflator is arranged to direct gas directly into only a portion of the chambers and the airbag includes a plurality of one-way valves arranged between adjacent chambers to enable flow of gas from the inflator to all of the chambers.

Another vehicle equipped with a knee bolster airbag system in accordance with the invention includes a compartmentalized airbag knee bolster device mounted to the instrument panel and including an inflator for providing pressurized gas upon actuation thereof and a compartmentalized airbag having a plurality of compartments in communication with the inflator. The compartmentalized airbag knee bolster device is mounted to the instrument panel such that the compartmentalized airbag substantially occupies a space between the instrument panel and the knees or lower extremities of an occupant situated in front of the instrument panel when inflated. The compartmentalized airbag may include a plurality of material sections defining a plurality of compartments and one- way valves arranged in the material sections between the compartments to control flow of inflating fluid between the compartments. Each compartment can have a width approximately equal to or less than the width of a knee of an occupant of the motor vehicle.

An inflatable tubular bolster for a vehicle in accordance with the invention includes an inflatable airbag having a plurality of cells, a gas generator fluidly connected to the airbag via a gas conduit and a crash sensor connected to the gas generator for detecting an impact involving the vehicle. When an impact is detected by the crash sensor, the gas generator causes the cells to be inflated and the airbag deploys from a stowed position downward and rearward into a position below an instrument panel of the vehicle such that it restrains forward and downward movement of an occupant situated in front of the instrument panel. The airbag may be arranged to deploy in front of an occupant's knees and thereby inhibits forward and downward movement of the occupant.

A system for protecting occupants of a vehicle during a crash involving the vehicle in accordance with the invention includes a plurality of inflators for generating pressurized gas, a crash sensor system for controlling the inflators to begin generating pressurized gas based on a crash involving the vehicle, a plurality of primary airbags each directly connected to a respective inflator and receiving pressurized gas directly from the respective inflator and at least one secondary airbag in flow communication with each primary airbag such that inflation of the primary airbag by the respective inflator causes inflation of the secondary airbag(s). This resembles a chain reaction of inflating airbags which progresses from an airbag closest to the vehicle structure inward until contact is made by a secondary airbag with the occupant. Thus, when a plurality of secondary airbags are present and distanced sequentially from the primary airbag, gas from the primary airbag passes into a first one of the secondary airbags and from the first secondary airbag to a second one of the secondary airbags and so on. The secondary airbags may include a one-way valve which enables flow of gas from each secondary airbag to an adjoining downstream secondary airbag. Each primary airbag may also include a one-way valve which enable flow of gas from the primary airbag to an adjoining secondary airbag.

In one particular embodiment, the crash system includes an anticipatory crash sensor arranged to determine whether a crash involving the vehicle is about to occur and to direct the inflators to generate gas prior to the crash such that the primary airbags and the at least one secondary airbags are inflated prior to the crash. In this manner, the entire unoccupied interior space of the passenger compartment can be filed with airbags to cushion any occupants in a crash.

Each inflator may include a gas generator for producing pressurized gas to inflate a respective primary airbags and an aspiration system for combining gas from the passenger compartment of the vehicle with pressurized gas from the gas generator and directing the combined flow of gas into the respective primary airbag.

Other objects and advantages of the present invention will become apparent from the following description of the preferred embodiments and in the claims taken in conjunction with the accompanying drawings.

BRIEF DESCRIPTION OF THE DRAWINGS

The following drawings are illustrative of embodiments of the invention and are not meant to limit the scope of the invention as encompassed by the claims.

FIG. 10 is a partial view of the interior driver area of a vehicle showing a self-contained airbag module containing the film airbag of this invention in combination with a stored gas inflator.

FIG. 11 is a view looking toward the rear of the airbag module of FIG. 10 with the vehicle removed taken at 11—11 of FIG. 10.

FIG. 14 illustrates the vehicle of FIG. 13 when the safety device is in the operative state.

FIG. 15 is a sectional view of one form of safety device as shown in FIGS. 13 and 14 in a plane perpendicular to the vertical direction.

FIG. 15A is a view as in FIG. 15 with additional sheets of material attached to span the cells.

FIGS. 21A, 21D, 21F, 21H, 21J and 21L illustrate various common fabric airbag designs that have been converted to film and have additional film layers on each of the two sides of the airbag.

FIGS. 21B, 21C, 21E, 21G, 21I, 21K and 21M are cross-sectional views of FIGS. 21A, 21D, 21F, 21H, 21J and 21L.

DETAILED DESCRIPTION OF THE PREFERRED EMBODIMENTS

1. Plastic Film Airbags

Figure 1:
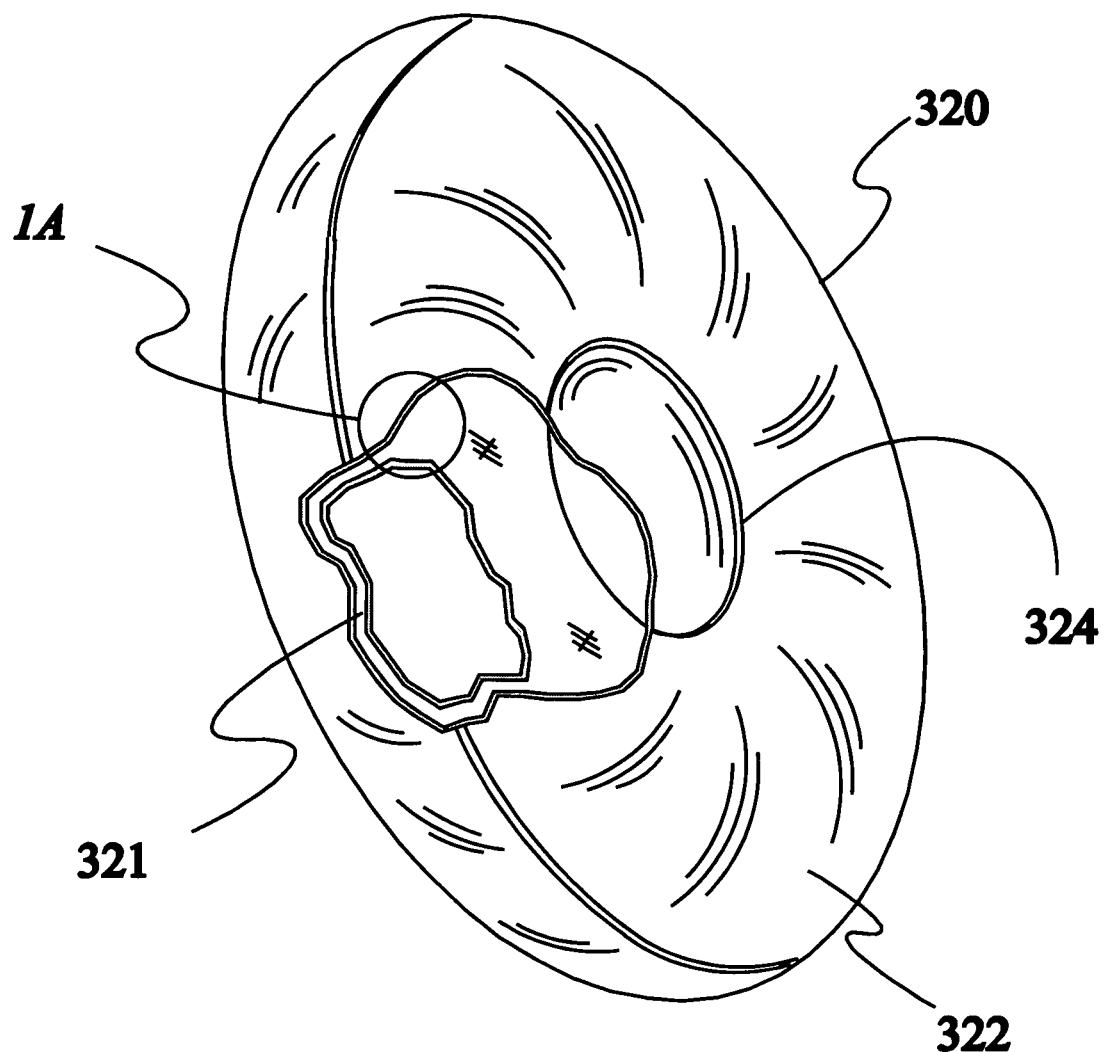
FIG. 1 is a perspective view with portions cut away and removed of a film airbag wherein the film is comprised of at least two layers of material which have been joined together by a process such as co-extrusion or successive casting or coating.

A fundamental problem with the use of plastic films for airbags is that when a single conventional plastic film is used and a tear is (inadvertently) introduced into the film, the tear typically propagates easily and the airbag fails catastrophically upon deployment. As noted above, this invention is concerned with various methods of eliminating this problem and thus of permitting the use of films for airbags with the resulting substantial cost and space savings as well as a significant reduction in injuries to occupants. The reduction in occupant injury arises from the fact that the film is much lighter than the fabric in a conventional airbag and it is the mass of the airbag traveling at a high velocity which typically injures the out-of-position occupant. Also, since the packaged airbag is considerably smaller than conventional airbags, the module is also smaller and the total force exerted on the occupant by the opening of the deployment door is also smaller further reducing the injuries to severely out-of- position occupants caused by the initial stages of the airbag deployment. Finally, in some preferred implementations of this invention, the airbag is mounted onto the ceiling of the vehicle making it very difficult for an occupant to get into a position as to be injured by the opening of the deployment door. Ceiling mounting of conventional fabric airbags is less practical due their excessive size. Ceiling mounting of full protection film airbags, on the other hand, is practical based on the use of the materials and, the reinforcements disclosed here.

One method of solving the tear problem is to use two film airbags or two airbag layers, one inside the other, where the airbags or layers are attached to each other with an adhesive which is strong enough to hold the two airbags or layers closely together but not sufficiently strong to permit a tear in one airbag or layer to propagate to the other. If a tear is initiated in the outer airbag or layer, for example, and the material cannot support significant tensile stresses in the material close to the tear, the inner airbag or layer must accommodate the increased tensile stress until it can be transferred to the outer layer at some distance from the tear. If the tear is caused by a small hole, this increased stress in the inner bag may only occur for a few hole diameters away from the hole. If the inner airbag is also made from an elastomer and the outer airbag layer is made from a less elastic material, the outer material can cause the airbag to take on a particular, desired shape and the inner airbag is used to provide the tear resistance.

In a preferred embodiment, five layers make up the film that is used to construct the airbag. The inner layer is a high tensile strength plastic such as NYLON® and the two outer layers are elastomeric and also capable of being heat sealed together. The three layers are joined together using an adhesive layer between each adjacent pair of layers resulting in a total of five layers. In addition to blunting the propagation of a crack, the elastomeric layers allow the airbag to be formed by heat sealing the elastic layers together. Additional layers can be added if particular properties are desired. Additional layers may also be used at particular locations where added strength is desired, such as at the seams. Although five layers are described, a preferred embodiment is to use three layers by eliminating one elastic and one adhesive layer. Also, in many cases, the elastic and inelastic layers can be thermally bonded together eliminating the need for the adhesive layer.

The problem which arises with a two airbag system with one airbag inside of and attached to the other, when both film layers have high elastic moduli and the cause of the tear in one airbag also causes a tear in the second airbag, is solved if one of the materials used for the two airbags has a low modulus of elasticity, such a thermoplastic elastomer. In this case, even though a tear starts in both airbags at the same time and place, the tear will not propagate in the thermoplastic elastomer and thus it will also be arrested in the high modulus material a short distance from the tear initiation point.

An example of a two layer airbag construction is illustrated in FIG. 1 which is a perspective view with portions cut away and removed of a film airbag made from two layers or sheets of plastic film material, which are preferably substantially coextensive with one another. Frequently, a third adhesive layer is used if the first and second layers cannot be otherwise joined together.

Some of the constructions discussed below contain various materials for reinforcing films. Although not yet available, a promising product for this purpose is carbon nanotubes. These materials are 100 times stronger than steel and have one sixth the weight. Such nanotubes have been demonstrated at Rice University, The University of Texas and Trinity College in Dublin, Ireland.

The phenomenon of crack blunting is discussed in some detail in C.-Y. Hui, A. Jagota, S. J. Bennison and J. D. Londono "Crack blunting and the strength of soft elastic solids", Proc. R. Soc. London, A(2003) 459, 1489–1516. The invention herein makes use of crack blunting to arrest the propagation of a crack (or tear) by the use of elastic layers on one or both sides of the more rigid film, typically NYLON®. The NYLON® prevents the stretching of the elastic films and the elastic films serve to both seal the pieces of plastic film to make an airbag and to blunt the propagation of cracks or tears.

Figure 37:
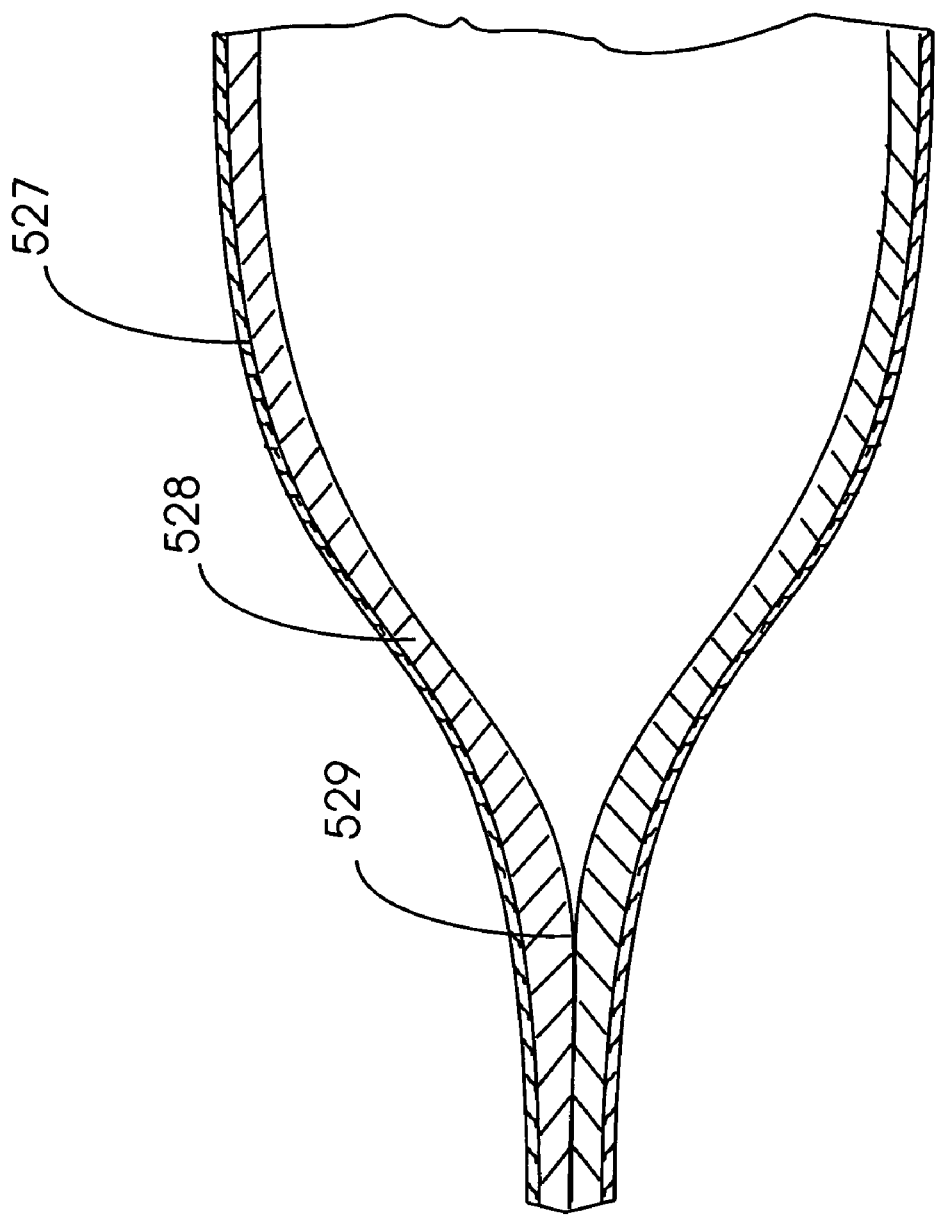
FIG. 37 illustrates a section of a seam area of an airbag showing the deformation of the elastic sealing film layer.

As discussed above and elsewhere herein, the combination of two layers of film wherein one layer comprises a high tensile strength material, such as biaxially oriented Nylon®, and the other generally thicker layer comprises an elastic material, such as polyurethane or a thermoplastic elastomer, not only provides the high strength plus blunting property but also permits the stress concentrations in the seams to be substantially reduced. This is illustrated in FIG. 37 where an airbag includes a high tensile strength layer 527 of Nylon®, for example, an elastic layer 528 of polyurethane, for example, and a joint 529 illustrates the expansion of the elastic layer 528 signifying the redistribution of the stresses in the joint 529. This stress distribution takes place both along the seam (i.e., into the plane of the drawing) and into the joint 529 (i.e., from right to left in the drawing). By this process, the maximum stress can be moved from the joint 529 to the material away from the joint 529 where the strength of the high tensile strength material in layer 527 limits the pressure that the airbag can withstand. By thereby reducing or eliminating the stress concentrations in the joints 529 and/or seams, the thickness and thus the weight of the material making up the airbag is reduced. This permits an airbag to be constructed with interconnected compartments formed by joining portions of sheet material together, e.g., by heat sealing or vulcanization, to form the desired shape for occupant protection while minimizing stress concentrations and thus minimizing the weight of the airbag.

Appendix 1 provides a finite element analysis for a production side curtain airbag as used on the AGM Saturn vehicle. The stresses calculated in the seams are shown to require a Nylon® film thickness of about 0.3 mm or about 0.012 inches to withstand a gage pressure of about 2.8 $kg/cm^2$. Through the use of the elastic film techniques described herein, this thickness can be dramatically reduced to about 0.004 inches or lower.

As mentioned above, U.S. Pat. No. 5,811,506 (Slagel) describes a thermoplastic, elastomeric polyurethane for use in making vehicular airbags. Slagel does not mention the possibility of using this material in a laminated film airbag. The elasticity of this material and the fact that it can be cast or otherwise made into a thin film renders this an attractive candidate for this application especially due to its high temperature resistance and other properties. Such a laminated film airbag would be considerably thinner and have a lighter weight than the polyurethane material by itself which would have to be quite thick to avoid becoming a balloon.

Another technique which can be used in some situations where particular geometries are desired is to selectively deposit or laminate metal foil onto particular sections or locations of the airbag. Such a foil not only greatly reduces gas permeation or leakage through the material but it also adds local stiffness or tensile strength to a particular area of the airbag. This can be used, for example, to reinforce the airbag seams or joints. The most common material for this purpose is aluminum; however, other metals can also be used. The selective addition of metal foil can also be used to control the shape of the airbag. Naturally, for some applications one layer of the entire airbag can be foil.

Other additives can be used in conjunction with the film airbags according with this invention including, for example, aluminum tribydrate or antimony trioxide for flame proofing, BPS by Morton Thiokol for mildew prevention and TINUVUN 765 by Ciba Geigy for ozone resistance.

2. Driver Side Airbag

Figure 1A:
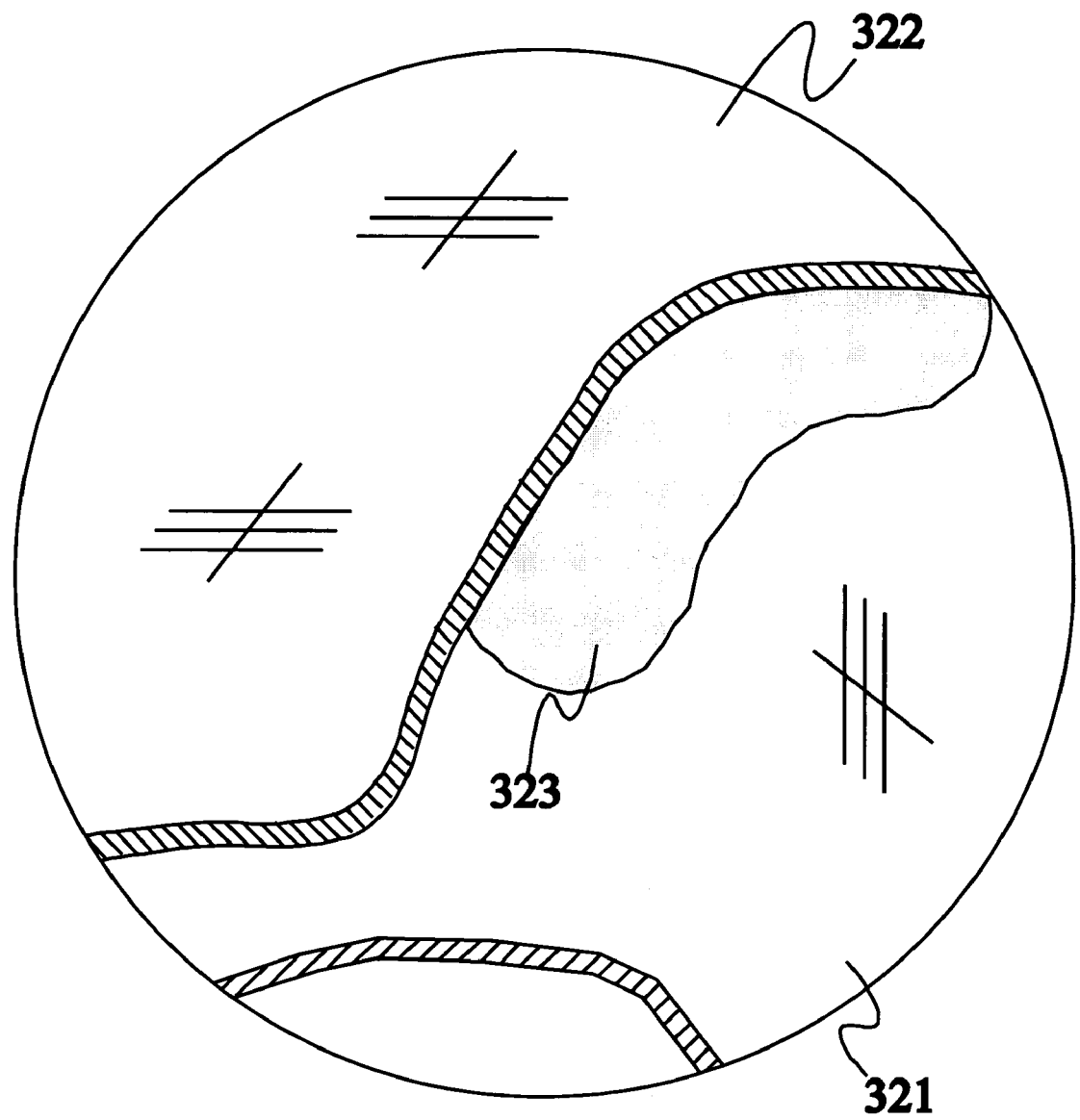
FIG. 1A is an enlarged view of the inner film airbag layer and outer film airbag layer taken within circle 1A of FIG. 1.

In FIG. 1, the driver airbag is shown in the inflated condition generally at 320 with one film layer 321 lying inside a second film layer 322. The film layers 321, 322, or sheets of film laminated or otherwise attached together, are non-perforated and are also referred to as airbags or layers herein since they constitute the same. FIG. 1A is an enlarged view of the material of the inner layer 321 and outer layer 322 taken within circle 1A of FIG. 1. When manufactured, the film of the inner layer 321 may be made from a thermoplastic elastomer such as polyurethane, for example, as shown in FIG. 1A, and the outer layer 322 may be made from a more rigid material such as NYLON® or polyester. The two film layers 321, 322 are held together along their adjacent regions by adhesive such as an adhesive 323 applied in a manner sufficient to provide adherence of the two film layers 321, 322 together, as is known in the art.

In FIG. 1, a driver side airbag 320 is illustrated where the bag is formed from two flat pieces of material 321, 322 and a center cylindrical piece 324 all of which are joined together using heat sealing with appropriate reinforcement at the heat sealed joints. Heat sealing entails the application of heat to one or both of the surfaces to be joined. In most implementations, the center cylindrical piece 324 is not required as taught in U.S. Pat. No. 5,653,464 mentioned above.

The example of FIG. 1 is meant to be illustrative of a general technique to minimize the propagation of tears in a composite film airbag. In an actual airbag construction, the process can be repeated several times to create a composite airbag composed of several layers, each adjacent pair of layers optionally joined together with adhesive.

The materials used for the various film layers can be the same or different and are generally made from NYLON®, polyethylene or polyester, for the high modulus component and from polyurethane, polyester elastomer such as HYTREL™ or other thermoplastic elastomers for the low modulus component, although other materials could also be used. The use of different materials for the different layers has the advantage that tear propagation and strength properties can complement each other. For example, a material which is very strong but tears easily can be used in conjunction with a weaker material which requires a greater elongation before the tear propagates or where the tear does not propagate at all as with blunting materials. Alternately, for those cases where self-shaping is not necessary, all layers can be made from thermoplastic elastomers which expand upon inflation and do not maintain any set shape.

In the implementation of FIG. 1, the adhesive 323 has been applied in a uniform coating between the film layers. In some cases, it is preferable to place the adhesive in a pattern so as to permit a tear to propagate a small distance before the stress is transferred between layers. This permits the stress concentration points to move a small distance away from each other in the two films and further reduces the chance that a catastrophic failure will result. Thus, by selecting the pattern of the application of the adhesive 323 and/or the location(s) of application of the adhesive 323, it is possible to control the propagation of a tear in the composite airbag 320.

Figure 1B:
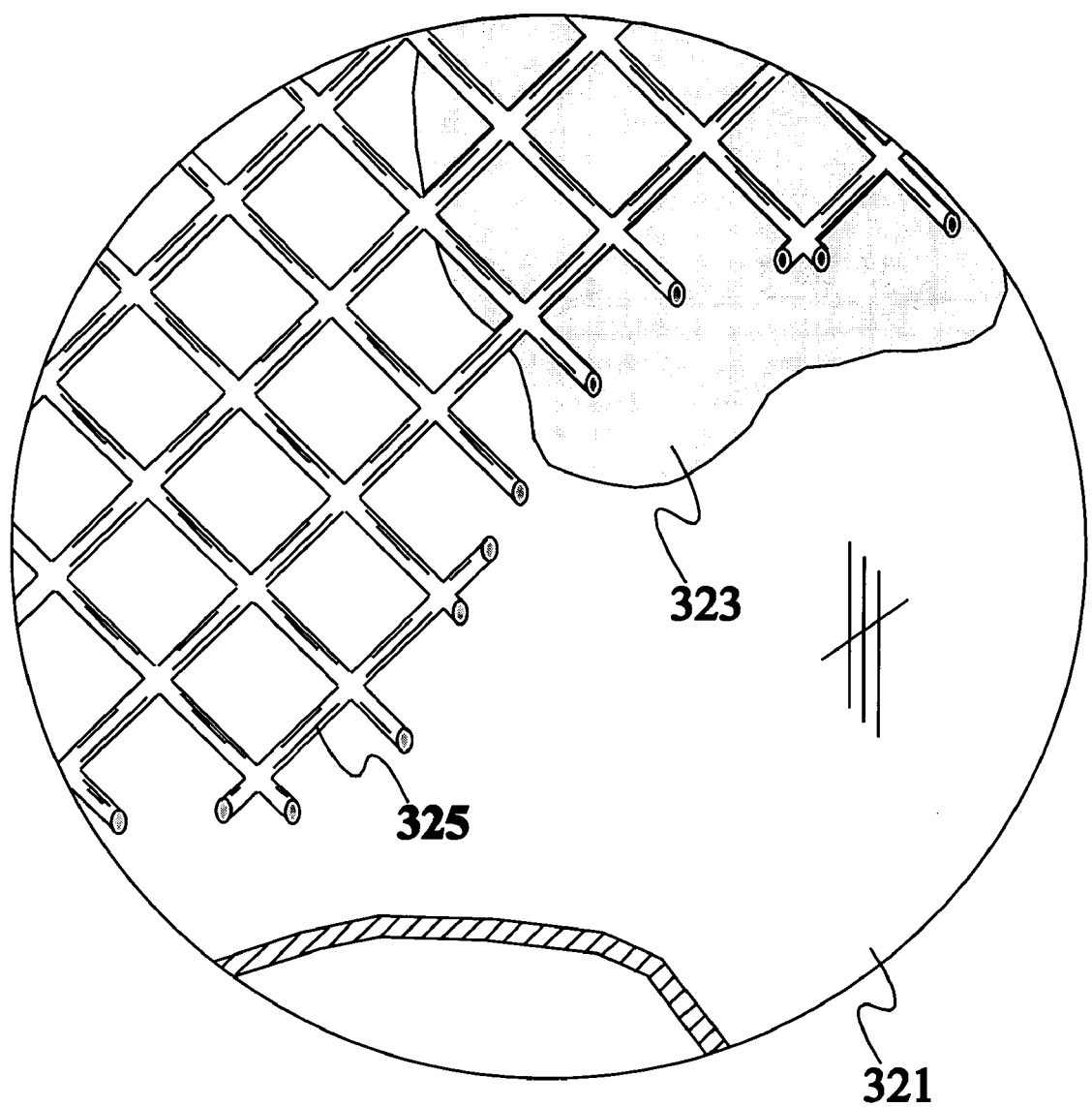
FIG. 1B is an enlarged view of the material of the inner film airbag and outer film airbag taken within circle 1A of FIG. 1 but showing an alternate configuration where the outer airbag layer has been replaced by a net.

FIG. 1B illustrates an alternate configuration of a composite airbag where the outermost airbag 322 has been replaced by a net 325. There may be additional film layers beneath the inner layer 321 in this embodiment. A "net" is defined for the purposes of this application as an interlaced or intercrossed network of material, e.g., strips of material which cross one another. The interlacing may be generated, e.g., by weaving discrete elongate strips of material together or by molding, casting, progressive coating or a similar process in which case the material is molded into the network to provide an intercrossed structure upon formation. Additionally, the net 325 may be formed integrally with the film material in which case it appears as a substantial change in material thickness from the net 325 and film portions of the material to the only film portions of the material. The strips of material may be joined at the intersection points in the event that discrete material strips are woven together. In the illustrated embodiment, the material strips which constitute the net 325 are oriented in two directions perpendicular to one another. However, it is within the scope of the invention to have a net comprising material strips oriented in two, non-perpendicular directions (at an angle to one another though) or three or more directions so long as the material strips are interlaced with each other to form the net. Additionally, the net pattern can vary from one portion of the airbag to another with the particular location and orientation determined by analysis to minimize stress concentrations, eliminate wrinkles and folds, or for some other purpose.

Also, it is understood that the net has openings surrounded by material having a thickness and width substantially smaller than the openings.

The net 325 may be an integral part of the inner airbag 321 or it can be attached by an adhesive 323, or by another method such as heat sealing, to the inner airbag 321 or it can be left unattached to the inner airbag 321 but nevertheless attached to the housing of the airbag system. In this case, the stress in the inner airbag 321 is transferred to the net 325 which is designed to carry the main stress of the composite airbag and the film of the inner airbag 321 is used mainly to seal and prevent the gas from escaping. Since there is very little stress in the film layer constituting the inner airbag 321, a tear will in general not propagate at all unless there is a failure in the net 325. The net 325 in this illustration has a mesh structure with approximately square openings of about 0.25 inches. Naturally, this dimension will vary from design to design. The adhesive 323 also serves the useful purpose of minimizing the chance that the net 325 will snag buttons or other objects which may be worn by an occupant. The design illustrated in FIG. 1B shows the net 323 on the outside of the inner airbag 321. Alternately, the net 325 may be in the inside, internal to the inner airbag 321, especially if it is created by variations in thickness of one continuous material.

Figure 1C:
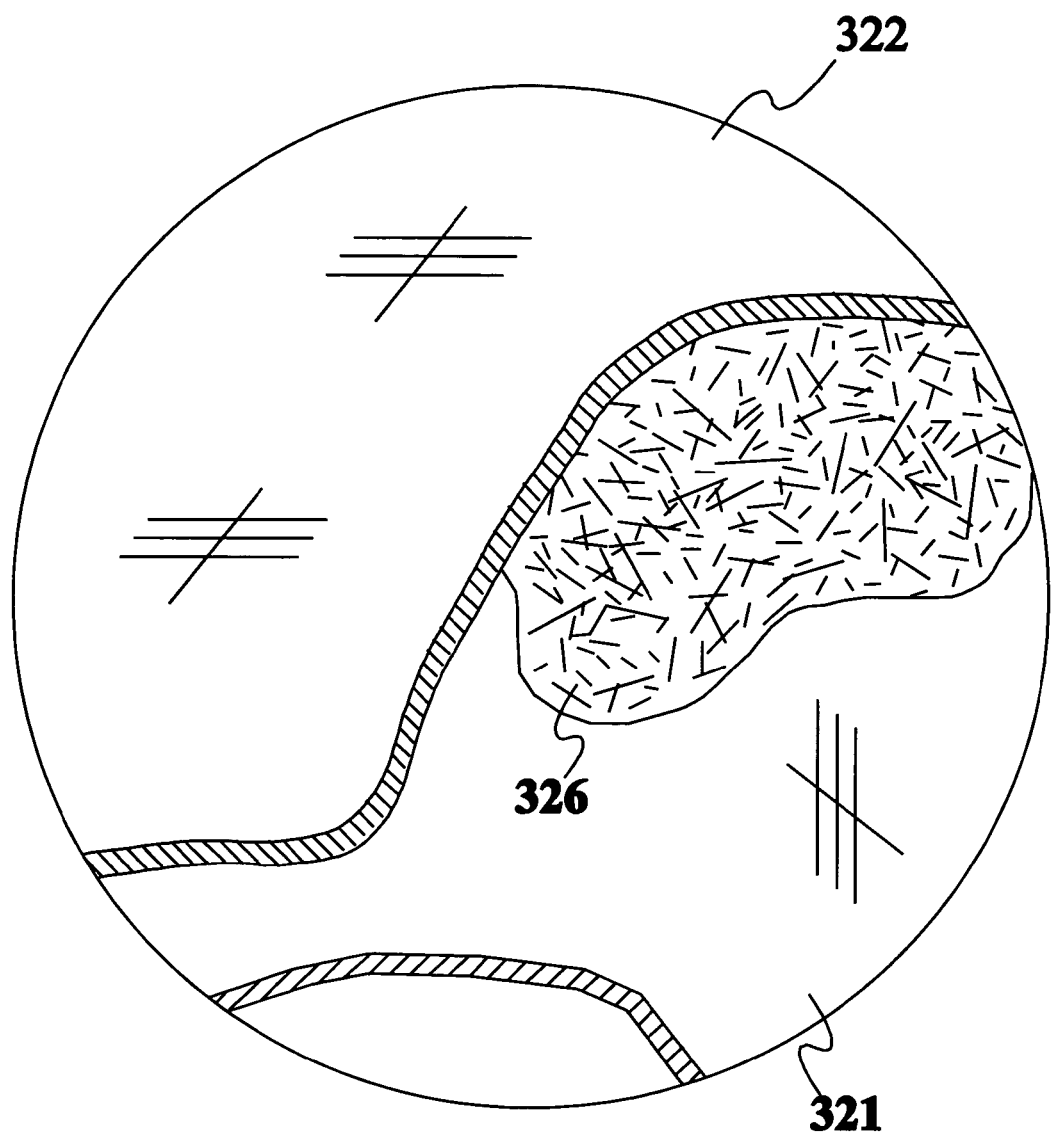
FIG. 1C is an enlarged view of the material of the inner film airbag layer and outer film airbag layer taken within circle 1A of FIG. 1 but showing an alternate configuration where fibers of an elastomer are incorporated into an adhesive layer between the two film layers.

In one embodiment, the net 325 is attached to the housing of the inner airbag 321 and is designed to enclose a smaller volume than the volume of the inner airbag 321. In this manner, the inner airbag 321 will be restrained by the net 325 against expansion beyond the volumetric capacity of the net 325. In this manner, stresses are minimized in the film permitting very thin films to be used, and moreover, a film having a higher elastic modulus can be used. Many other variations are possible. In one alternative embodiment, for example, the net 325 is placed between two layers of film so that the outer surface of the composite airbag is smooth, i.e., since the film layer is generally smooth. In another embodiment shown in FIG. 1C, fibers 326 of an elastomer, or other suitable material, are randomly placed and sealed between two film layers 321,322 (possibly in conjunction with the adhesive). In this embodiment, the fibers 326 act to prevent the propagation of tears in much the same manner as a net. The net 325 may also be constructed from fibers.

Figure 1D:
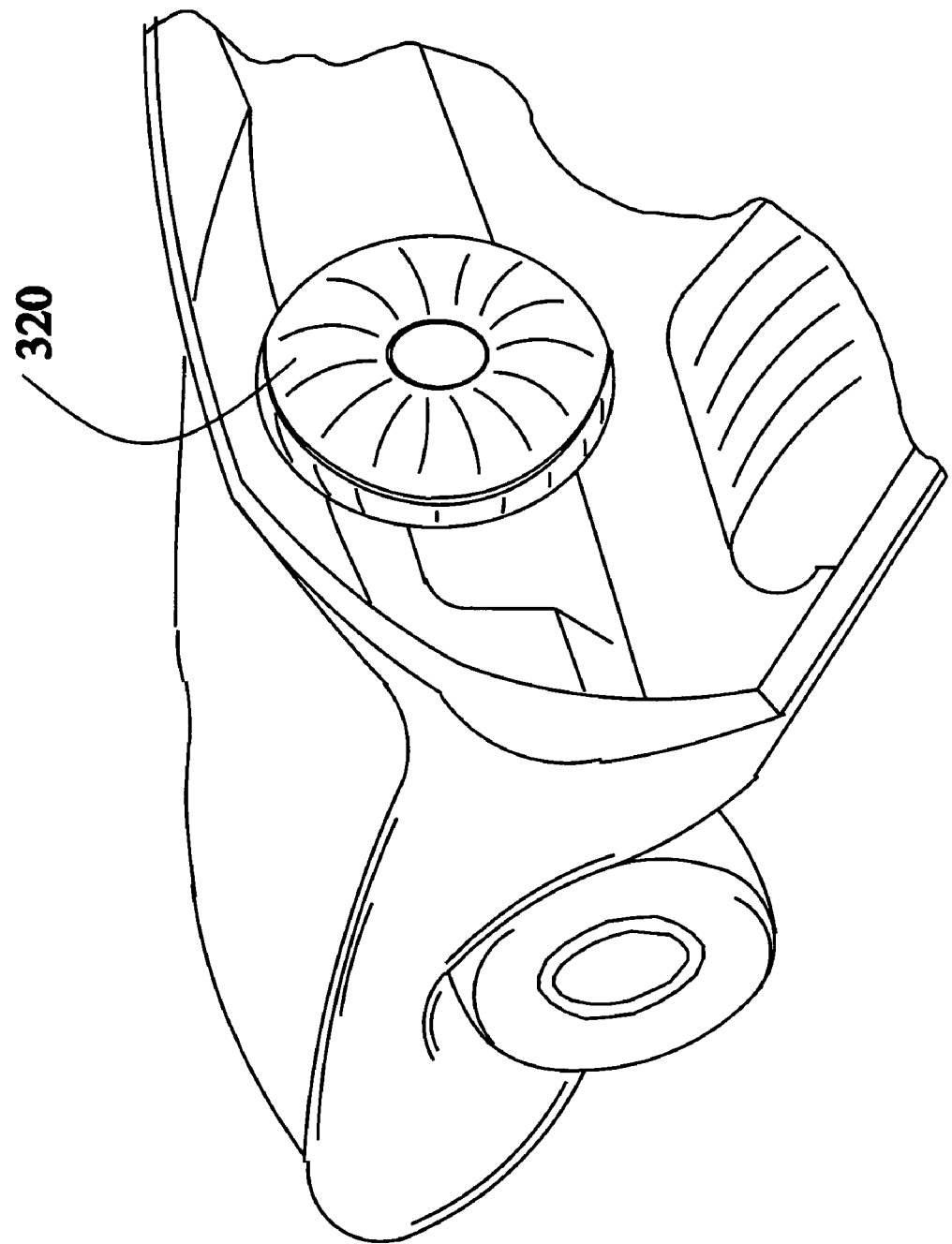
FIG. 1D is a perspective view with portions cut away of a vehicle showing the driver airbag of FIG. 1 mounted on the steering wheel and inflated.

The driver airbag 320 of FIG. 1 is shown mounted on a vehicle by conventional mounting means (not shown) in the driver side position and inflated in FIG. 1D.

It is understood that the airbag 320 is arranged prior to deployment in a module or more specifically in a housing of the module and further that the interior of the airbag 320 is adapted to be in fluid communication with an inflator or inflator system for inflating the airbag, e.g., a gas generation or gas production device. Thus, the inflator is coupled in some manner to the housing. Also, the module includes an initiator or initiation system for initiating the gas generation or production device in response to a crash of the vehicle. This structure is for the most part not shown in the drawings but may be included in connection with all of the airbag concepts disclosed herein.

Figure 2:
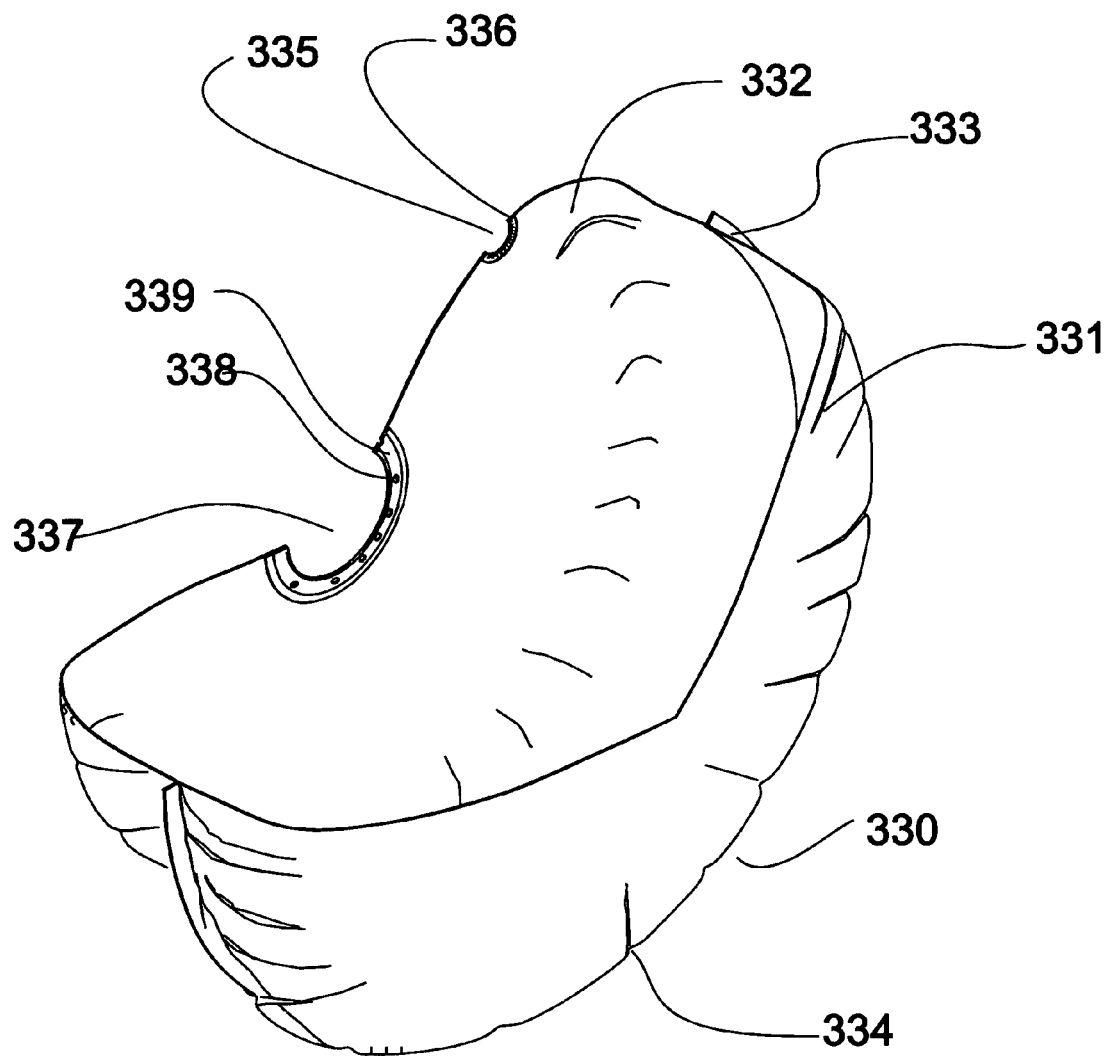
FIG. 2 is a partial cutaway perspective view of a driver side airbag made from plastic film.

An airbag made from plastic film is illustrated in FIG. 2 which is a partial cutaway perspective view of a driver side airbag 330 made from film. This film airbag 330 is constructed from two flat disks or sheets of film material 331 and 332 which are sealed together by heat welding or an adhesive to form a seam 333. A hole 337 is provided in one of the sheets 332 for attachment to an inflator (not shown). The hole 337 can be reinforced with a ring of plastic material 339 and holes 338 are provided in the ring 339 for attachment to the inflator. A vent hole 335 is also provided in the sheet 332 and it can be surrounded by a reinforcing plastic disk 336. Since this airbag 330 is formed from flat plastic sheets 331 and 332, an unequal stress distribution occurs causing the customary wrinkles and folds 334.

Several different plastic materials are used to make plastic films for balloons as discussed in U.S. Pat. No. 5,188,558, U.S. Pat. No. 5,248,275, U.S. Pat. No. 5,279,873 and U.S. Pat. No. 5,295,892. These films are sufficiently inelastic that when two flat disks of film are joined together at their circumferences and then inflated, they automatically attain a flat ellipsoidal shape. This is the same principle used herein to make a film airbag, although the particular film materials selected are different since the material for an airbag has the additional requirement that it cannot fail during deployment when punctured.

When the distinction is made herein between an "inelastic" film airbag and an elastic airbag, this difference in properties is manifested in the ability of the untethered elastic airbag to respond to the pressure forces by becoming approximately spherical with nearly equal thickness and diameter while the inelastic film airbag retains an approximate ellipsoidal shape, or other non-spherical shape in accordance with the design of the inelastic film airbag, with a significant difference between the thickness and diameter of the airbag.

An analysis of the film airbag shown in FIG. 2 shows that the ratio of the thickness to the diameter is approximately 0.6. This ratio can be increased by using films having greater elasticity. A completely elastic film, rubber for example, will form an approximate sphere when inflated. This ratio can also be either increased or decrease by a variety of geometric techniques some of which are discussed below. The surprising fact, however, is that without resorting to complicated tethering involving stitching, stress concentrations, added pieces of reinforcing material, and manufacturing complexity, the airbag made from inelastic film automatically provides nearly the desired shape for driver airbags upon deployment (i.e., the roughly circular shape commonly associated with driver side airbags). Note that this airbag still has a less than optimum stress distribution which will be addressed below.

Figure 3A:
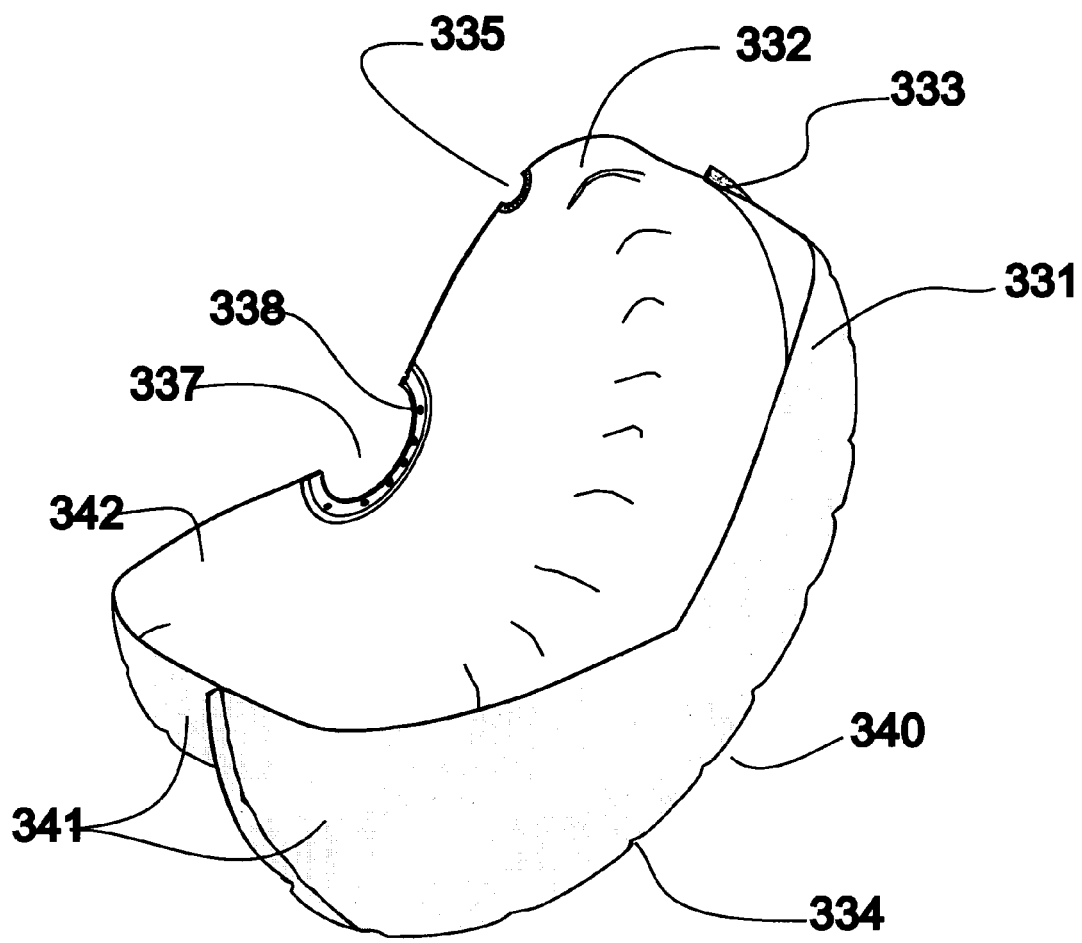
FIG. 3A is a partial cutaway perspective view of an inflated driver side airbag made from plastic film and a fabric to produce a hybrid airbag.

Although there are many advantages in making the airbag entirely from film, there is unfortunately reluctance on the part of the automobile manufacturers to make such a change in airbag design until the reliability of film airbags can be satisfactorily demonstrated. To bridge this gap, an interim design using a lamination of film and fabric is desirable. Such a design is illustrated in FIG. 3A which is a partial cutaway perspective view of a driver side airbag made from film 342 laminated with fabric 341 to produce a hybrid airbag 340. The remaining reference numbers represent similar parts as in the embodiment shown in FIG. 2. In all other aspects, the hybrid airbag 340 acts as a film airbag. The inelastic nature of the film 342 causes the hybrid airbag 340 to form the proper shape for a driver airbag. The fabric 341, on the other hand, presents the appearance of a conventional airbag when viewed from the outside. Aside from the lamination process, the fabric 341 may be attached to the film 342 directly by suitable adhesives, such that there are only two material layers, or by heat sealing or any other convenient attachment and bonding method. Note, this is not to be confused with a neoprene or silicone rubber coated conventional driver side airbag where the coating does not significantly modify the properties of the fabric.

Figure 3B:
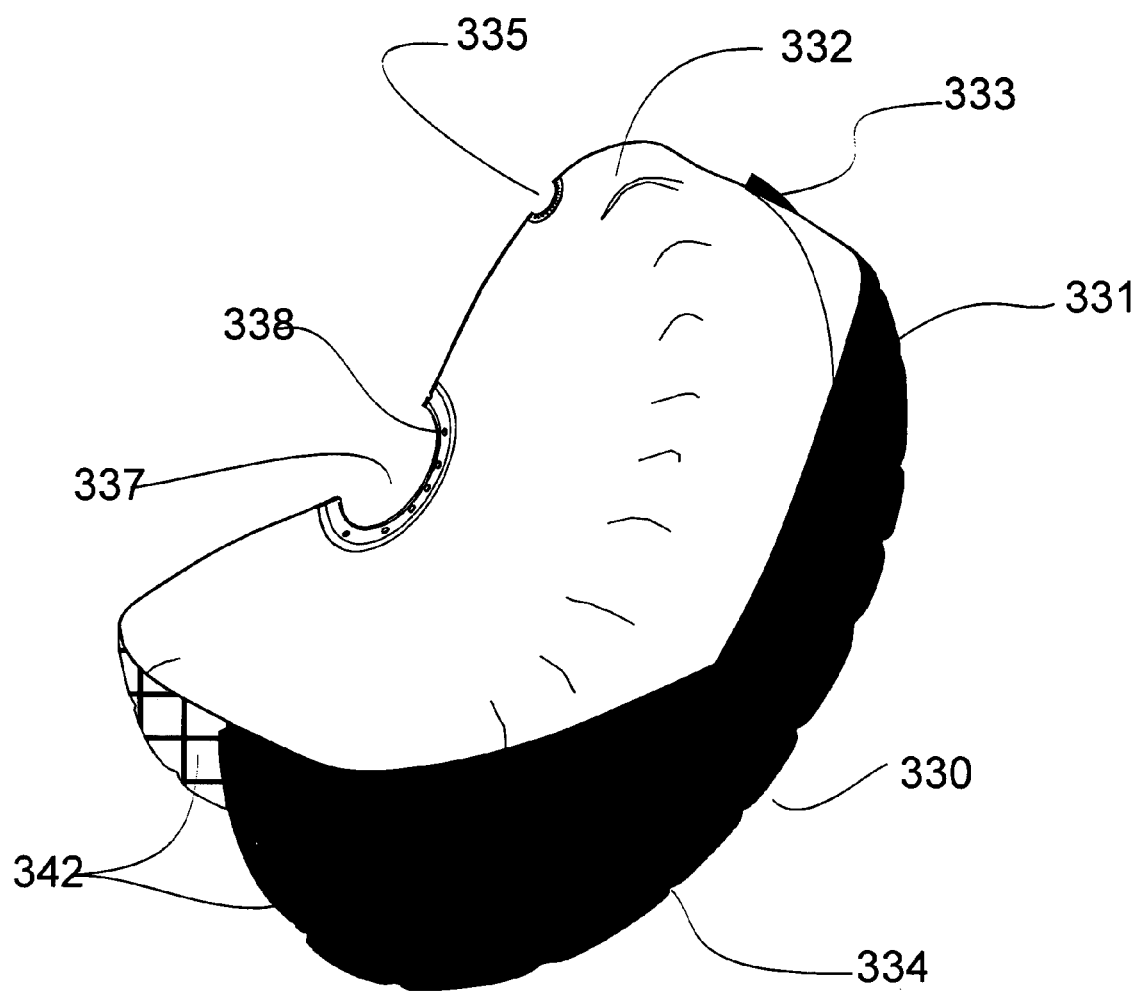
FIG. 3B is a partial cutaway perspective view of an inflated driver side airbag made from plastic film and a net to produce a hybrid airbag.

Analysis, as described in the above-referenced U.S. Pat. No. 5,505,485, has shown that a net is much stronger per unit weight than a fabric for resisting tears. This is illustrated in FIG. 3B which is a partial cutaway perspective view of a driver side airbag 330 made from film 332 and a net 342, which is preferably laminated to the film 332 or formed from the same material as the film 332 and is integral with it, to produce a hybrid airbag. The analysis of this system is presented in the above-referenced patent which is included herein by reference and therefore will not be reproduced here. The reference numerals designating the element in FIG. 3B correspond to the same elements as in FIG. 3A.

Figure 3C:
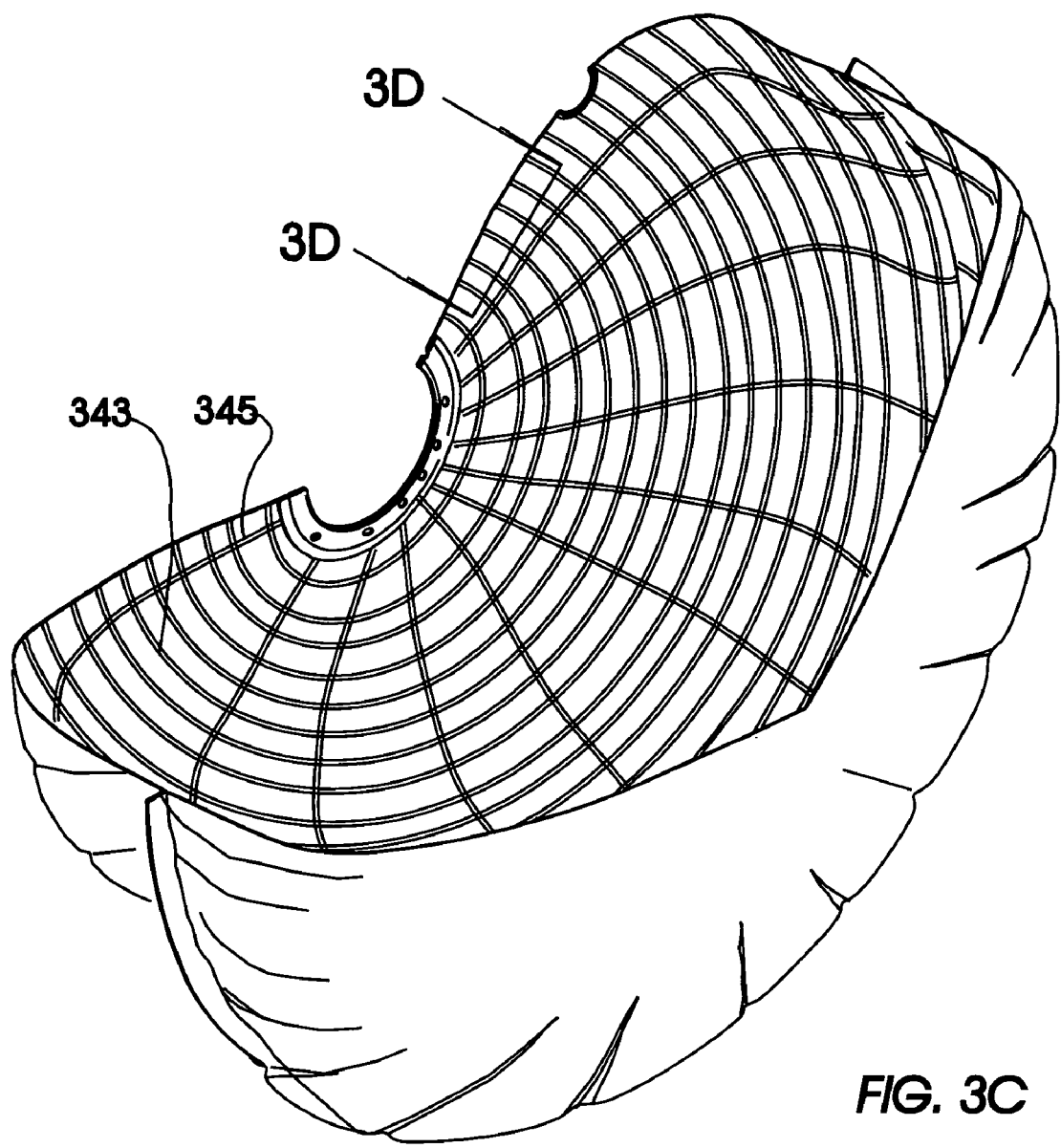
FIG. 3C is a partial cutaway perspective view of an inflated driver side airbag made from plastic film having a variable thickness reinforcement in a polar symmetric pattern with the pattern on the inside of the airbag leaving a smooth exterior.
Figure 3D:
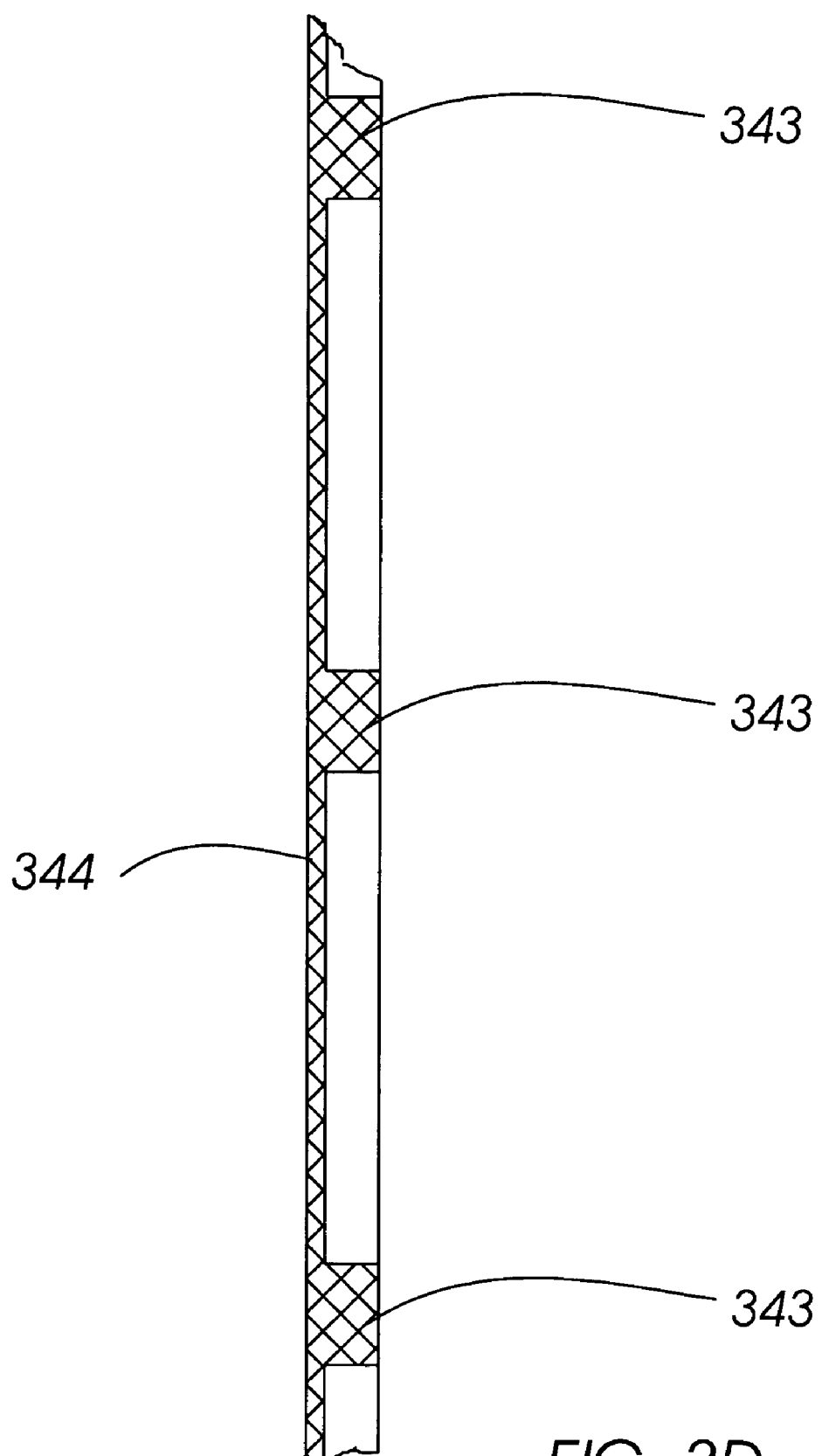
FIG. 3D is an enlarged cross sectional view of the material of the film airbag taken at 3D-3D of FIG. 3C showing the thickness variation within the film material.

For axisymmetric airbag designs such as shown in FIGS. 3A–3D, a more efficient reinforcement geometry is to place the reinforcements in a pattern of circular rings 343 and ribs 345 (FIG. 3C). A cross-sectional view of the material taken along line 3D—3D in FIG. 3C is shown in FIG. 3D. In this case, the reinforcement has been made by a progressive coating process from a thermoplastic elastomeric material such as polyurethane. In this case, the reinforcing rings and ribs 343, 345 are many times thicker than the spanning thin film portions 344 and the reinforcing ribs 345 have a variable spacing from complete contact at the center or polar region to several centimeters at the equator. The reinforcements may comprise the laminated net as discussed above. Since the rings and ribs 343, 345 are formed in connection with the inner surface of the airbag 330, the outer surface of the airbag 330 maintains its generally smooth surface.

In this regard, it should be stated that plastic manufacturing equipment exists today which is capable of performing this progressive coating process, i.e., forming a multilayer plastic sheet (also referred to as a material sheet) from a plurality of different plastic layers. One such method is to provide a mold having the inverse form of the predetermined pattern and apply the specific plastic materials in individual layers into the mold, all but the initial layer being applied onto a preexisting layer. The mold has depressions having a depth deeper than the remaining portions of the mold which will constitute the thicker regions, the thinner portions of the mold constituting the spanning regions between the thicker regions. Also, it is possible and desirable to apply a larger amount of the thermoplastic elastomer in the depressions in the mold so that the thicker regions will provide a reinforcement effect. In certain situations, it is foreseeable that only the thermoplastic elastomer can be coated into the depressions whereas a plastic material which will form an inelastic film layer is coated onto the spanning regions between the depressions as well as in the depressions in order to obtain an integral bond to the thermoplastic elastomer. The mold can have the form of the polar symmetric pattern shown in FIG. 3C.

Figure 4A:
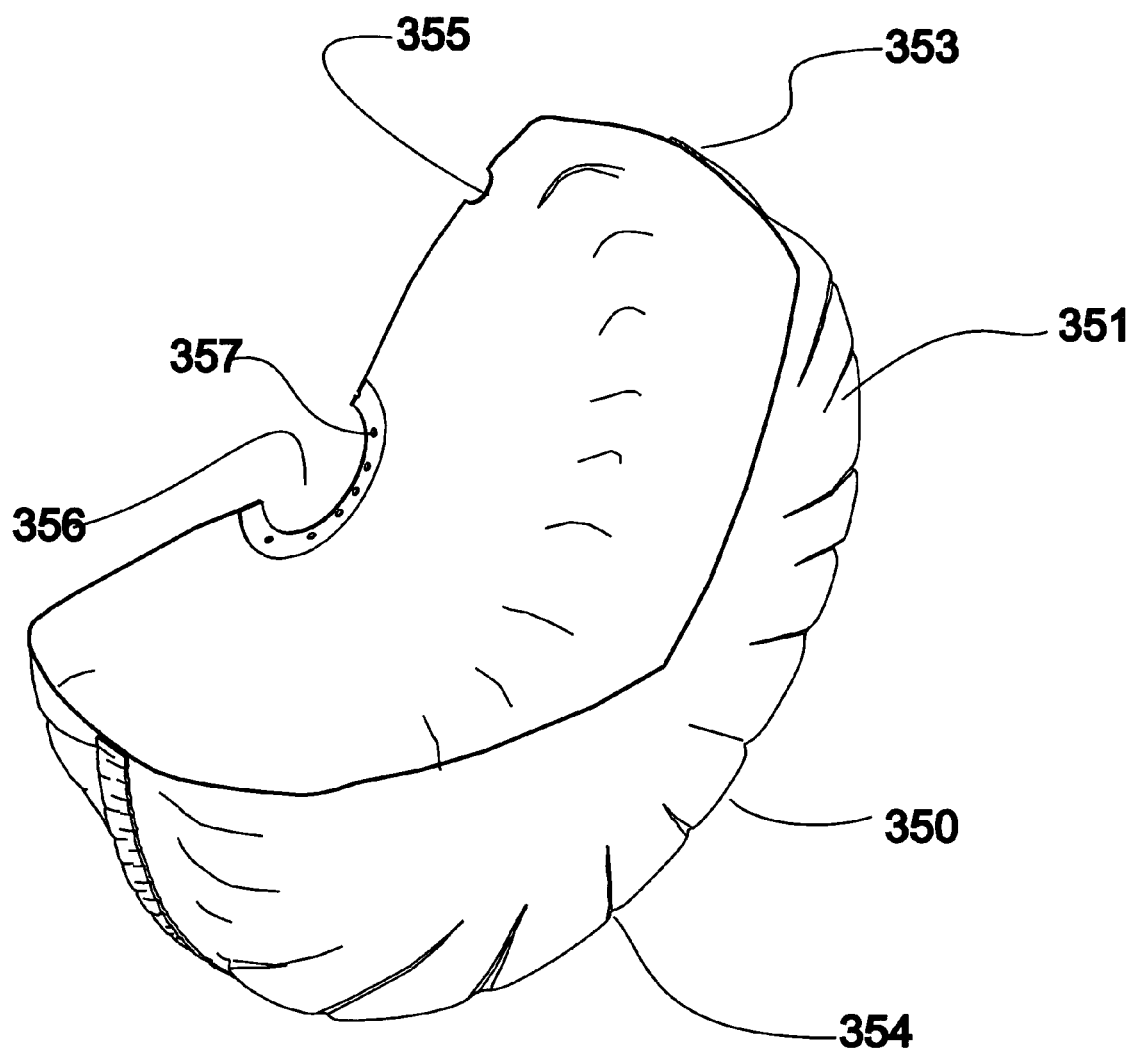
FIG. 4A is a partial cutaway perspective view of an inflated driver side airbag made from plastic film using a blow molding process.

The film airbag designs illustrated thus far were constructed from flat plastic sheets which have been sealed by heat welding, adhesive or otherwise. An alternate method to fabricate an airbag is to use a molding process to form an airbag 350 as illustrated in FIG. 4A which is a partial cutaway perspective view of a driver side airbag made from film using blow molding (a known manufacturing process). Blow molding permits some thickness variation to be designed into the product, as does casting and progressive coating methods molding (other known manufacturing processes). In particular, a thicker annular zone 353 is provided on the circumference of the airbag 350 to give additional rigidity to the airbag 350 in this area. Additionally, the material surrounding the inflator attachment hole 356 has been made thicker removing the necessity for a separate reinforcement ring of material. Holes 357 are again provided, usually through a secondary operation, for attachment of the airbag 350 to the inflator.

The vent hole 355 is formed by a secondary process and reinforced, or, alternately, provision is made in the inflator for the gases to exhaust therethrough, thereby removing the need for the hole 355 in the bag material itself. Since this design has not been stress optimized, the customary wrinkles and folds 354 also appear. The vent hole 355 might also be a variable-sized or adjustable vent hole to achieve the benefits of such as known to those skilled in the art.

Figure 4B:
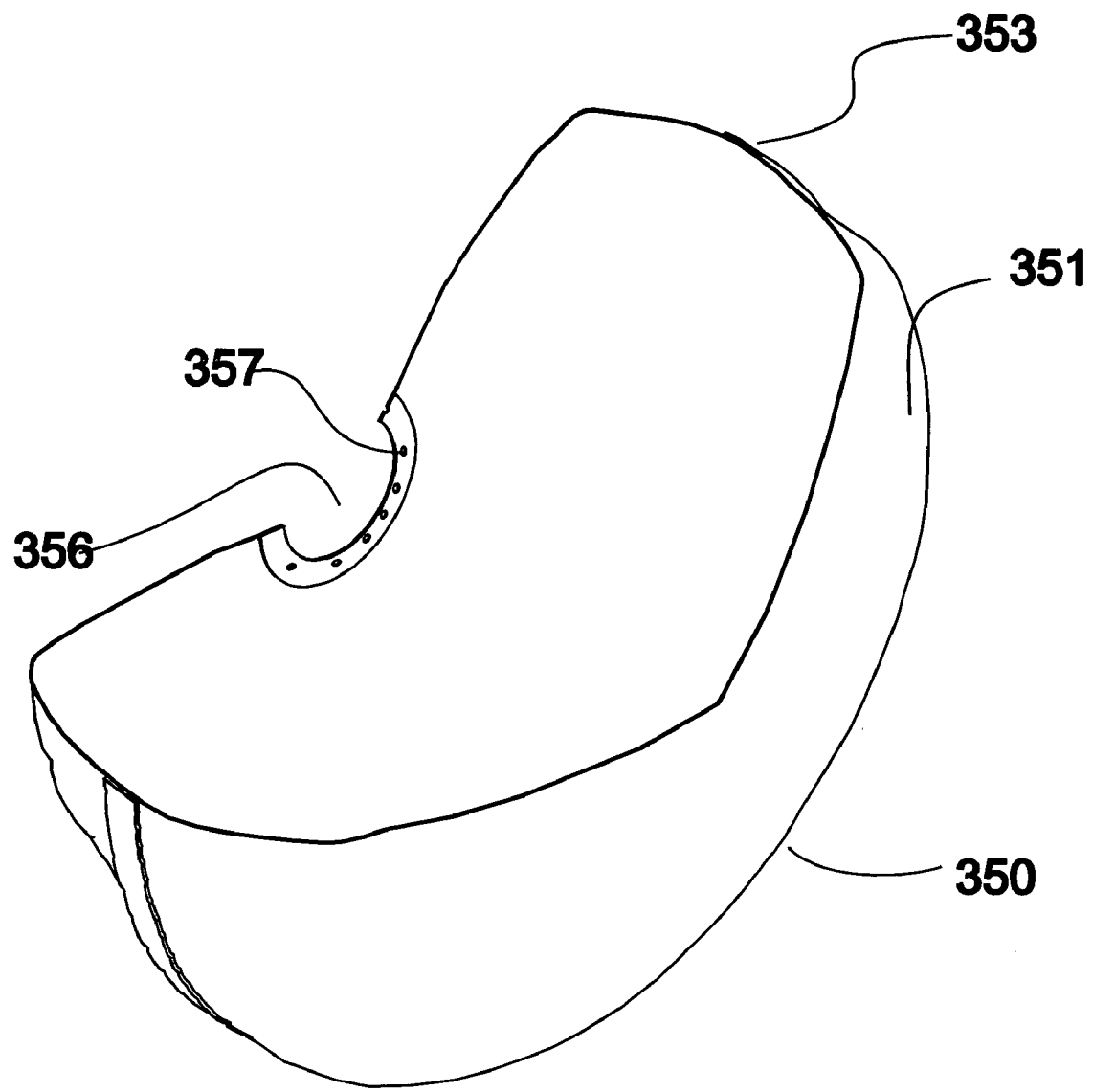
FIG. 4B is a partial cutaway perspective view of an inflated driver side airbag made from plastic film using a blow molding process so that the airbag design has been partially optimized using finite element airbag model where the wrinkles have been eliminated and where the stresses within the film are more uniform.

One advantage of the use of the blow molding process to manufacture airbags is that the airbag need not be made from flat sheets. Through careful analysis, using a finite element program for example, the airbag can be designed to substantially eliminate the wrinkles and folds seen in the earlier implementations. Such a design is illustrated in FIG. 4B which is a partial cutaway perspective view of a driver side airbag made from film using a blow molding process where the airbag design has been partially optimized using a finite element airbag model. This design has a further advantage in that the stresses in the material are now more uniform permitting the airbag to be manufactured from thinner material.

Figure 4C:
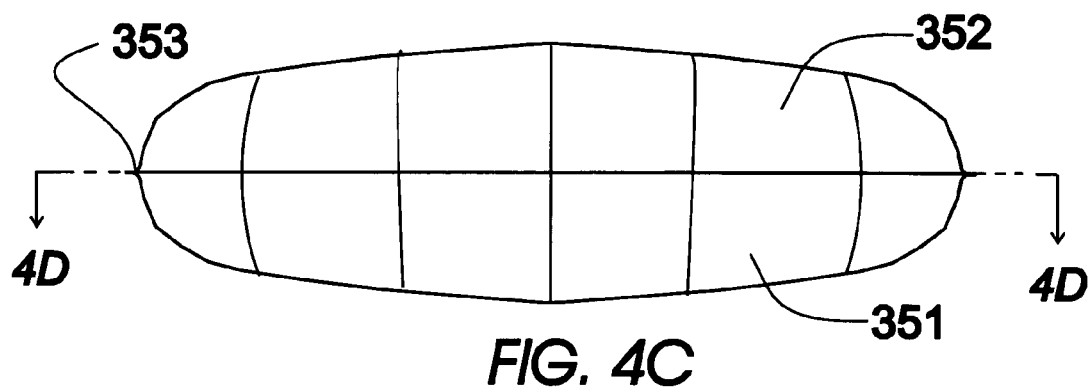
FIG. 4C is a cutaway view of an inflated driver side airbag made from plastic film showing a method of decreasing the ratio of thickness to effective diameter.
Figure 4D:
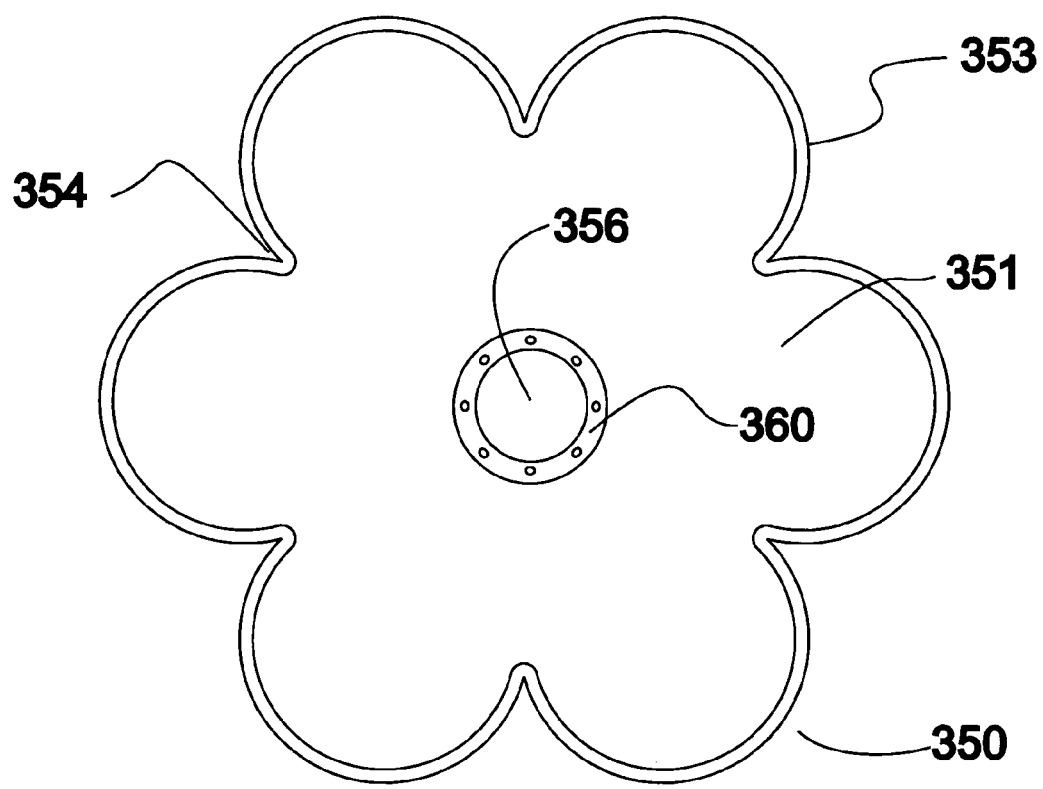
FIG. 4D is a view of a driver side airbag of FIG. 4C as viewed along line 4D-4D.

In some vehicles, and where the decision has been made not to impact the driver with the airbag (for example if a hybrid airbag is used), the inflated airbag comes too close to the driver if the ratio of thickness to diameter is 0.6. In these applications, it is necessary to decrease this ratio to 0.5 or less. For this ratio, thickness means the dimension of the inflated airbag measured coaxial with the steering column, assuming the airbag is mounted in connection with the steering column, and diameter, or average or effective diameter, is the average diameter measured in a plane perpendicular to the thickness. This ratio can be obtained without resorting to tethers in the design as illustrated in FIG. 4C which is a side view of a driver side airbag made from film where the ratio of thickness to effective diameter decreases. FIG. 4D is a view of the airbag of FIG. 4C taken along line 4D—4D. This airbag 350 can be manufactured from two sheets of material 351 and 352 which are joined together by sealing means to form seal 353. Inflator attachment hole 356 can be reinforced with a ring of plastic material 360 as described above. Many circumferential geometries can be used to accomplish this reduction in thickness to diameter ratio, or even to increase this ratio if desired. The case illustrated in FIG. 4C and FIG. 4D is one preferred example of the use of a finite element design method for an airbag.

Some vehicles have a very steep steering column angle. The direct mounting of an airbag module on the steering wheel will therefore not provide good protection to the driver. One approach to solve this problem can be accomplished by using a softer wheel rim or column, which adjusts its angle when pressed by the occupant. However, in some cases this can have just the opposite effect. If a non-rotating driver side airbag is used, the airbag can be arranged to deploy at a different angle from the steering wheel without modifying the steering column while the airbag can be inflated in a direction appropriate for driver protection. Another advantage of using a non-rotating driver side airbag module is that the angle of the sensor axis is independent of the steering column angle for self-contained airbag modules.

In a high-speed vehicle crash, the steering column may collapse or shift due to the severe crush of the front end of the vehicle. The collapse of the steering column can affect the performance of an airbag if the bag is installed on the steering column. One steering system proposed herein purposely induces a large stroking of the steering column when the driver side airbag is activated. This stroking or "disappearing" column, creates a large space in the driver side compartment and therefore allows the use of a relatively large airbag to achieve better protection. In both of the above cases, an airbag module not rotating with the steering wheel is the better choice to accomplish occupant protection.

Recently, there are some developments in steering design, such as "steering by wire", to eliminate the steering column or the mechanical mechanism connecting the steering column to the front wheels. The rotation of the steering wheel is converted into a signal which controls the turning of front wheels by actuators adjacent to the wheels. As steer-by-wire is commercialized, it will be advantageous to use the invention herein of a non-rotating driver side airbag module, which does not have to be supported by a steering column.

To provide better viewing to the instrumentation panel for the driver, it is also beneficial to arrange a driver side airbag module so that it does not obstruct this view. A non-rotating driver side airbag can be either arranged to be out of the central portion of the steering wheel or completely out of the steering wheel to avoid this inconvenience.

Figure 38:
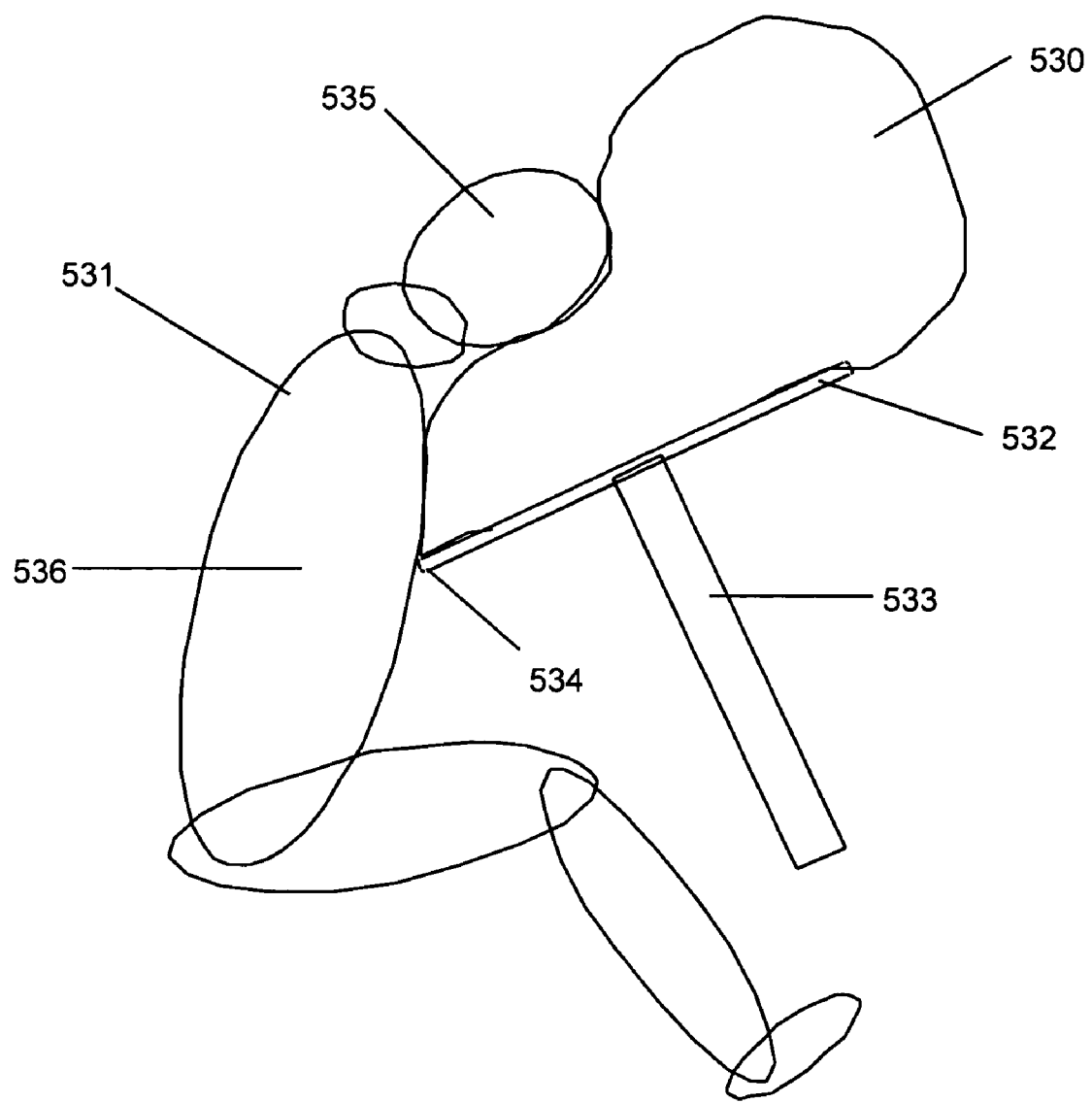
FIG. 38 shows a deployed airbag, supported on the steering wheel of a vehicle with a steep steering column, in contact with an occupant.

An inflated airbag 530 interacting with driver 531 is shown in FIG. 38. Airbag 530 is installed in and deployed from steering wheel 532. The steering column 533 has a steep column angle placing the lower rim 534 of the steering wheel close to the driver 531. When the driver 531 moves forward after a crash, the driver's head 535 and upper torso 536 make contact with the airbag 530 and the steering wheel 532. The airbag 530 is then deformed and pushed by the occupant 531 so that the airbag 530 does not form a cushion between the upper torso 536 and the steering wheel 532 even though the driver's head 535 is in full contact with the airbag 530.

Figure 39B:
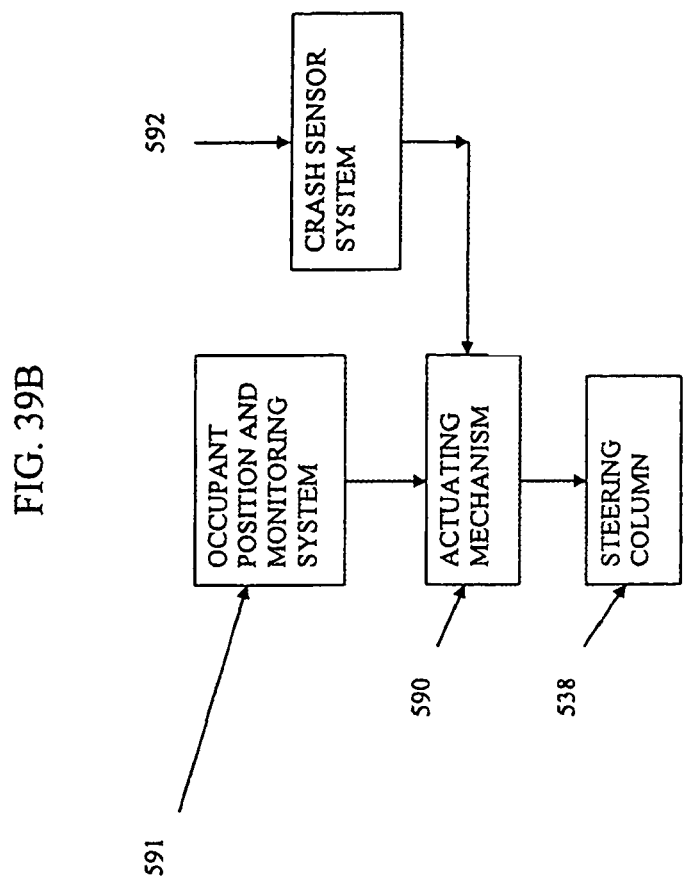
FIG. 39B is a schematic of an exemplifying use of the steering column shown in FIG. 39A.
Figure 39A:
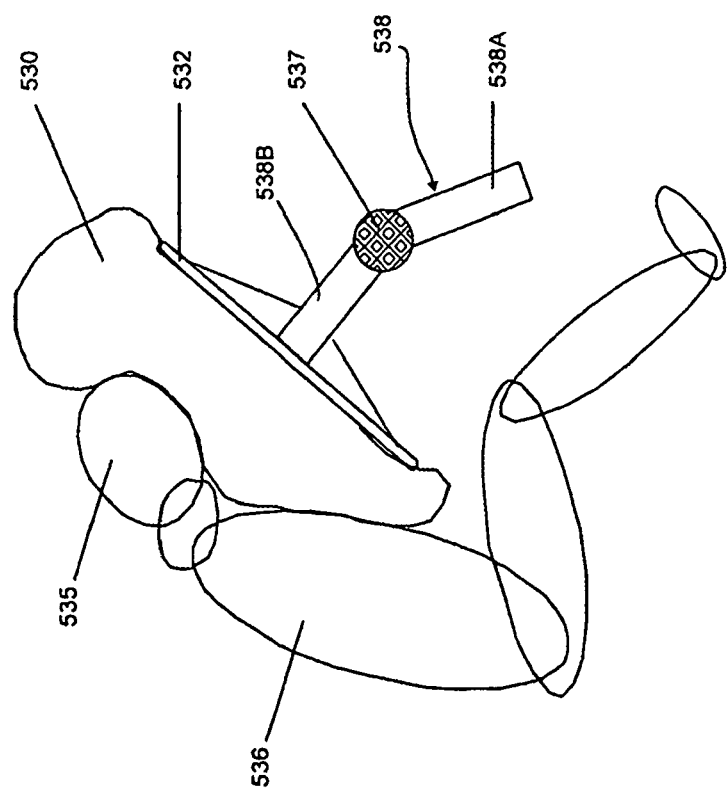
FIG. 39A shows an inflated airbag and a steering wheel, self-aligned with an occupant.

A modified column 538 is illustrated in FIG. 39A, which is equipped with a joint 537 between a lower part 538A of the steering column 538 connected to the vehicle and an upper part 538B of the steering column 538 connected to the steering wheel 532. Joint 537 allows the steering wheel 532 and the inflated airbag 530 to have a variable angle relative to the lower part 538A of the steering wheel 538 and thus an adjustable angle to the driver 531. Appropriate rotation of the joint 537 enables the inflated airbag 530 to align with the head 535 and upper torso 536 of the driver 531. The protection offered by the steering column 538 including the airbag 530 in FIG. 39A is an improvement over the system in FIG. 38 since the airbag 530 is in a better orientation to cushion the driver 531 and penetration of the lower rim 534 of the steering wheel 532 is avoided. The concept of self-aligned driver side airbag can also be accomplished by rotating the steering wheel 532 or utilizing a soft rim for the steering wheel 532.

Construction of the joint 537 may involve use of a pivot hinge having two parts pivotable relative to one another with one part being attached to the lower part 538A of the steering column 538 and the other part being attached to the upper part 538B of the steering column 538. Alternatively, one of the lower and upper parts 538A, 538B can be formed with a projecting member and the other part formed with a fork-shaped member and a pivot pin connects the projecting member and fork-shaped member. Other ways to construct joint 537 will be apparent to those skilled in the art in view of the disclosure herein and are encompassed by the description of joint 537.

Pivotal movement of the upper part 538B of the steering column 538 and thus the steering wheel 532 and airbag 530 mounted in connection therewith may be realized manually by the driver or automatically by an actuating mechanism 590 (see FIG. 39B). The actuating mechanism 590 can be designed to cooperate with an occupant position and monitoring system 591 to receive the detected position and/or morphology of the driver 531 therefrom and then adjust the steering column 538 to cause adjustment of the position of the steering wheel 532 to a position within a range of optimum positions for a driver in that position and/or with that morphology. To allow for situations in which the driver manually changes the position of the steering wheel 532 outside of the range of optimum positions for the driver based on the position and/or morphology of the driver detected by the occupant position and monitoring system 591, the actuating mechanism 590 can be designed to cooperate with a crash sensor system 592 to receive a signal indicative of an impending or actual crash and then automatically adjust the position of the upper part 538B of the steering column 538. In this manner, even if the driver has the steering wheel 532 set in a position during regular driving in which it will adversely affect airbag deployment, the actuating mechanism 590 causes the steering wheel 532 to be re-positioned during the crash.

Figure 40:
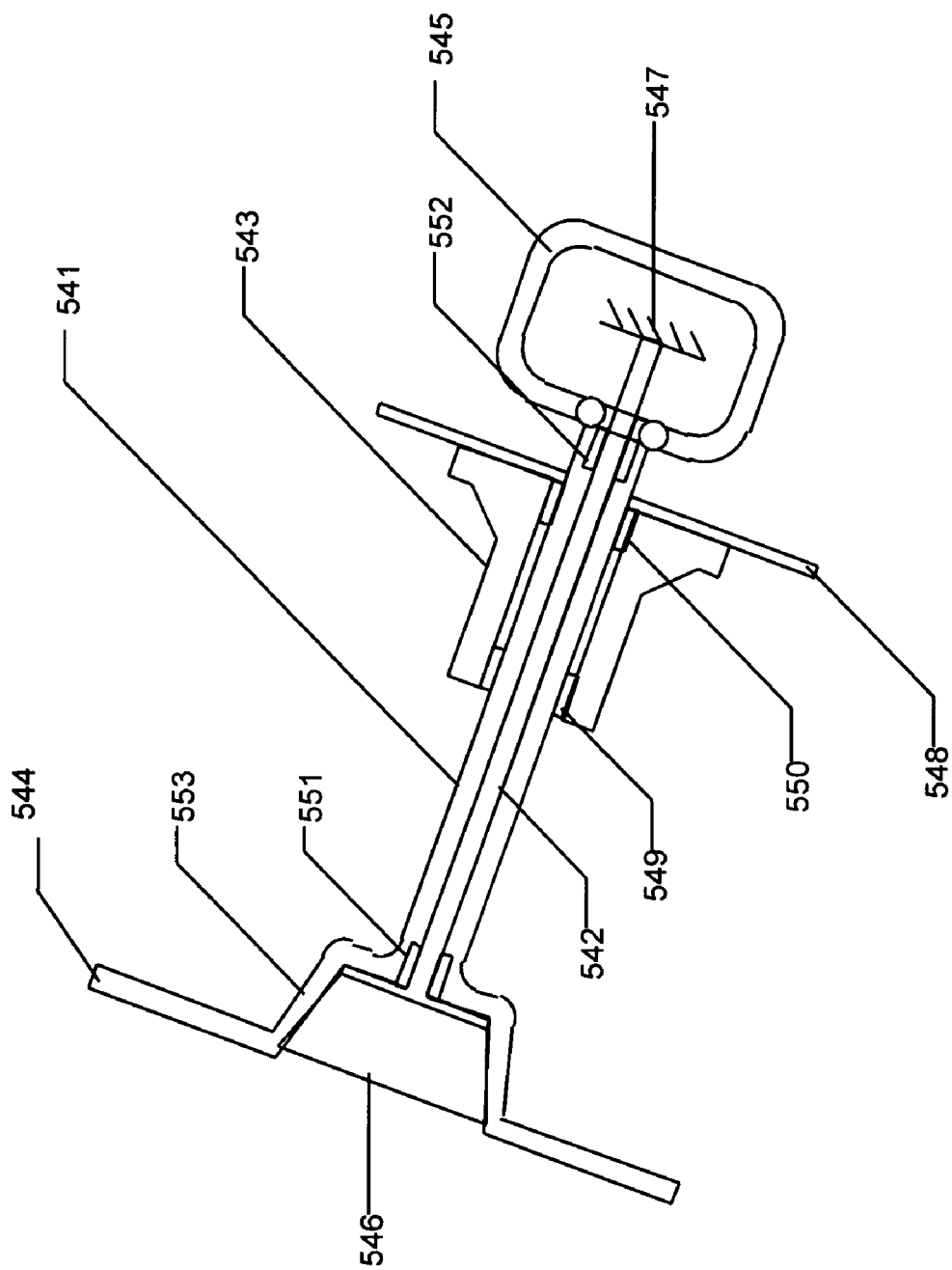
FIG. 40 shows a driver side airbag module supported by a steering column, but not attached to the steering wheel.

A design with an airbag and an inflator on the steering column is illustrated in FIG. 40. The steering column comprises an outer shaft 541, an inner shaft 542, and a supporting bracket 543. Outer shaft 541 can be coupled with the steering wheel 544 at one end region and extended to the engine compartment at the other end region to drive the steering mechanism 545 which causes turning of the tire(s) of the vehicle. The inner shaft 542 can be coupled with the inflator and airbag module 546 at one end region while the other end region can be attached to a stationary part 547 of the vehicle chassis in the engine compartment, for example. The supporting bracket 543 can be fixed to the firewall 548 for support. Bearings 549 and 550 can be placed between the bracket 543 and the outer shaft 541 to rotatably support the outer shaft 541 on the bracket 543, and as shown in FIG. 40 are in contact with the outer shaft 541, and bearings 551 and 552 can be placed between the outer shaft 541 and the inner shaft 542 and can be used for rotatably supporting the outer shaft 541 on the inner shaft 542. The outer and inner shafts 541, 542 may be tubular and concentric to one another.

Inner shaft 542 is stationary, not rotating with the steering wheel 544, therefore the airbag in airbag module 546 can be designed in an arbitrary shape and orientation. For example, a large airbag can be designed to provide the optimal protection of the driver. A less rigid steering wheel or column can also reduce the force exerted on the driver and allow the airbag to align with the driver. For example, a curved portion 553 of the steering wheel 544 can be designed to be flexible or to move away when the force on the rim of the steering wheel 544 exceeds a certain level. This force can be measured by appropriate measurement devices or sensors and a processor used to determine when the curved portion 553 of the steering wheel 544 should be moved away.

Steering wheel 544 has a central cavity in which the inflator and airbag module 546 is situated. This central cavity may be centered about a rotation axis of the steering wheel 544.

Although module 546 is referred to as an inflator and airbag module, it is conceivable that only the airbag is arranged in the steering wheel 544, i.e., in the cavity defined thereby, while the inflator portion is arranged at another location and the inflation gas is directed into the airbag, e.g., the inflator is arranged on the dashboard and inflating gas directed into the airbag via a passage in the inner shaft 542.

Figure 41:
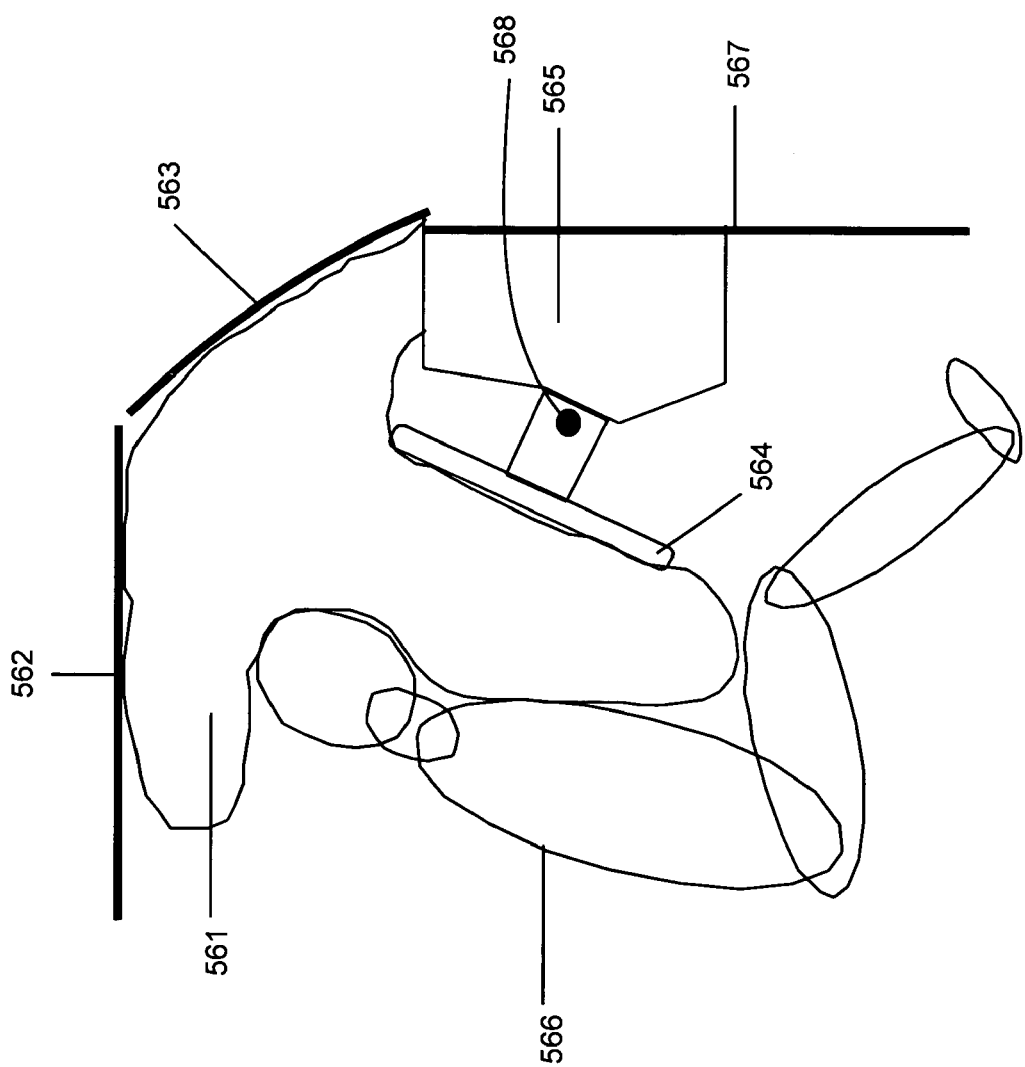
FIG. 41 illustrates an inflated driver side airbag installed on the dashboard of a vehicle.

A driver side restraint system, which is installed on or in the dashboard 565 of a vehicle is depicted in FIG. 41. As shown in the drawing, the inflated airbag 561 fills the space between the ceiling of the passenger compartment 562, the windshield 563, the steering wheel 564, the dashboard 565, and the driver 566. The airbag 561 is of such a geometry that the driver 566 is surrounded by air cushion after the airbag 561 is fully inflated. An additional improvement can be provided if the steering wheel 564 and column strokes and sinks toward the dashboard 565 increasing the space between the driver 566 and the steering wheel 564. The stroking movement of the steering wheel 564 and column can be initiated by the restraint system crash sensor. One approach is to use a mechanism where pins 568 lock the column and the steering wheel 564. As soon as the sensor triggers to initiate the airbag 561, the pins can be released and the steering wheel 564 and the column can then move towards the firewall 567. Other mechanisms for enabling movement of the steering wheel 564, i.e., the steering column to sink toward the dashboard 565, can be used in the invention.

Figure 42:
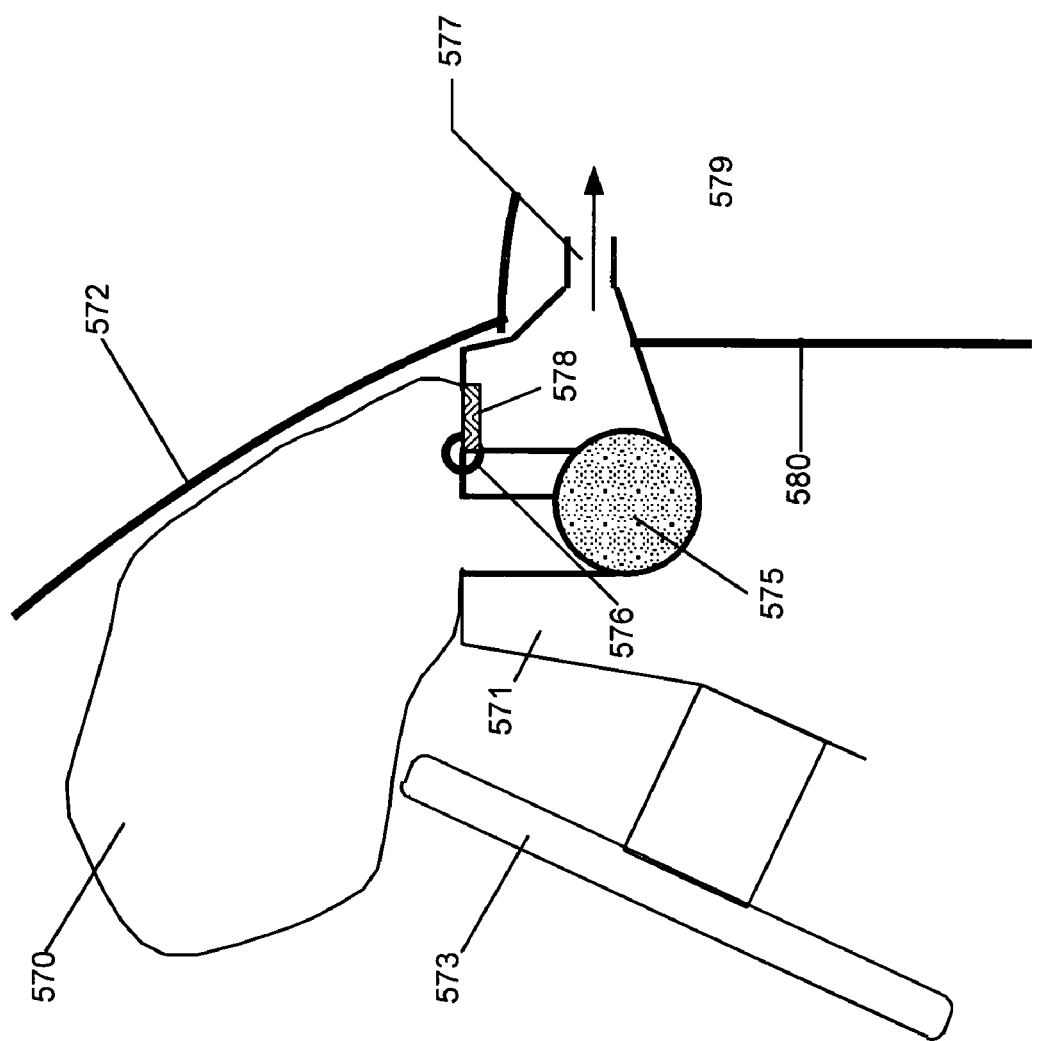
FIG. 42 shows an airbag system installed on the dashboard of a vehicle with a vent hole to the engine compartment.

An airbag 570 installed on the dashboard 571 of a vehicle is illustrated in FIG. 42. The airbag 570 is partially deployed between the windshield 572 and the steering wheel 573 and the dashboard 571. The inflator 575 provides gas to unfold and inflate the airbag 570. A torsional spring 576, or other mechanism, can be used to control the opening of a valve 577, which controls the flow of gas out of vent hole 578 of the airbag 570. When the pressure inside the airbag 570 is lower than a desired pressure, the valve 577 can close retaining the gas within the airbag 570. When the pressure inside the airbag 570 exceeds a design level, the valve 577 opens and releases gas from the airbag 570 into the engine compartment 579, which is separated from the passenger compartment by firewall 580. Although only a single vent hole 578 and associated valve 577 are shown, multiple vent holes and/or valves can be provided.

Figure 43A:
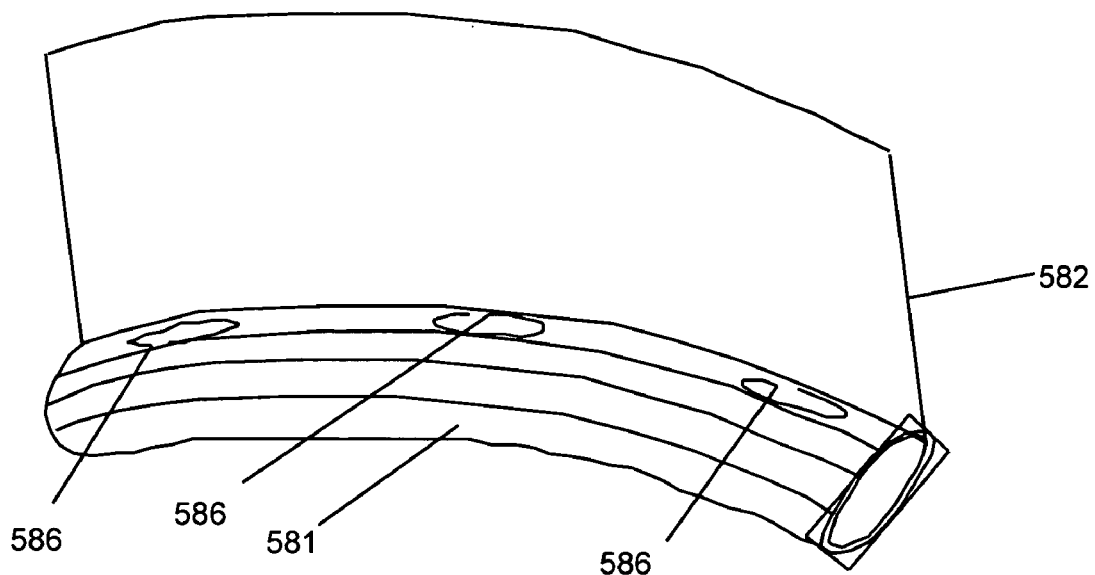
FIGS. 43A and 43B show a tubular inflatable system mounted on the dashboard of a vehicle.
Figure 43B:
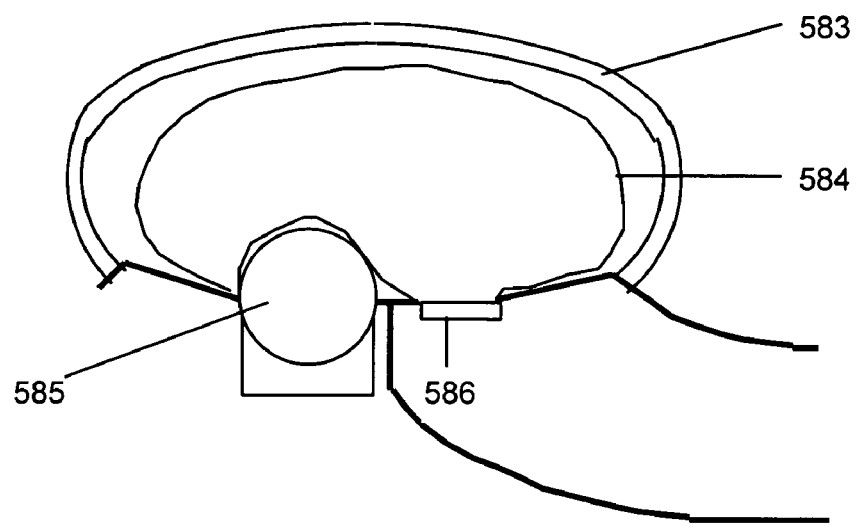

A distributed inflator and airbag module 581 along the dashboard of a vehicle below the windshield 582 is illustrated in FIG. 43A. FIG. 43B illustrates a side view of the inflator and airbag module 581, which shows the module cover 583, the folded airbag 584, the inflator 585 and the vent hole 586 covering an opening in the airbag 584. The long tubular inflator 585, which has multiple ports along the module 581, can evenly and quickly generate gas to inflate the airbag 584. Multiple vent holes 586 are shown in FIG. 43A, located near the bottom of the windshield 582. These vent holes 586, since they cover openings in the airbag 584, can direct, or allow the flow of, the exhaust gases from the airbag 584 into the engine compartment. More specifically, vent holes 586 can be used regulate the gas flow from the airbag 584 to the engine compartment so that the inflated airbag 584 can be matched to the occupant and the severity of the crash.

Airbag 584 may be attached to the dashboard so that the periphery of the opening in the airbag 584 associated with each vent hole 586 is aligned with the vent hole 586.

Drive-by-wire is being considered for automobiles. Such a system will permit a significant reduction in the mass and cost of the steering wheel and steering column assembly. However, if the airbag is still deployed from the steering wheel, the strength and thus weight of the airbag will have to be largely maintained. Thus, a preferable arrangement is to cause the steering wheel and column to move out of the way and have the airbag for the driver deploy from the dashboard or the ceiling as discussed elsewhere herein. Such an airbag can be multi-chambered so as to better capture and hold the driver in position during the crash.

3. Passenger Side Airbag

Figure 5:
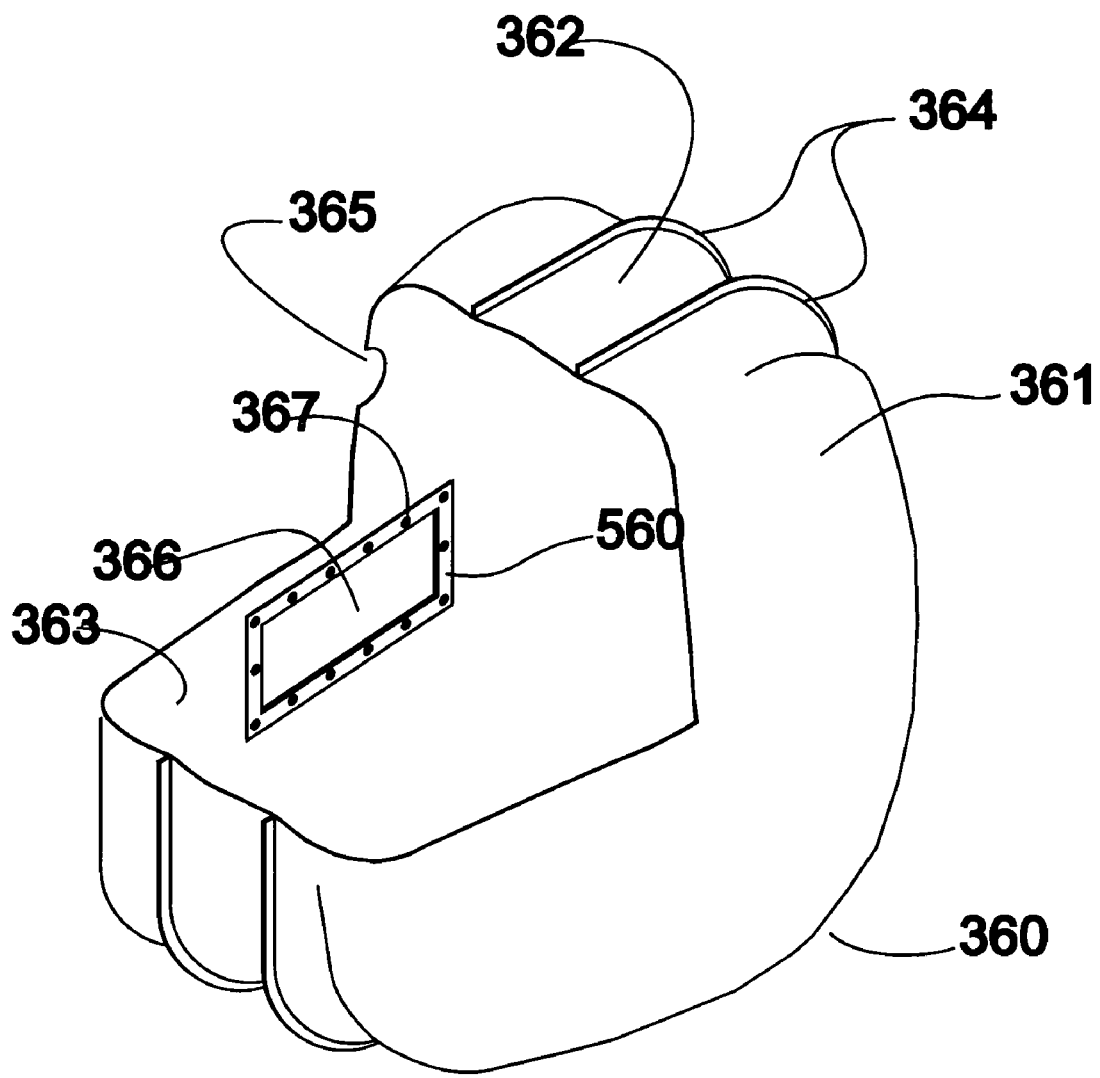
FIG. 5 is a partial cutaway perspective view of a passenger side airbag made from plastic film.

The discussion above has been limited for the most part to the driver side airbag which is attached to the vehicle steering wheel or otherwise arranged in connection therewith. This technology is also applicable to a passenger side airbag, which is generally attached to the instrument panel, as illustrated in FIG. 5 which is a partial cutaway perspective view of a passenger side airbag 360 made from three pieces or sheets of flat film 361, 362 and 363 which have joined seams 364 between adjacent pieces of film 361, 362, 363. The passenger side airbag, as well as rear seat airbags and side impact airbags, generally have a different shape than the driver side airbag but the same inventive aspects described above with respect to the driver side airbag could also be used in connection with passenger side airbags, rear seat airbags and side impact airbags. Although illustrated as being constructed from a plurality of sheets of plastic film, the passenger side airbag 360 can also be made by blow molding or other similar molding process, i.e., as one unitary sheet. Also, for many vehicles, the film sheet 362 is unnecessary and will not be used thereby permitting the airbag to once again be manufactured from only two flat sheets. The inflator attachment hole 366 is now typically rectangular in shape and can be reinforced by a rectangular reinforcement plastic ring 368 having inflator-mounting holes 367. A vent hole 365 can also be provided to vent gases from the deploying airbag 360. The vent hole 365 might be a variable-sized or adjustable vent hole to achieve the benefits of such as known to those skilled in the art.

Another class of airbags that should be mentioned are side impact airbags that deploy from the vehicle seat or door. These also can be made from plastic film according to the teachings of this invention.

4. Inflatable Knee Bolster

Figure 6:
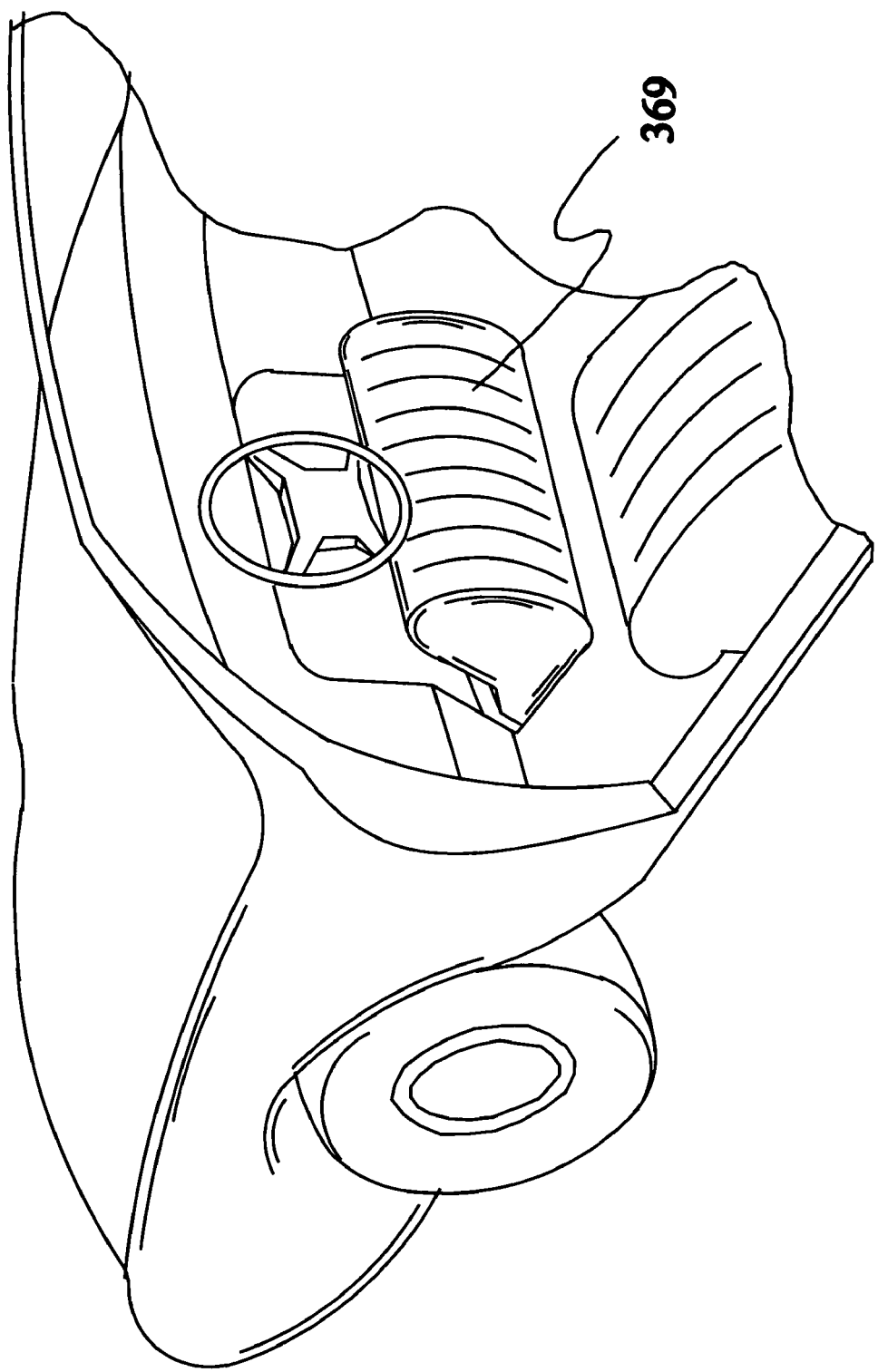
FIG. 6 is a perspective view with portions cut away of a vehicle showing the knee bolster airbag in an inflated condition mounted to provide protection for a driver.

In FIG. 6, a knee protection airbag for the front driver is shown generally at 369 (and is also referred to as a knee bolster herein). Since the knee airbag 369 fills the entire space between the knees and the instrument panel and since the instrument panel is now located at a substantial distance from the occupant's knees, there is substantially more deflection or stroke provided for absorbing the energy of the occupant. Submarining is still prevented by inflating the knee airbag 369 to a higher pressure, typically in excess of 1 bar and sometimes in excess of 2 bars gage, and applying the force to the occupant knees before he or she has moved significantly. Since the distance of deployment of the knee airbag 369 can be designed large enough to be limited only by the interaction with an occupant or some other object, the knee airbag 369 can be designed so that it will inflate until it fills the void below the upper airbag, not illustrated in this figure. The knee protection airbag 369 can take the form of a fabric or any of the composite airbags disclosed above, e.g., include a plastic film layer and an overlying net, or two or more plastic film layers, usually at least one is inelastic to provide the shape of the knee bolster and at least one is elastic to control the propagation of a tear. The knee bolster airbag can also be deployed using as aspirated inflator or other method permitting the airbag to be self limiting or self adjusting so as to fill the space between the knees of the occupant and the vehicle structure.

In FIG. 6, the width of the cells is typically less than the width of the knee of an occupant. In this manner, the capturing of the knees of the occupant to prevent them from sliding off of the knee airbag 369 is enhanced.

In the preferred designs presented here and below, the knee airbag 369 is deployed as a cellular airbag with the cells, frequently in the form of tubes, interconnected during inflation and, in most cases, individual valves in each chamber close to limit the flow of gas out of the chamber during the accident. In this manner, the occupant is held in position and prevented from submarining. A composite film is one preferred material, however, fabric can also be used with some increased injury risk. The cellular or tubular airbags designs described herein are also sometimes referred to as compartmentalized airbags.

Figure 23:
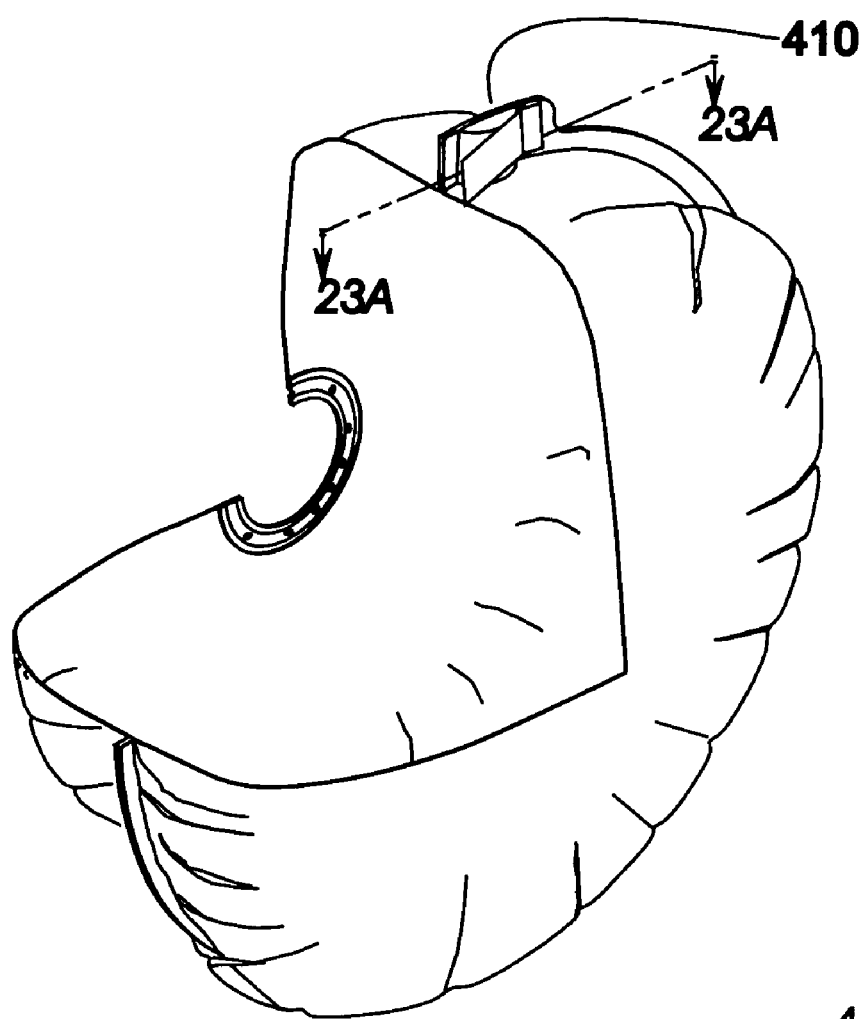
FIG. 23 is a partial cutaway perspective view of a driver side airbag made from plastic film having a variable vent in the seam of the airbag.
Figure 23A:
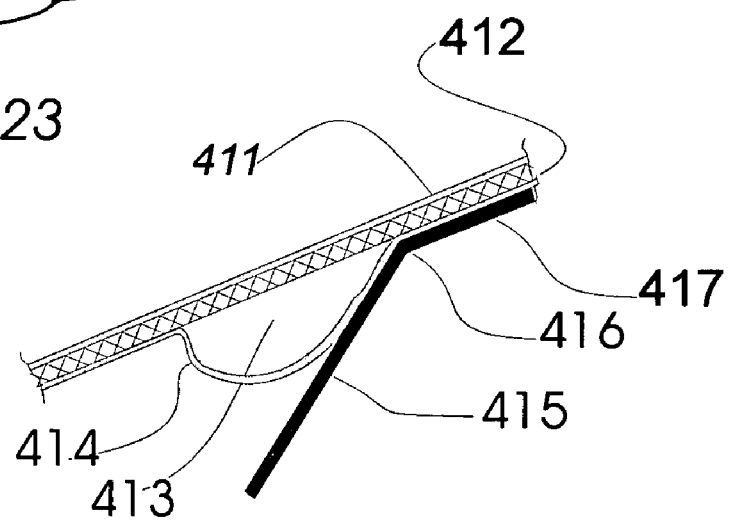
FIG. 23A is an enlargement of the variable vent of FIG. 23 taken along line 23A-23A of FIG. 23.

Normally, the knee bolster airbag will not have vents. It will be deployed to its design pressure and remain deployed for the duration of the accident. For some applications, a vent hole will be used to limit the peak force on the knees of the occupant. As an alternate to providing a fixed vent hole as illustrated in the previous examples, a variable vent hole can be provided as shown in FIGS. 23 and 23A (discussed below). Alternately, this variable vent function can be incorporated within the inflator as described in U.S. Pat. No. 5,772,238.

Typically, inflatable knee bolster installations comprise an inflatable airbag sandwiched between a rigid or semi rigid load distributing impact surface and a reaction surface. When the inflator is triggered, the airbag expands to move the impact surface a predetermined distance to active position. This position may be determined by tethers between the reaction and impact surfaces. These installations comprise numerous parts, bits and pieces and require careful installation. In contrast, in a preferred knee bolster described herein, there is no rigid load distributing surface but rather, the knee bolster conforms to the shape of the knees of the occupant. Tethers in general are not required or used as the shaping properties of inelastic films are utilized to achieve the desired airbag shape. Finally, the preferred designs herein are not composed of numerous parts and in general do not require careful installation. One significant problem with the use of load distribution plates as is commonly done in the art is that no provision is made to capture the knees and thus, especially if the crash is an angular impact or if the occupant is sitting on an angle with respect to the knee bolster or has his or her legs crossed, there is a tendency for the knees to slip sideways off of the knee bolster defeating the purpose of the system. In the multi-cellular knee bolster disclosed herein, the cells expand until they envelop the occupant's knees, capturing them and preventing them from moving sideways. Once each cell is filled to a design pressure, a one-way valve closes and flow out of the cell is prevented for the duration of the crash. This design is especially effective when used with an anticipatory sensor as the knees can be captured prior to movement relative to the passenger compartment caused by the crash. A signal from the anticipatory sensor would initiate an inflator to inflate the knee bolster prior to or simultaneous with the crash.

An improvement to this design, not illustrated, is to surround the airbags with a net or other envelope that can slide on the surface of the airbag cells until they are completely inflated. Then, when the occupant begins loading the airbag cells during the crash, displacement of the knees not only compresses the cells that are directly in line with the knees but also the adjacent cells thus providing a significant increase to the available effective piston area to support the knees in much the same way that a load distribution plate functions. Such a net or envelope effectively distributes the load over a number of cells thus limiting the required initial pressure within the airbag cells. Other methods of accomplishing this load distribution include the addition of somewhat flexible stiffeners into the surface of the airbag where it contacts the knees again with the goal of causing a load on one cell to be partially transferred to the adjacent cells.

In the preferred design, as discussed below, the cellular airbags inflate so as to engulf the occupant by substantially filling up all of the space between the occupant and the walls of the passenger compartment freezing the occupant in his or her pre-crash position and preventing the occupant from ever obtaining a significant velocity relative to the passenger compartment. This will limit the acceleration on the occupant to below about 15–20 Gs for a severe 30 MPH barrier crash. This retains the femur loads well below the requirements of FMVSS-208 and can essentially eliminate all significant injury to the occupant in such a crash. This, of course, assumes that the vehicle passenger compartment is effectively designed to minimize intrusion, for example.

In most of the preferred designs disclosed herein, the surface that impacts the occupant is a soft plastic film and inflicts little if any injury upon impact with the occupant. Even the fabric versions when used as a knee bolster, for example, can be considered a soft surface compared with the load distribution plates or members that impact the knees of the occupant in conventional inflatable knee bolster designs. This soft impact is further enhanced when an anticipatory sensor is used and the airbags are deployed prior to the accident as the deployment velocity can be substantially reduced.

In a conventional airbag module, when the inflator is initiated, gas pressure begins to rise in the airbag which begins to press on the deployment door. When sufficient force is present, the door breaks open along certain well-defined weakened seams permitting the airbag to emerge from its compartment. The pressure in the airbag when the door opens, about 10 to 20 psi, is appropriate for propelling the airbag outward toward the occupant, the velocity of which is limited by the mass of the airbag. In the case of a film airbag, this mass is substantially less, perhaps by as much as a factor of three or more, causing it to deploy at a much higher velocity if subjected to these high pressures. This will place unnecessary stresses in the material and the rapid movement of the airbag past the deployment door could induce abrasion and tearing of the film by the deployment door. A film airbag, therefore, must be initially deployed at a substantially lower pressure. However, conventional deployment doors require a higher pressure to open. This problem is discussed in detail in the above-referenced patents and patent applications where, in one implementation, a pyrotechnic system is used to cut open the door according to the teachings of Barnes et al. (U.S. Pat. No. 5,390,950).

There are of course many ways of making inflatable knee restraints using chambered airbags, such a illustrated in U.S. Pat. No. 6,685,217, without deviating from the teachings of this invention.

5. Ceiling-Deployed Airbags

The airbags disclosed herein and in the assignee's prior patents are believed to be the first examples of multi-chambered airbags that are deployed from the ceiling and the first examples of the use of tubular or cellular airbags. These designs should become more widely used as protection is sought for other situations such as preventing occupants from impacting with each other and when developments in drive-by-wire are implemented. In the former case, airbags will be interposed between seating positions and in the latter case, steering wheel assemblies will become weaker and unable to support the loads imposed by airbags. In some cases, in additional to support from the ceiling, these airbags will sometimes be attached to other surfaces in the vehicle such as the A, B and C pillars in much the way that some curtain airbags now receive such support.

Figure 7:
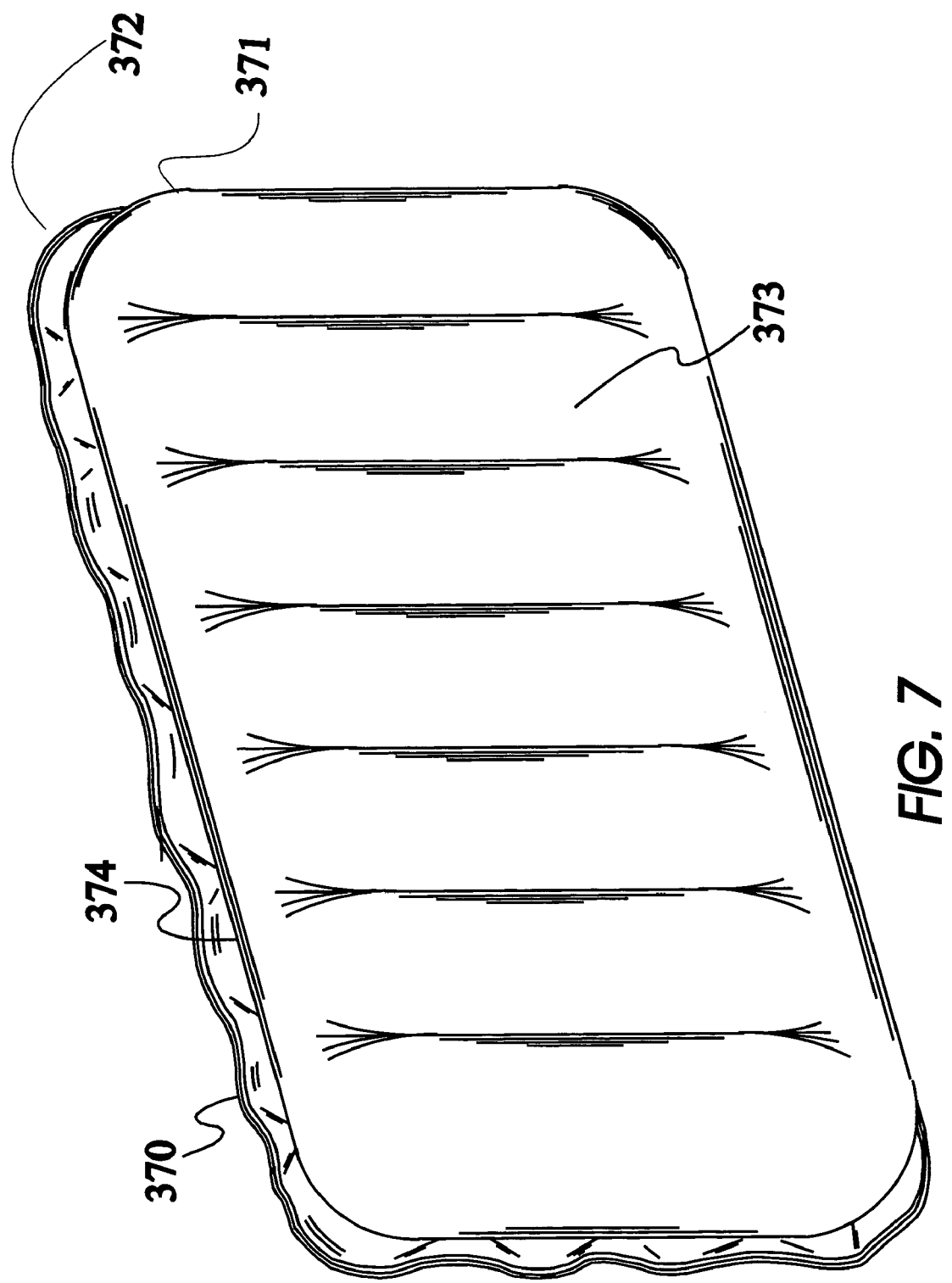
FIG. 7 is a perspective view of an airbag and inflator system where the airbag is formed from tubes.

One method of forming a film airbag is illustrated generally at 370 in FIG. 7. In this implementation, the airbag is formed from two flat sheets or layers of film material 371, 372 which have been sealed, e.g., by heat or adhesive, at joints 374 to form long tubular shaped mini-airbags 373 (also referred to herein as compartments or cells) in much the same way that an air mattress is formed. In FIG. 7, a single layer of mini-airbags 373 is shown. It should be understood that the mini-airbags 373 are interconnected to one another to allow the inflating gas to pass through all of the interior volume of the airbag 370. Also, the joints 374 are formed by joining together selected, opposed parts of the sheets of film material 371, 372 along parallel lines whereby the mini-airbags 373 are thus substantially straight and adjacent one another. In other implementations, two or more layers could be used. Also, although a tubular pattern has been illustrated, other patterns are also possible such as concentric circles, waffle- shaped or one made from rectangles, or one made from a combination of these geometries or others. The film airbag 370 may be used as either a side airbag extending substantially along the entire side of the vehicle, an airbag disposed down the center of the vehicle between the right and left seating positions or as a rear seat airbag extending from one side of the vehicle to the other behind the front seat (see FIG. 8) and may or may not include any of the venting arrangements described herein.

Figure 8:
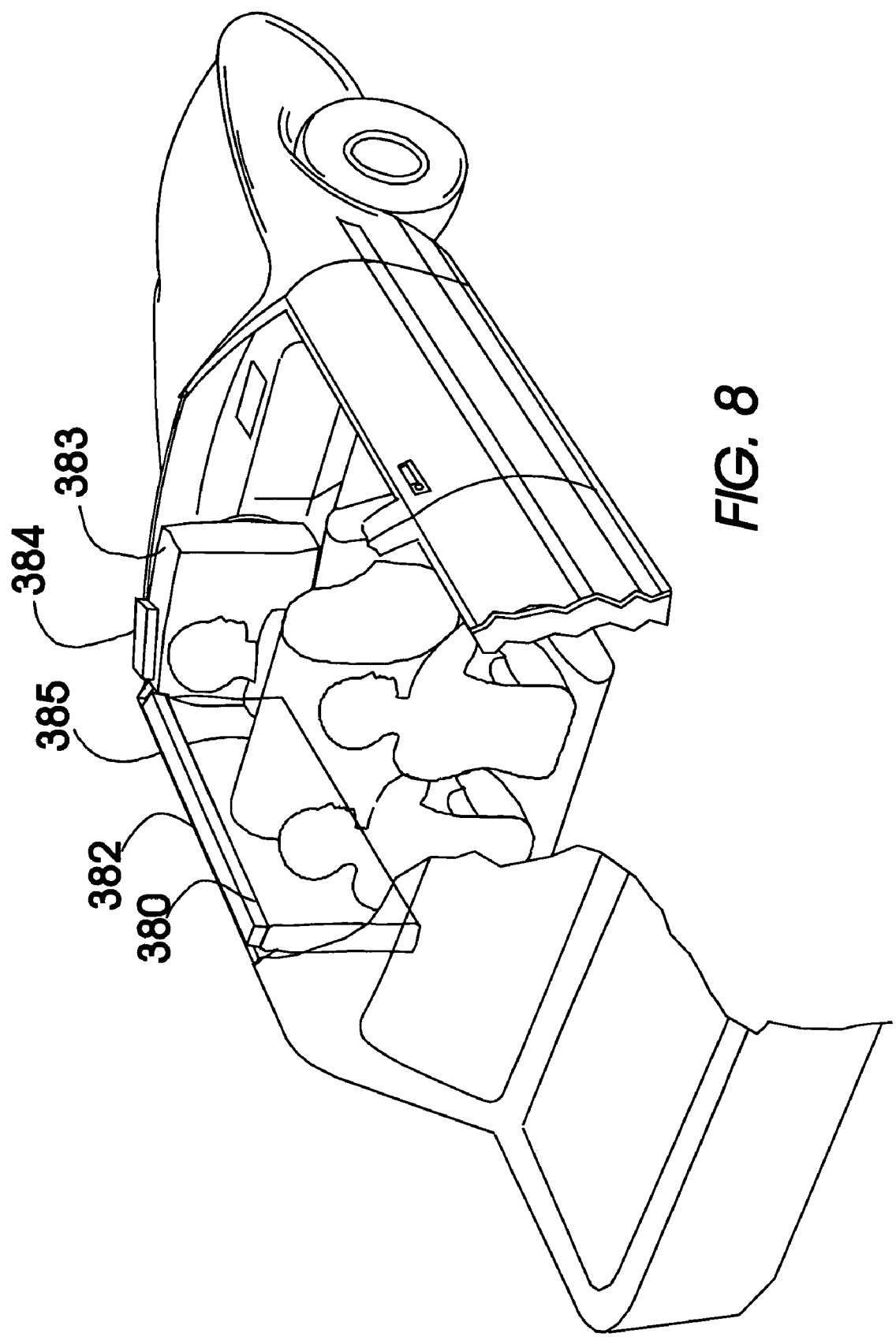
FIG. 8 is a perspective view with portions removed of a vehicle having several deployed film airbags.

FIG. 8 is a perspective view with portions removed of a vehicle having several deployed film airbags. Specifically, a single film airbag having several interconnected sections, not shown, spans the left side of the vehicle and is deployed downward before being filled so that it fits between the front seat and the vehicle side upon inflation (an airbag spanning the right side of the vehicle can of course be provided). This provides substantial support for the airbag and helps prevent the occupant from being ejected from the vehicle even when the side window glass has broken. A system which also purports to prevent ejection is described in Bark (U.S. Pat. No. 5,322,322 and U.S. Pat. No. 5,480,181). The Bark system uses a small diameter tubular airbag stretching diagonally across the door window. Such a device lacks the energy absorbing advantages of a vented airbag however vents are usually not desired for rollover protecting airbags. In fact, the device can act as a spring and can cause the head of the occupant to rebound and actually experience a higher velocity change than that of the vehicle. This can cause severe neck injury in high velocity crashes. The airbag of Bark '322 also is designed to protect primarily the head of the occupant, offering little protection for the other body parts. In contrast to the completely sealed airbag of Bark, a film airbag of the present invention can have energy absorbing vents and thus dampens the motion of the occupant's head and other body parts upon impact with the film airbag. Note that the desirability of vents typically goes away when anticipatory sensors are used as discussed elsewhere herein.

The airbag of Bark '322 covers the entire vehicle opening and receives support from the vehicle structure, e.g., it extends from one side of the B-pillar to the other so that the B-pillar supports the airbag 380. In contrast to the tube of Bark, the support for a preferred embodiment of the invention disclosed herein in some cases may not require complicated mounting apparatus going around the vehicle door and down the A-pillar but is only mounted to or in the ceiling above the side door(s). Also, by giving support to the entire body and adjusting the pressure between the body parts, the airbag of the present invention minimizes the force on the neck of the occupant and thus minimizes neck injuries.

5.1 Side Curtain Airbag

In FIG. 8, a single side protection airbag for the driver side is illustrated at 380. A single front airbag spans the front seat for protection in frontal impacts and is illustrated at 383 with the ceiling mounted inflator at 384. A single airbag is also used for protection of each of the rear seat occupants in frontal impacts and is illustrated at 385. With respect to the positioning of the side airbag 380, the airbag 380 is contained within a housing 382 which can be position entirely above the window of the side doors, i.e., no portion of it extends down the A-pillar or the B-pillar of the vehicle (as in Bark). The side airbag housing 382 thus includes a mounting structure (not shown) for mounting it above the window to the ceiling of the vehicle and such that it extends across both side doors (when present in a four-door vehicle) and thus protects the occupants sitting on that side of the vehicle from impacting against the windows in the side doors. To ensure adequate protection for the occupants from side impacts, as well as frontal impacts and roll-overs which would result in sideward movement of the occupants against the side doors, the airbag housing 382 is constructed so that the airbag 380 is initially projected in a downward direction from the ceiling prior to inflation and extends at least substantially along the entire side of the ceiling. This initial projection may be designed as a property of the module 382 which houses the airbag 380, e.g., by appropriate construction and design of the module and its components such as the dimensioning the module's deployment door and deployment mechanism.

Although a variety of airbag designs can be used as the side impact protection airbag, one preferred implementation is when the airbag includes first and second attached non-perforated sheets of film and a tear propagation arresting mechanism arranged in connection with each of the film sheets for arresting the propagation of a tear therein. A net may also be used as described above. The net would constrict or tension the airbag if it were to be designed to retain an interior volume less than the volume of the airbag (as discussed above).

The airbag can include a venting device (e.g., a venting aperture as shown in FIGS. 3A and 3B) arranged in connection with the airbag for venting the airbag after inflation thereof. In certain embodiments, the airbag is arranged to extend at least along a front portion of the ceiling such that the airbag upon inflation is interposed between a passenger in the front seat of the vehicle and the dashboard (this aspect being discussed below with respect to FIG. 12).

Figure 9:
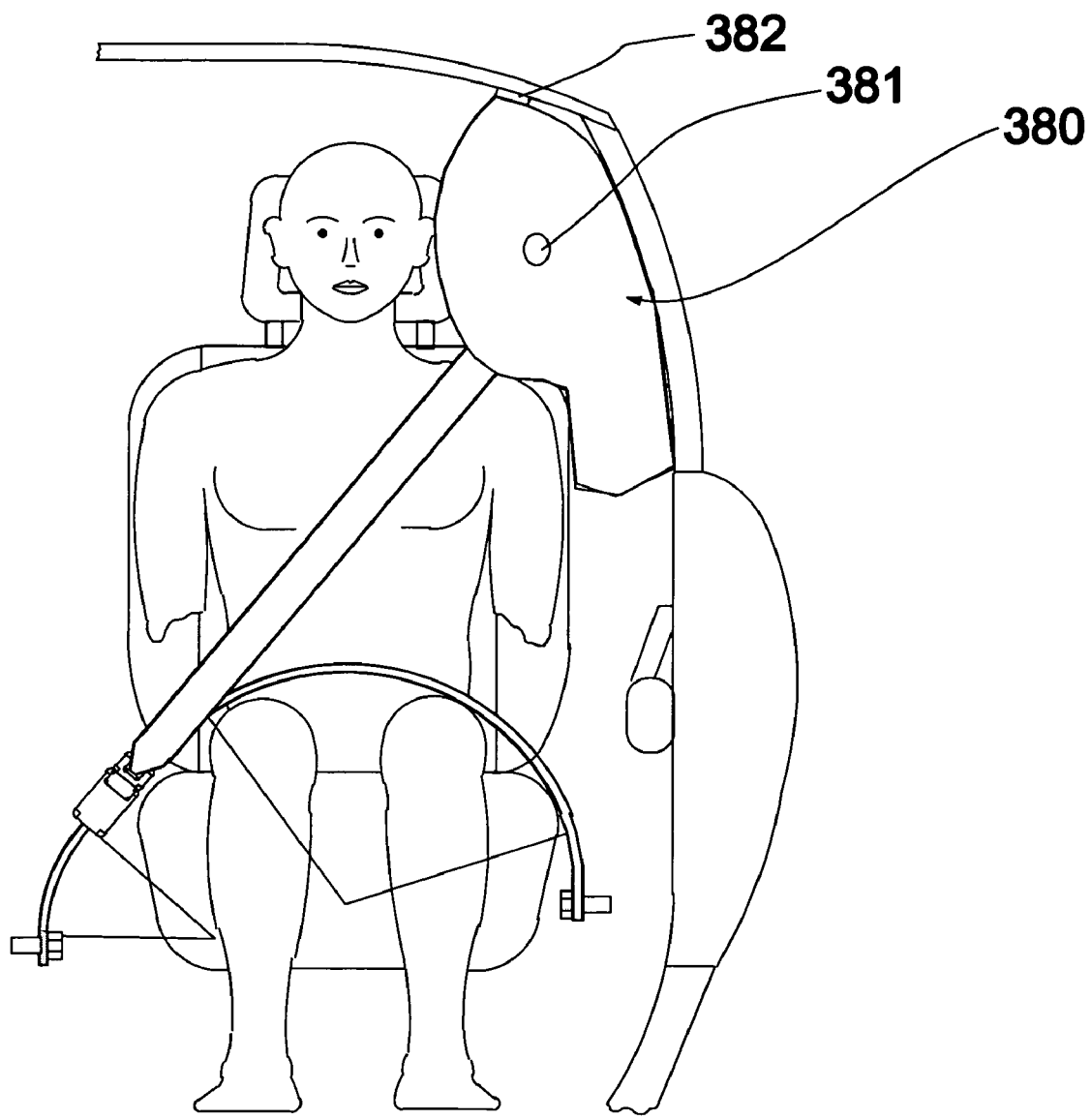
FIG. 9 is a view of another preferred embodiment of the invention shown mounted in a manner to provide protection for a front and a rear seat occupant in side impact collisions and to provide protection against impacts to the roof support pillars in angular frontal impacts.

FIG. 9 is a view looking toward the rear of the vehicle of the deployed side protection airbag of FIG. 8 wherein like numbers represent the same parts in both drawings. An airbag vent is illustrated as a fixed opening 381. Naturally, other venting designs are possible including venting through the airbag inflator as disclosed in the above- referenced patents and patent applications as well as the variable vent described below with reference to FIGS. 23 and 23A or even no vent for rollover protection.

It can be seen that the upper edge of the airbag is connected to an inflator 382 and that the airbag 380 covers the height of the window in the door in this implementation.

Figure 9A:
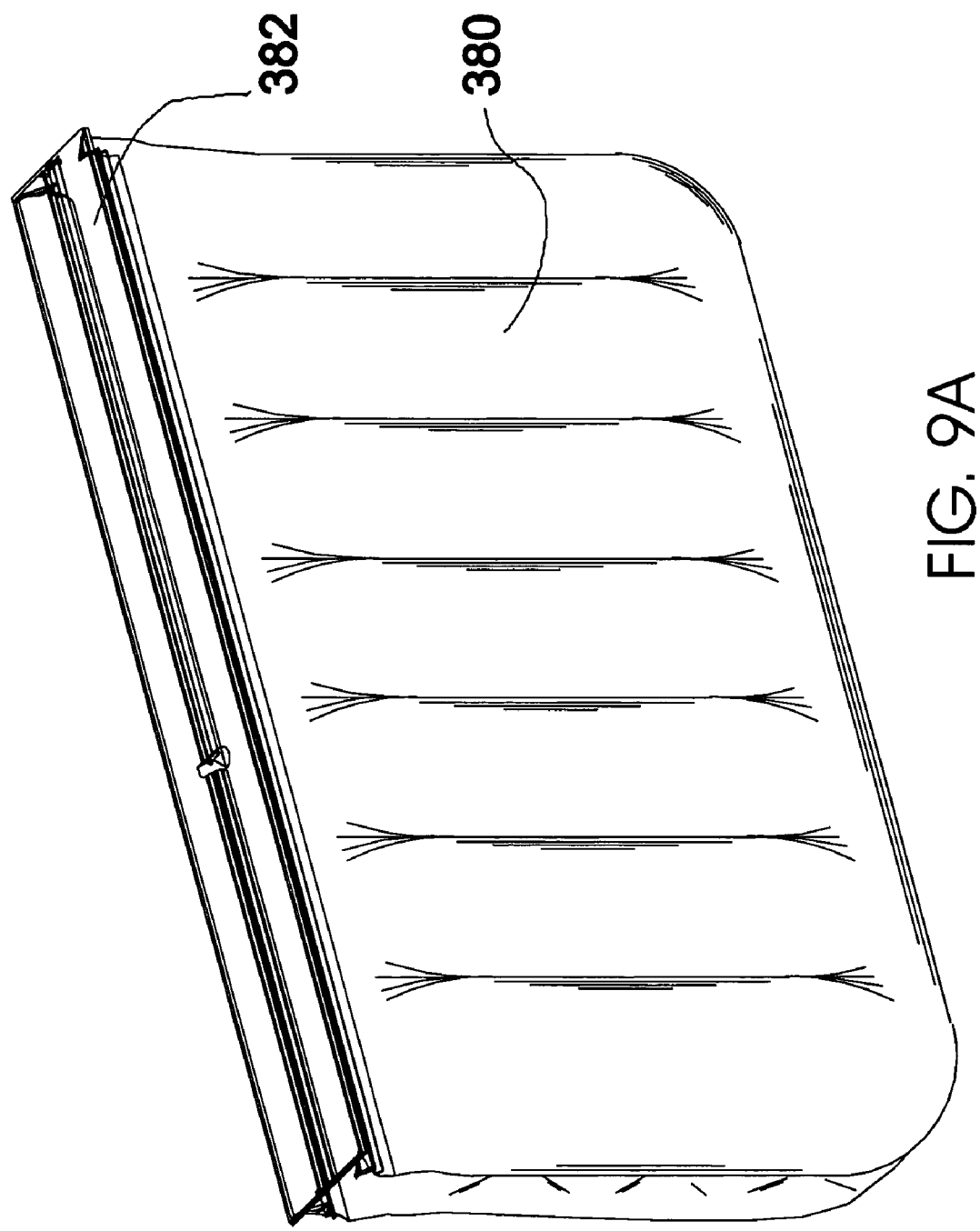
FIG. 9A is a view of the side airbag of FIG. 9 of the side airbag with the airbag removed from the vehicle.

FIG. 9A is a view of a side airbag similar to the one of FIG. 9 although with a different preferred shape, with the airbag 380 removed from the vehicle wherein like numbers represent like parts. The parallel compartments or cells can be seen. This aspect is discussed below with reference to FIGS. 17–19.

5.1 Frontal Curtain Airbag

FIGS. 10, 11 and 11A–11D illustrate the teachings of this invention applied in a manner similar to the airbag system of Ohm in U.S. Pat. No. 5,322,326. The airbag of Ohm is a small limited protection system designed for the aftermarket. It uses a small compressed gas inflator and an unvented thin airbag which prevents the occupant from contacting with the steering wheel but acts as a spring causing the occupants head to rebound from the airbag with a high velocity. The system of FIG. 10 improves the performance of and greatly simplifies the Ohm design by incorporating the sensor and compressed gas inflator into the same mounting assembly which contains the airbag. The system is illustrated generally at 390 in FIG. 10 where the mounting of the system in the vehicle is similar to that of Ohm.

In FIG. 11, the module assembly is illustrated from a view looking toward the rear of the airbag module of FIG. 10 with the vehicle removed, taken at 11—11 of FIG. 10. The module 390 incorporates a mounting plate 391, a high pressure small diameter tube constituting an inflator 393 and containing endcaps 394 which are illustrated here as having a partial spherical surface but may also be made from flat circular plates. The mounting plate 391 is attached to the vehicle using screws, not illustrated, through mounting holes 395. An arming pin 389 is illustrated and is used as described below.

Figure 11A:
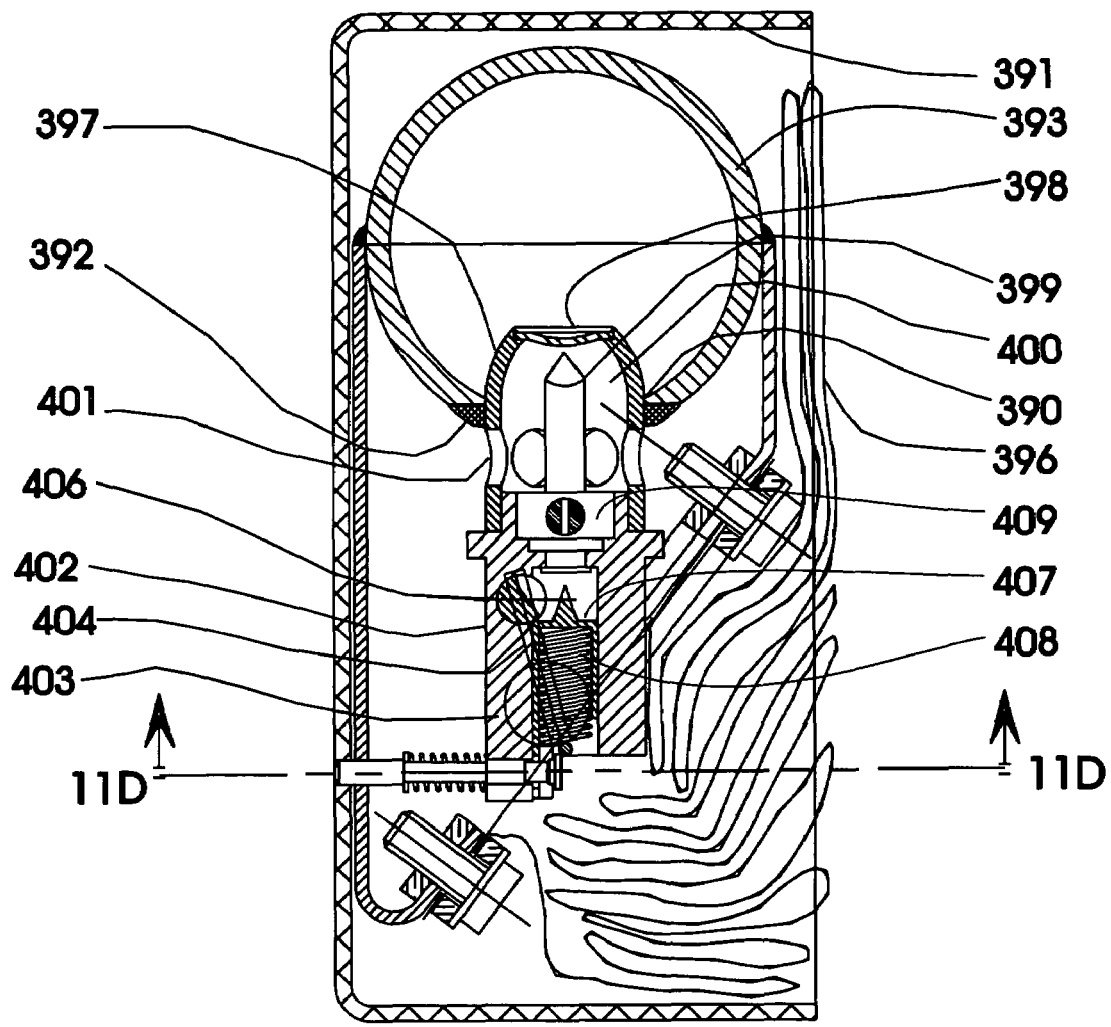
FIG. 11A is a cross sectional view of the airbag module of FIG. 11 taken at 11A—11A.

FIG. 11A is a cross section view of the airbag module of FIG. 11 taken at 11A-11A and illustrates the inflator initiation system of this invention. The inflator 393 is illustrated as a cylindrical tube, although other cross section shapes can be used, which contains a hole 390 therein into which is welded by weld 392 to an initiation assembly 397. This assembly 397 has a rupture disk 398 welded into one end which will now be described in more detail. A rupture pin 399 is positioned adjacent rupture disk 398 which will be propelled to impact the rupture disk 398 in the event of an accident as described below. When disk 398 is impacted by pin 399, it fails thereby opening essentially all of the orifice covered by disk 398 permitting the high pressure gas which is in a tube of the inflator 393 to flow out of the tube 393 into cavity 400 of initiator assembly 397 and then through holes 401 into cavity 402. Cavity 402 is sealed by the airbag 396 which now deploys due to the pressure from the gas in cavity 402.

When the vehicle experiences a crash of sufficient severity to require deployment of the airbag 396, sensing mass 403, shown in phantom, begins moving to the left in the drawing toward the front of the vehicle. Sensing mass 403 is attached to shaft 404 which in turn is attached to D-shaft 405 (see FIG. 11C). As mass 403 moves toward the front of the vehicle, D-shaft 405 is caused to rotate. Firing pin 407 is held and prevented from moving by edge 406 of D-shaft 405. However, when D-shaft 405 rotates sufficiently, edge 406 rotates out of the path of firing pin 407 which is then propelled by spring 408 causing the firing pin point to impact with primer 409 causing primer 409 to produce high pressure gas which propels pin 399 to impact disk 398 releasing the gas from inflator tube 393 inflating the airbag 396 as described above. The sensor 403,404, D-shaft 405 and primer mechanism 407, 408, 409 is similar to mechanisms described in U.S. Pat. No. 5,842,716 which is included herein by reference and therefore will not be described in more detail here.

Figure 11B:
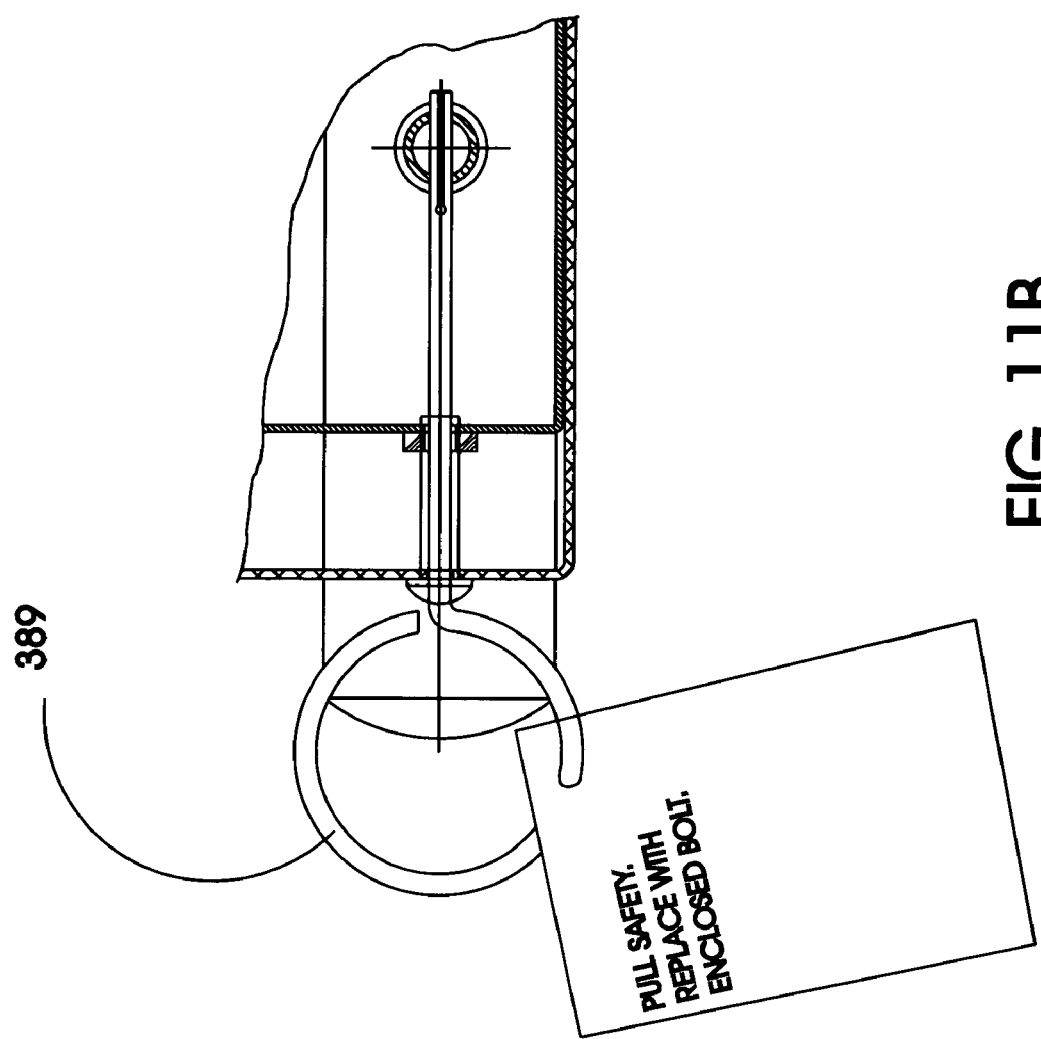
FIG. 11B is a cross sectional view, with portions cutaway and removed, of the airbag module of FIG. 11 taken at 11B—11B.
Figure 11C:
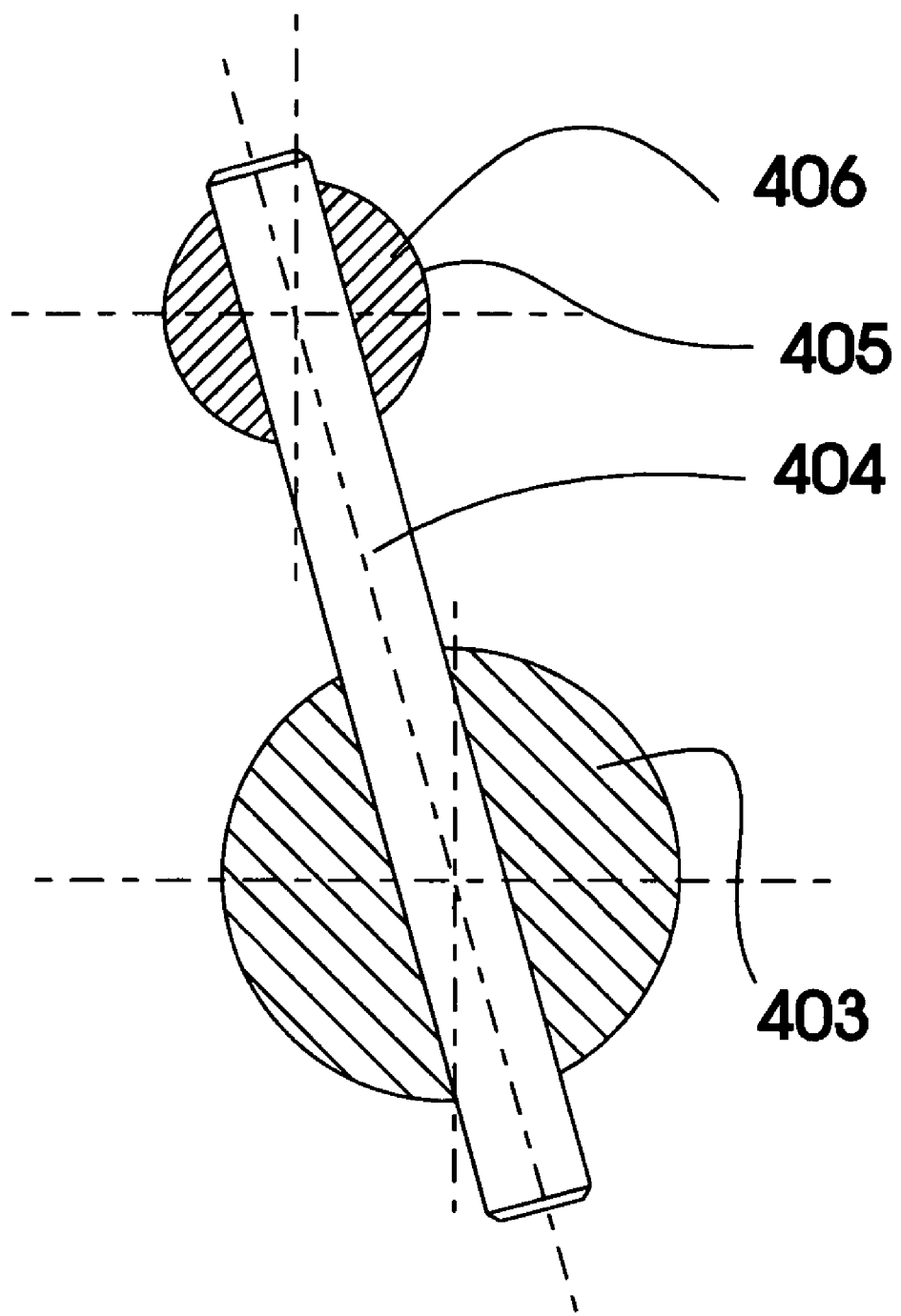
FIG. 11C is a cross sectional view of the airbag module of FIG. 11 taken at 11C—11C.
Figure 11D:
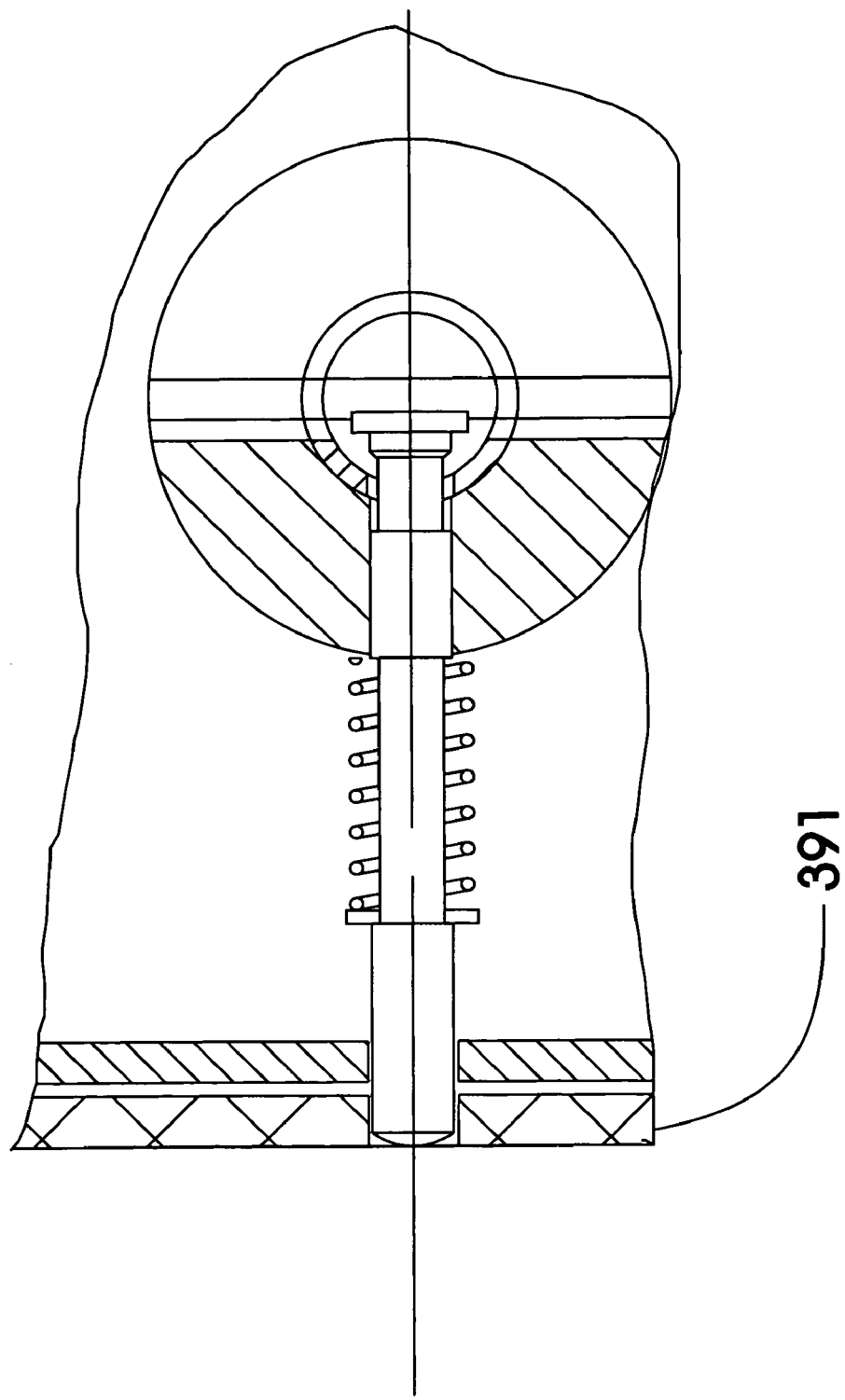
FIG. 11D is a cross sectional view of the airbag module of FIG. 11A taken at 11D—11D.

FIG. 11B is a cross section view, with portions cutaway and removed, of the airbag module 390 of FIG. 11 taken at 11B—11B and illustrates the arming pin 389 which is removed after the module 390 is mounted onto the vehicle. If the module 390 were to be dropped accidentally without this arming pin 389, the sensor could interpret the acceleration from an impact with the floor, for example, as if it were a crash and deploy the airbag 396. The arming system prevents this from happening by preventing the sensing mass 403 from rotating until the arming pin 389 is removed.

Figure 12:
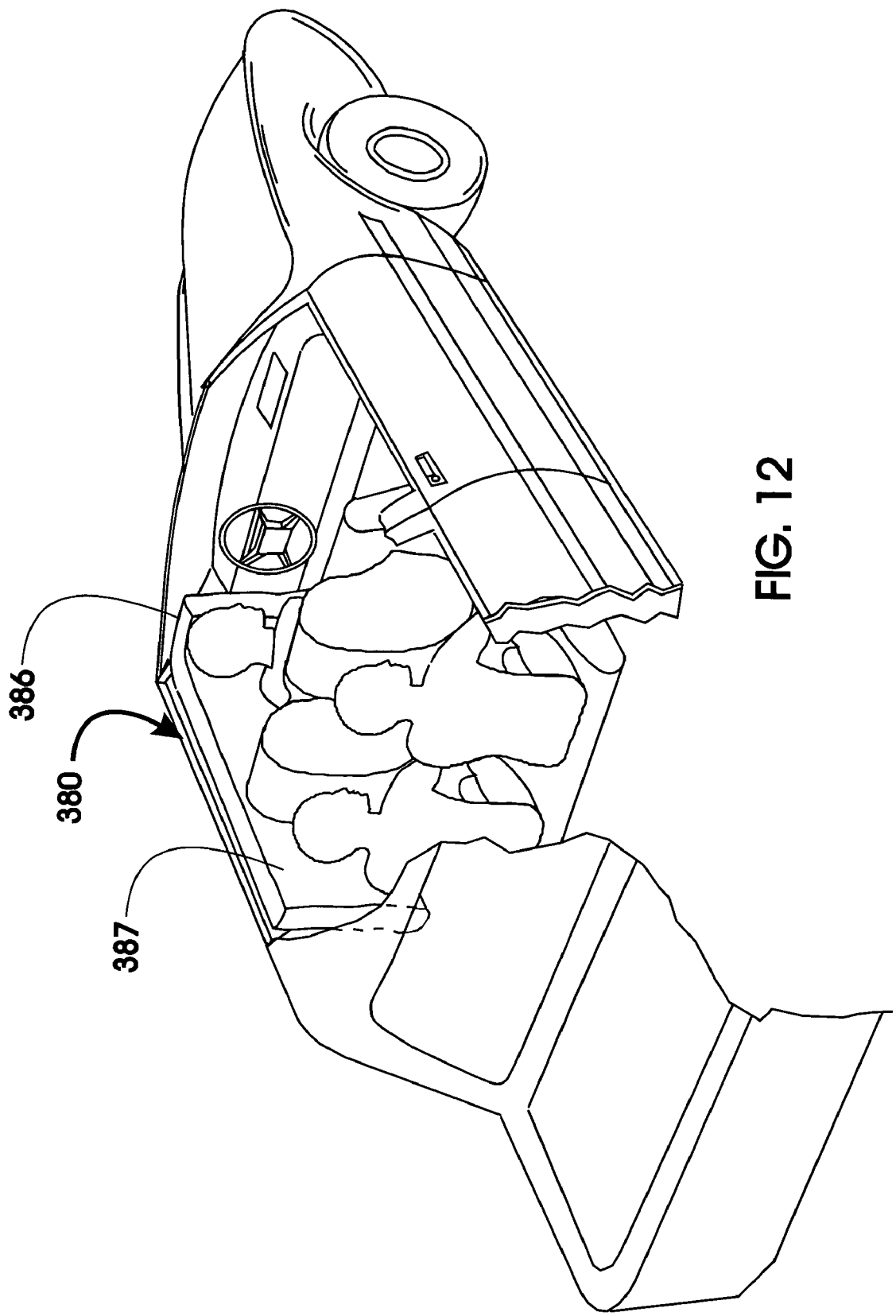
FIG. 12 is a perspective view of another preferred embodiment of the invention shown mounted in a manner to provide protection for a front and a rear seat occupant in side impact collisions, to provide protection against impacts to the roof support pillars in angular frontal impacts and to offer some additional protection against ejection of the occupant or portions of the occupant.

FIG. 12 is a perspective view of another preferred embodiment of the airbag of this invention 380 shown mounted in a manner to provide protection for a front and a rear seat occupant in side impact collisions and to provide protection against impacts to the roof support pillars in angular frontal impacts and to offer some additional protection against ejection of the occupant.

More particularly, in this embodiment, an airbag system for protecting at least the front-seated occupant comprises a single integral airbag 380 having a frontal portion 386 sized and shaped for deploying in front of the front-seated occupant and a side portion 387 sized and shaped for deploying to the side of the front-seated occupant. In this manner, airbag 380 wraps around the front-seated occupant during deployment for continuous front to side coverage. An inflator (not shown) is provided for inflating the single integral airbag with gas. As shown, the side portion 387 may be sized and shaped to deploy along an entire side of the vehicle, the side portion 387 is longer than the frontal portion 386 and the frontal portion 386 and side portion 387 are generally oriented at a 90 degree angle relative to each other. As with the other side curtain airbags discussed in connection with FIGS. 8, 9, 9A and 12, the airbag 380 may be housed in the ceiling. Also, as noted throughout this application, airbag 380 may comprise one or more sheets of film and the tear propagation arresting means or a net may be provided to tension or constrict the deployment of the airbag 380. The construction can also comprise straight or curved interconnected cells or tubular structures.

Figure 13:
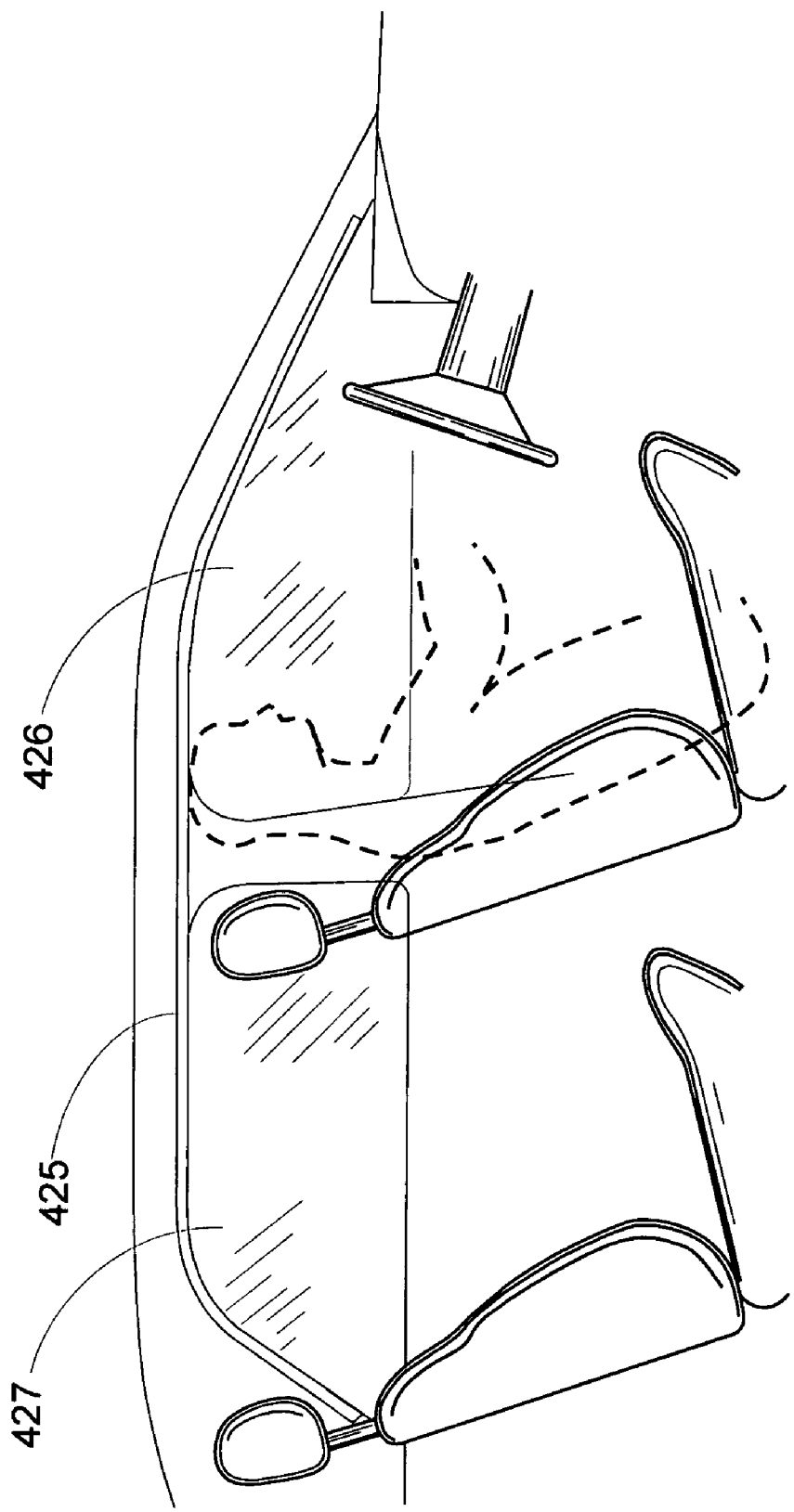
FIG. 13 is a side view of the interior of a motor vehicle provided with another form of safety device in accordance with the invention, before the safety device moves to the operative state.

FIGS. 13 and 14 illustrate another embodiment of the invention intended to provide protection from side impacts and rollover accidents not only for a person in the front seat of a motor vehicle such as a motor car, but also for a person in the rear seat of the vehicle which is similar to that shown in FIGS. 8, 9 and 9A.

Referring to FIG. 13, the housing 425 is provided over both the front door 426 and the rear door 427. The airbag or other type of inflatable element 428 is shown in the inflated state in FIG. 14. The inflatable element 428 has its top edge 429 secured to a part of the housing 425 or ceiling of the passenger compartment that extends above the doors 426, 427 of the motor vehicle (see, e.g., FIG. 9A). The design of the inflatable element is similar to that shown in FIG. 7 or 9A, with the inflatable element including a plurality of parallel cells or compartments 432, which when inflated are substantially cylindrical. A gas generator 430 is provided which is connected to the inflatable element 428 in such a way that when the gas generator 430 is activated by a sensor 431 to supply gas to the cells 432. Sensor 431 may be separate as shown or formed integrally with the gas generator 430, or which is otherwise associated with the gas generator 430, and responds to a crash condition requiring deployment of the inflatable element 428 to activate the gas generator 430. Thus, as the inflatable element 428 inflates, the cells 432 inflate in a downward direction until the inflatable element 428 extends across the windows in the doors 426,427 of the motor vehicle (see FIG. 9). As the inflatable element 428 inflates, the length of the lower edge thereof decreases by as much as 30% as a consequence of the inflation of the cells 432. This reduction in the length of the lower edge ensures that the inflated element 428 is retained in position as illustrated in FIG. 14 after it has been inflated. Although shown as parallel tubes, other geometries are of course possible such as illustrated in FIGS. 21A–21L.

The inflatable element 428 described above incorporates a plurality of parallel substantially vertical, substantially cylindrical cells 432. The inflatable element 428 may be made of interwoven sections of a material such as film or other material such as woven fabric. Such a interweaving of material comprises a first layer that defines the front of the inflatable element 428, i.e., the part that is visible in FIGS. 13 and 14, and a second layer that defines the back part, i.e., the part that is adjacent the window in FIGS. 13 and 14, whereby selected parts of the first region and the second region are interwoven to define links in the form of lines where the front part and the back part of the inflatable element are secured together. A technique for making an inflatable element of inter-woven sections of material is described in more detail in International Patent Publication No. WO 90/09295, incorporated by reference herein.

The tubes or cells 432 can be further joined together as illustrated in FIG. 15A by any method such as through the use of an additional sheet of material 433 which joins the front and back edges 434 and 435 of the adjacent cells 432 in order to render the inflatable element 428 more resistant to impacts from parts of the body of an occupant. The additional chambers 436 formed between the additional sheet of material 433 and the front and back edges of the cells 432 can either be pressurized at the same pressure as the tubes or cells 432 or they can be left exposed to the atmosphere, as is preferred. Although illustrated as joining adjacent cells of the inflatable element 428, they can alternatively be arranged to join nonadjacent cells. Although the cells are illustrated as parallel tubes, any geometry of chambers, cells or tubes can benefit from this improvement including those as illustrated in FIGS. 21A–21L.

FIG. 15 is a cross section showing the nature of the cells 432 of the inflatable element 428 of FIGS. 13 and 14. It can be seen that the cells 432 are immediately adjacent to each other and are only separated by narrow regions where the section of material, e.g., film, forming the front part of the inflatable element 428 has been woven or otherwise attached by heat sealing or adhesive with the section of material forming the back part of the inflated element.

Also, as noted throughout this application, inflatable element 428 may have any of the disclosed airbag constructions. For example, inflatable element 428 may comprise one or more sheets of film and the tear propagation arresting mechanism or a net may be provided to tension or constrict the deployment of the inflatable element 428. The film surface facing the occupant need not be the same as the film facing the side window, for example. In order to prevent broken glass, for example, from cutting the airbag, a thicker film, a lamination of a film and a fabric or a film and a net can be used.

There are many ways of making ceiling-mounted frontal protection airbags using chambers without departing from the teachings of this invention such as disclosed in published patent applications WO03093069, 20030234523 and 20030218319. Such airbags can be made from tubular sections or sections of other shapes and the amount of deployment of such airbags can be determined by occupant sensors as disclosed in other patents assigned to the assignee of this patent. Such airbags can be flat as disclosed herein or other shapes.

5.3 Other Compartmentalized Airbags

As mentioned above, anticipatory crash sensors based on pattern recognition technology are disclosed in several of assignee's patents and pending patent applications. The technology now exists to allow the identification and relative velocity determination to be made for virtually any airbag-required accident prior to the accident occurring. This achievement now allows airbags to be reliably deployed prior to the accident. The implications of this are significant. Prior to this achievement, the airbag system had to wait until an accident started before a determination could be made whether to deploy one or more of the airbags. The result is that the occupants, especially if unbelted, would frequently achieve a significant velocity relative to the vehicle passenger compartment before the airbags began to interact with the occupant and reduce his or her relative velocity. This would frequently subject the occupant to high accelerations, in some cases in excess of 40 Gs, and in many cases resulted in serious injury or death to the occupant especially if he or she is unrestrained by a seatbelt or airbag. On the other hand, a vehicle typically undergoes less than a maximum of 20 Gs during even the most severe crashes. Most occupants can withstand 20 Gs with little or no injury. Thus, as taught herein, if the accident severity could be forecast prior to impact and the vehicle filled with plastic film airbags that freeze the occupants in their pre-crash positions, then many lives will be saved and many injuries will be avoided.

One scenario is to use a camera, or radar-based or terahertz-based anticipatory sensor to estimate velocity and profile of impacting object. From the profile or image, an identification of the class of impacting object can be made and a determination made of where the object will likely strike the vehicle. Knowing the stiffness of the engagement part of the vehicle allows a calculation of the mass of the impacting object based on an assumption of the stiffness impacting object. Since the impacting velocity is known and the acceleration of the vehicle can be determined, we know the impacting mass and therefore we know the severity or ultimate velocity change of the accident. From this, the average chest acceleration that can be used to just bring the occupant to the velocity of the passenger compartment during the crash can be calculated and therefore the parameters of the airbag system can be set to provide that optimum chest acceleration. By putting an accelerometer on the airbag surface that contacts the occupant, the actual chest acceleration can be measured and the vent size can be adjusted to maintain the calculated optimum value. With this system, neither crush zone or occupant sensors are required, thus simplifying and reducing the cost of the system and providing optimum results even without initiating the airbag prior to the start of the crash.

There is of course a concern that if the airbags are inflated too early, the driver may lose control of the vehicle and the accident would be more severe than in the absence of such early inflation. To put this into perspective, experiments and calculations show that a reasonable maximum time period to inflate enough airbags to entirely fill a normal sedan is less than 200 ms. To protect the occupants of such a vehicle by filling the vehicle with airbags before the accident would require initiating deployment of the airbags about 200 ms prior to the accident which corresponds to a distance of vehicle travel of approximately 15 feet for the case where two vehicles are approaching each other with a closing velocity of about 60 MPH. It is unlikely that any action taken by the driver during that period would change the outcome of the accident and when the sensor signals that the airbags should be deployed, a control system can take control of the vehicle and prevent any unstable motions.

Figure 16:
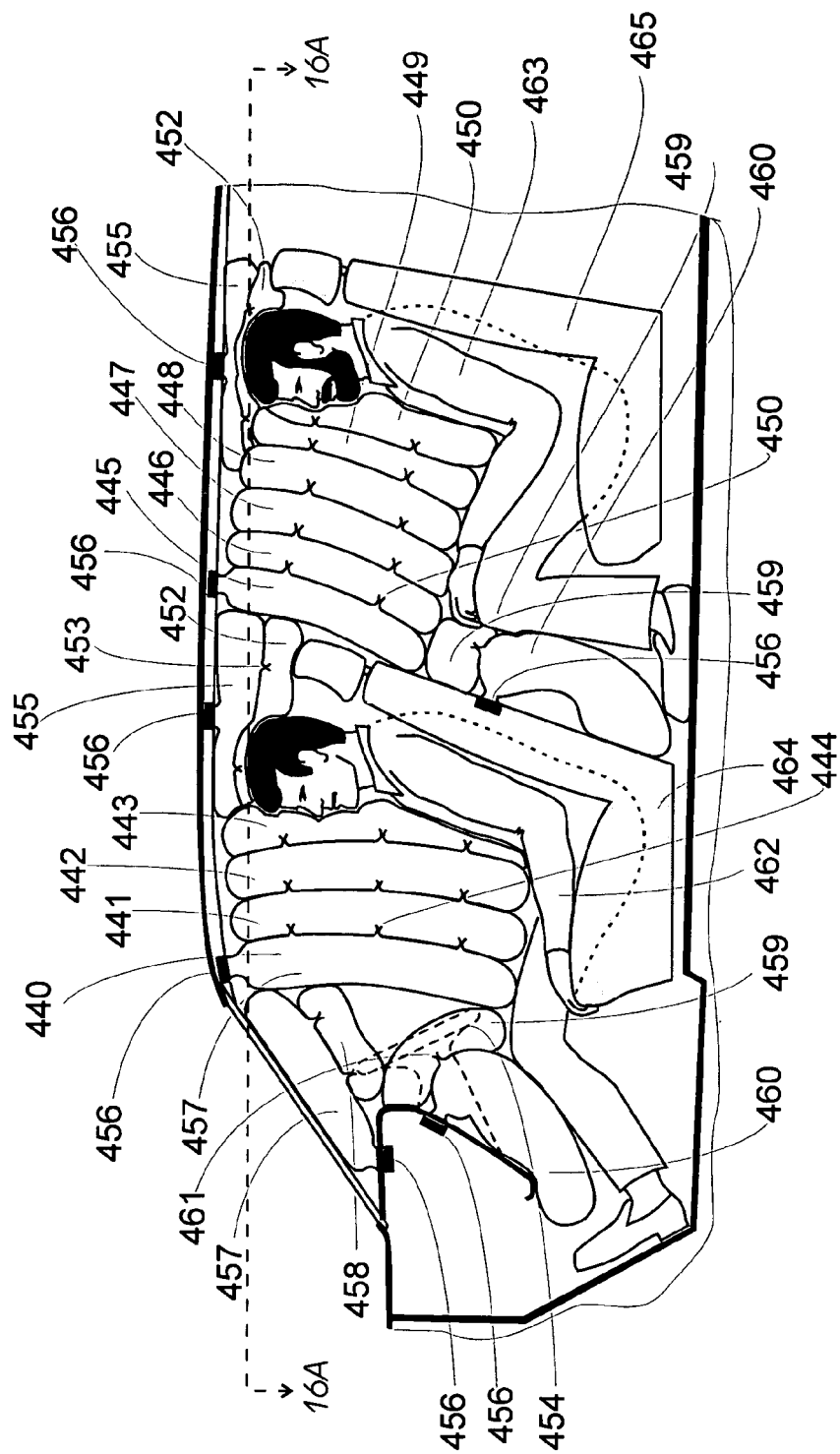
FIG. 16 is a side view of the passenger compartment of a vehicle showing the compartment substantially filled with layers of tubular film airbags some of which are interconnected.

FIG. 16 illustrates one preferred method of substantially filling the passenger compartment with airbags. Primary airbag 440 along with secondary airbags 441, 442, and 443 prior to inflation are attached to one or more aspirated inflators 456 and stored, for example, within the headliner or ceiling of the vehicle. When the anticipatory or other crash sensor, not shown, determines that deployment is necessary, primary airbag 440 deploys first and then secondary airbags 441–443 deploy from gas that flows through airbag 440 and through one way valves 444. Inflation continues until pressure builds inside the airbags 440–443 indicating that they have substantially filled the available volume. This pressure buildup reduces and eventually stops the aspiration and the remainder of the gas from the gas generator flows either into the airbags 440–443 to increase their pressure or into the passenger compartment. Since the pumping ratio of the aspirated inflator 456 is typically above 4, approximately 75% of the gas in the airbags 440–443 comes from the passenger compartment thus minimizing the pressure increase in the passenger compartment and injuries to the ears of the occupants. This also permits the substantial filling of the passenger compartment without the risk of breaking windows or popping doors open. If additional pressure relief is required then it can be achieved, for example, by practicing the teachings of current assignee's U.S. Pat. No. 6,179,326.

In a similar manner, primary airbag 445 inflates filling secondary airbags 446–450 through one-way valves 451. Additionally, airbags 455 mounted above the heads of occupants along with secondary airbags 452 can be inflated using associated inflators 456 to protect the heads of the occupants from impact with the vehicle roof or headliner. If occupant sensors are present in the vehicle, then when the rear seat(s) is (are) unoccupied, deployment of the rear-seat located airbags can be suppressed.

The knees and lower extremities of the occupants can be protected by knee airbags 460 and secondary airbags 459 in a similar manner. The design of these airbags will depend on whether there is a steering wheel 454 present and the design of the steering wheel 454. In some cases, for example, a primarily airbag may deploy from the steering wheel 454 while in other cases, when drive-by-wire is implemented, a mechanism may be present to move the steering wheel 454 out of the way permitting the secondary airbag(s) 459 to be deployed in conjunction with the knee airbag 460. The knee airbag deployment will be discussed in more detail below.

Figure 16A:
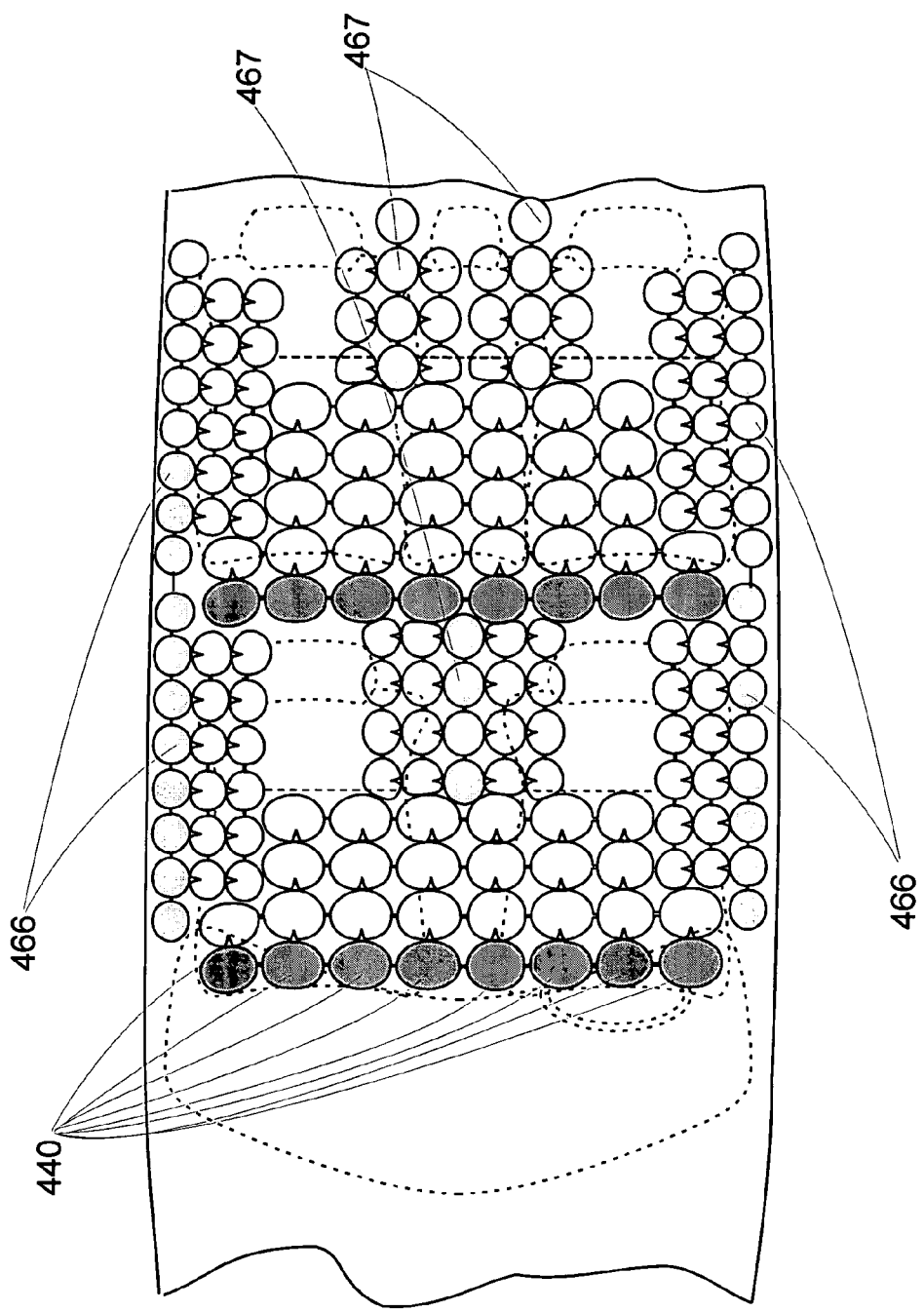
FIG. 16A is a top view of the airbag arrangement of FIG. 16 taken along lines 16A—16A.

FIG. 16A illustrates a view from the top of the vehicle with the roof removed taken along lined 16A-16A in FIG. 16 with the vehicle unoccupied. As can be seen, primary airbag 440, for example, is actually a row of tubular structures similar to that shown in FIG. 7. Additionally, curtain airbags 466 are present only in this implementation and they also comprise several rows of tubes designed to contact the occupants and hold them away from contacting the sides of the vehicle. Airbags 467 are also advantageously provided down the center of the vehicle to further restrain the occupants and prevent adjacent occupants from impacting each other.

In the preferred design, support for the airbags relies of substantially filling the vehicle and therefore loads are transferred to the walls of the vehicle passenger compartment. In many cases, this ideal cannot be completely achieved and straps of tethers will be required to maintain the airbags in their preferred locations. Again, this will depend of the design and implementation of this invention to a particular vehicle.

The particular designs of FIGS. 16 and 16A are for illustrative purposes only and the particular method of substantially filling a portion of the passenger compartment with airbags will depend substantially on the vehicle design.

Figure 17:
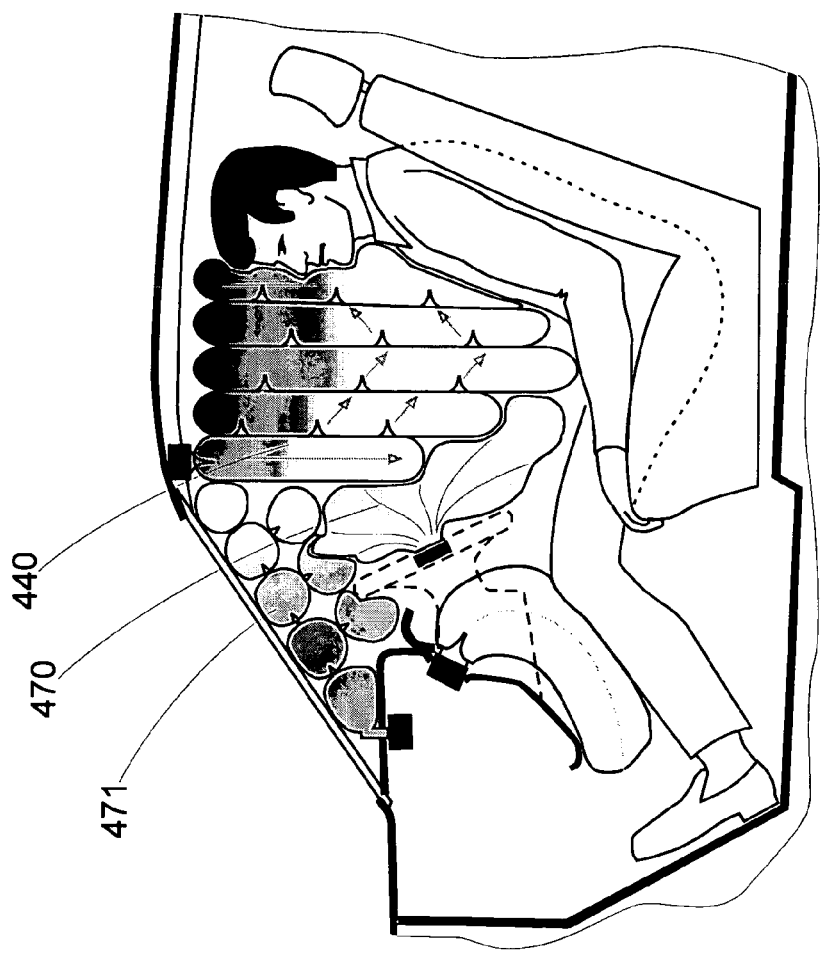
FIG. 17 is a similar but alternate arrangement of FIG. 16.

An alternate design is illustrated in FIG. 17 where a cellular airbag 470 deploys from the steering wheel in a somewhat conventional manner and additional lateral tubes 471 deploy between the occupant and the windshield. These airbags also provide added support for the steering wheel airbag for those cases where drive-by-wire has been implemented and the heavy structural steering wheel and column has been replaced by a lighter structure.

Figure 18:
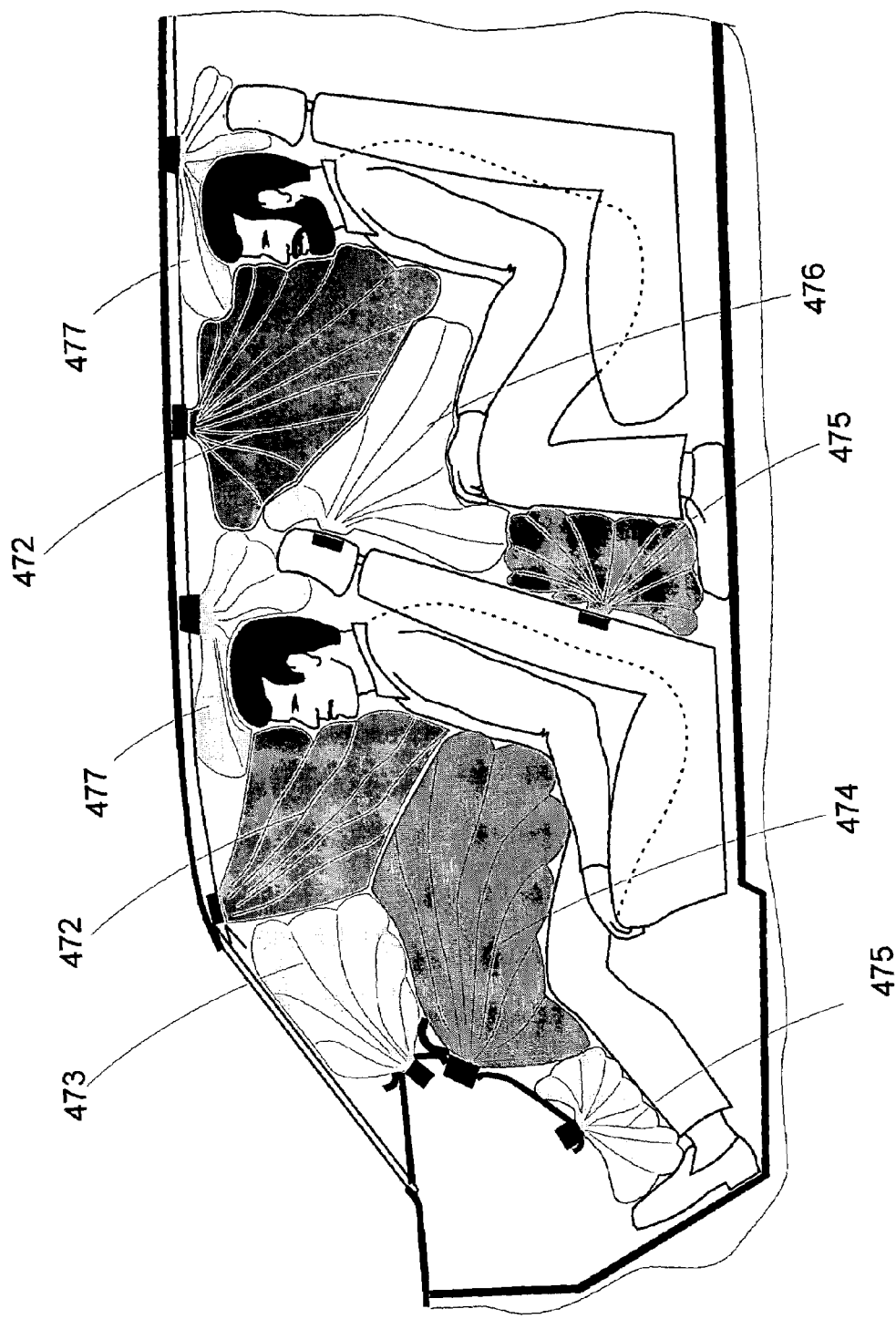
FIG. 18 is another alternate arrangement to FIG. 16 using airbags that expand radially from various inflators.

FIG. 18 illustrates an example wherein cellular tubular airbags made from thin plastic film, for example, expand is a flower pattern to engage the occupants and receive support from the walls, ceiling etc. of the passenger compartment. The airbags deform and interact with each other and the occupants to conform to the available space and to freeze the occupants in their pre-crash positions. Airbags 472 come from the ceiling for upper body protection. Airbags 473 deploy from the upper instrument panel for upper body protection and airbags 474 deploy for lower body protection. Airbags 475 protect the knees and lower extremities and airbags 476 protect the rear seated occupants. Finally, airbags 477 again provide protection for the tops of the heads of the occupants. Although not shown in this drawing, additional airbags may be provided to prevent the lateral movement of the occupants such as curtain and center mounted airbags. Again, the intent is to fill as much of the vehicle passenger compartment surrounding the occupant as possible. If occupant sensors are present and the absence of a rear seated occupant, for example, can be detected, then the rear seat airbags need not be deployed.

Figure 19A:
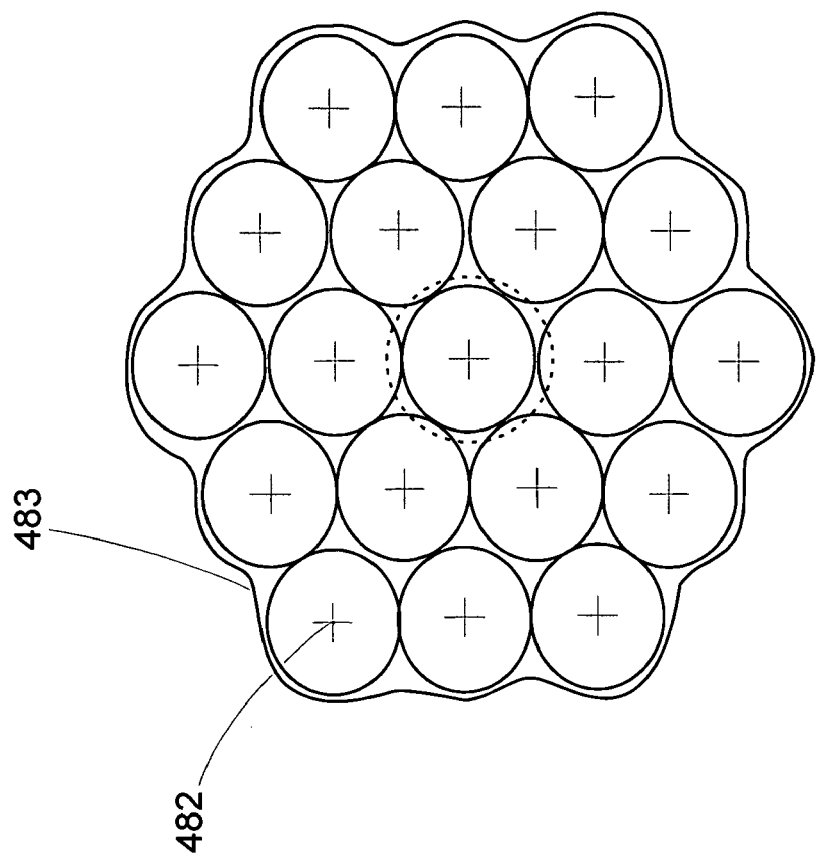
FIG. 19A is a end view of the airbags of FIG. 19 taken along lines 19A—19A.
Figure 19:
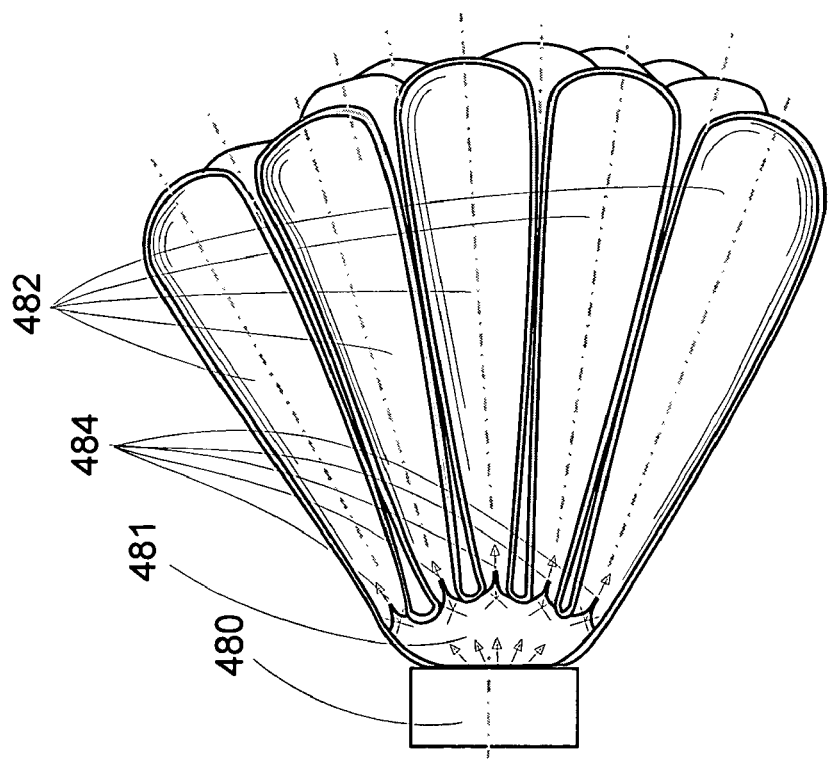
FIG. 19 is a detail of the radial expanding tubular airbags of FIG. 18.

FIGS. 19 and 19A illustrate an example of a flower-type airbag design. The inflator 480, preferably an aspirated inflator, discharges into a common distribution volume or manifold, which can be made from the plastic film, which distributes the gas to the cells or tubes 482 of the airbag assembly through one-way valves 484, formed in the sheet of the tubes 482, in a manner similar to the tubular airbags of FIG. 16. An envelope 483 of plastic film is provided to contain the tubes 482. Alternately, the tubes 482 can be connected together along their adjacent edges and the envelope 483 eliminated.

Figure 20A:
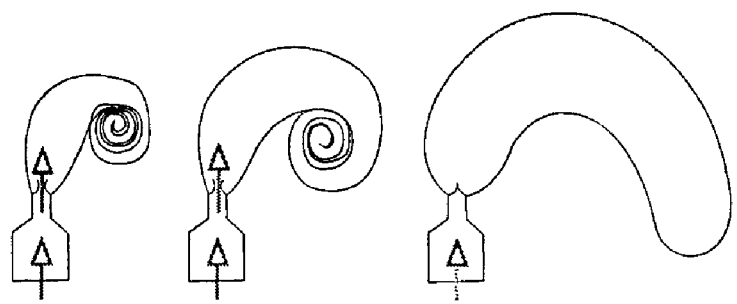
FIG. 20A illustrates the deployment stages of the knee bolster arrangement of FIG. 20.
Figure 20:
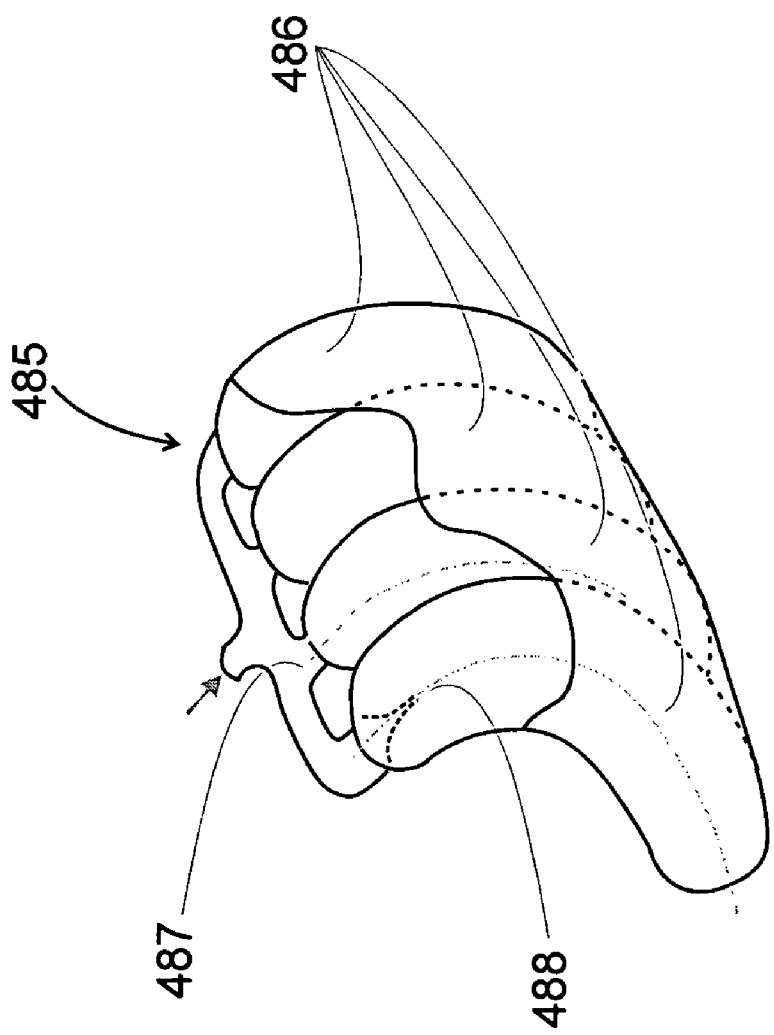
FIG. 20 is a detailed view of a knee bolster arrangement in accordance with the invention.

FIGS. 20 and 20A illustrate an example of a knee bolster airbag 485 and its inflation sequence. Only four tubes are illustrated although frequently, a larger number will be used. The inflation gas comes from the inflator, not shown, into a manifold 487 which distributes the gas into the tubes 486 through one-way valves 488 formed in the material of the airbag 485. During inflation, the airbag 485 unrolls in a manner similar to a Chinese whistle.

In some of the implementations illustrated here, the airbags do not have vent holes. At the end of the crash, the gas in the airbags should be allowed to exhaust, which generally will occur through the inflator housing. Vents in the airbags for the purpose of dissipating the kinetic energy of the occupants can, in many cases, be eliminated since the philosophy is to freeze the occupant before he or she has achieved significant velocity relative to the passenger compartment. In other words, there will be no "second collision", the term used to describe the injury producing impact of the occupant with the walls of the passenger compartment. The occupants will, in general, experience the same average deceleration as the vehicle which in a 30 mph barrier crash is significantly less than 20 Gs.

FIGS. 21A, 21D, 21F, 21H, 21J and 21L illustrate six related art curtain airbag designs that have been modified according to teachings of this invention to include the use of an envelope or a material sheet that spans the cells or tubes that make up the curtain airbag. The curtain airbag of FIG. 21A, designated 490, is a design based on parallel vertical tubes 491 and can be made from fabric or plastic film. Sheets of fabric or film material 492 are attached to the outer edges of tubes 491 so as to span from one tube to the adjacent tubes as illustrates in FIG. 21B which is a view of FIG. 21A taken along line 21B—21B. The volumes created between the tubes 491, i.e., cells, can be pressurized as illustrated in FIG. 21C or left exposed to the atmosphere as illustrated in FIG. 21B. The particular geometry that the cells will acquire is shown simplified here. In reality, the cell geometry will depend on the relative lengths of the various material sections, the thickness of the material and the relative inflation pressures of each cell. Care must be exercised in the design to assure that resulting airbag will fold properly into the storage area. The presence of the envelope of spanning sheets renders the curtain airbag 490 significantly more resistant to deformation on impact from the head of the occupant, for example. This improves the ability of the airbag to retain the occupant's head within the vehicle during a side impact or rollover. The main function of the curtain airbag 490 is to prevent this partial ejection which is the major cause of injury and death in side impact and rollover accidents. Although the envelope or spanning sheets 492 add additional material to the airbag 490, the added stiffness created actually permits the use of thinner materials for the entire airbag 490 and thus reduces the total weight and hence the cost of the airbag 490.

Figure 21H:
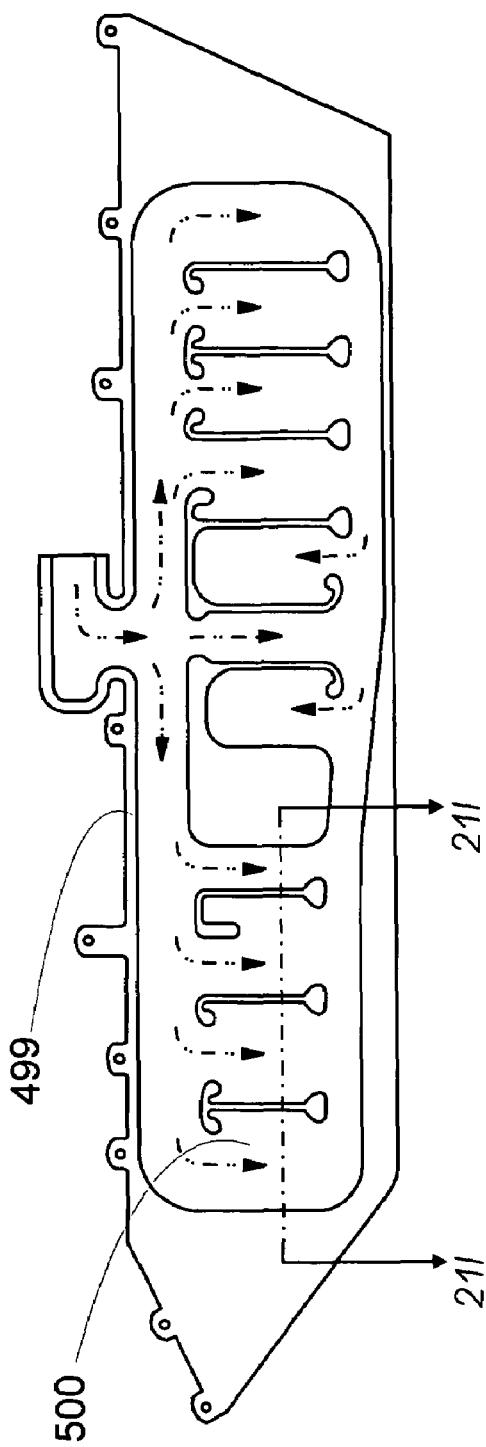

FIGS. 21D and 21E illustrate an alternate geometry of a side curtain airbag where the tubes acquire a varying thickness and shape. Curtain airbag 493 has tubes 494 and an envelope or spanning sheet 495. FIGS. 21F and 21G illustrate still another geometry of a side curtain airbag where the tubes 497 are formed by joining islands between the opposing sheets of material. As in all of the cases of FIGS. 21A, 21D, 21F, 21H, 21J and 21L, various manufacturing processes can be used to join the opposing sheets of material including sewing, heat sealing, adhesive sealing and interweaving where the entire bag is made in one pass through the loom, among others. Curtain airbag 496 has tubes 497 and an envelope or spanning sheet 498 (FIGS. 21F and 21G).

Figure 21I:
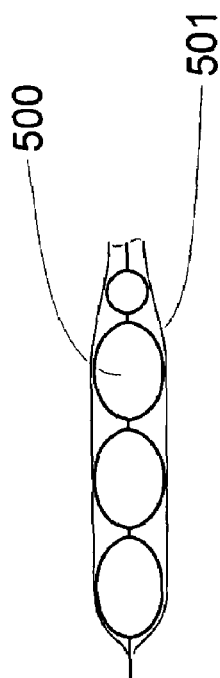
Figure 21J:
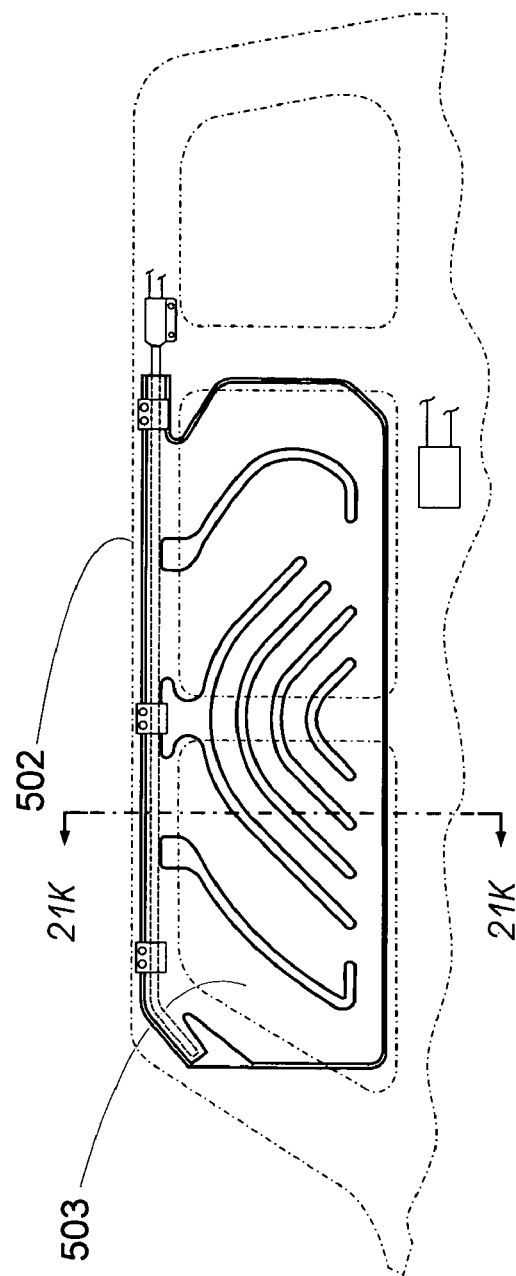
Figure 21K:
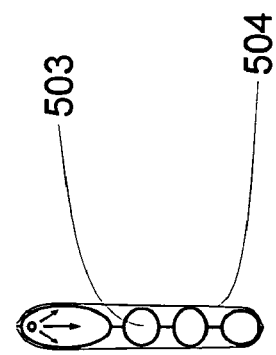

FIGS. 21H and 21I illustrate another geometry of a side curtain airbag where the tubes again acquire a roughly rectangular shape. Curtain airbag 499 has tubes 500 and an envelope or spanning sheet 501. FIGS. 21J and 21K illustrate yet another alternate geometry of a side curtain airbag where the tubes are slanted but still retain a roughly rectangular shape. Curtain airbag 502 has tubes 503 and an envelope or spanning sheet 504.

Figure 21L:
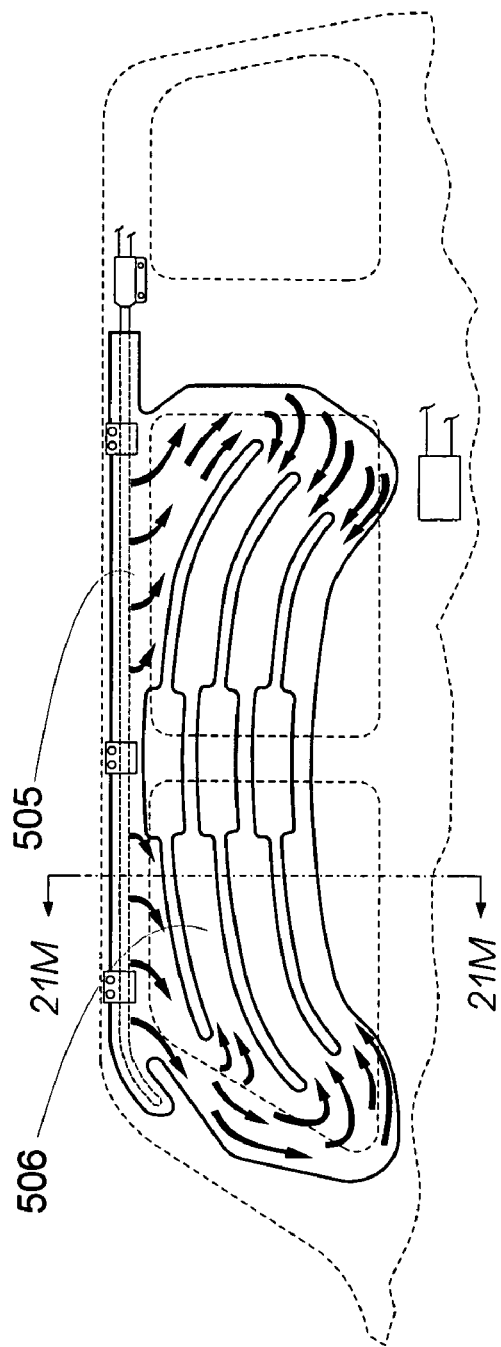
Figure 21M:
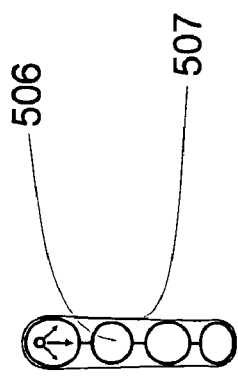

Finally, FIGS. 21L and 21M illustrate still another geometry of a side curtain airbag where the tubes again acquire a roughly rectangular shape with the tubes running roughly fore and aft in the vehicle. Curtain airbag 505 has tubes 506 and an envelope or spanning sheet 507.

The deployment of an airbag from the vehicle trim such as the headliner, A-Pillar, B-Pillar, C-Pillar was believed to be first disclosed in the current assignee's patents referenced above. As airbags begin to fill more and more of the passenger compartment as taught here and in other patents to the current assignee, the edges of the passenger compartment or the locations where the walls of the passenger compartment join become attractive locations for the deployment of airbags. This is especially the case when the airbags are made from thin plastic film that can be stored at such locations since they occupy a minimum of space. Thus, storage locations such as disclosed in U.S. Patent Application Publication No. 20030178821 are contemplated by this and previous inventions by the current assignee. For some applications, it is possible to put the entire airbag system in the headliner if knee protection is not required. This is a problem for convertible vehicles where the edges of the passenger compartment become more important.

The size of the cells or tubes in the various airbag designs discussed above can vary according to the needs of the particular application. For a given internal pressure, the thickness of the film material decreases as the diameter of the tubes decreases. Since the thickness determines the weight of the airbag and thus the potential to cause injury on impact with an occupant, in general, an airbag made from multiple smaller tubes will cause less injury than a single-chambered airbag of the same size. Therefore, when possible the designs should use more smaller cells or tubes. In the extreme, the vehicle can be filled with a large number of small airbags each measuring three inches or less in diameter, for example, and as long as the passenger compartment is substantially filled at least between the occupant and the compartment in the direction of the crash, the exact positioning of a particular airbag becomes less important as each one will receive support from others and eventually the passenger compartment walls.

Through the implementation of the ideas expressed herein, the airbag system becomes truly friendly. It can deploy prior to the accident, freeze the occupant in his or her pre-crash position, impact the occupant without causing injury, and gradually deflate after the accident. Inflators would preferably be aspirated to draw most of the required gas from the passenger compartment. Since an aspirated inflator automatically adjusts to provide just the right amount of gas, only single stage pyrotechnic systems would be required. Occupant sensors would not be necessary as the system would adjust to all occupants regardless of whether they were seated in a rear-facing child seat, belted, unbelted, out-of-position, lying down, sleeping, had their feet in the dashboard, etc. By eliminating the dual stage inflator, using aspiration thereby greatly reduces the amount of propellant required and by using thin plastic film, this airbag system is not only by far the best performing system it is also potentially the least expensive system.

Figure 22:
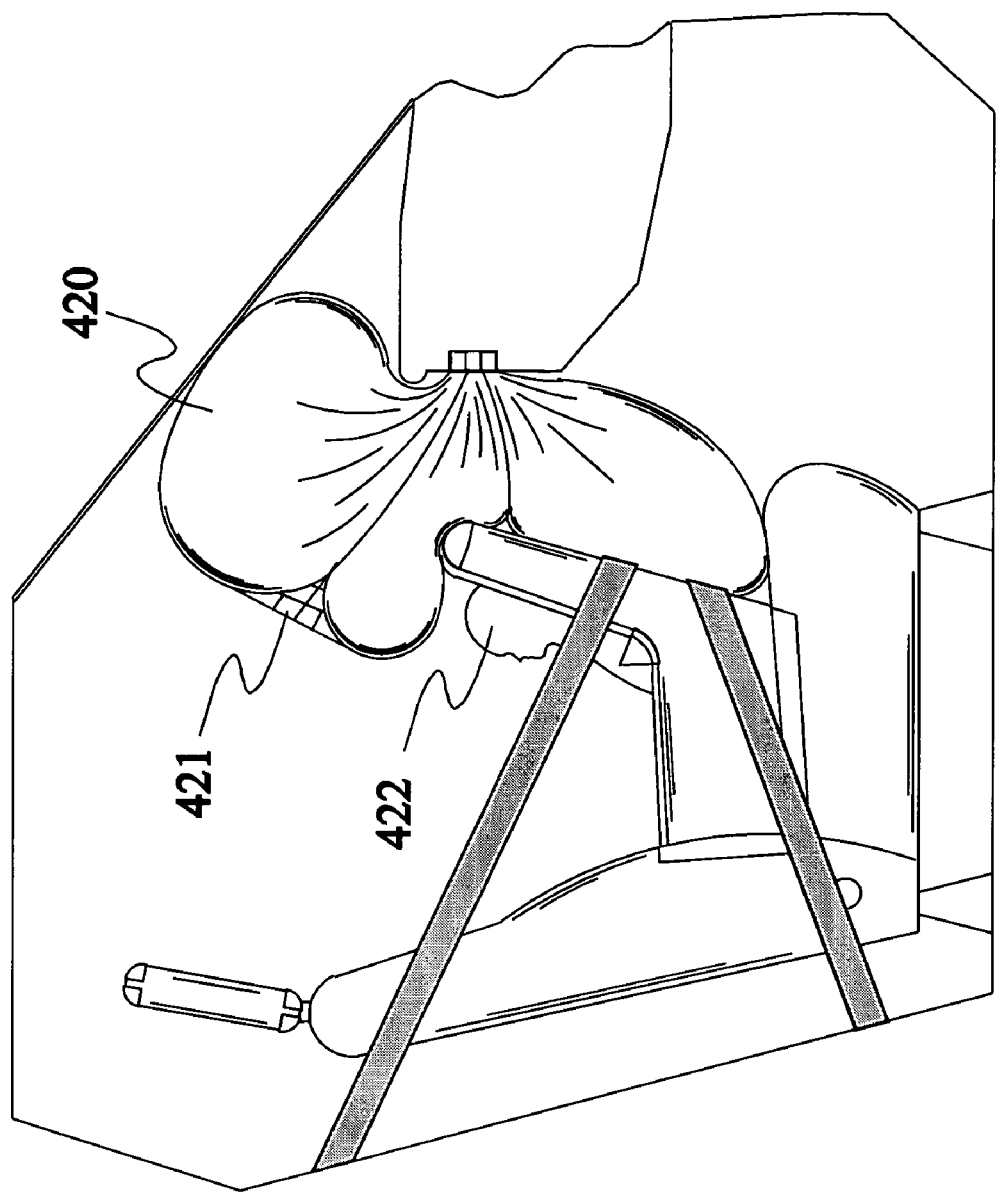
FIG. 22 is a perspective view of a self limiting airbag system composed of a multiplicity of airbags surrounded by a net, most of which has been cutaway and removed, designed to not cause injury to a child in a rear-facing child seat.

In FIG. 22, the advantages of the self-limiting airbag system disclosed herein and in more detail in U.S. Pat. No. 5,772,238 and with reference to FIG. 8, when used with a rear-facing child seat, are illustrated. In this case, where multiple film airbags are illustrated, the airbags deploy but the deployment process stops when each of the film airbags interacts with the child seat and the pressure within each bag rises to where the flow is stopped. In this case, the child 422 is surrounded by airbags 420 and further protected from the accident rather than being injured as is the case with current design airbags. The airbags 420 can be additionally surrounded by a net or other envelope 421 most of which has been cutaway and removed in the figure. In other implementations, a single airbag will be used in place of the multiple airbags illustrated here or multiple attached airbags can be used eliminating the need for the net.

The self-limiting feature is illustrated here by either a variable orifice exhaust port in the airbag, discussed in more detail below, or, preferably, provision is made in the airbag inflator itself as illustrated in the referenced '238 patent where a close-down of the aspiration system is used during the deployment portion of the process and a smaller variable orifice is used during the deflation portion. The aspiration cutoff can be designed so that the airbag deploys until the pressure begins to rise within the bag which then stops the inflation process, closes the aspiration ports and the airbag then becomes stiffer to absorb the kinetic energy of the impacting occupant. Thus, during the deployment phase, very little force is exerted on the occupant, or the child seat, but as the occupant begins to move into and load the airbag, substantial force is provided to limit his or her motion.

6. Rear of Seat Mounted Airbags

FIG. 18, discussed above, illustrates airbags that deploy from the rear of the front seat to protect rear seat occupants of a vehicle in a crash. These airbags also provide protection for front seat occupants to help prevent unbelted occupants in the rear seat from moving into the front seat during a crash and causing injury to those occupants seated in the front seat.

7. Exterior Airbags

Airbags that deploy outside of the vehicle have been disclosed primarily for side impact in the current assignee's patents. Generally, these externally deployed airbags are based on the use of an anticipatory sensor that identifies that an accident is about to occur using, for example, pattern recognition technologies such as neural network. Normally, these airbags are made from fabric but as the properties of films improve, these fabric airbags will be replaced by film airbags. In particular, using technology available today, the combination of a film and a reinforcing net can now be used to construct externally deployed airbags that are both stronger and lighter in weight than fabric. U.S. Patent Publication No. 20030159875 discloses the use of a resin for a pedestrian protection airbag. Naturally, all of the film airbag constructions illustrated herein for interior use are also applicable for external use with appropriate changes in dimensions, material properties etc. as needed to satisfy the requirements of a particular application.

Particular mention should be made of pedestrian protection since this is rapidly becoming a critical safety issue primarily in Japan and Europe where the percentage of people killed in automobile accidents that are pedestrians is greater than in North America. Although many patents have now issued and are pending relating to pedestrian airbags, none, except those of the current assignee, make use of an anticipatory sensor that can identify that the vehicle is about to impact with a pedestrian. See, for example, U.S. Patent Publication No. 20030159875 and EP01338483A2. Since this technology has been developed by the current assignee, the technology is now available to identify that a pedestrian is about to be struck by the vehicle. This technology uses a camera or other imaging system and a pattern recognition system such as a neural network or combination network as defined in the above-referenced current assignee's patents.

Exterior airbags can require a substantial amount of gas for inflation and thus are candidates for aspirated inflators such as disclosed in the current assignee's U.S. Patent Application Publication No. 20020101067. Such exterior airbags can also be of the shape and construction as disclosed herein and illustrated, for example, in U.S. Patent Application Publication No. 20040011581. Such exterior airbags can be made from plastic film.

8. Variable Vent

A great deal of effort has gone into the design on "smart" inflators that can vary the amount of gas in the airbag to try to adjust for the severity of the crash. The most common solution is the dual stage airbag where either of two charges or both can be initiated and the timing between the initiation can be controlled depending on the crash. Typically, one charge is set off for low speed crashes and two for higher speed crashes. The problem, of course, is to determine the severity of the crash and this is typically done by a passenger compartment-mounted crash sensor. This is relatively easy to do for barrier crashes but the crashes in the real world are quite different. For example, some pole crashes can appear to be mild at the beginning and suddenly become severe as the penetrating pole strikes the engine. In this case, there may not be time to initiate the second charge. An alternate solution, as reported in current assignee's patents listed above, is to use a single stage inflator but to control the flow of gas into or out of the airbag. If this is an aspirated inflator, this control happens automatically and if the airbag is a film airbag, it can be designed to interact with any occupant and thus inflator control is not required.

In an alternate situation where either a conventional inflator is used or an aspirated inflator is used, the flow out of the airbag can be managed to control the acceleration of the chest of the occupant. Most airbags have a fixed vent hole. As an alternate to providing a fixed vent hole as illustrated in the previous examples, a variable vent hole can be provided as shown in FIGS. 23 and 23A, where FIG. 23 is a partial cutaway perspective view of a driver side airbag made from film having a variable vent in the seam of the airbag. In this embodiment of an airbag, a hinged elastic member or flap 415 is biased so that it tends to maintain vent 410 in a closed position. As pressure rises within the airbag, the vent 410 is forced open as shown in FIG. 23 and FIG. 23A, which is a detail of the vent 410 shown in FIG. 23 taken along line 23A-23A of FIG. 23. This construction enables the use of a smaller inflator and also reduces the maximum chest acceleration of the occupant in a crash and more accurately controls the deceleration of the occupant. In FIGS. 23 and 23A, vent 410 contains a opening 413 formed between film layer 414 and reinforcement member 412. Film layer 411 is also sealed to reinforcing member 412. Member 415 is attached to reinforcing member 412 (via portion 417) through film 414. A weakened section 416 is formed in member 415 to act as a hinge. The elasticity of the material, which may be either metal or fiber reinforced plastic or other suitable material, is used to provide the biasing force tending to hold the variable opening closed. The variable vent can also be accomplished through controlling the flow back through the inflator assemble. This latter method is particularly useful when aspirated inflators and self limiting airbags are used. For other variable vent designs see "Discharge valves for airbags and airbags including the same" U.S. patent application Ser. No. 10/278,721, filed Oct. 23, 2001.

Figure 24:
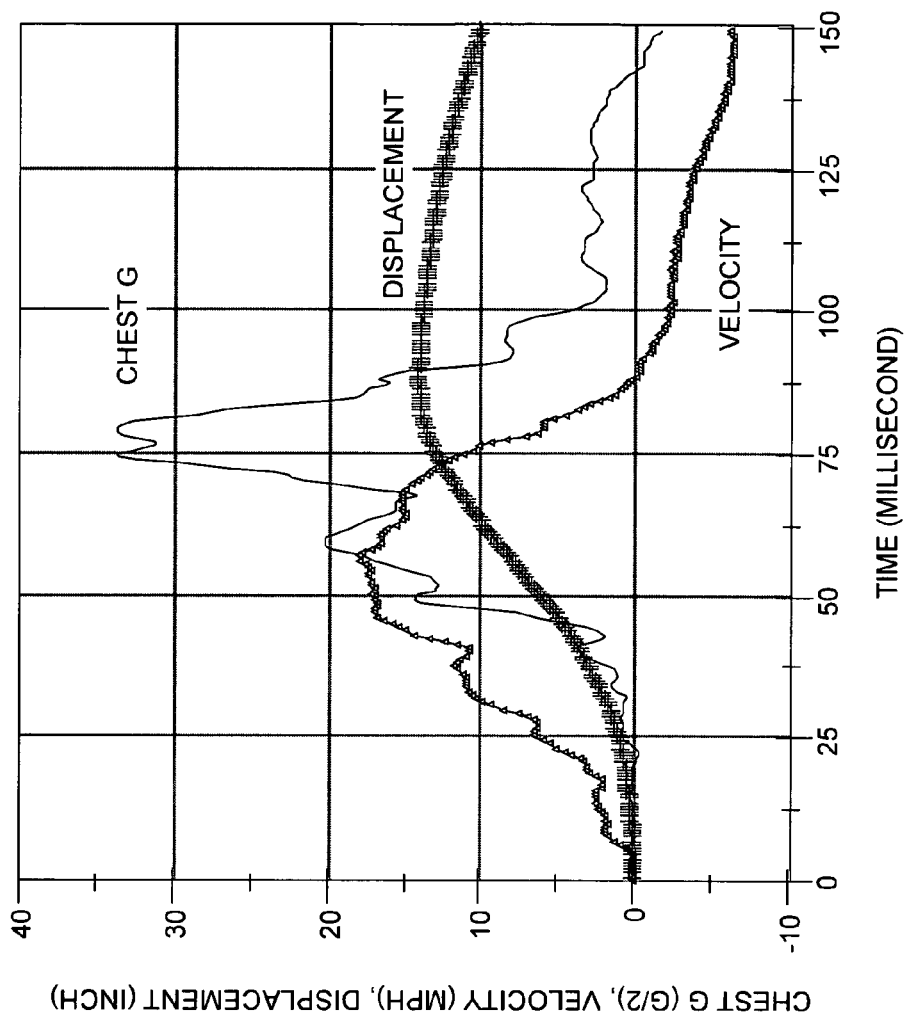
FIG. 24 shows a plot of the chest acceleration of an occupant and the occupant motion using a conventional airbag.
Figure 25:
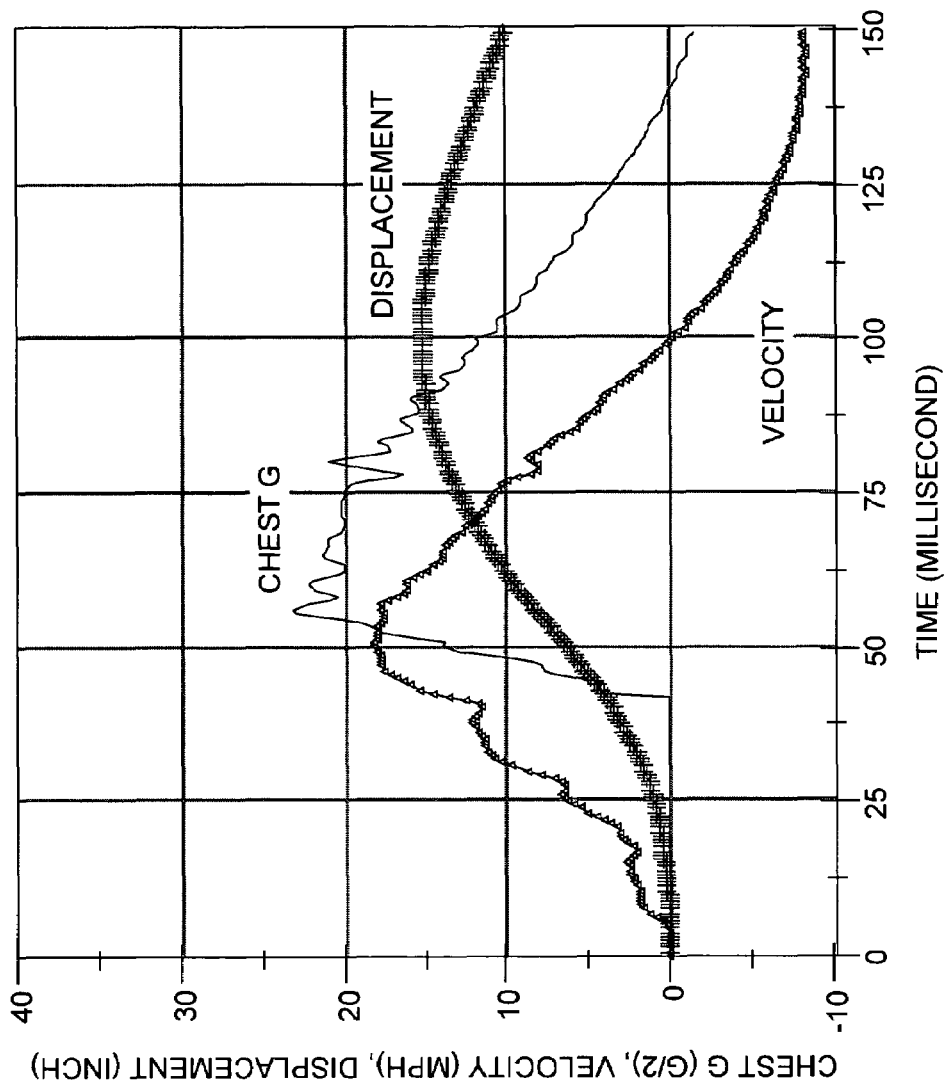
FIG. 25 shows the chest acceleration of an occupant and the resulting occupant motion when the variable orifice of this invention is utilized.

FIG. 24 shows a typical chest G pulse experienced by an occupant and the resulting occupant motion when impacting an airbag during a 35-MPH frontal impact in a small vehicle. When the variable orifice airbag is used in place of the conventional airbag, the chest acceleration curve is limited and takes the shape similar to a simulation result shown in FIG. 25. Since it is the magnitude of the chest acceleration that injures the occupant, the injury potential of the airbag in FIG. 25 is substantially less than that of FIG. 24.

Since the variable exhaust orifice remains closed as long as the pressure in the airbag remains below the set value, the inflator need only produce sufficient gas to fill the airbag once. This is approximately half of a gas which is currently produced by standard inflators. Thus, the use of a variable orifice significantly reduces the total gas requirement and therefore the size, cost and weight of the inflator. Similarly, since the total amount of gas produced by all inflators in the vehicle is cut approximately in half, the total amount of contaminants and irritants is similarly reduced or alternately each inflator used with the variable orifice airbag is now permitted to be somewhat dirtier than current inflators without exceeding the total quantity of contaminants in the environment. This in turn, permits the inflator to be operated with less filtering, thus reducing the size and cost of the inflator. The pressure buildup in the vehicle is also substantially reduced protecting the occupants from ear injuries and permitting more or larger airbags to be deployed.

The characteristics of inflators vary significantly with temperature. Thus, the mass flow rate of gas into the airbag similarly is a significant function of the temperature of the inflator. In conventional fixed orifice airbags, the gas begins flowing out of the airbag as soon as positive pressure is achieved. Thus, the average pressure in the airbag similarly varies significantly with temperature. The use of a variable orifice system as taught by this invention however permits the bags to be inflated to the same pressure regardless of the temperature of the inflator. Thus, the airbag system will perform essentially the same whether operated at cold or hot temperature, removing one of the most significant variables in airbag performance. The airbag of this invention provides a system which will function essentially the same at both cold and hot temperatures.

The variable orifice airbag similarly solves the dual impact problem where the first impact is sufficient to trigger the crash sensors in a marginal crash where the occupant is wearing a seatbelt and does not interact with the airbag. A short time later in a subsequent, more serious accident, the airbag will still be available to protect the occupant. In conventional airbags using a fixed orifice, the gas generator may have stopped producing gas and the airbag may have become deflated.

Since the total area available for exhausting gas from the airbag can be substantially larger in the variable orifice airbag, a certain amount of protection for the out-of-position occupant is achieved even when the aspiration system of the referenced '238 patent is not used. If the occupant is close to the airbag when it deploys, the pressure will begin to build rapidly in the airbag. Since there is insufficient time for the gas to be exhausted through the fixed orifices, this high pressure results in high accelerations on the occupant's chest and can cause injury. In the variable orifice embodiment, however, the pressure will reach a certain maximum in the airbag and then the valve would open to exhaust the gas as fast as the gas generator is pumping gas into the airbag thus maintaining a constant and lower pressure than in the former case. Naturally, the bag must be sufficiently deployed for the valve to be uncovered so that it can operate. Alternately, the valving system can be placed in the inflator and caused to open even before the cover opens thereby handling the case where the occupant is already against the deployment door when the airbag deployment is initiated.

Many geometries can be used to achieve a variable orifice in an airbag. These include very crude systems such as slits placed in the bag in place of round exhaust vents, rubber patches containing one or more holes which are sewn into the bag such that the hole diameter gets larger as the rubber stretches in response to pressure in the bag, plus a whole variety of flapper valves similar to that disclosed in this invention. Slit systems, however, have not worked well in experiments and rubber patches are affected by temperature and thus are suitable only for very crude systems. Similarly, the bag itself could be made from a knitted material, which has the property that its porosity is a function of the pressure in the bag. Thus, once again, the total amount of gas flowing through the bag becomes a function of the pressure in the bag.

Although the case where the pressure is essentially maintained constant in the bag through the opening of a valve has been illustrated, it is possible that for some applications, a different function of the pressure in the bag may be desirable. Thus, a combination of a fixed orifice and variable valve might be desirable. The purpose of adjusting the opening area of an airbag vent hole is to control the gas flow rate out of the vent hole according to the pressure inside the airbag. If the pressure is higher, then the area of the vent hole becomes larger and allows more gas to flow out. By regulating the pressure inside an airbag, the force applied on an occupant is minimized.

A superior solution to the problem is to place an acceleration sensor on the surface to the airbag that contacts the chest of the occupant. An electronic controlled valve can then be tied to the accelerometer and the acceleration of the chest of the occupant can be controlled to limit this acceleration below some value such as 40 Gs. Alternately, if the severity of the crash has been accurately forecast, then the airbag can provide the minimum deceleration to the occupant's chest to bring the occupant to the same speed as the vehicle passenger compartment at the time the airbag has become deflated.

When airbags are used in conjunction with an anticipatory sensor to inflate and hold the occupants in their pre-crash position, they usually will not have vents for dissipating the kinetic energy of the occupants since the occupants will never attain a significant velocity relative to the vehicle. Rather, usually but not always, it will be desirable to retain such airbags in their inflated state for several seconds and then to deflate them to permit the occupants to egress from the vehicle. There are several methods of permitting such airbags to deflate including: opening the aspiration vent when aspirated inflators are used; electrically and/or mechanically opening the airbags when the pressure drops below atmospheric pressure; chemically, thermally melting or burning or otherwise opening a hole in such an airbag after a predetermined time period or perhaps two seconds (for example) after the vehicle motion has stopped; etc.

9. Airbags with a Barrier Coating

Note most of the following section was taken from U.S. Pat. No. 6,087,016 and U.S. Pat. No. 6,232,389 which describe barrier coatings in general but not for application to airbags. Quotation marks have been omitted for easier reading.

The Barrier Coating Mixtures

A barrier coating mixture according to this invention includes the following components in a carrier liquid (i.e., aqueous or solvent):

(a) an elastomeric polymer;
(b) a dispersed, exfoliated layered platelet filler having an aspect ratio greater than 25; and
(c) at least one optional surfactant, wherein the solids content is desirably below 30% solids and the ratio of polymer (a) to filler (b) is between about 20:1 and 1:1. These barrier coating mixtures result in films with reductions in permeability of 5 times to 2300 times relative to the unfilled polymer. These results are substantially higher than the prior art on other platelet filled barrier coatings.

The barrier coating mixtures used in the invention are selected by balancing several critical features, i.e., appropriate dispersion of the filler in the elastomeric polymer, orientation of the filler platelets in the elastomeric polymer, as well as high aspect ratio of the filler, in order to achieve the desired permeability reductions and flexibility in the dried barrier coating and in the airbags. These characteristics are demonstrated by the data shown in FIG. 26. The barrier coating mixture of this invention desirably contains an unusually low solids content, i.e., between about 1% and about 30% solids. A more desirable range of solids content is between about 5% to about 17% solids.

The solids content is an important consideration in the barrier coatings compositions and performance of the dried coatings because the solids content effects the dispersion of the high aspect ratio filler. If high total solids content is used in the barrier coating composition, one would not achieve well-dispersed filler, e.g., vermiculite, and the permeability reductions characteristic of the coatings of this invention, and reported in the examples and figures herein, are not achieved. The preferred range of solid content (5%–17%) is unexpectedly well below that typically used in the coating industry and therefore not predicted by the prior art teachings concerning barrier coatings formulations. This is especially true of the airbag industry where no such fillers are used prior to the teachings of this invention.

The relationship between the percentage of solids in the coating composition to the weight percent of filler in the resulting dried coating is an unexpectedly important issue in obtaining desired barrier coatings of this invention. For example, in embodiments in which the barrier coating composition contains as the elastomeric polymer, butyl rubber (Lord Corporation), and as the filler, MICROLITE™ 963++ vermiculite solution (W. R. Grace & Co.), FIG. 29 illustrates a range of maximum total solids that can be used in the coatings formulation of this invention without resulting in agglomeration and other negative effects on the dried coating (i.e., film) properties as a function of the fraction of the total solids made up by the filler.

In one embodiment, where the MICROLITE™ filler is at 5%, the maximum solids is about 16%; in another wherein the filler is 25%, the maximum solids is about 9%. In still another embodiment, where the filler is about 50%, the maximum solids is about 5%. Other examples fall within those ranges, as indicated in FIG. 29. The results shown in FIG. 29 are based on the formulations used in Examples 9–12 discussed below.

Figure 29:
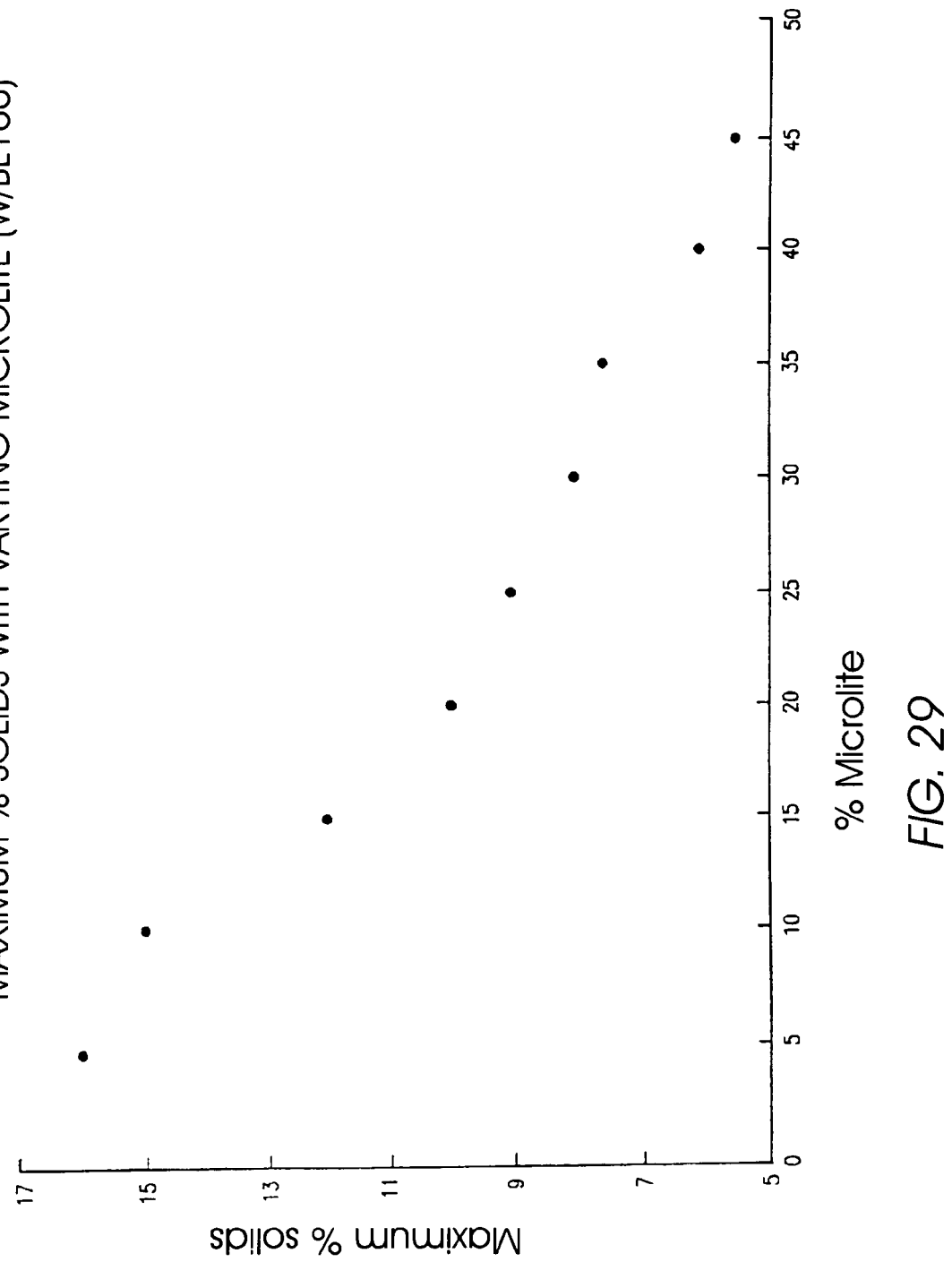
FIG. 29 is a graph illustrating the maximum percentage solids useful in coating compositions of the invention using butyl latex (BL100™), vs. percentage by weight of MICROLITE® vermiculite in the compositions.
Figure 30:
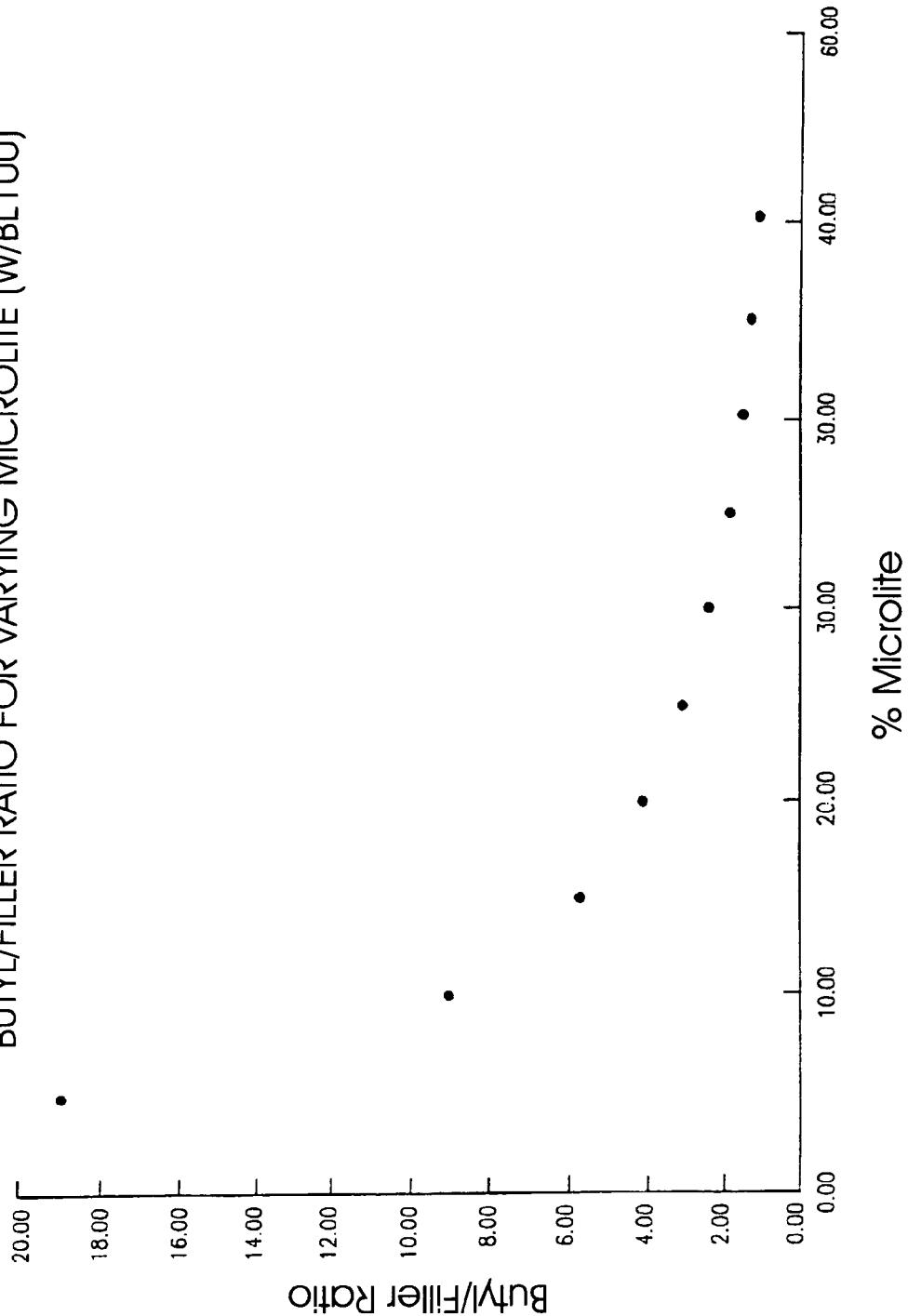
FIG. 30 is a graph illustrating the butyl latex (BL100™) to filler ratio useful in coating compositions of the invention vs. percentage by weight of MICROLITE® vermiculite in the compositions.
Figure 31:
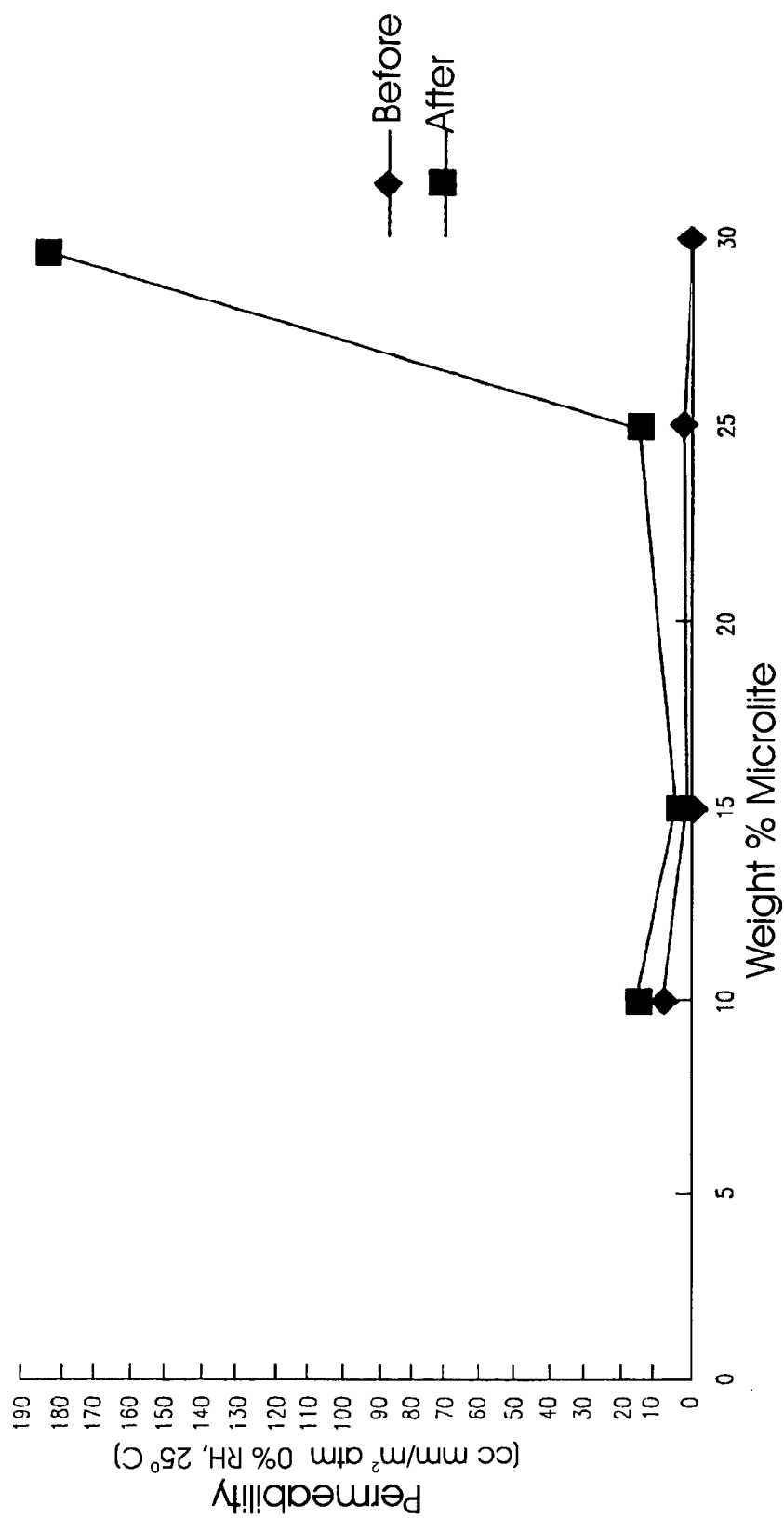
FIG. 31 illustrates flexibility data at 10% elongation, 1K cycles based on the flex test of Example 17.
Figure 32:
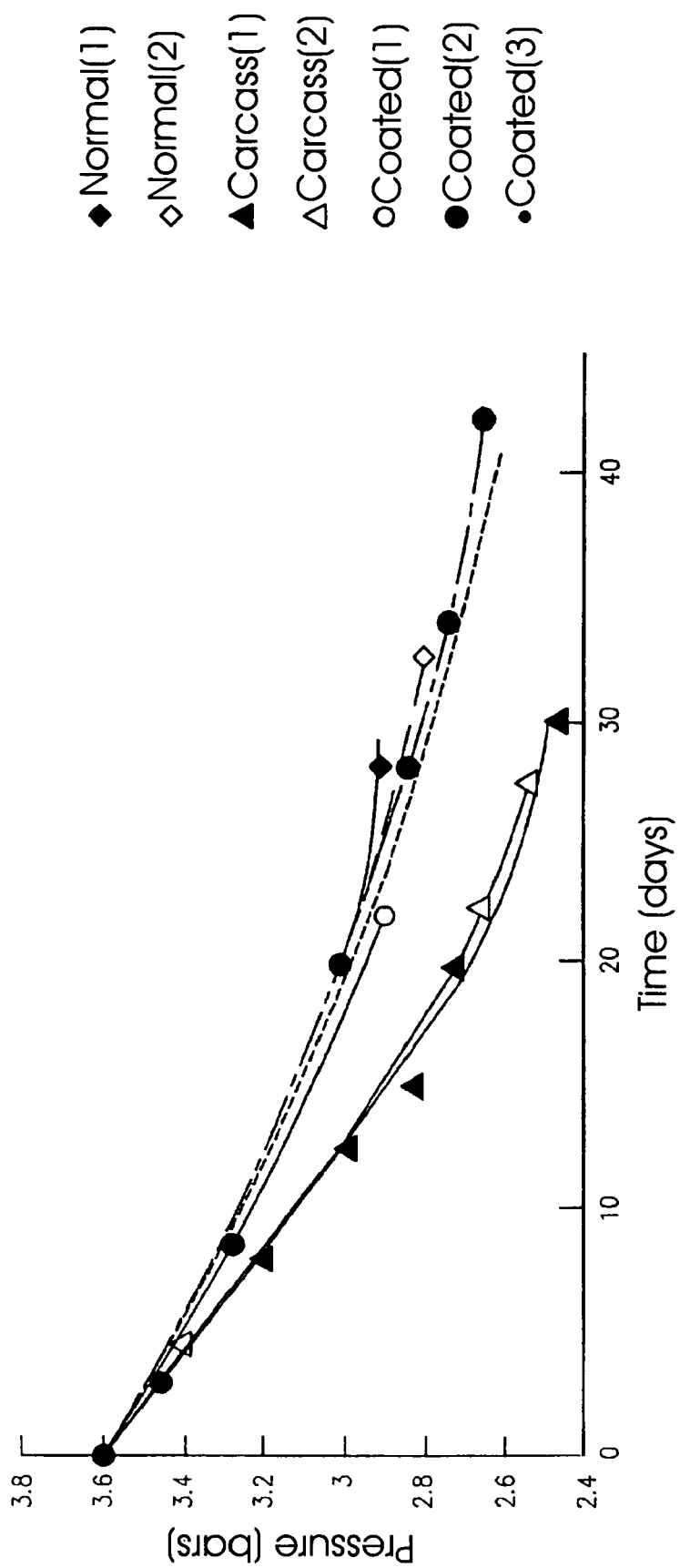
FIG. 32 is a schematic view of a vehicle with portions cutaway showing an airbag module including an airbag in accordance with the invention in the ceiling of the vehicle.
Figure 33:
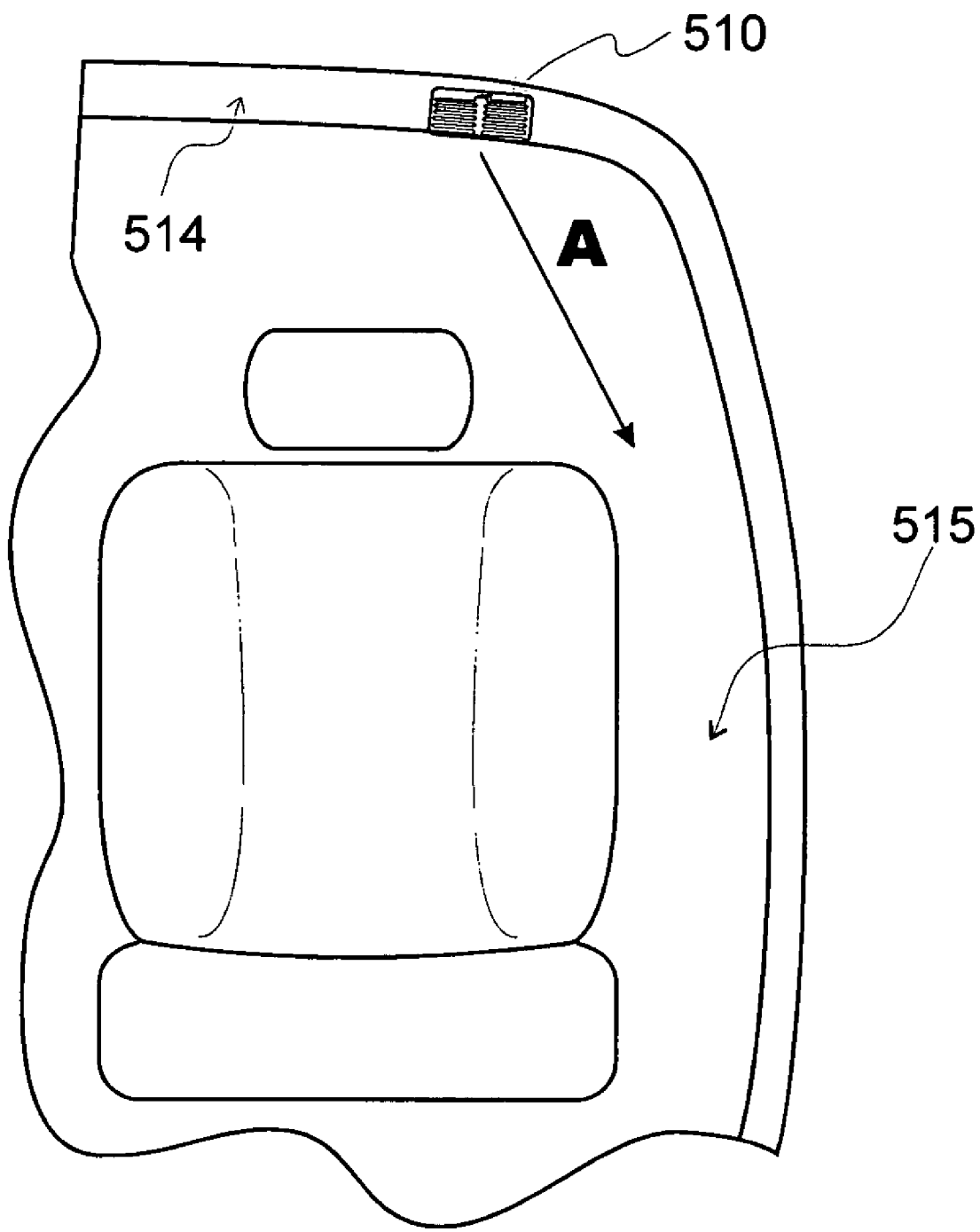
FIG. 33 is a partial cross section of a vehicle passenger compartment illustrating a curtain airbag in the folded condition prior to deployment.
Figure 34:
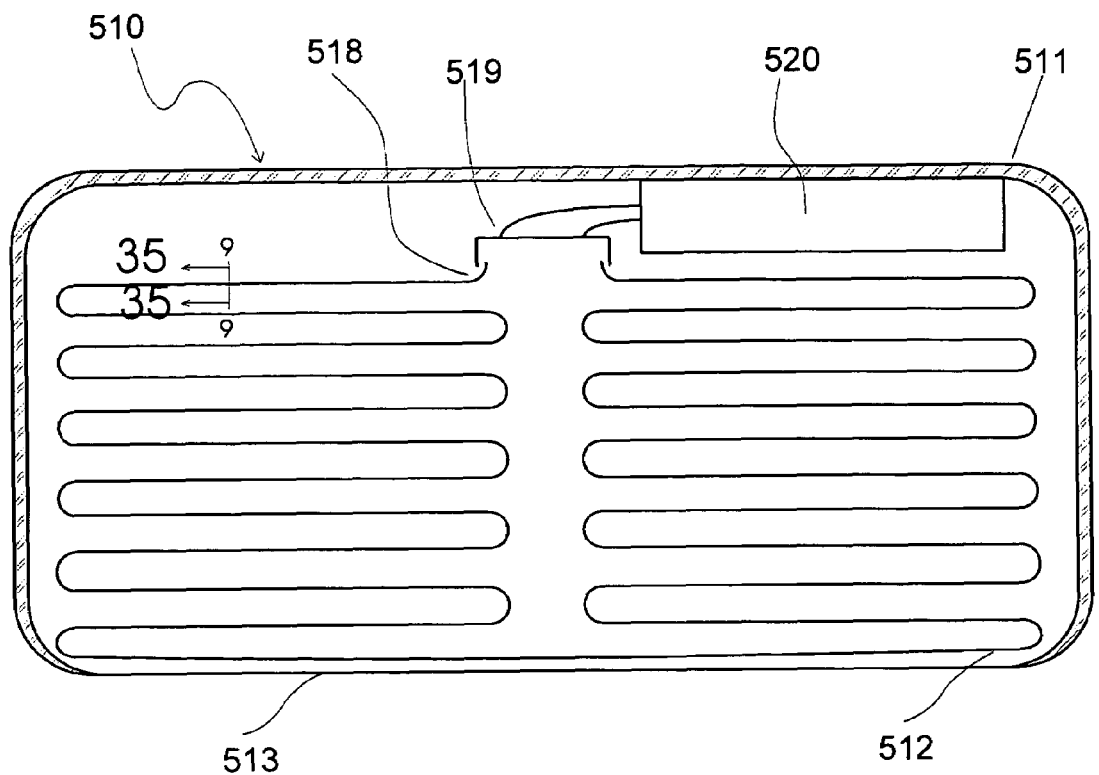
FIG. 34 is an enlarged view of airbag module shown in FIG. 33.

The unusually low solids contents described in FIG. 29 for a butyl-containing polymer latex are also applicable to other elastomeric polymer latexes, as well as to elastomeric polymers in carrier liquids which also contain other solvents or co-solvents. One of skill in the art will understand the need to make some alterations in the maximums provided by FIG. 29 for other formulations of barrier coatings of this invention taking into account changes in electrolyte concentration, surfactants, grade and composition of vermiculite or other filler, and grade and composition of polymeric latex or other elastomeric polymer in a carrier as described herein.

If desired, the solids content of the barrier coating mixtures can be further adjusted to levels below the maximums shown in FIG. 29 using thickeners, in order to adjust the final film thickness, as well as to adjust the suspension rheology. See, for example, Examples 14–15 which demonstrate the increase in viscosity from 4.5 cP to 370 cP using PVOH terpolymer; and Example 16 which similarly increases viscosity using lithium chloride as a thickener. Other conventionally used thickeners may also be useful.

The solids content of the coating mixtures of this invention is preferably based upon a preferred polymer to filler ratio of between about 20:1 to about 1:1, more preferably 9:1 to 1:1, particularly when the polymer is a butyl- containing polymer such as a butyl latex, and the filler is a vermiculite solution. Examples 9–12 indicate a variety of desirable compositions of this invention characterized by a polymer to filler ratios within the above range, over a range of solids contents, polymer contents by weight and filler contents by weight.

Preferably, in the dried barrier coating (film), the polymer is present at between about 45 to about 95 by weight and the dispersed layered filler is present at between about 5 to about 55% by weight.

A. The Elastomeric Polymer

Elastomeric polymers useful in forming coating mixtures of this invention include polymers selected generally from among many classes. The selected polymers may be curable polymers, partially cured polymers, or uncured polymers, and may be soluble in water or a solvent. Such polymers include, without limitation, olefinic thermoplastic elastomer (TPO); polyamide thermoplastic elastomer (Polyamide TPE); polybutadiene thermoplastic elastomer, e.g., syndiotactic 1,2-polybutadiene thermoplastic elastomer (polybutadiene TPE); polyester thermoplastic elastomer (Polyester TPE); polyurethane thermoplastic elastomer (TUPR), for example, thermoplastic polyester-polyurethane elastomer (TPAU), and thermoplastic polyether-polyurethane elastomer (TPEU); styrenic thermoplastic elastomer (Styrenic TPE); vinyl thermoplastic elastomer, e.g., polyvinyl chloride polyol (pPVC).

A variety of rubbery polymers (curable, partially cured, or uncured) may also be employed as the polymer component of the present invention, including acrylic rubber, such as ethylene-acrylate copolymer (EACM); and butadiene rubber, such as polybutadiene. Butyl-containing polymers useful in forming coating mixtures of this invention include, without limitation, curable, partially cured, or uncured polymers: butyl rubber, such as isobutylene-isoprene copolymer (IIR); bromobutyl rubber, e.g., bromoisobutylene-isoprene copolymer (BIIR); chlorobutyl rubber, e.g., chloroisobutylene-isoprene copolymer (CIIR); and isobutylene rubber. Butyl rubber is defined as a poly(isobutylene) homopolymer or a copolymer of poly(isobutylene) with isoprene. Modified butyl rubbers include halogenated poly(isobutylene) and its copolymers and isoprene. Additional polymers or copolymers that contain more than 50% isobutylene are also useful in the practice of this invention, for example, poly(isobutylene-co-acrylonitrile), etc. Other butyl-containing polymers which are curable, partially cured or uncured, may be readily selected by one of skill in the art.

Still other useful elastomeric polymers are chlorosulfonated polyethylene rubber, e.g., chlorosulfonated polyethylene (CSM); epichlorohydrin rubber, such as polyepichlorohydrin (CO), polyepichlorohydrin copolymer (CO copolymer); ethylene-propylene rubber (EPR), such as ethylene-propylene copolymer (EPM), ethylene- propylene-diene copolymer (EPDM).

Other polymers for such use include fluoroelastomers, such as vinylidene fluoride-hexafluoropropylene copolymer (FKM); natural rubber (NR); neoprene rubber such as polychloroprene (CR); nitrile rubber, such as acrylonitrile-butadiene copolymer (NBR); polyisoprene rubber (PI); polysulfide rubber; polyurethane, such as polyester urethane (AU), and polyether urethane (EU); propylene oxide rubber; silicone rubber, such as silicone (MQ), and methylvinyl-fluorosilicone (FVMQ) and styrene-butadiene rubber, such as styrene-butadiene copolymer (SBR).

The polymer is preferably capable of forming a solution, dispersion, latex, suspension or emulsion in water or a solvent, or a mixture thereof. Specifically exemplified below is a coating mixture of the invention employing as the elastomeric polymer, butyl latex. A suitable commercially available butyl latex for use in the compositions of this invention is Lord® BL-100 butyl latex, which is a 62% by weight aqueous butyl latex solution [Lord Corporation]. Another suitable butyl latex, the use of which is illustrated in Example 10, is Polymer Latex ELR butyl latex, a 50% butyl latex solution (Polymer Latex). Still another suitable polymer is a 51.7% bromo-butyl latex solution available from Polymer Latex (see Examples 11–12). These latexes contain an ionic surfactant package which stabilizes the latex and effects the performance of the barrier formulation. Other butyl latexes are anticipated to be similarly useful if combined with similar ionic surfactants. Preferably, the selected polymer is present in the dried coating mixture at a minimum of about 45% by weight of the dried compositions.

B. The Filler

Figure 26:
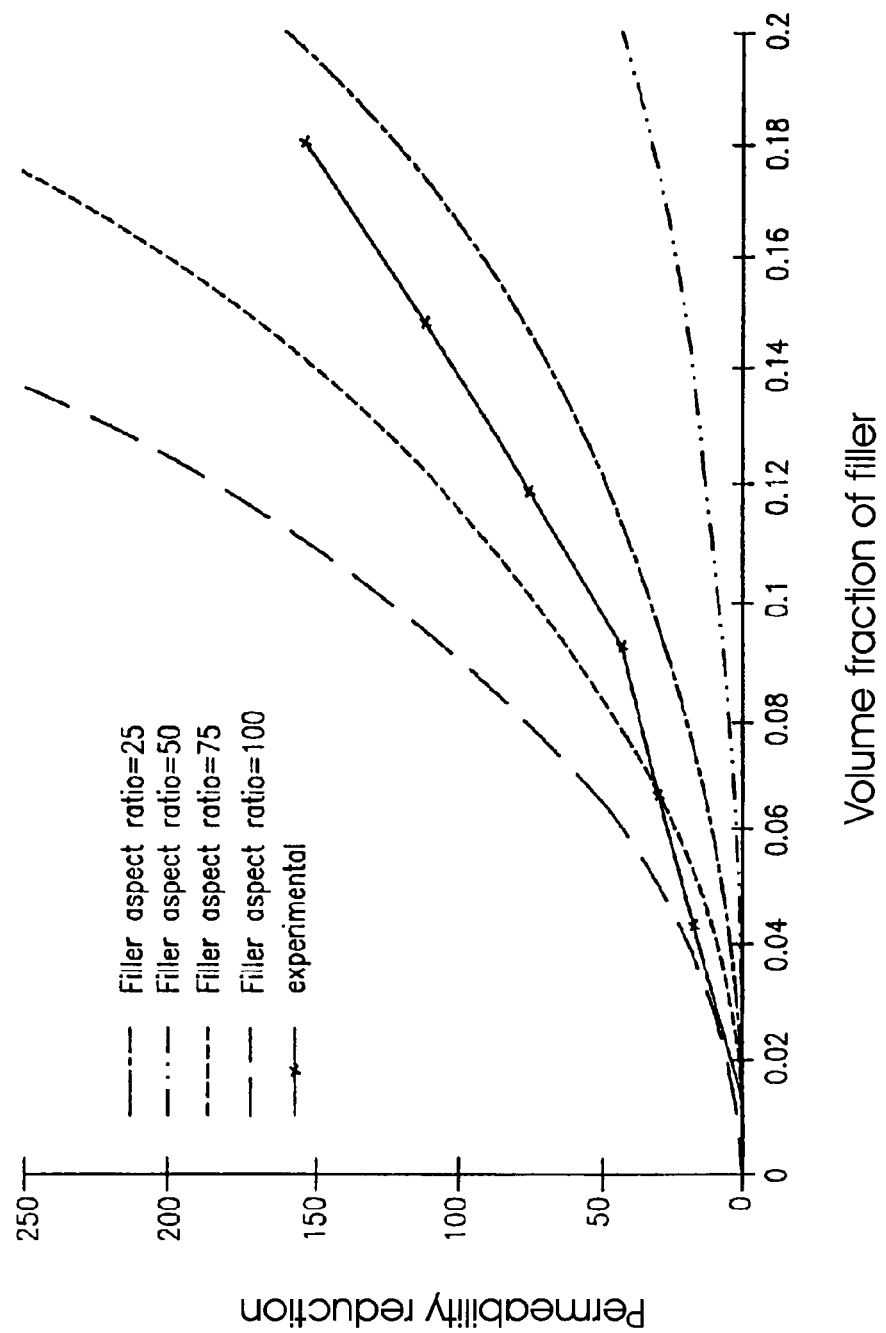
FIG. 26 is a "Cussler" model graph indicating the effective aspect ratios achieved by compositions of this invention. The graph plots reduction of permeability vs. volume percentages of filler in barrier coating mixtures of the present invention. Cussler describes several models for the permeability reduction due to oriented layered fillers, which depend on the microstructure expected. For simplicity, this invention employs the equation: $Pu/P=[1+(a2X2)/(1-X)]/(1-X)$, where P is the permeability of the filled material, Pu is the permeability of the unfilled material; a is the aspect ratio of the filler particles; X is the volume fraction of the filler particles in the coating. Cussler's theoretical curves for fillers with aspect ratios of 25, 50, 75, and 100 are present on the graph. The thick "experimental" data line records the experimental data points for the barrier coating mixtures of Examples 1–8 below. Effective aspect ratios can be estimated from the position of the data relative to the theoretical curves.
Figure 27:
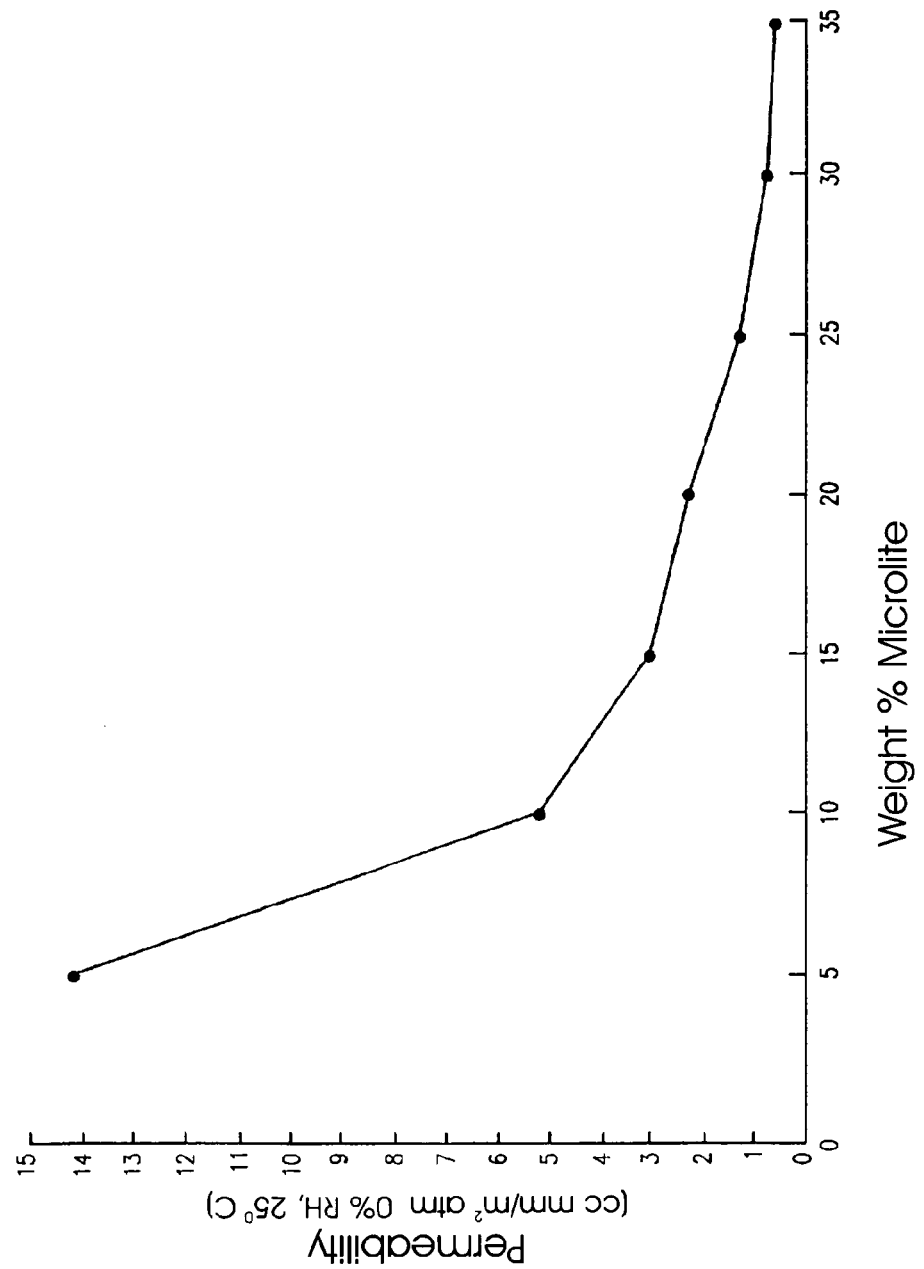
FIG. 27 is a graph plotting permeability results based on the weight percentage of a filler, vermiculite. Permeability is plotted vs. weight % of filler. Increase in weight % of filler decreases the permeability of the coating.
Figure 28:
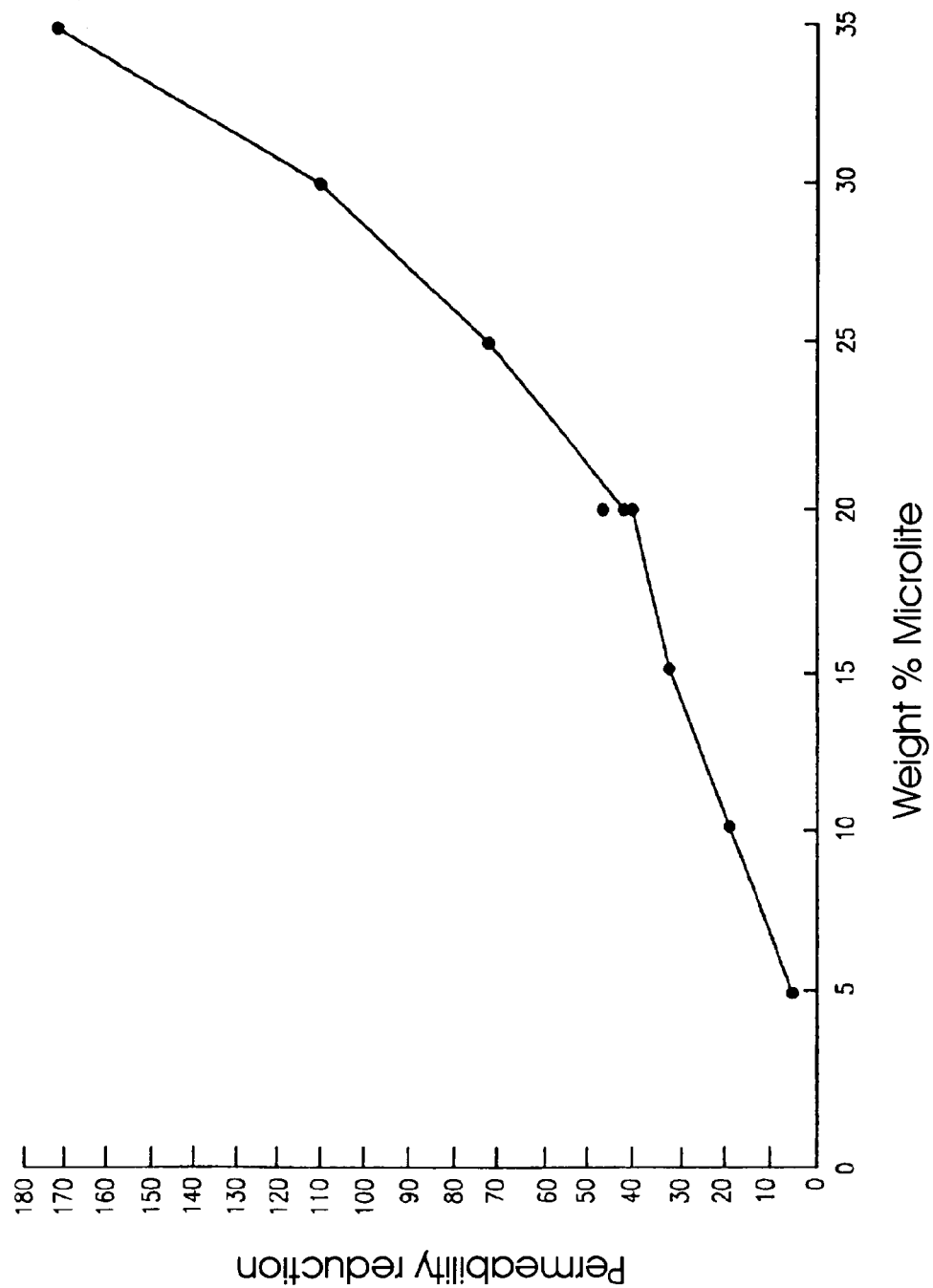
FIG. 28 is a graph plotting reduction in permeability vs. weight % of filler in coating. Increase in weight % of filler increases the reduction of permeability.

The coating mixtures of this invention as described above also include a dispersed layered filler which, upon mixture, has an inherently high aspect ratio, which can range from about 25 to as high as about 30,000. The presently preferred filler is vermiculite. More particularly, a desirable vermiculite is MICROLITE® 963++ water- based vermiculite dispersion (W. R. Grace) [see, EP Application No. 601,877, published Jun. 15, 1994] which is a 7.5% by weight aqueous solution of dispersed mica. One novel aspect of the mixtures of the present invention is the effective aspect ratio of the selected filler in the dried coating. According to this invention, in the dried coating, the filler remains substantially dispersed, thereby having a "high effective aspect ratio", as shown in FIG. 26. FIG. 26 assumes high levels of orientation.

Preferably, the effective aspect ratio of the filler in the compositions of this invention is greater than 25 and preferably greater than about 100, although higher ratios may also be obtained. In embodiments in which orientation is not high, the effective aspect ratio required for large reductions in permeability will be higher than 100. In the coating mixtures (the liquid), the layered filler is present at between about 1 to about 10% by weight of the total mixture. In the dried coatings of this invention, the layered filler is present at a minimum of about 5% by weight to a maximum of about 55% of the dried coating. The compositions of the present invention, when dried, retain the filler in well-dispersed form, resulting in a high effective aspect ratio of the dried coating, and greatly increased reduction in permeability, as illustrated in FIG. 26.

MICROLITE® vermiculite is the preferred filler because of its very high aspect ratio. The vermiculite plates have an average lateral size of between 10 and 30 microns. The plates are largely exfoliated in water, and thus their thickness is 1–2 nm. The aspect ratio of the filler in water dispersion is an average of 10,000–30,000. It is clear that many plates reassemble during the coating and drying process of the present invention, thus reducing the effective aspect ratio achieved in the final coating. However, it is a great advantage to start with as large an aspect ratio as possible.

Although MICROLITE® 963++ vermiculite (W. R. Grace) is preferred, good results may also be achieved with less exfoliated grades of MICROLITE® vermiculite (i.e., grades 963, 923, and 903). Other layered silicates are also useful in the barrier coatings and films of this invention. The effectiveness of other silicates in the barrier coating of this invention depends upon the lateral size of the platelets, the degree of exfoliation in water, and the degree to which they reassemble to form larger particles during the coating and drying process. Examples of other layered silicates include bentonite, vermiculite, montmorillonite, nontronite, beidellite, volkonskoite, hectorite, saponite, laponite, sauconite, magadiite, kenyaite, ledikite and mixtures of the above silicates. The selection and use of other known silicates which have properties similar to those of MICROLITE® vermiculite, as well as sufficiently high aspect ratios, are expected to be obvious to one of skill in the art following the teachings of this invention.

C. Surfactants and Other Additives

Coating mixtures used in the invention, particularly those useful on surfaces and interfaces according to this invention, also preferably contain at least one or more suitable surfactant to reduce surface tension. Surfactants include materials otherwise known as wetting agents, anti-foaming agents, emulsifiers, dispersing agents, leveling agents etc. Surfactants can be anionic, cationic and nonionic, and many surfactants of each type are available commercially. A suitable surfactant for inclusion in these compositions possesses a critical micelle concentration sufficiently low to ensure a dried coating uncompromised by residual surfactant.

Preferably, the surfactant(s) useful in the methods and solutions of this invention are nonionic, particularly useful with a highly charged filler, such as vermiculite. In the event of an unfavorable interaction of the anionic emulsifier present in the butyl latex dispersion [Lord], which is a presently preferred source of the butyl-containing polymer, any additional ionic additives must be kept to a minimum. This variable is eliminated where the surfactant or emulsifier is non-ionic. Increase in ionic concentration of the compositions containing vermiculite, such as by the addition of a base to adjust pH, e.g., LiOH, NH$_4$OH, and NaOH can cause agglomeration of the filler, which adversely affects permeability reduction.

Some embodiments of this invention include at least two surfactants, which include preferably both a wetting agent and an anti-foaming agent. Still other compositions may have additional surfactants to perform additional effects. Desirable surfactants employed in the examples below are the non-ionic siloxane-based, Silwet® L-77 wetting agent [OSI Specialties, Inc.], the BYK®-306 wetting/leveling agent [BYK Chemie], FOAMASTER® VL defoamer (Henkel), and the DC200® anti-foaming agent [Dow Corning], among others. As exemplified below, an antifoaming agent may be predispersed in solution with, e.g., 1-methyl-2-pyrrolidinone (NMP) because some antifoaming agents are not soluble in the barrier coating.

Other suitable surfactants may also be selected. The amount and number of surfactants added to the coating solution or composition will depend on the particular surfactant(s) selected, but should be limited to the minimum amount of surfactant that is necessary to achieve wetting of the substrate while not compromising the performance of the dried coating. For example, typical surfactant amounts can be less than or equal to about 10% by weight of the dried coating.

In another embodiment, thickeners may be used in the coating formulations to adjust viscosity. Such thickeners may include, without limitation, a polyvinyl alcohol (PVOH) terpolymer, e.g., polyvinylbutyral/polyvinylacetate/polyvinylalcohol or a lithium chloride thickener. In one embodiment, the viscosity of the coating mixture can be increased from 4.5 cP to 370 cP with the addition of the PVOH terpolymer to the formulation as illustrated in Examples 14–15. For example, for a coating mixture containing 10% total solids with 2% MICROLITE® vermiculite formulation, a thickener such as PVOH terpolymer can be added in an amount of between about 3% to about 5.5% by weight. Desirably the thickener is added in an amount of greater than 3.5% by weight. A preferred range of thickener is between about 5 and 5.5% by weight.

It has been noted that greater than 5.5% by weight of PVOH terpolymer thickener can cause agglomeration of the filler platelets. As another example, the viscosity of the coating mixture can also be increased with the addition of lithium chloride as a thickener to the coating mixture, (See e.g., Example 16). For example, for a coating mixture containing 10% total solids with 2% MICROLITE®, the thickener is employed in an amount between about 3% to about 5% by weight. Desirably greater than 4% thickener is employed, and more desirably 5% thickener is employed. Greater than 5% by weight of the lithium chloride thickener produces poor barrier properties. One of skill in the art would readily determine and adjust the type and amounts of thickener depending on the type and amount of filler employed in the coating mixture based on the teachings contained herein.

Still other optional components of the barrier coating are components which effect curing of the coating. For example, one type of cure "package" contains about 10 to about 30% by weight zinc oxide, about 5 to about 20% by weight sulfur, about 30 to about 60% by weight water, about 0.1 to about 10% of a dispersing agent, about 5 to about 20% of zinc dibutyidithio-carbamate and about 1 to about 10% zinc 2-mercaptobenzothiazole. The amount of cure package added to the coating mixture is based on the amount of butyl rubber in the coating mixture.

In one embodiment, greater than 10 parts dried cure package is added per 100 parts butyl rubber in the coating mixture. A desirable amount of dried cure package is about 15 parts cure package per 100 parts butyl rubber in the mixture. One of skill in the art can readily design a cure "package" to enhance the curing of a butyl latex barrier coating mixture of this invention, and select a desirable amount to be added to the coating mixture, based on the teachings of this specification combined with the knowledge of the art. See, e.g., U.S. Pat. No. 4,344,859.

D. The Carrier Liquid

The coating mixtures of this invention are present in a suitable carrier liquid. Carriers which are suitable for use in the composition of this invention include, without limitation, water and solvents such as hexane, heptane, toluene, 1 methyl-2-pyrrolidinone, cyclohexanone, ethanol, methanol, and other hydrocarbons. Combinations of water with an organic carrier may also be used as the carrier liquid. Selection of a suitable organic solvent carrier is within the skill of the art.

E. Specific Embodiments of Barrier Mixtures

One example of a barrier coating mixture useful for application to substrates such as a fabric portion of an airbag and in particular a side curtain airbag according to this invention comprises coating formed by a barrier coating mixture comprising in a carrier liquid: (a) an elastomeric polymer; (b) a dispersed exfoliated layered platelet filler preferably having an aspect ratio greater than 25; and optionally (c) at least one surfactant. The elements are selected so that the solids content of the mixture is less than about 30% and the ratio of the polymer to the filler is preferably between about 20:1 and about 1:1. These barrier coating mixtures result in films with reductions in permeability of 5 times to 2300 times relative to the unfilled polymer. These results are substantially higher than the prior art on other platelet filled barrier coatings or any airbag coatings.

Another barrier coating mixture which is desirable for application to a fabric portion of an airbag according to this invention includes the following components in a carrier liquid, (a) a butyl-containing polymer latex; (b) a dispersed exfoliated layered vermiculite filler preferably having an aspect ratio about 1000 or greater; and optionally (c) at least one surfactant. The components are selected such that the solids content of the mixture is less than abut 17% and the ratio of the polymer to the filler is between about 20:1 and about 1:1.

In a preferred embodiment, the coating mixtures described above have solids contents of between about 5% to about 15% by weight, and form dried coatings on the airbag surface that comprise between about 45% to about 95% by weight of the polymer, between about 5% to about 55% by weight of the filler, and between about 1.0% to about 10% by weight of the surfactant(s). The dried coatings of the mixtures described above, contain fillers which preferably exhibit an effective aspect ratio of greater than about 25, reduces the gas, vapor or chemical permeability greater than 5-fold that of the dried, unfilled polymer alone. Preferably, the effective aspect ratio of the dried coatings is greater than about 50, and even greater than about 100.

One preferred coating mixture useful in this invention has a solids contents of between about 5% to about 15% by weight and the dried coating comprises between about 65% to about 90% by weight of a butyl-containing polymer latex, between about 10% to about 35% by weight of a vermiculite filler, between about 0.1% to about 0.10% by weight an anti-foaming agent as surfactant, with the total surfactant weight percent up to about 15%. As described in examples below, the selected polymer is the elastomer butyl rubber or butyl latex, e.g., Lords BL-100 butyl latex in a 62% by weight aqueous butyl latex solution [Lord Corporation]. Additional preferred barrier coating mixtures useful in this invention may be prepared by methods described in detail in Examples 1–12 and 14–16.

III. The Coated Article

Once prepared as described in detail in the Examples below, the coating mixtures may be applied to a portion of fabric which will be incorporated into or sewn to form an airbag of a vehicle, to reduce the permeability of the fabric to gas, vapor (moisture) or chemicals. The dried coating, in which the filler exhibits an effective aspect ratio of greater than about 25, reduces the gas, vapor or chemical permeability greater than 5-fold that of the dried, unfilled polymer alone. In the dried coating, more preferably, the polymer is present in the mixture when dried at a weight percent of at least about 45%. The filler is preferably present in the mixture when dried at greater than about 5% by weight. These barrier films achieve reductions in permeability of 5 times to 2300 times relative to the unfilled polymer. These results are substantially higher than the prior art on other platelet filled elastomers.

Preferably, the effective aspect ratio of the dried coating is greater than about 50, and even greater than about 100. As indicated in Examples 1–12, reductions in permeability attributed to compositions of this invention can range from approximately 5 times to 2300 times that of unfilled polymer alone.

The coating compositions used in the invention may be applied on the inside of the fabric, i.e., on a portion of the fabric which, once the airbag is formed, will face the interior gas-receiving compartment of the airbag. The coating is applied by standard techniques, with spray coating and dip coating likely to be the most effective.

The present invention substantially reduces the weight of a side curtain airbag, for example, by providing equivalent sealing of the fabric thereby reducing the flow of the inflation gas through the material using substantially less sealing material. Typically, the weight of the sealant is reduced by a factor of five or more. However, much of the leakage occurs through the seams and sealing the fabric will not reduce this leakage. Most side curtain airbags are currently sealed at the edges by sewing or interweaving where the entire airbag is woven at once. In the first case, the sewing threads make holes in the fabric and serve as a path for gas leakage. In the second case, interweaving results in a leakage path since when the airbag is pressurized the stresses in the seams separate the threads at the joints again creating leakage paths. A preferred method is to heat or adhesive seal the pieces of fabric together and to do so over an extended seam width thereby eliminating the leakage paths. Since such seals are often weaker than a sewn or woven seam, careful attention must be given to the design of the airbag chambers to prevent stress concentrations in the seams. This frequently requires a finite analysis and redesign of the individual chambers in order to eliminate such stress concentrations.

The airbag may be formed completely by interweaving, heat sealing or sewing of the layers before the barrier coating is applied. Currently, airbags are often formed this way but without a barrier coating. In general, any known technique for manufacturing an airbag can be applied to make an airbag in accordance with the invention, i.e., an airbag made of one or more substrates and a barrier coating.

A selected barrier coating mixture, such as those described above may be applied to a surface or interface of a fabric section to be incorporated into an airbag to accomplish a variety of purposes in the airbag manufacturing industries to reduce the permeability of the airbag to gas, vapor or chemicals.

IV. Methods of Coating a Substrate or Forming a Film

The fabric sections to be coated by the compositions of the invention may be previously untreated or may have a variety of pre-treatments to their surfaces. For example, the fabric sections may have on at least one side a heat seal layer. Such heat seal layers may be made of an ethylene-propylene copolymer or ethylene-propylene- butylene terpolymer. Thus, the coating solution is applied on the surface of the heat seal layer. Alternatively, the fabric sections may comprise a protective topcoat layer, such as polyurethane or Teflon®-type materials [DuPont] for abrasion resistance, etc. Such topcoats may be selected by one of skill in the art. The coatings of this invention may be applied over or under the topcoat layer.

Alternatively, the article may be cured prior to application of the coating, or it may be cured following application of the coating on the appropriate surface.

To form the coated article of this invention, the application of the selected barrier coating mixture may be accomplished by techniques including, without limitation, roller transfer or paint coating, spray coating, brush coating and dip coating. Roll coating techniques include, but are not limited to, rod, reverse roll, forward roll, air knife, knife over roll, blade, gravure and slot die coating methods. General descriptions of these types of coating methods may be found in texts, such as Modern Coating and Drying Techniques, (E. Cohen and E. Gutoff, eds; VCH Publishers) New York (1992) and Web Processing and Converting Technology and Equipment, (D. Satas, ed; Van Nostrand Reinhold) New York (1984). Three dimensional articles may preferably be coated by the techniques which include, but are not limited to, spray coating or dip coating. The method of application is not a limitation on the present invention, but may be selected from among these and other well-known methods by the person of skill in the art. However, the coating must be applied so that drying takes place on the substrate and not in the air (i.e. powder coating). If drying takes place during spraying or other means of application, agglomeration may occur.

The coating mixtures may be applied to a fabric substrate, such as an exterior or interior surface, an interface, or component of the airbag, at any desired thickness. Thus, for example, the coating mixtures of the present invention may be applied to the surface of fabric sections by the methods described above to form a dried coating of a thickness between about 0.1 (m to about 100 (m of dry coating. Such adjustments to thickness are well within the skill of the art [see, e.g., Canadian Patent No. 993,738].

After coating, the coated airbag, may be dried at a selected temperature, e.g., room temperature or greater than room temperature. The selection of the drying temperature, relative humidity, and convective air flow rates depends on the desired time for drying; that is, reduced drying times may be achieved at elevated air temperatures, lower relative humidity and higher rates of air circulation over the drying coating surface. After drying, the exfoliated silicate filler particles are oriented within the elastomeric latex (solution, emulsion, etc.) to a high degree parallel to each other and to the airbag substrate surface. One of skill in the art can readily adjust the drying conditions as desired. The performance of the dried barrier coating is insensitive to drying temperatures over the range 25–160° C.

The dried coatings exhibit a surprising reduction in permeability compared to the prior art and particularly compared to unfilled polymers.

The dried coating preferably maintains its low permeability after repeated mechanical loading and elongation up to about 10% of the airbag. The evaluation of the coating integrity after exposure to repeated loading and elongation was examined as described below in Example 17.

The coatings and methods of the present invention described above may be applied to the manufacture or repair of airbags to improve air or gas retention. The barrier coatings may allow reduced mass, reduced gas permeability resulting in better air retention, reduced thermo-oxidative degradation, and enhanced wear and elongation of the useful life of the article.

Referring now to FIGS. 33, 34, 35A and 35B, an airbag module in accordance with the invention is designated generally as 510 and comprises a module housing 511 in which an airbag 512 is folded. The housing 511 may be arranged in any vehicle structure and includes a deployment door 513 to enable the airbag to deploy to protect the occupants of the vehicle from injury. Thus, as shown, the housing 511 may be mounted in the ceiling 514 of the vehicle passenger compartment 515 to deploy downward in the direction of arrow A as a side curtain airbag to protect the occupants during the crash.

Figure 35A:
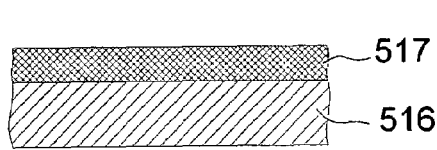
FIG. 35A is a cross-sectional view taken along the line 35-35 in FIG. 34.

As shown in FIG. 35A, one embodiment of the airbag 512 comprises a substrate 516 and a barrier coating 517 formed on the substrate 516, either on the inner surface which will come into contact with the inflation fluid or on an outer surface so that the barrier coating 517 will come into contact only with inflation fluid passing through the substrate 516. The airbag 512 may be formed with any of the barrier coatings described herein. In one embodiment, a flat sheet of the substrate 516 would be coated with the barrier coating 517 and then cut to form airbags having an edge defining an entry opening for enabling the inflation of the airbag. The edge 518 of the airbag 512 would then be connected, e.g., by sealing, to a part 519 of the housing 511 which defines a passage through which the inflation fluid can flow into the interior of the airbag 512 (see FIG. 34). The inflation fluid may be generated by an inflator 520 possibly arranged in the module housing 511.

Figure 35B:
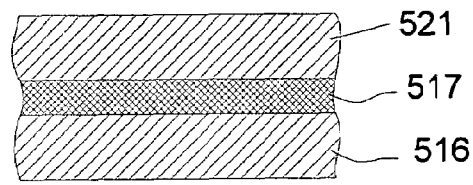
FIG. 35B is another cross-sectional view taken along the line 35-35 in FIG. 34.

In the embodiment shown in FIG. 35B, the barrier coating 517 is placed between two substrates 516, 521. Any number of substrates and barrier coatings can be used in the invention. Also, the number of substrates and barrier coatings can be varied within a single airbag to provide additional substrates and/or barrier coatings for high stresses areas.

Figure 36:
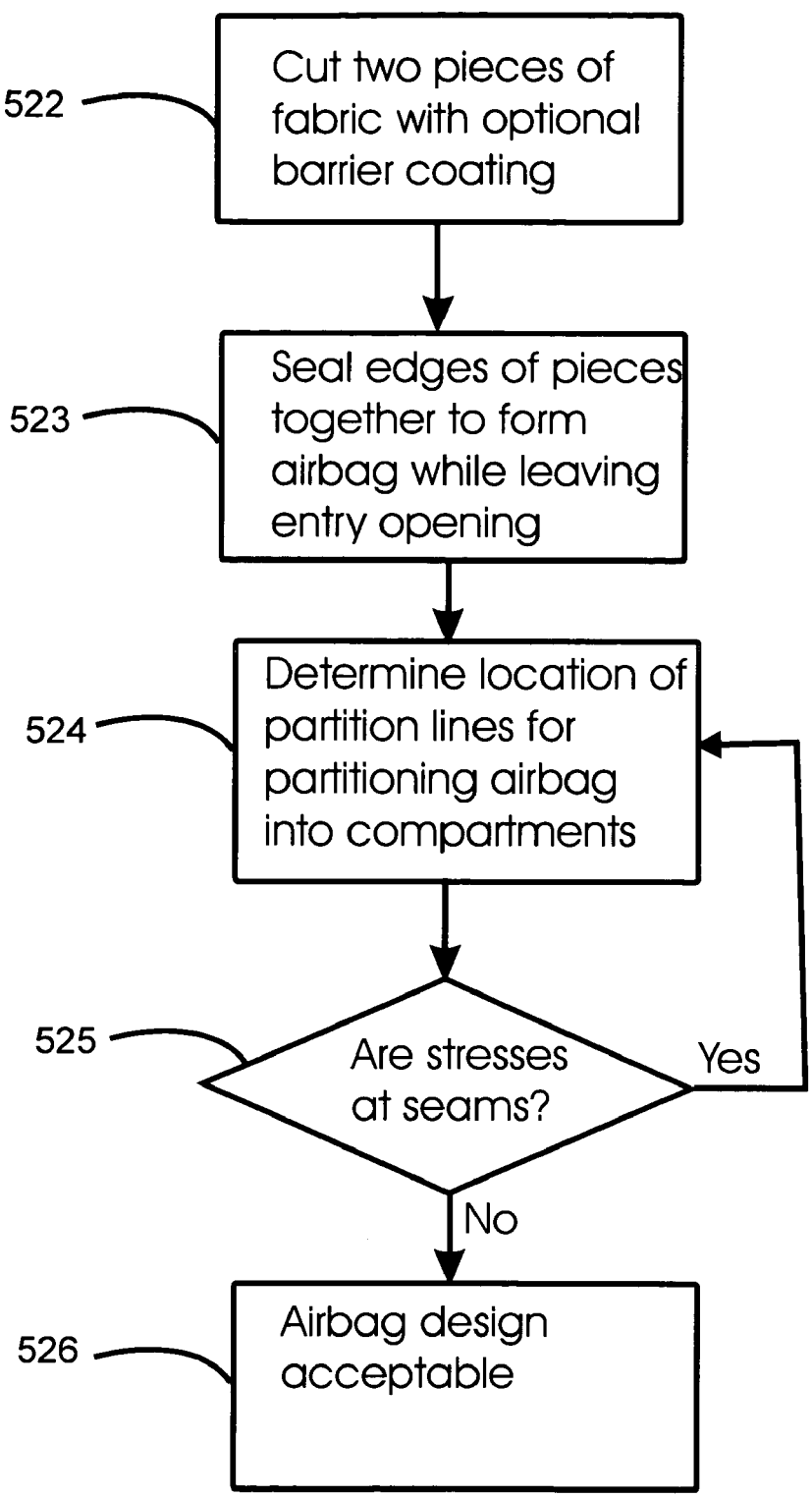
FIG. 36 is a flow chart of a method for designing a side curtain airbag in accordance with the invention.

Referring now to FIG. 36, a method for designing a side curtain airbag in accordance with the invention will now be described. It is a problem with side curtain airbags that since they are usually formed of two pieces of material, the manner of connecting the pieces of material results in leakage at the seams.

To avoid this problem, in the invention, two pieces of material, for example, a piece of fabric with a barrier coating as described herein, are cut (step 522) and edges of the two pieces are sealed together to form an airbag while leaving open an entry opening for inflation fluid (step 523). The location of partition lines for partitioning the airbag into a plurality of compartments, e.g., a plurality of parallel compartment each of which is receivable of inflation fluid and adapted to extend vertically along the side of the vehicle, is determined (step 524) and it is determined whether the stresses are at the seams (step 525). If not, the design is acceptable (step 526). Otherwise, the airbag is re-designed until stresses are not created at the seams during inflation or a minimum of stress is created at the seams during inflation. The determination of the location of the partition lines may involve analysis of the airbag using finite element theory.

The invention is illustrated by the following examples, which are not intended to limit the scope of this invention.

EXAMPLE 1

Barrier Coating

An aqueous elastomeric barrier coating solution according to this invention is prepared as follows, in which the elastomer is butyl latex (MW=600,000) and the filler is MICROLITE® dispersed mica.

In a 50 mL beaker, 0.7 g BYK®-306 wetting agent (a polyether modified dimethyl polysiloxane copolymer) [BYK Chemie], 4.4 g 1N NH40H and 20.5 g distilled water are stirred into solution on a stir plate with a stir bar. 18.9 g Lord® BL-100 butyl latex in a 62% by weight aqueous butyl latex solution [Lord Corporation] is placed in a glass jar, and the solution is slowly added to the butyl latex with stirring. The resulting solution is Solution A.

In a 10 mL beaker, a premix to disperse the antifoaming agent in a water soluble solvent is made by mixing 0.125 g of solvent 0.04% by weight 1-methyl-2-pyrrolidinone (NMP) solution and DC 200 Fluid®, 1000 cs [Dow Corning] and 1.5 g 1N NH4OH. This solution is added with stirring with a stir bar on a stir plate to a separate 100 mL beaker containing 17.3 g MICROLITE® 963++ dispersed mica in a 7.5% by weight aqueous solution [W. R. Grace]. Distilled water (36.3 g) is added to the resulting solution, which is referred to as Solution B.

Solution B is slowly added into stirred Solution A with maximum stirring on the stir plate. High shear stirring is not used. The resulting dispersion at room temperature is ready for application, e.g., spray-coating, onto a plastic or rubber substrate. The coating mixture has a 13.7% solids in water content.

After this coating solution is applied to a polypropylene film substrate and allowed to dry, the coating contains 85.4% by weight butyl rubber, 9.5% by weight filler, 5.1% BYK wetting agent, and 0.0003% by weight DC200 anti-foaming agent (a linear polydimethylsiloxane polymer) [Dow Corning].

The oxygen transmission rate (OTR) is measured using a MOCON® OX-TRAN 2/20 module. The OTR is 239.6 cc/m2 day@ 1 atmosphere, 0% RH, 23° C. Permeability of the composition is 5.2 cc mm/m2 day atmosphere @ 0% RH, 23° C. The reduction in permeability of this coating is 18.1 times the reduction in permeability of the unfilled butyl latex.

EXAMPLE 2

Barrier Coating

Another aqueous elastomeric barrier coating solution according to this invention is prepared as follows, in which the elastomer is butyl latex (MW=600,000) and the filler is MICROLITE® dispersed mica at 5% by weight.

In a 50 mL beaker, 0.5 g BYK® (BYK Chemie), 5.3 g 1N NH4OH and 16 g distilled water are weighed and mixed and the resulting solution stirred on a stir plate with a stir bar. In a 2 oz glass jar, 23 g of Lord® BL-100 Butyl Latex (62% butyl latex solution, Lord Corporation) is weighed. Slowly the solution in the 50 mL beaker is added into the butyl latex solution while manually stirring. This is Solution A, which is then set aside without stirring.

In a 10 mL beaker, 0.125 g of 0.04% NMP solution, DC 200® Fluid, 1000 cs (Dow Corning) and 1.5 g 1N NH4OH are mixed together. In a separate 100 mL beaker 10 g of MICROLITE® 963++ filler (7.5% solution, W. R. Grace) is weighed. The solution from the 10 mL beaker is added into the MICROLITE® filler while stirring with a stir bar on a stir plate. 43.4 g of distilled water is added to the resulting Solution B in the 100 mL beaker.

Solution A is then stirred, and Solution B is slowly added into Solution A with maximum stirring on the stir plate (not high shear stirring). The resulting mixture has 15.5% solids in water.

After this coating solution is applied to a polypropylene film substrate and allowed to dry, the coating contains 92.0% by weight butyl latex, 4.8% MICROLITE® filler, 3.2% BYK 306 surfactant and 0.0003% DC200 surfactant. The oxygen transmission rate (OTR) is measured using a MOCON® OX-TRAN 2/20 module. The OTR is 284.6 cc/m2 day @1 atmosphere, 0% RH, 23° C. Permeability of the composition is 14.2 cc mm/m2 day atmosphere @ 0% RH, 23° C. The reduction in permeability of this coating is 6.6 times the reduction in permeability of the unfilled butyl latex.

EXAMPLE 3

Barrier Coating

Yet another aqueous elastomeric barrier coating solution according to this invention is prepared as follows, in which the elastomer is butyl latex (MW=600,000) and the filler is MICROLITE® dispersed mica at 15% by weight.

Solution A: In a 50 mL beaker, 0.32 g BYK®-306 (BYK Chemie), 3.5 g 1N NH4OH and 26.1 g distilled water are mixed. The resulting solution is stirred on a stir plate with a stir bar. In a 2 oz glass jar, 15.1 g of Lord® BL-100 Butyl Latex (62% butyl latex solution, Lord Corporation) is weighed out. Slowly the solution in the 50 mL beaker is added into the butyl latex solution while manually stirring. The resulting Solution A is set aside without stirring.

Solution B: In a 10 mL beaker 0.04 g of 0.04% NMP solution with DC 200® Fluid, 1000 cs (Dow Corning) and 1.5 g 1N NH4OH are mixed. In a separate 100 mL beaker 22.0 g of MICROLITE® filler is weighed, while stirring with a stir bar on a stir plate. Distilled water (31.5 g) is added to the resulting solution in the 100 mL beaker.

Solution A is stirred and Solution B is slowly added into Solution A with maximum stirring on the stir plate (without high shear stirring). The resulting mixture has 11.3% solids in water content.

After this coating solution is applied to a polypropylene film substrate and allowed to dry, the coating contains 82.6% by weight butyl rubber, 14.6% by weight MICROLITE® filler, 2.8% by weight BYK 306 surfactant and 0.00014% by weight DC200 surfactant.

The oxygen transmission rate (OTR) is measured using a MOCON® OX-TRAN 2/20 module. The OTR is 102.6 cc/m2 day @ 1 atmosphere, 0% RH, 23° C. Permeability of the composition is 2.99 cc mm/m2 day atmosphere @ 0% RH, 23° C. The film which results from this dried coating mixture provides a reduction in permeability of 31.4 times that of the unfilled polymer.

EXAMPLE 4

Barrier Coating

Yet another aqueous elastomeric barrier coating solution according to this invention is prepared as follows, in which the elastomer is butyl latex (MW=600,000) and the filler is MICROLITE® dispersed mica at 20% by weight.

Solution A: In a 50 mL beaker, 0.5 g BYK®-306 (BYK Chemie), 3.0 g 1N NH4OH and 28.6 g distilled water are added and the resulting solution stirred on a stir plate with a stir bar. In a 2 oz glass jar, 12.9 g of Lord® BL-100 Butyl Latex (62% butyl latex solution, Lord Corporation) is weighed out. Slowly the solution in the 50 mL beaker is added into the butyl latex solution while manually stirring. This Solution A is set aside without stirring.

Solution B: In a 10 mL beaker, 0.0625 g of 0.04% NMP solution of DC200® Fluid, 1000 cs (Dow Corning) and 1.5 g 1N NH4OH are mixed together. In a separate 100 mL beaker 26.7 g of MICROLITE® 963++ filler (7.5% solution, W. R. Grace) is weighed out. The solution from the 10 mL beaker is added into the MICROLITE® filler while stirring with a stir bar on a stir plate. 26.8 g of distilled water is added to the resulting solution in the 100 mL beaker.

Solution A is stirred and Solution B is slowly added to it with maximum stirring on the stir plate without high shear stirring. The resulting coating mixture contains 10.5% solids in water.

After this coating solution is applied to a polypropylene film substrate and allowed to dry, the coating contains 76.2% by weight butyl rubber, 19.1% by weight MICROLITE® filler, 4.7% BYK 306 surfactant, and 0.00024% DC200 surfactant. The oxygen transmission rate (OTR) is measured using a MOCON® OX-TRAN 2/20 module. The OTR is 89.4 cc/m2 day @ 1 atmosphere, 0% RH, 23° C. Permeability of the composition is 2.04 cc mm/m2 day atmosphere @ 0% RH, 23° C. The film which results from this dried coating mixture provides a reduction in permeability of 46.1 times that of the unfilled polymer.

EXAMPLE 5

Barrier Coating

Yet another aqueous elastomeric barrier coating solution according to this invention is prepared as follows, in which the elastomer is butyl latex (MW=600,000) and the filler is MICROLITE® dispersed mica at 25% by weight.

Solution A: In a 50 mL beaker, 0.5 g BYK®-306 (BYK Chemie), 2.5 g 1N NH4OH and 31.1 g distilled water are added and the resulting solution stirred on a stir plate with a stir bar. In a 2 oz glass jar, 10.9 g of Lord® BL-100 Butyl Latex (62% butyl latex solution, Lord Corporation) is weighed out. Slowly, the solution in the 50 mL beaker is added into the butyl latex solution while manually stirring. This Solution A is set aside without stirring.

Solution B: In a 10 mL beaker, 0.0625 g of 0.04% NMP solution of DC200 Fluid, 1000 cs (Dow Corning) and 1.5 g 1N NH4OH are mixed together. In a separate 100 mL beaker 30.0 g of MICROLITE® 963++ filler (7.5% solution, W. R. Grace) is weighed out. The solution from the 10 mL beaker is added into the MICROLITE® filler while stirring with a stir bar on a stir plate. 23.5 g of distilled water is added to the resulting solution in the 100 mL beaker.

Solution A is stirred and Solution B is slowly added to it with maximum stirring on the stir plate without high shear stirring. The resulting coating mixture contains 9.5% solids in water. After this coating solution is applied to a polypropylene film substrate and allowed to dry, the coating contains 70.9% by weight butyl rubber, 23.8% by weight MICROLITE® filler, 5.3% BYK 306 surfactant, and 0.00026% DC200 surfactant.

The oxygen transmission rate (OTR) is measured using a MOCON® OXTRAN 2/20 module. The OTR is 40.2 cc/m2 day@ 1 atmosphere, 0% RH, 23° C. Permeability of the composition is 1.0 cc mm/m2 day atmosphere @ 0% RH, 23° C. The film which results from this dried coating mixture provides a reduction in permeability of 88.3 times that of the unfilled polymer.

EXAMPLE 6

Barrier Coating

Yet another aqueous elastomeric barrier coating solution according to this invention is prepared as follows, in which the elastomer is butyl latex (MW=600,000) and the filler is MICROLITE® dispersed mica at 30% by weight.

Solution A: In a 50 mL beaker, 0.5 g BYK®-306 (BYK Chemie), 2.5 g 1N NH4OH and 31.3 g distilled water are added and the resulting solution stirred on a stir plate with a stir bar. In a 2 oz glass jar, 10.7 g of Lord® BL-100 Butyl Latex (62% butyl latex solution, Lord Corporation) is weighed out. Slowly the solution in the 50 mL beaker is added into the butyl latex solution while manually stirring. This Solution A is set aside without stirring.

Solution B: In a 10 mL beaker, 0.0625 g of 0.04% NMP solution of DC200 Fluid, 1000 cs (Dow Corning) and 1.5 g 1N NH4OH are mixed together. In a separate 100 mL beaker 38.0 g of MICROLITE® 963++ filler (7.5% solution, W. R. Grace) is weighed out. The solution from the 10 mL beaker is added into the MICROLITE® filler while stirring with a stir bar on a stir plate. 15.5 g of distilled water is added to the resulting solution in the 100 mL beaker.

Solution A is stirred and Solution B is slowly added to it with maximum stirring on the stir plate without high shear stirring. The resulting coating mixture contains 10% solids in water.

After this coating solution is applied to a polypropylene film substrate and allowed to dry, the coating contains 66.3% by weight butyl rubber, 28.7% by weight MICROLITE® filler, 5.0% BYK 306 surfactant, and 0.00025% DC200 surfactant.

The oxygen transmission rate (OTR) is measured using a MOCON® OX-TRAN 2/20 module. The OTR is 32.6 cc/m2 day @ 1 atmosphere, 0% RH, 23° C. Permeability of the composition is 0.55 cc mm/m2 day atmosphere @ 0% RH, 23° C. The film which results from this dried coating mixture provides a reduction in permeability of 110.6 times that of the unfilled polymer.

EXAMPLE 7

Barrier Coating

Yet another aqueous elastomeric barrier coating solution according to this invention is prepared as follows, in which the elastomer is butyl latex (MW=600,000) and the filler is MICROLITE® dispersed mica at 35% by weight.

Solution A: In a 50 mL beaker, 0.5 g BYK®D-306 (BYK Chemie), 1.16 g 1N NH4OH and 35.0 g distilled water are added and the resulting solution stirred on a stir plate with a stir bar. In a 2 oz glass jar, 8.4 g of Lord® BL- 100 Butyl Latex (62% butyl latex solution, Lord Corporation) is weighed out. Slowly the solution in the 50 mL beaker is added into the butyl latex solution while manually stirring. This Solution A is set aside without stirring.

Solution B: In a 10 mL beaker, 0.125 g of 0.04% NMP solution of DC200® Fluid, 1000 cs (Dow Corning) and 1.5 g 1N NH4OH are mixed together. In a separate 100 mL beaker 37.3 g of MICROLITE® 0963++ filler (7.5% solution, W. R. Grace) is weighed out. The solution from the 10 mL beaker is added into the MICROLITE® filler while stirring with a stir bar on a stir plate. 16.5 g of distilled water is added to the resulting solution in the 100 mL beaker.

Solution A is stirred and Solution B is slowly added to it with maximum stirring on the stir plate without high shear stirring. The resulting coating mixture contains 8.5% solids in water.

After this coating solution is applied to a polypropylene film substrate and allowed to dry, the coating contains 61.2% by weight butyl rubber, 32.9% by weight MICROLITE® filler, 5.9% BYK 306 surfactant, and 0.00059% DC200 surfactant.

The oxygen transmission rate (OTR) is measured using a MOCON® OX-TRAN 2/20 module. The OTR is 26.8 cc/M2 day @ 1 atmosphere @ 0% RH, 23° C. Permeability of the composition is 0.55 cc mm/m2 day atmosphere @ 0% RH, 23° C. The film which results from this dried coating mixture provides a reduction in permeability of 171 times that of the unfilled polymer.

EXAMPLE 8

Barrier Coating

Yet another aqueous elastomeric barrier coating solution for use in the invention is prepared as follows, in which the elastomer is butyl latex (MW=600,000) and the filler is MICROLITE® dispersed mica at 18.7% by weight.

Solution A: In a 500 mL beaker, 7.0 g BYK®-306 (BYK Chemie), 17.9 g 1N NH4OH and 296.1 g distilled water are added and the resulting solution stirred on a stir plate with a stir bar. In a 16 oz. glass jar, 129 g of Lord® BL-100 Butyl Latex (62% butyl latex solution, Lord Corporation) is weighed out. Slowly the solution in the 500 mL beaker is added into the butyl latex solution while manually stirring. This Solution A is set aside without stirring.

Solution B: In a 100 mL beaker, 1.25 g of 0.04% NMP solution of DC200® Fluid, 1000 cs (Dow Corning) and 8 g 1N NH4OH are mixed together. In a separate 1000 mL beaker 266.7 g of MICROLITE® 963++ filler (7.5% solution, W. R. Grace) is weighed out. The solution from the 100 mL beaker is added into the MICROLITE® filler while stirring with a stir bar on a stir plate. 274 g of distilled water is added to the resulting solution in the 1000 mL beaker.

Solution A is stirred and Solution B is slowly added to it with maximum stirring on the stir plate without high shear stirring. The resulting coating mixture contains 8.5% solids in water.

After this coating solution is applied to a polypropylene film substrate and allowed to dry, the coating contains 74.8% by weight butyl rubber, 18.7% by weight MICROLITE® filler, 6.5% BYK 306 surfactant, and 0.00047% DC200 surfactant.

The oxygen transmission rate (OTR) is measured using a MOCON® OX-TRAN 2/20 module. The OTR is 123.2 cc/m2 day @ 1 atmosphere @ 0% RH, 23° C. Permeability of the composition is 2.96 cc mm/m2 day atmosphere @ 0% RH, 23° C. The film which results from this dried coating mixture provides a reduction in permeability of 31.6 times that of the unfilled polymer.

EXAMPLE 9

Barrier Coating Compositions Which Vary % MICROLITE® Vermiculite with % Solids

A. 16.0% Solids in Water: 95% butyl latex, 5% MICROLITE® filler

Part A: In a 4 oz glass jar, 24.7 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 3.4 g of 1N NH4OH and 16.8 g distilled water are mixed into solution, and the solution in the 30 mL beaker is slowly added into the butyl latex solution while stirring slowly.

Part B: In a 50 mL beaker, 44.0 g distilled water and 0.32 g 1N NH4OH are mixed. In a separate 100 mL beaker 10.7 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (21.5 microns) is formed on polypropylene from the above coating solution. The film results in an OTR of 386.1 cc/m2 day @ 1 atm, 23° C., 0% RH, and a permeability of 15.3 cc mmrn/m2 day atm @ 23° C., 0% RH, which results in a reduction in permeability of 6.2 times. The butyl/filler ratio equals 19.0:1.

B. 15.0% Solids in Water: 90% butyl latex, 10% MICROLITE® filler

Part A: In a 4 oz glass jar, 21.9 g of Lords BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 3.1 g of 1N $NH_4OH$ and 19.9 g distilled water are mixed into solution, and the solution in the 30 mL beaker is slowly added into the butyl latex solution while stirring slowly.

Part B: In a 50 mL beaker, 34.4 g distilled water and 0.6 g 1N NH$_4$OH are mixed. In a separate 100 mL beaker 20.0 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (22 microns) is formed on polypropylene from the above coating solution. The film results in an OTR of 166.5 cc/m$^2$ day @ 1 atm, 23° C., 0% RH, and a permeability of 4.57 cc mm/m$^2$ day atm @ 23° C., 0% RH, which results in a reduction in permeability of 20.7 times. The butyl/filler ratio equals 9.0:1.

C. 12.0% Solids in Water: 85% Butyl Latex, 15% MICROLITE® Filler

Part A: In a 4 oz glass jar, 16.5 g of Lordg BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 2.3 g of 1N NH$_4$OH and 26.1 g distilled water are mixed into solution, and the solution in the 30 mL beaker is slowly added into the butyl latex solution while stirring slowly.

Part B: In a 50 mL beaker, 30.3 g distilled water and 0.7 g 1N NH$_4$OH are mixed. In a separate 100 mL beaker 24.0 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (16.75 microns) is formed on polypropylene from the above coating solution. The film results in an OTR of 108.1 cc/m$^2$ day @1 atm, 23° C., 0% RH, and a permeability of 2.08 cc mm/m$^2$ day atm @ 23° C., 0% RH, which results in a reduction in permeability of 45.4×. The butyUfiller ratio equals 5.65:1.

D. 10.0% Solids in Water: 80% Butyl Latex, 20% MICROLITE® Filler

Part A: In a 4 oz glass jar, 13.0 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.8 g of 1N NH$_4$OH and 30.1 g distilled water are mixed into solution, and the solution in the 30 mL beaker is slowly added into the butyl latex solution while stirring slowly.

Part B: In a 50 mL beaker, 27.5 g distilled water and 0.8 g 1N NH$_4$OH are mixed. In a separate 100 mL beaker 26.7 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (16.25 microns) is formed on polypropylene from the above coating solution. The film results in an OTR of 56.3 cc/m$^2$ day @ 1 atm, 23° C., 0% RH, and a permeability of 0.9 cc mm/m$^2$ day atm @ 23° C., 0% RH, which results in a reduction in permeability of 104.9 times. The butyl/filler ratio equals 4.00:1.

E. 9.0% Solids in Water: 75% Butyl Latex, 25% MICROLITE® Filler

Part A: In a 4 oz glass jar, 11.0 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.5 g of 1N NH4OH and 32.4 g distilled water are mixed into solution, and the solution in the 30 mL beaker is slowly added into the butyl latex solution while stirring slowly.

Part B: In a 50 mL beaker, 24.1 g distilled water and 0.9 g 1N NH$_4$OH are mixed. In a separate 100 mL beaker 30 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (12.0 microns) is formed on polypropylene from the above coating solution. The film results in an OTR of 37.5 cc/m$^2$ day @ 1 atm, 23° C., 0% RH, and a permeability of 0.47 cc mm/m$^2$ day atm @ 23° C., 0% RH, which results in a reduction in permeability of 200.9 times. The butyl/filler ratio equals 3.00:1.

F. 8.0% Solids in Water: 70% Butyl Latex, 30% MICROLITE® Filler

Part A: In a 4 oz glass jar, 9.1 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.3 g of 1N NH$_4$OH and 34.5 g distilled water are mixed into solution, and the solution in the 30 mL beaker is slowly added into the butyl latex solution while stirring slowly.

Part B: In a 50 mL beaker, 22.0 g distilled water and 1.0 g 1N NH$_4$OH are mixed. In a separate 100 mL beaker 32 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (15.8 microns) is formed on polypropylene from the above coating solution. The film results in an OTR of 15.7 cc/m$^2$ day @ 1 atm, 23° C., 0% RH, and a permeability of 0.25 cc mm/M$^2$ day atm @ 23° C., 0% RH, which results in a reduction in permeability of 377.6 times. The butyl/filler ratio equals 2.34:1.

G. 7.5% Solids in Water: 65% Butyl Latex, 35% MICROLITE® Filler

Part A: In a 4 oz glass jar, 7.9 g of Lords BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.1 g of 1N NH$_4$OH and 35.9 g distilled water are mixed into solution, and the solution in the 30 mL beaker is slowly added into the butyl latex solution while stirring slowly.

Part B: In a 50 mL beaker, 19.0 g distilled water and 1.0 g 1N NH$_4$OH are mixed. In a separate 100 mL beaker 35 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (11.6 microns) is formed on polypropylene from the above coating solution. The film results in an OTR of 16.8 cc/m² day @ 1 atm, 23° C., 0% RH, and a permeability of 0.20 cc mm/m² day atm @ 23° C., 0% RH, which results in a reduction in permeability of 472.0 times. The butyl/filler ratio equals 1.85:1.

H. 6.0% Solids in Water: 60% Butyl Latex, 40% MICROLITE® Filler

Part A: In a 4 oz glass jar, 5.8 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 0.8 g of 1N $NH_4OH$ and 38.3 g distilled water are mixed into solution, and the solution in the 30 mL beaker is slowly added into the butyl latex solution while stirring slowly.

Part B: In a 50 mL beaker, 22.0 g distilled water and 1.0 g 1N $NH_4OH$ are mixed. In a separate 100 mL beaker 32 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (4.0 microns) is formed on polypropylene from the above coating solution. The film results in an OTR of 21.5 cc/M² day @1 atm, 23° C., 0% RH, and a permeability of 0.081 cc mm/m² day atm @ 23° C., 0% RH, which results in a reduction in permeability of 1165.4 times. The butyl/filler ratio equals 1.49:1.

I. 5.5% Solids in Water: 55% Butyl Latex, 45% MICROLITE® Filler

Part A: In a 4 oz glass jar, 4.9 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 0.7 g of 1N $NH_4OH$ and 39.3 g distilled water are mixed into solution, and the solution in the 30 mL beaker is slowly added into the butyl latex solution while stirring slowly.

Part B: In a 50 mL beaker, 21.0 g distilled water and 1.0 g 1N $NH_4OH$ are mixed. In a separate 100 mL beaker 33 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (3.6 microns) is formed on polypropylene from the above coating solution. The film results in an OTR of 20.6 cc/M² day@ 1 atm, 23° C., 0% RH, and a permeability of 0.076 cc mm/m² day atm @ 23° C., 0% RH, which results in a reduction in permeability of 1241.1 times. The butyl/filler ratio equals 1.22:1.

J. 5.0% Solids in Water: 50% Butyl Latex, 50% MICROLITE® Filler

Part A: In a 4 oz glass jar, 4.0 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 0.6 g of 1N $NH_4OH$ and 40.3 g distilled water are mixed into solution, and the solution in the 30 mL beaker is slowly added into the butyl latex solution while stirring slowly.

Part B: In a 50 mL beaker, 20.7 g distilled water and 1.0 g 1N NH4OH are mixed. In a separate 100 mL beaker 33.3 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (2.55 microns) is formed on polypropylene from the above coating solution. The film results in an OTR of 17.0 cc/M² day @1 atm, 23° C., 0% RH, and a permeability of 0.041 cc mm/m² day atm @23° C., 0% RH, which results in a reduction in permeability of 2302.4 times. The butyl/filler ratio equals 1.00:1.

K. 10.0% Solids in Water: 80% Butyl Latex, 20% MICROLITE® Filler

Part A: In a 4 oz glass jar, 13.0 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.8 g of 1N $NH_4OH$ and 30.1 g distilled water are mixed into solution, and the solution in the 30 mL beaker is slowly added into the butyl latex solution while stirring slowly.

Part B: In a 50 mL beaker, 27.5 g distilled water and 0.8 g 1N $NH_4OH$ are mixed. In a separate 100 mL beaker 26.7 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (9.75 microns) is formed on polypropylene from the above coating solution. The film results in an OTR of 53.5 cc/m² day@ 1 atm, 23° C., 0% RH, and a permeability of 1.0 cc mM/m² day atm @ 23° C., 0% RH, which results in a reduction in permeability of 94.4 times. The butyl/filler ratio equals 4.00:1.

L. 10.0% Solids in Water: 80% butyl latex, 20% MICROLITE® filer

Part A: In a 4 oz glass jar, 13.0 g of Lord® BL-100 Butyl Latex (61.6% butyl latex solution, Lord Corporation) is measured. This latex is stirred slowly with a stir bar on a stir plate. In a 30 mL beaker, 0.1 g BYK®-306 wetting agent (BYK Chemie), 1.8 g of 1N $NH_4OH$ and 30.1 g distilled water are mixed into solution, and the solution in the 30 mL beaker is slowly added into the butyl latex solution while stirring slowly.

Part B: In a 50 mL beaker, 27.5 g distilled water and 0.8 g 1N $NH_4OH$ are mixed. In a separate 100 mL beaker 26.7 g of MICROLITE® 963++ filler (7.5% solution, W. R. Grace) is measured, and the solution from the 50 mL beaker is added into the MICROLITE® filler while stirring with a stir bar on a stir plate.

Slowly Part B is added into Part A with medium stirring on the stir plate, avoiding high shear stirring.

A barrier film (10.85 microns) is formed on polypropylene from the above coating solution. The film results in an OTR of 70.3 cc/M² day @ 1 atm, 23°., 0% RH, and a permeability of 0.82 cc mM/m² day atm @ 23° C., 0% RH, which results in a reduction in permeability of 115.1 times. The butyl/filler ratio equals 4.00: 1.

EXAMPLE 10

Barrier Compositions Varying % Solids with 15% MICROLITE® Filler

A. 20.0% Solids in Water: 85% Polymer Latex butyl latex, 15% MICROLITE® Filler

Part A: In a 30 mL beaker, 0.075 g BYK®-023 wetting agent and 8.2 g distilled water are combined. The resulting solution is stirred on a stir plate with a stir bar. In a 4 oz glass jar, 25.5 g of Polymer Latex ELR Butyl Latex (50% butyl latex solution, research sample from Polymer Latex) is measured. The solution in the 30 mL beaker is slowly added into the butyl latex solution while manually stirring and the solution set aside without further stirring.

Part B: In a 30 mL beaker, 10.3 g distilled water and 0.9 g 1N NH$_4$OH are mixed. In a separate 100 mL beaker 30 g of MICROLITE® 963++ filler is measured. The solution from the 30 mL beaker is added into the MICROLITE® filler while stirring with a stir bar on a stir plate.

Stirring of Part A is resumed and Part B is slowly added into Part A with maximum stirring on the stir plate, avoiding high shear stirring.

A barrier film (17.3 microns) on polypropylene from the above coating solution resulted in an OTR of 165 cc/m$^2$ day @ 1 atm, 23° C., 0% RH, and a permeability of 3.7 cc mm/m$^2$ day atm @ 23° C., 0% RH, which results in a reduction in permeability of 25.4 times. Butyl/filler ratio equals 5.67:1.

B. 25.0% Solids in Water: 85.0% Butyl Latex, 15.0% MICROLITE® Filler

Part A: In a 10 mL beaker, 0.075 g BYK®-023 wetting agent and 1.9 g distilled water are combined. The resulting solution is stirred on a stir plate with a stir bar. In a 4 oz glass jar, 31.9 g of Polymer Latex ELR Butyl Latex (50% butyl latex solution, research sample from Polymer Latex) is measured. The solution in the 10 mL beaker is slowly added into the butyl latex solution while manually stirring and the solution set aside without further stirring.

Part B: In a 10 mL beaker, 2.6 g distilled water and 1.1 g 1N NH$_4$OH are mixed. In a separate 100 mL beaker 37.5 g of MICROLITE® 963++ filler is measured. The solution from the 10 mL beaker is added into the MICROLITE® filler while stirring with a stir bar on a stir plate.

Stirring of Part A is resumed and Part B is slowly added into Part A with maximum stirring on the stir plate, avoiding high shear stirring.

A barrier film (20.9 microns) on polypropylene from the above coating solution resulted in an OTR of 125.6 cc/m$^2$ day @ 1 atm, 23° C., 0% RH, and a permeability of 3.2 cc mm/m$^2$ day atm @ 23° C., 0% RH, which results in a reduction in permeability of 29.5 times. Butyl/filler ratio equals 5.67:1.

C. 27.0% Solids in Water: 85.0% Butyl Latex, 15.0% MICROLITE® Filler

Part A: In a 4 oz glass jar, 35.0 g of Polymer Latex ELR Butyl Latex and 0.15 g BYK®-023 wetting agent are measured and slowly stirred with a stir bar on a stir plate.

Part B: In a 100 mL beaker 41.2 g of MICROLITE® 963++ filler is measured.

Part B is slowly added into Part A with maximum stirring on the stir plate, avoiding high shear stirring.

A barrier film (23.9 microns) on polypropylene from the above coating solution resulted in an OTR of 162.8 cc/M$^2$ day @ 1 atm, 23° C., 0% RH, and a permeability of 5.0 cc mm/m$^2$ day atm @ 23° C., 0% RH which results in a reduction in permeability of 18.9×. Butyl/filler ratio=5.66:1. 27% is the maximum solids content achieved without removing water from the latex.

EXAMPLE 11

Barrier Coating using Bromo-Butyl-Latex and Varying % Solids with 20% MICROLITE® Filler A. 15.0% Solids in Water: 80.0% Butyl Latex, 20.0% MICROLITE® filler Part A: In a 50 mL beaker, 0.1 g BYK®-306 wetting agent, 3.2 g 1N NH$_4$OH and 18.5 g distilled water are measured and the resulting solution stirred on a stir plate with a stir bar. In a 4 oz glass jar, 23.2 g of Polymer Latex ELR Bromobutyl Latex (51.7% bromo-butyl latex solution, research sample from Polymer Latex) is measured. The solution in the 50 mL beaker is slowly added into the butyl latex solution while manually stirring, and the resulting solution set aside without stirring.

Part B: In a 30 mL beaker, 13.8 g distilled water and 1.2 g 1N NH$_4$OH are mixed. In a separate 100 mL beaker, 40 g of MICROLITE® 963++ filler are measured. The solution from the 30 mL beaker is added into the MICROLITE® filler while stirring with a stir bar on a stir plate.

Stirring of Part A is resumed. Part B is slowly added into Part A with maximum stirring on the stir plate, avoiding high shear stirring.

A barrier film (15.3 microns) on polypropylene from the above coating solution resulted in an OTR of 180.5 cc/m$^2$ day @ 1 atm, 23° C., 0% RH, and a permeability of 3.52 cc mm/m$^2$ day atm @ 23° C., 0% RH which results in a reduction in permeability of 28.7 times. Bromo-butyl/filler ratio=4.00:1.

B. 18.0% Solids in Water: 80.0% Butyl Latex, 20.0% MICROLITE® filler

Part A: In a 50 mL beaker, 0.1 g BYK®-306 wetting agent, 3.9 g 1N NH$_4$OH and 13.1 g distilled water are combined and the resulting solution stirred on a stir plate with a stir bar. In a 4 oz glass jar, 27.9 g of Polymer Latex ELR Bromobutyl Latex is measured; the solution in the 50 mL beaker is slowly added into the butyl latex solution while manually stirring. This solution is set aside without stirring.

Part B: In a 30 mL beaker, 5.6 g distilled water and 1.4 g 1N NH$_4$OH are mixed. In a separate 100 mL beaker 48 g of MICROLITE® 963++ filler are measured. The solution from the 30 mL beaker is added into the MICROLITE® filler while stirring with a stir bar on a stir plate. Stirring of Part A is resumed. Part B is slowly added into Part A with maximum stirring on the stir plate, avoiding high shear stirring.

A barrier film (23.6 microns) on polypropylene from the above coating solution resulted in an OTR of 94.6 cc/m$^2$ day @ 1 atm, 23° C., 0% RH, and a permeability of 2.52 cc mm/m$^2$ day atm @23° C., 0% RH which results in a reduction in permeability of 40.1 times. Bromo-butyl/filler ratio=4.01:1.

C. 20.0% Solids in Water: 80.0% Butyl Latex, 20.0% MICROLITE® Filler

Part A: In a 30 mL beaker, 0.1 g BYK®-306 wetting agent, 4.3 g 1N NH$_4$OH and 9.7 g distilled water are combined. The resulting solution is stirred on a stir plate with a stir bar. In a 4 oz glass jar, 30.9 g of Polymer Latex ELR Bromobutyl Latex is measured. The solution in the 30 mL beaker is slowly added into the butyl latex solution while manually stirring. This solution is set aside without stirring.

Part B: In a 10 mL beaker, 0.1 g distilled water and 1.6 g 1N NH$_4$OH are mixed. In a separate 100 mL beaker 53.3 g of MICROLITE® 963++ filler is measured. The solution from the 10 mL beaker is added into the MICROLITE® filler while stirring with a stir bar on a stir plate.

Stirring of Part A is resumed. Part B is slowly added into Part A with maximum stirring on the stir plate, avoiding high shear stirring.

A barrier film (19.3 microns) on polypropylene from the above coating solution resulted in an OTR of 104.8 cc/m$^2$ day @ 1 atm, 23° C., 0% RH, and a permeability of 2.31 cc mm/m$^2$ day atm @ 23° C., 0% RH which results in a reduction in permeability of 43.8 times. Bromo-butyl/filler ratio=4.00:1.

D. 22.8% Solids in Water: 80.0% Butyl Latex, 20.0% MICROLITE® Filler

Part A: In a 10 mL beaker, 0.1 g BYK®-306 wetting agent, 3.0 g 1N NH$_4$OH and 0.0 g distilled water are combined. The resulting solution is stirred on a stir plate with a stir bar. In a 4 oz glass jar, 35.6 g of Polymer Latex ELR Bromobutyl Latex is measured. The solution in the 10 mL beaker is slowly added into the butyl latex solution while manually stirring. This solution is set aside without stirring.

Part B: In a 10 mL beaker, 1.0 g distilled water and 0.0 g 1N NH$_4$OH are mixed. In a separate 100 mL beaker 61.3 g of MICROLITE® 963++ filler is measured. The solution from the 10 mL beaker is added into the MICROLITE® filler while stirring with a stir bar on a stir plate.

Stirring of Part A is resumed. Part B is slowly added into Part A with maximum stirring on the stir plate, avoiding the use of high shear stirring.

A barrier film (18.1 microns) on polypropylene from the above coating solution resulted in an OTR of 153.4 cc/m$^2$ day @ 1 atm, 23° C., 0% RH, and a permeability of 3.4 cc mm/m$^2$ day atm @ 23° C., 0% RH which results in a reduction in permeability of 29.7 times. Bromo-butyl/filler ratio=4.00:1.

EXAMPLE 12

Barrier Coatings Varying % MICROLITE® Filler with 20% Solids using Bromo-Butyl Latex A. 20.0% Solids in Water: 85.0% butyl latex, 15. % MICROLITE® filler Part A: In a 30 mL beaker, 0.1 g BYK®-306 wetting agent, 4.6 g 1N NH$_4$OH and 7.4 g distilled water are combined and the resulting solution stirred on a stir plate with a stir bar. In a 4 oz glass jar, 32.9 g of Polymer Latex ELR Bromobutyl Latex (51.7% bromo-butyl latex solution, research sample from Polymer Latex) is measured. The solution in the 30 mL beaker is slowly added into the butyl latex solution while manually stirring. This solution is set aside without stirring.

Part B: In a 30 mL beaker, 13.8 g distilled water and 1.2 g 1N NH$_4$OH are mixed. In a separate 100 mL beaker 40 g of MICROLITE® 963++ filler is measured. The solution from the 30 mL beaker is added into the MICROLITE® filler while stirring with a stir bar on a stir plate.

Stirring of Part A is resumed. Part B is slowly added into Part A with maximum stirring on the stir plate, avoiding high shear stirring.

A barrier film (19.6 microns) on polypropylene from the above coating solution resulted in an OTR of 172.2 cc/m$^2$ day @ 1 atm, 23° C., 0% RH, and a permeability of 4.25 cc mm/m$^2$ day atm @ 23° C., 0% RH which results in a reduction in permeability of 23.8 times. Bromo-butyl/filler ratio=5.67:1.

B. 20.0% Solids in Water: 80.0% Gutyl Latex, 20.0% MICROLITE® filler

Part A: In a 30 mL beaker, 0.1 g BYK®-306 wetting agent, 4.3 g 1N NH$_4$OH and 9.7 g distilled water are combined and the resulting solution stirred on a stir plate with a stir bar. In a 4 oz glass jar, 30.9 g of Polymer Latex ELR Bromobutyl Latex is measured. The solution in the 30 mL beaker is slowly added into the butyl latex solution while manually stirring; this solution is set aside without stirring.

Part B: In a 10 mL beaker, 0.1 g distilled water and 1.6 g 1N NH$_4$OH are mixed. In a separate 100 mL beaker 53.3 g of MICROLITE® 963++ filler is measured. The solution from the 10 mL beaker is added into the MICROLITE® filler while stirring with a stir bar on a stir plate.

Stirring of Part A is resumed and Part B is slowly added into Part A with maximum stirring on the stir plate, avoiding high shear stirring.

A barrier film (38.2 microns) on polypropylene from the above coating solution resulted in an OTR of 56.7 cc/m$^2$ day @ 1 atm, 23° C., 0% RH, and a permeability of 2.32 cc mm/m$^2$ day atm @ 23° C., 0% RH which results in a reduction in permeability of 43.6 times. Bromo-butyl/filler ratio=4.00:1.

C. 20.0% Solids in Water: 75.0% Butyl Latex, 25.0% MICROLITE® filler

Part A: In a 10 mL beaker, 0.1 g BYK®-306 wetting agent, 3.0 g 1N NH$_4$OH and 0.0 g distilled water are mixed and the resulting solution stirred on a stir plate with a stir bar. In a 4 oz glass jar, 29.0 g of Polymer Latex ELR Bromobutyl Latex is measured. The solution in the 10 mL beaker is slowly added into the butyl latex solution while manually stirring and this solution set aside without stirring.

Part B: In a 100 mL beaker 66.7 g of MICROLITE® 963++ filler is measured. 1.6 g 1N NH$_4$OH is added to the MICROLITE® filler while stirring with a stir bar on a stir plate.

Stirring of Part A is resumed and Part B is slowly added into Part A with maximum stirring on the stir plate, avoiding high shear stirring.

A barrier film (20.5 microns) on polypropylene from the above coating solution resulted in an OTR of 67.4 cc/m$^2$ day @ 1 atm, 23° C., 0% RH, and a permeability of 1.5 cc mm/m$^2$ day atm @ 23° C., 0% RH which results in a reduction in permeability of 67.4 times. Bromo-butyl/filler ratio=3.00:1.

EXAMPLE 13

Barrier Coating with Butyl Latex Applied to Carcass Rubber Substrate

The elastomeric barrier coating solution described in Example 3 above is applied onto another substrate, an elastomeric substrate referred to as "carcass rubber". Carcass rubber is a mixture of styrene-butadiene rubber, butadiene rubber and natural rubber.

After the coating solution described in Example 3 is applied to the carcass rubber substrate and allowed to dry, it demonstrates an OTR (measured using a MOCON® OX-TRAN 2/20 module) of 82 cc/M$^2$ day @ 1 atmosphere, 0% RH, 23° C. Permeability of the composition is 1.8 cc mm/m$^2$ day atmosphere @ 0% RH, 23° C. The coating which results from this dried coating mixture provides a reduction in permeability of 52.5 times that of the unfilled polymer.

The coated substrate is then subjected to stress. The coated carcass rubber is flexed about 1100 times at 10% elongation. After flex, the OTR and permeability of the coating is again measured as described above. The OTR of the flexed coated substrate is 173.5 cc/m$^2$ day @ 1 atmosphere, 0% RH, 23° C. Permeability of the coating on the flexed substrate is 4.2 cc mM/m$^2$ day atmosphere @ 0% RH, 23° C. The coating after flex on the substrate provides a reduction in permeability of 22.4 times that of the unfilled polymer.

EXAMPLE 14

Barrier Coating Containing 5% PVOH Terpolymer

Another exemplary barrier coating formulation of the present invention comprises 10% solids in water, 75% by weight butyl latex, 20% by weight MICROLITE® filler, and 5% PVOH terpolymer as a thickener. The coating is prepared as follows:

Part A: In a 4 oz glass jar, 11.47 g of Lord® BL-100™ Butyl Latex is measured, and stirred slowly on a stir plate with a stir bar. In a 50 mL beaker, 0.1 g BYK®G 306 wetting agent, 1.57 g of 1N NH$_4$OH and 31.84 g distilled water are mixed. The solution in the 50 mL beaker is added into the butyl latex solution while stirring slowly.

Part B: In a 50 mL beaker, 0.5 g of Mowiol® terpolymer of PVB (poly(vinylbutyral))/PVA (poly(vinylacetate))/PVOH (poly(vinylalcohol)) (Hoechst) and 25 g of distilled water are mixed. A stir bar is added to this solution and the solution is heated in a water bath with stirring until dissolved. In a separate 30 mL beaker, 0.8 g of 1N NH$_4$OH and 2.03 g distilled water are mixed. In a separate 100 mL beaker, 26.67 g of MICROLITE® 963++ filler is measured and the solution from the 30 mL beaker is added into the MICROLITE® filler while stirring with a stir bar on a stir plate. To the resulting solution in the 100 mL beaker, the dissolved PVOH solution is added while stirring.

Slowly Part B is added into Part A with medium stirring on the stir plate, avoiding high shear stirring. The resulting formulation had a viscosity of 326 cP (Brookfield DVII+, 60 rpm, 25° C.) which is an increase from a viscosity of 4.5 cP (Brookfield DVII+, 60 rpm, 25° C.) of the formulation without the PVOH terpolymer thickener.

A barrier film (4.9 microns) on polypropylene from the above coating solution resulted in an OTR of 171.1 cc/m$^2$ day @ 1 atm, 23° C., 0% RH, a permeability of 1.05 cc mM/m$^2$ day atm @ 23° C., 0% RH which results in a reduction in permeability of 89.9×. Butyl/filler ratio equals 3.7:1.

EXAMPLE 15

Barrier Coating Containing 5.5% PVOH Terpolymer

Another exemplary barrier coating formulation of the present invention comprises 10% solids in water, 74.5% by weight butyl latex, 20% by weight MICROLITE® filler, and 5.5% PVOH terpolymer as a thickener. The coating is prepared as follows:

Part A: In a 8 oz glass jar, 28.48 g of Lord® BL-100™ Butyl Latex is measured. A stir bar is added and the latex stirred slowly on a stir plate. In a 100 mL beaker, 0.25 g BYK® 306 wetting agent, 3.96 g of 1N NH$_4$OH and 79.81 g distilled water are mixed. The solution in the 100 mL beaker is slowly added into the butyl latex solution while stirring slowly.

Part B: In a first 50 mL beaker, 1.375 g of Mowiol® terpolymer of PVB (poly(vinylbutyral))/PVA (poly(vinylacetate))/PVOH (poly(vinylalcohol)) (Hoechst) and 30 g of distilled water are mixed. A stir bar is added to this solution and the solution is heated in a water bath with stirring until dissolved. In a second 50 mL beaker, 2.0 g of 1N NH$_4$OH and 37.46 g distilled water are mixed. In a separate 150 mL beaker, 66.67 g of MICROLITE® 963++ filler is measured. The solution from the second 50 mL beaker is added into the MICROLITE® filler while stirring with a stir bar on a stir plate. To the resulting solution in the 150 mL beaker, the dissolved PVOH solution is added while stirring.

Part B is added into Part A with medium stirring on the stir plate, avoiding high shear stirring. The resulting formulation had a viscosity of 370 cP (Brookfield DVII+, 60 rpm, 25° C.) which is an increase from a viscosity of 4.5 cP (Brookfield DVII+, 60 rpm, 25° C.) of the formulation without the PVOH terpolymer thickener.

A barrier film (4.0 microns) on polypropylene from the above coating solution resulted in an OTR of 130.8 cc/m$^2$ day @ 1 atm, 23° C., 0% RH, a permeability of 0.62 cc mM/m$^2$ day atm @ 23° C., 0% RH which results in a reduction in permeability of 152.2×. Butyl/filler ratio equals 3.7: 1.

EXAMPLE 16

Barrier Coating Containing 4.3% Lithium chloride and Cure Package

Another exemplary barrier coating of the present invention contains 11.7% solids in water, 68.4% by weight butyl latex, 17.1% w/w MICROLITE® filler, 4.3% w/w lithium chloride as a thickener and 10.2% w/w of a "cure package" to enhance curing of the coating on a substrate. The barrier coating was prepared as follows:

Part A: In a 8 oz glass jar, 78.2 g of Lord® BL-100™ Butyl Latex was measured and a stir bar was added. This solution was stirred slowly on a stir plate. In a 150 mL beaker, 0.3 g BYK® 306 wetting agent, 10.9 g of 1N NH$_4$OH and 118.5 g distilled water are combined. The solution in the 150 mL beaker is slowly added into the butyl latex solution while stirring slowly. The glass jar is placed into a 70° C. water bath with mechanical stirring. Stirring in the 70° C. bath is continued for 15 minutes and then 13.8 g of a cure package Ti-Rite #M1 (containing about 21.4% by weight zinc oxide, about 10-11% by weight sulfur, about 47-48% by weight water, about 23% of a dispersing agent, about 14-15% of zinc dibutyidithio-carbamate and about 34% zinc 2-mercaptobenzothiazole, Technical Industries, Inc.) is added. The solution is stirred and heated for 2 hours, after which it is removed from the 70° C. water bath to a 25° C. water bath with stirring until cooled. 3 g lithium chloride (Fisher Scientific) dissolved in 75 g distilled water is added and the solution stirred for 1 hour. After 1 hour, 0.3 g FOAMASTER VL defoamer (Henkel) is added to the cooled solution, which is stirred for 5 minutes.

Part B: In a 150 mL beaker, 4.8 g of 1N NH$_4$OH and 135.2 g distilled water are mixed. In a separate 250 mL beaker, 160.0 g of MICROLITE® 963++ filler is measured. The solution from the 150 mL beaker is added into the MICROLITE® filler while stirring with a stir bar on a stir plate.

Part B is added slowly into Part A with medium stirring on the stir plate, avoiding high shear stirring. The resulting formulation had a viscosity of 8120 cP (Brookfield DVII+, 0.396 rpm, 25° C.) which is an increase from a viscosity of 4.5 cP (Brookfield DVII+, 60 rpm, 25° C.) of the formulation without the lithium chloride thickener.

A barrier film (13.9 microns) on polypropylene from the above coating solution resulted in an OTR of 59.7 cc/m² day @ 1 atm, 23° C., 0% RH, and a permeability of 0.89 cc mm/m² day atm @ 23° C., 0% RH which results in a reduction in permeability of 106.1 times. Butyl/filler ratio equals 4.0:1.

A barrier film was coated onto butyl rubber and cured at 170° C. for 20 minutes in an oven. The cured barrier film (13.4 microns) on butyl rubber from the above coating solution resulted in an OTR of 53.7 cc/m² day @ 1 atm, 23° C., 0% RH, and a permeability of 1.77 cc mm/m² day atm @ 23° C., 0% RH which results in a reduction in permeability of 53.3 times. Butyl/filler ratio equals 4.0: 1.

EXAMPLE 17

Elongation or Flex Test

In order to determine the integrity of the coatings after application to a substrate, an elongation or flex test was conducted. Essentially, the coated substrate to be evaluated is attached to one surface of a reinforced elastomeric beam. The beam is bent about its neutral axis in a cyclic fashion so that the coated substrate experiences a repeating sinusoidal tensile strain ranging from about 0.1% to about 10%. These strains are transferred from the surface of the beam to the substrate, and to the coating.

All references and patents cited above are incorporated herein by reference. Numerous modifications and variations of the present invention are included in the above-identified specification and are expected to be obvious to one of skill in the art. Such modifications and alterations to the compositions and processes of the present invention are believed to be encompassed in the scope of the claims appended hereto.

10. Summary

Briefly, described above is an airbag for a vehicle which includes a plurality of sections of material joined to one another, e.g., heat-sealed or adhesively-sealed, to form a plurality of substantially interconnected compartments receivable of an inflating medium. The sections of material may be discrete sheets of film with optional tear propagation arresting means. Two or more of the sections of material may be at least partially in opposed relationship to one another and then joined to one another at locations other than at a periphery of any of the sections to thereby form the interconnected compartments between the sections of material. The sections of material may be joined to one another along parallel or curved lines or links to thereby form the interconnected compartments between the sections of material, which when inflated, will be cellular or tubular.

Also described above is an inflatable occupant protection system which includes a housing mounted in the vehicle and having an interior, a deployable inflatable element or airbag contained within the housing interior prior to deployment, an inflator coupled to the housing for inflating the airbag (such as a gas generator for supplying a gas into the interior of the airbag), the airbag being attached to and in fluid communication with the inflator, and an initiator for initiating the gas generator to supply the gas into the interior of the airbag in response to a crash of the vehicle, i.e., a crash sensor. The airbag may be as described in the paragraphs above. The housing may be elongate and extends substantially along the entire side of the vehicle such that the airbag is arranged to inflate between a side of the vehicle and the respective spaces above both the front and rear seats. In another implementation, the housing is arranged in the front seat and extends between sides of the vehicle such that the airbag is arranged to inflate outward from the front seat toward the rear seat.

Also disclosed is a method for manufacturing an airbag for a vehicle in which a plurality of sections of material are joined together to form a plurality of interconnected compartments, e.g., by applying an adhesive between opposed surfaces of the sections of material to be joined together or heating the sections of material to be joined together. The sections of material may be joined together along parallel or curved lines to form straight or curved, elongate interconnected compartments which become tubular or cellular when inflated with a gas.

The tear propagation arresting structure for the film sheets may be (i) the incorporation of an elastomeric film material, a laminated fabric, or net, which are connected to each of the pieces of plastic film (e.g., the inelastic film which provides the desired shape upon deployment of the airbag), or (ii) means incorporated into the formulation of the plastic film material itself. Also, the two pieces of film may be formed as one integral piece by a blow molding or similar thermal forming or laminating process.

In accordance with one other embodiment of the invention, an airbag has a coating composition which contains substantially dispersed exfoliated layered silicates in an elastomeric polymer. This coating, when dry, results in an elastomeric barrier with a high effective aspect ratio and improved permeability characteristics, i.e., a greater increase in the reduction of permeability of the coating. Drying may occur naturally over time and exposure to air or through the application of heat. This is a further use of a plastic film where although the mechanical properties of the base material are not altered the flow properties through the material are.

The airbag is optionally made of fabric and can take any form including those in the prior art. For example, if a side curtain airbag, then the airbag can define a series of tubular gas-receiving compartments, or another series of compartments. The side curtain airbag can be arranged in a housing mounted along the side of the vehicle, possibly entirely above the window of the vehicle or partially along the A-pillar of the vehicle.

The side curtain airbag includes opposed sections or layers of material, either several pieces of material joined together at opposed locations or a single piece of material folded over onto itself and then joined at opposed locations. Gas is directed into the compartments from a gas generator or a source of pressurized gas. Possible side curtain airbags include those disclosed in the current assignee's U.S. Pat. No. 5,863,068, U.S. Pat. No. 6,149,194 and U.S. Pat. No. 6,250,668.

The invention is not limited to side curtain fabric airbags and other fabric airbags are also envisioned as being encompassed by the invention. Also, it is conceivable that airbags may be made of materials other than fabric and used with a barrier coating such as any of those disclosed herein and other barrier coatings which may be manufactured using the teachings of this invention or other inventions relates to barrier coatings for objects other than airbags. Thus, the invention can encompass the use of a barrier coating for an airbag, regardless of the material of the airbag and its placement on the vehicle.

In one aspect, the present invention provides a side curtain airbag including one or more sheets of fabric that contains air or a gas under pressure, and having on an interior or exterior surface of the fabric sheet(s) a barrier coating formed by applying to the surface a mixture comprising in a carrier liquid an elastomeric polymer, a dispersed exfoliated layered platelet filler preferably having an aspect ratio greater than about 25 and optionally at least one surfactant. The solids content of the mixture is optionally less than about 30% and the ratio of polymer to the filler is optionally between about 20:1 and about 1:1. The coating may be dried on the coated surface, wherein the dried barrier coating has the same polymer to filler ratio as in the mixture and provides an at least 5-fold greater reduction in gas, vapor, moisture or chemical permeability than a coating formed of the unfilled polymer alone.

In one preferred embodiment, the fabric is coated with a barrier coating mixture, which contains the polymer at between about 1% to about 30% in liquid form and between about 45% to about 95% by weight in the dried coating. The dispersed layered filler is present in the liquid coating mixture at between about 1% to about 10% by weight, and in the dried coating formed thereby, at between about 5% to about 55% by weight. The dried coating, in which the filler exhibits an effective aspect ratio of greater than about 25, and preferably greater than about 100, reduces the gas, vapor or chemical permeability greater than 5-fold that of the dried, unfilled polymer alone.

In another preferred embodiment, the invention provides a fabric side curtain airbag coated with a preferred barrier coating mixture which has a solids contents of between about 5% to about 15% by weight, and comprises in its dried state between about 65% to about 90% by weight of a butyl rubber latex, between about 10% to about 35% by weight of a layered filler, desirably vermiculite, and between about 0.1% to about 15% by weight of a surfactant.

In another embodiment, the invention provides a fabric side curtain airbag on a surface or at the interface of two surfaces therein a dried barrier coating formed by a barrier coating mixture comprising in a carrier liquid, an elastomeric polymer, a dispersed exfoliated layered platelet filler preferably having an aspect ratio greater than about 25 and optionally at least one surfactant, wherein the solids content of the mixture may be less than about 30% and the ratio of polymer to the filler is optionally between about 20:1 and about 1:1. When dried, the coating optionally comprises about 45% to about 95% by weight of the polymer, between about 5% to about 55% by weight the dispersed layered filler; and between about 1.0% to about 15% by weight the surfactant. The coating on the article, in which the filler exhibits an effective aspect ratio of greater than about 25, preferably greater than about 100, reduces the gas, vapor or chemical permeability of the airbag greater than 5-fold the permeability of the airbag coated with the polymer alone.

In still another embodiment, the invention provides a fabric side curtain airbag having on a surface or at the interface of two surfaces therein a dried barrier coating formed by a barrier coating mixture comprising in a carrier liquid, a butyl-containing polymer latex, a dispersed exfoliated layered vermiculite filler preferably having an aspect ratio about 1000 or greater; and optionally at least one surfactant. The solids content of the mixture may be less than about 17% and the ratio of the polymer to the filler may be between about 20:1 and about 1:1.

In a preferred embodiment, the coating mixture has a solids content of between about 5% to about 15% by weight, and forms a dried coating on the surface that comprises between about 65% to about 90% by weight the butyl-containing polymer, between about 10% to about 35% by weight the vermiculite filler, and between about 1.0% to about 15% by weight the surfactant. The coating on the inflated product in which the filler exhibits an effective aspect ratio of greater than about 25, preferably greater than about 100, reduces the gas, vapor or chemical permeability of the airbag greater than 5-fold the permeability of the article coated with the polymer alone.

In still a further embodiment, the invention provides a method for making a fabric side curtain airbag, the method involving coating a surface of the fabric airbag with, or introducing into the interface between two surfaces of the fabric airbag, an above-described barrier coating mixture.

One method for manufacturing an airbag module including an airbag in accordance with the invention entails applying to a surface of a substrate a solution comprising an elastomeric polymer and a dispersed exfoliated layered filler and causing the solution to dry to thereby form a barrier coating on the substrate, forming an airbag having an edge defining an entry opening for enabling the inflation of the airbag from the substrate having the barrier coating thereon, arranging the airbag in a housing, sealing the edge of the airbag to the housing and providing a flow communication in the housing to allow inflation fluid to pass through the entry opening into the airbag. The airbag is preferably folded in the housing. The airbag may be formed by cutting the substrate to the desired shape and size.

Another method for manufacturing an airbag module entails applying to a surface of a first substrate a solution comprising an elastomeric polymer and a dispersed exfoliated layered filler, covering the solution with a second substrate, causing the solution to dry to thereby form a barrier coating between the first and second substrates, forming an airbag having an edge defining an entry opening for enabling the inflation of the airbag from the first and second substrates having the barrier coating therebetween, arranging the airbag in a housing and sealing the edge of the airbag to the housing. Further, a flow communication is provided in the housing to allow inflation fluid to pass through the entry opening into the airbag. The airbag may be folded in the housing. The formation of the airbag may involve cutting the first and second substrates having the barrier coating therebetween.

Another method for forming an airbag, in particular a side curtain airbag or another type of airbag made of a first piece for fabric constituting a front panel of the airbag and a second piece of fabric constituting a rear panel of the airbag, entails heat or adhesive sealing the first and second pieces of fabric together over an extended seam width to form an airbag while maintaining an entry opening for passage of inflation fluid into an interior of the airbag and partitioning the airbag along partition lines into a plurality of chambers each receivable of the inflation fluid. The location of the partition lines is determined to prevent concentration of stress in the seams, e.g., by analyzing the airbag using finite element analysis as described in Appendix 1 herein and Appendices 1-6 of the '379 application. The first and second pieces of fabric may be coated with a barrier coating.

Still another method for forming an airbag in accordance with the invention comprises the steps of providing a plurality of layers of material, interweaving, heat sealing or sewing the layers together to form the airbag while maintaining an entry opening for passage of inflation fluid into an interior of the airbag and coating the airbag with a barrier coating. The airbag may be a side airbag with front and rear panel joined together over an extended seam width. As such, it is possible to partition the airbag along partition lines into a plurality of chambers each receivable of the inflation fluid and determine the location of the partition lines to prevent concentration of stress in the seams.

There has thus been shown and described an airbag system with a self-limiting and self-shaping airbag which fulfills all the objects and advantages sought after. Further, there has been shown and described an airbag system with a film airbag utilizing a film material which comprises at least one layer of a thermoplastic elastomer film material which fulfills all the objects and advantages sought after. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the following claims. For example, the present invention describes numerous different airbag constructions as well as different methods for fabricating airbags. It is within the scope of the invention that all of the disclosed airbags can, for the most part, be made by any of the methods disclosed herein. Thus, in one typical process for constructing a film airbag having at least two compartments, either isolated from one another, within one another or in flow communication with each other, at least one flat panel of film airbag material is provided and then manipulated, processed or worked to form the different compartments. More particularly, the flat panel is joined at appropriate locations to form the different compartments, e.g., by heat sealing or an adhesive. The compartments may be any shape disclosed herein, e.g., tubular-shaped.

With respect to the construction of the airbag as shown in FIGS. 3C and 3D, another method of obtaining the airbag with a variable thickness is to provide an initial, substantially uniformly thick film substrate (inelastic film) and thereafter applying a coating (a thermoplastic elastomer) thereon in predetermined locations on the substrate, preferably in an organized predetermined pattern, such that it is possible to obtain thicker portions in comparison to other uncoated portions. In this manner, the film airbag can be provided with distinct thicknesses at different locations, e.g., thicker portions which constitute rings and ribs (i.e., the polar symmetric pattern of FIG. 3C), or only at specific locations where it is determined that higher stresses arise during deployment for which reinforcements by means of the thicker film is desired. An alternative fabrication method would be to produce the airbag from thermoplastic elastomeric material with an initial varying thickness as well as a layer of inelastic film to provide the airbag with the desired shape. In this regard, plastic-manufacturing equipment currently exists to generate a plastic sheet with a variable thickness. Such equipment could be operated to provide an airbag having thicker portions arranged in rings and ribs as shown in FIG. 3C.

Lastly, the limiting net described above may be used to limit the deployment of any and all of the airbags described herein, including embodiments wherein there is only a single airbag.

This application is one in a series of applications covering safety and other systems for vehicles and other uses. The disclosure herein goes beyond that needed to support the claims of the particular invention that is claimed herein. This is not to be construed that the inventors are thereby releasing the unclaimed disclosure and subject matter into the public domain. Rather, it is intended that patent applications have been or will be filed to cover all of the subject matter disclosed above.

APPENDIX 1

1. INTRODUCTION

This Appendix deals with an improved side impact film airbag the drawings of which can be found in [1]. The thickness of the film has been assumed according to an approximate analysis given in [3], [4].

From the mechanical viewpoint, the side impact airbag is a soft, nonlinearly deformable shell that experiences large displacements and strains. It has a fairly complicated shape, folds may appear in it when inflated, so over 100,000 finite elements would be required to approximate this mechanical model. A nonlinear problem of a dimensionality so high could not be solved with computing facilities available to the author. Therefore the author had to use an artificial approach of "smearing" the folds over the shell, to split the whole system into fragment, and to calculate each fragment separately. The number of finite elements involved was thus reduced to a few thousands.

Results obtained by the analysis of two key fragments of the "Saturn" car's side impact airbag are presented below. A comparison of these data with approximate results from the report [3] is also given.

2. APPROACH TO THE ANALYSIS

The calculation was performed by a multi-physics software system ANSYS, version 8. The analysis was based on a triangular membrane finite element SHELL41 that allows for large displacements/strains and resists to the tension only. If the strain is negative, the element loses the resistance in one or two directions thus simulating the formation of folds. In a situation like this the element will become iternally changeable (unstable).

In order to prevent this internal changeability that leads to an instability of the computation, we used an artificial technique that had been employed previously in the report [5]. Second layer of finite elements was installed in parallel with the main layer, the additional elements being made of a material with special properties. The material had an infinitesimal modulus of elasticity and a very high coefficient of thermal expansion. A negative value of temperature was specified for the elements of the second layer so that the thermal deformation of each element was equal to −1.0. An unstressed element made of this material would shrink to zero dimensions when subjected to temperature. At the same time, the low modulus of elasticity let this element deform with little or no stress. Thus, a conglomerate of two elements—a membrane and a special-purpose ones—never experienced a compression; it was internally unchangeable and differed little by its properties from the SHELL41 element that simulated the formation of folds.

At the initial stage of iterations, all finite elements were reinforced by a Winkler-type elastic bed with a low response factor; this was done to prevent the matrix of reactions from being degenerate. At subsequent stages of iterations, this elastic bed was removed, so the final solution was not influenced by it.

Nontheless, these measures were not sufficient. We solved the "Transient" problem instead of "Static". The system was environed by a very viscous medium, and the material of the shell was assumed to have a damping ability with the decrement of 0.9.

3. NUMBERS

The dimensions of the model were taken from the drawing of the side impact airbag for the "Saturn" car.

The thickness of the material the airbag is made of is $\delta=0.02$ cm. The elasticity modulus of the material is $E=35153$ kg/cm$^2$, the Poisson ratio $v=0.39$. The stress limit is $[\sigma]=1125$ kg/cm$^2$. The pressure above ambient inside the airbag is $p=2.8$ kg/cm$^2$.

4. LEFT PART OF THE AIRBAG

4.1. Design Model

Figure 44:
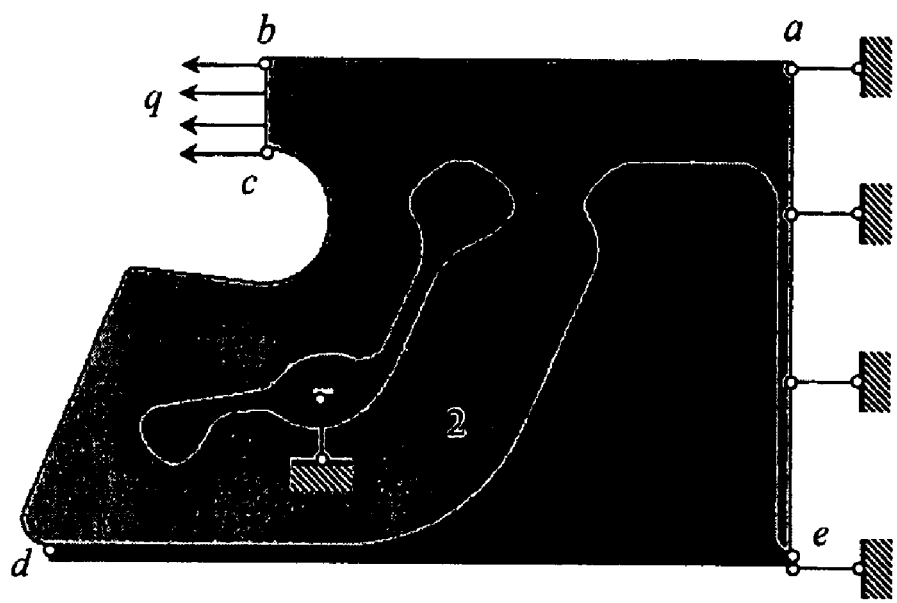
FIG. 44 schematically shows a fragment extracted from the airbag, specifically, a design model of the airbag's left part.

A fragment is extracted from the airbag as shown schematically in FIG. 44. The fragment contains a hollow 2 and adhesive joints 1 and 3. The exterior contour of the hollow at the segments a-b and c-d is glued, while the segments b-c and e-a have free edges. The right vertical boundary of the fragment that includes also the segment e-a is restrained against the horizontal displacement. The boundary b-c is free from any constraints or fixations. The fragment is restrained against the vertical displacement at the location where the tether is attached to the joint 1. Only one film layer is under consideration. There are constraints against the movement out of the plane of the drawing in glued places.

The internal pressure p upon the inlet pipe is represented in the design model as a linear uniform load q applied to the segment b-c of the boundary.

The magnitude of this load is determined by the assumption that a circular orifice will appear in the area b-c when the airbag is inflated.

$$q = \frac{ps}{2\pi}; \qquad (1)$$

where s is the length of the segment b-c.

4.2. Computed Results

Figure 45:
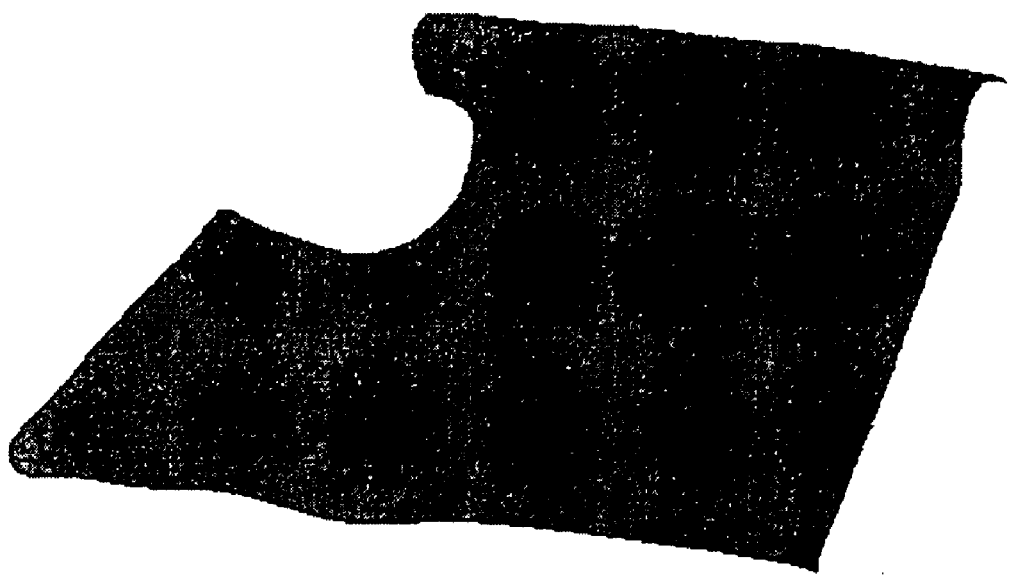
FIG. 45 shows the division of the fragment in FIG. 44 into finite elements and the deformed model.
Figure 46:
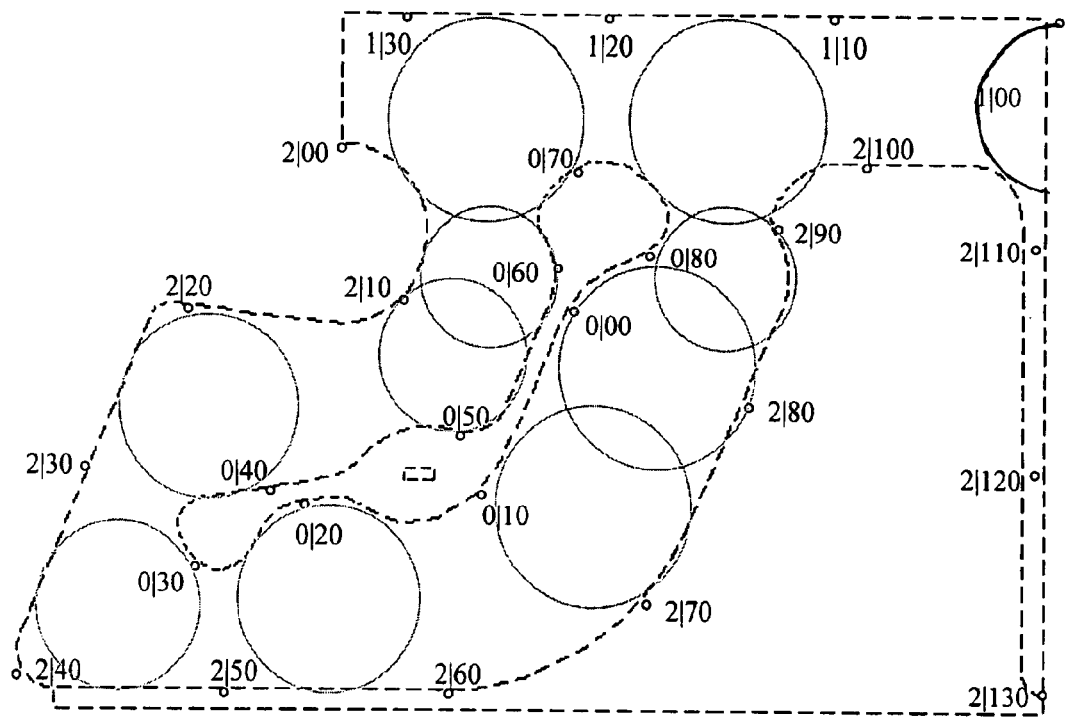
FIG. 46 shows contours of the adhesive joints in the left part of the airbag, with numbered points.

The fragment described above was analyzed using the ANSYS system. The division of it into finite elements and the deformed model are presented in FIG. 45. It is the peeling stress at the contours of the adhesive joints that is of greatest importance. The fragment contains three adhesive joint contours denoted by the numbers 0, 1, and 2. Each of the contours contains a system of points where the peeling stress was calculated. These points are based on the fragment's division into finite elements. The numbering of the points is presented in FIG. 46. FIG. 46 shows only numbers multiple of 10. No. of the adhesive joint is shown to the left from the main number, before a vertical stroke. Both points and joints are numbered starting from 0.

Further below, Table 1, Table 2, and Table 3 present the peeling stress per unit of length at the contours of the adhesive joints.

TABLE 1

The peeling stress per unit of length at the contour of the interior adhesive joint, in kg/cm.

|      | 0      | 1      | 2      | 3      | 4      | 5      | 6      | 7      | 8      | 9      |
|------|--------|--------|--------|--------|--------|--------|--------|--------|--------|--------|
| 0\|00 | 6.785  | 10.955 | 11.545 | 10.505 | 10.987 | 8.825  | 10.172 | 13.024 | 16.163 | 16.920 |
| 0\|10 | 18.535 | 18.505 | 19.681 | 25.438 | 16.148 | 6.000  | 1.739  | 1.861  | 2.660  | 2.978  |
| 0\|20 | 2.543  | 1.973  | 2.820  | 6.378  | 12.770 | 23.162 | 17.892 | 13.755 | 16.140 | 16.362 |
| 0\|30 | 15.683 | 13.626 | 16.297 | 7.694  | 15.910 | 20.259 | 12.407 | 8.345  | 8.590  | 8.448  |
| 0\|40 | 6.871  | 5.574  | 3.834  | 1.703  | 3.938  | 12.646 | 13.045 | 12.626 | 7.729  | 3.005  |
| 0\|50 | 2.332  | 2.193  | 3.395  | 6.469  | 8.861  | 9.542  | 7.854  | 5.362  | 4.168  | 4.205  |
| 0\|60 | 4.309  | 4.284  | 19.589 | 15.423 | 14.197 | 17.848 | 13.684 | 17.610 | 18.803 | 14.139 |
| 0\|70 | 9.943  | 11.172 | 17.991 | 21.964 | 16.348 | 9.769  | 9.762  | 7.222  | 14.429 | 21.337 |
| 0\|80 | 13.257 | 5.132  | 5.674  | 5.684  | 5.723  |        |        |        |        |        |

TABLE 2

The peeling stress per unit of length at the contour of the upper adhesive joint, in kg/cm.

|      | 0     | 1     | 2     | 3     | 4     | 5     | 6     | 7     | 8     | 9     |
|------|-------|-------|-------|-------|-------|-------|-------|-------|-------|-------|
| 1\|00 | 7.005 | 6.974 | 7.122 | 6.846 | 6.775 | 6.890 | 6.643 | 6.473 | 6.372 | 6.417 |
| 1\|10 | 6.904 | 7.528 | 7.710 | 7.674 | 7.818 | 7.973 | 7.914 | 7.678 | 6.828 | 6.828 |
| 1\|20 | 6.590 | 6.290 | 7.259 | 7.300 | 7.990 | 8.726 | 8.365 | 8.349 | 7.504 | 7.009 |
| 1\|30 | 6.338 | 5.656 | 7.308 |       |       |       |       |       |       |       |

TABLE 3

The peeling stress per unit of length at the contour of the lower adhesive joint, in kg/cm.

|      | 0      | 1      | 2      | 3      | 4      | 5      | 6     | 7     | 8     | 9      |
|------|--------|--------|--------|--------|--------|--------|-------|-------|-------|--------|
| 2\|00 | 5.081  | 7.023  | 9.005  | 14.965 | 17.418 | 11.986 | 6.895 | 7.063 | 8.710 | 10.901 |
| 2\|10 | 12.583 | 11.992 | 10.946 | 15.227 | 7.677  | 4.418  | 5.042 | 5.462 | 5.556 | 5.999  |
| 2\|20 | 4.973  | 7.786  | 2.213  | 1.022  | 6.363  | 7.543  | 7.435 | 7.079 | 6.976 | 5.290  |
| 2\|30 | 4.924  | 4.435  | 5.577  | 5.953  | 6.406  | 6.572  | 6.393 | 5.426 | 3.334 | 1.814  |
| 2\|40 | 1.647  | 1.733  | 2.948  | 6.017  | 6.396  | 7.357  | 6.795 | 6.045 | 5.671 | 5.138  |
| 2\|50 | 5.653  | 5.912  | 6.780  | 7.349  | 7.511  | 7.839  | 7.935 | 7.665 | 7.558 | 7.933  |
| 2\|60 | 6.841  | 6.189  | 6.505  | 6.355  | 6.246  | 6.539  | 7.009 | 7.798 | 7.965 | 8.816  |

TABLE 3-continued

The peeling stress per unit of length at the contour of the lower adhesive joint, in kg/cm.

|      | 0      | 1      | 2      | 3      | 4      | 5      | 6      | 7      | 8      | 9      |
|------|--------|--------|--------|--------|--------|--------|--------|--------|--------|--------|
| 2\|70  | 8.776  | 9.051  | 9.508  | 9.603  | 10.742 | 12.203 | 11.854 | 11.796 | 11.702 | 11.541 |
| 2\|80  | 11.258 | 10.800 | 10.619 | 10.247 | 9.626  | 5.522  | 5.010  | 4.744  | 5.203  | 0.785  |
| 2\|90  | 22.997 | 4.573  | 9.593  | 10.424 | 11.200 | 14.579 | 21.015 | 15.845 | 22.726 | 9.884  |
| 2\|100 | 6.285  | 6.952  | 6.641  | 6.992  | 5.507  | 15.312 | 20.309 | 6.303  | 3.521  | 2.989  |
| 2\|110 | 3.121  | 3.020  | 3.047  | 3.090  | 3.144  | 3.186  | 3.215  | 3.232  | 3.243  | 3.251  |
| 2\|120 | 3.252  | 3.249  | 3.239  | 3.225  | 3.209  | 3.190  | 3.166  | 3.142  | 3.105  | 2.377  |
| 2\|130 | 1.117  | 1.258  |        |        |        |        |        |        |        |        |

Figure 47:
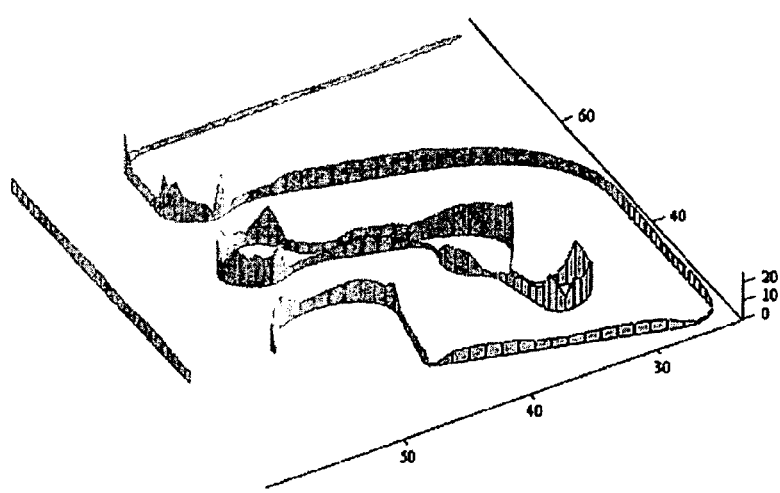
FIG. 47 is a first view of a plot of the peeling stress per unit of length at the adhesive joint in the left part of the airbag.
Figure 48:
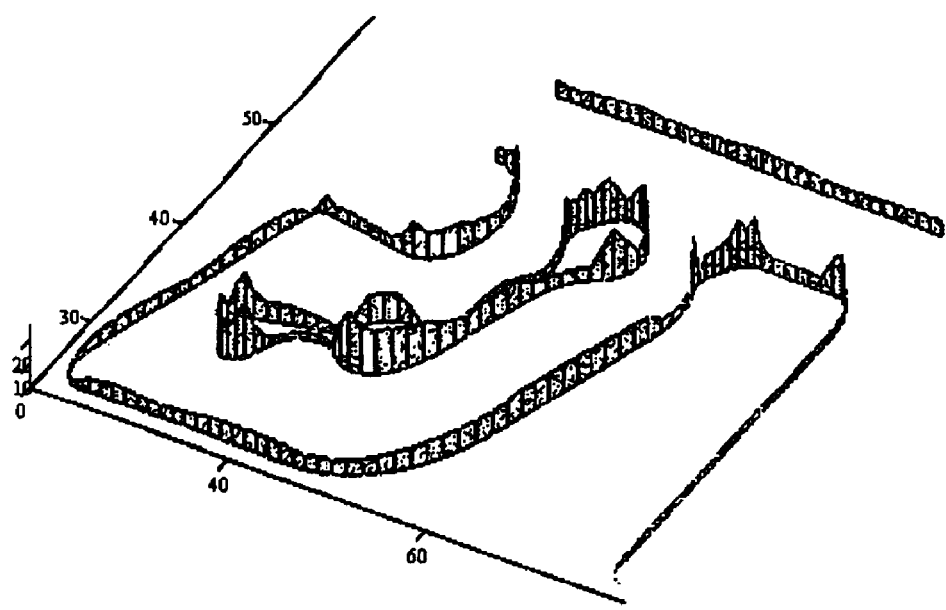
FIG. 48 is a second view of a plot of the peeling stress per unit of length at the adhesive joint in the left part of the airbag.

FIG. 47 and FIG. 48 present the same results as plots.

5. RIGHT PART OF THE AIRBAG

5.1. Design Model

Figure 49:
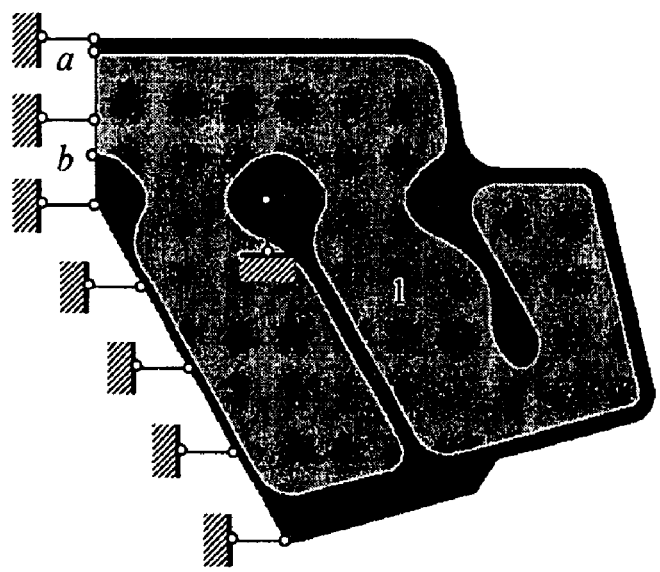
FIG. 49 is a view of a design model of the right part of the airbag.

The design model of the airbag's right part is presented in FIG. 49. This fragment contains a hollow 1 and an adhesive joint 2. The hollow's boundary includes a segment where there is no gluing; this is a-b. The left boundary of the fragment that consists of a vertical and a slanted segment is restrained against the horizontal displacement. The fragment is restrained against the vertical displacement at the location where a tether is attached to the joint 2. Only one layer of the film is under consideration. In glued areas the movement out of the drawing's plane is prohibited.

5.2. Computed Results

Figure 50:
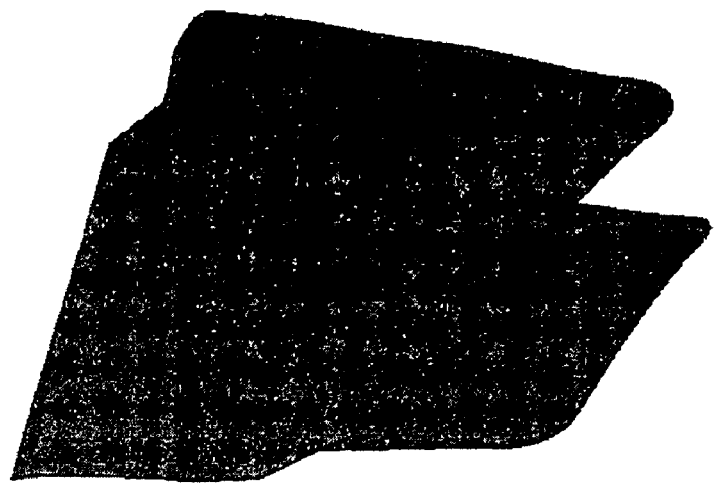
FIG. 50 is a view of a model of the right part of the airbag when divided into finite elements and deformed.

The fragment described above was analyzed using the ANSYS computing system. The division into finite elements and the deformed model of the fragment are shown in FIG. 50.

Figure 51:
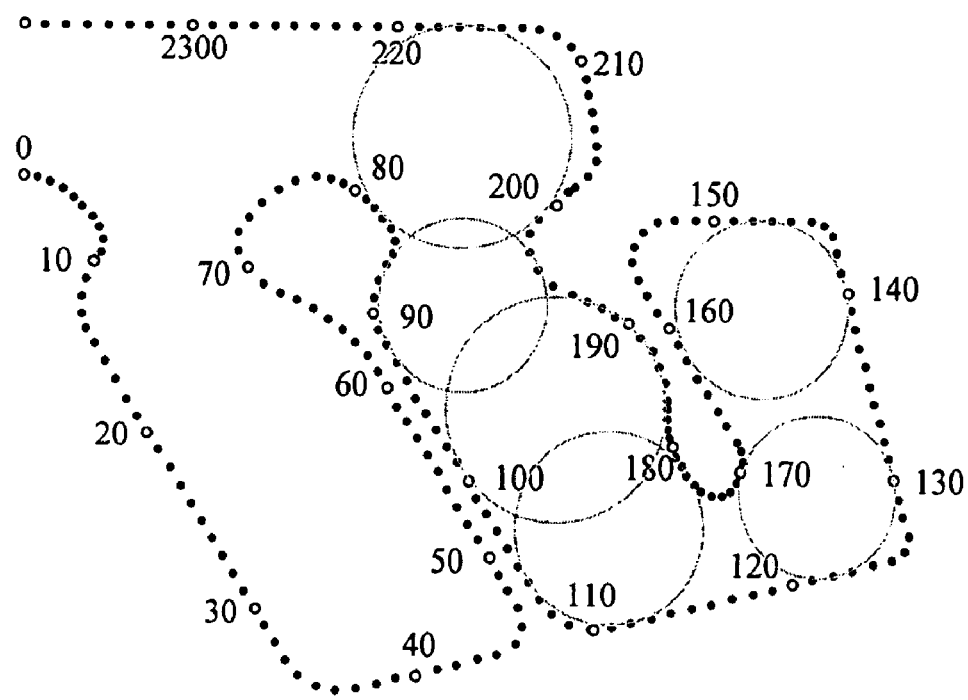
FIG. 51 is a view of the adhesive joint contour in the right part of the airbag, with numbered points.

The peeling stress values were calculated at the contour of the adhesive joint. There is a set of points at the contour where this calculation was done. These points are based on the division of the fragment into finite elements. The numbered points are shown in FIG. 51. This figure shows only points with their numbers multiple of 10. The numbering of the points starts from 0.

Further below, Table 4 presents the peeling stress per unit of length at the contour of the joint.

TABLE 4

The peeling stress per unit of length at the adhesive joint contour in the right part of the airbag, in kg/cm.

|     | 0      | 1      | 2      | 3      | 4      | 5      | 6      | 7      | 8      | 9      |
|-----|--------|--------|--------|--------|--------|--------|--------|--------|--------|--------|
| 00  | 14.238 | 16.334 | 19.846 | 22.688 | 20.342 | 14.974 | 10.743 | 8.131  | 14.357 | 10.062 |
| 10  | 6.078  | 5.232  | 5.858  | 8.232  | 4.075  | 6.990  | 7.895  | 8.366  | 8.779  | 9.306  |
| 20  | 12.168 | 10.953 | 11.311 | 11.292 | 12.251 | 13.040 | 12.736 | 11.379 | 9.245  | 9.957  |
| 30  | 10.466 | 9.130  | 8.134  | 5.059  | 5.826  | 7.645  | 4.694  | 6.856  | 9.272  | 8.915  |
| 40  | 9.413  | 8.896  | 8.147  | 5.687  | 5.386  | 4.469  | 3.240  | 3.181  | 5.713  | 7.198  |
| 50  | 8.269  | 10.133 | 10.153 | 10.450 | 11.232 | 11.798 | 12.318 | 12.235 | 11.204 | 10.490 |
| 60  | 9.515  | 9.526  | 8.205  | 7.182  | 7.917  | 6.984  | 6.136  | 6.622  | 14.798 | 28.583 |
| 70  | 22.469 | 11.544 | 9.084  | 16.882 | 19.330 | 21.931 | 15.683 | 12.137 | 17.191 | 22.350 |
| 80  | 19.938 | 16.920 | 16.002 | 15.250 | 12.840 | 15.437 | 14.523 | 5.722  | 4.516  | 4.959  |
| 90  | 8.396  | 3.918  | 7.193  | 7.966  | 8.085  | 9.228  | 9.546  | 10.486 | 10.906 | 11.039 |
| 100 | 10.489 | 9.853  | 9.273  | 8.984  | 8.925  | 8.293  | 7.290  | 5.767  | 5.395  | 5.401  |
| 110 | 5.891  | 6.394  | 7.551  | 7.668  | 7.641  | 7.174  | 6.211  | 5.758  | 5.765  | 6.135  |
| 120 | 6.619  | 6.572  | 6.046  | 5.956  | 6.569  | 3.176  | 1.836  | 5.940  | 5.831  | 5.727  |
| 130 | 6.207  | 6.809  | 7.335  | 7.655  | 7.806  | 7.824  | 7.763  | 7.622  | 8.331  | 8.166  |
| 140 | 7.841  | 7.220  | 5.721  | 4.609  | 3.287  | 3.955  | 5.576  | 7.194  | 7.571  | 6.896  |
| 150 | 6.774  | 6.203  | 4.245  | 3.417  | 4.579  | 4.185  | 3.878  | 4.522  | 5.298  | 5.700  |
| 160 | 6.044  | 6.750  | 6.979  | 7.294  | 7.694  | 8.295  | 10.454 | 19.026 | 26.943 | 21.343 |
| 170 | 16.309 | 11.136 | 10.388 | 7.362  | 8.802  | 12.405 | 16.557 | 21.215 | 26.529 | 28.257 |
| 180 | 25.480 | 18.475 | 11.281 | 7.369  | 5.912  | 5.075  | 5.064  | 5.878  | 5.975  | 7.290  |
| 190 | 5.846  | 7.059  | 4.124  | 5.634  | 11.706 | 16.570 | 20.157 | 16.296 | 16.069 | 15.546 |
| 200 | 10.449 | 7.869  | 3.327  | 2.784  | 4.478  | 5.589  | 7.517  | 7.424  | 7.240  | 5.929  |
| 210 | 6.856  | 5.323  | 5.197  | 5.822  | 6.996  | 8.026  | 8.524  | 8.882  | 9.480  | 9.919  |
| 220 | 9.318  | 8.978  | 8.507  | 8.027  | 7.856  | 8.504  | 8.863  | 9.083  | 9.406  | 9.564  |
| 230 | 9.605  | 9.893  | 10.248 | 10.492 | 9.925  | 9.206  | 8.347  | 7.817  | 8.146  |        |

Figure 52:
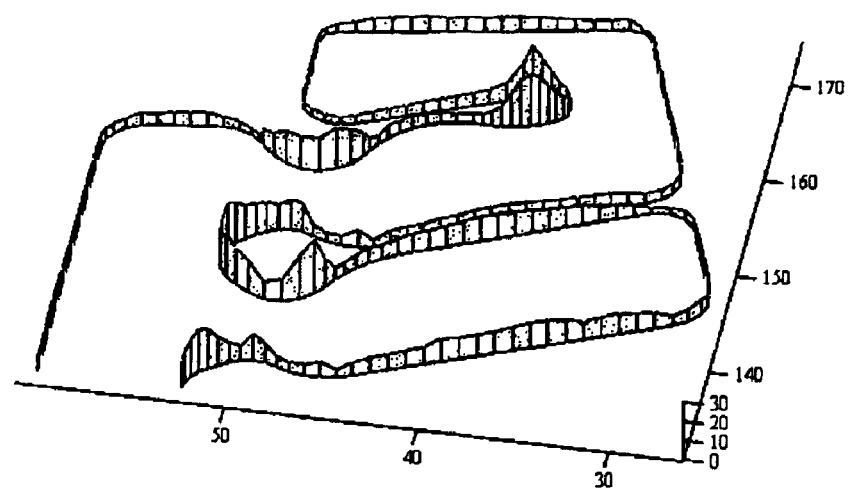
FIG. 52 is a first view of a plot of the peeling stress per unit of length as the adhesive joint in the right part of the airbag.
Figure 53:
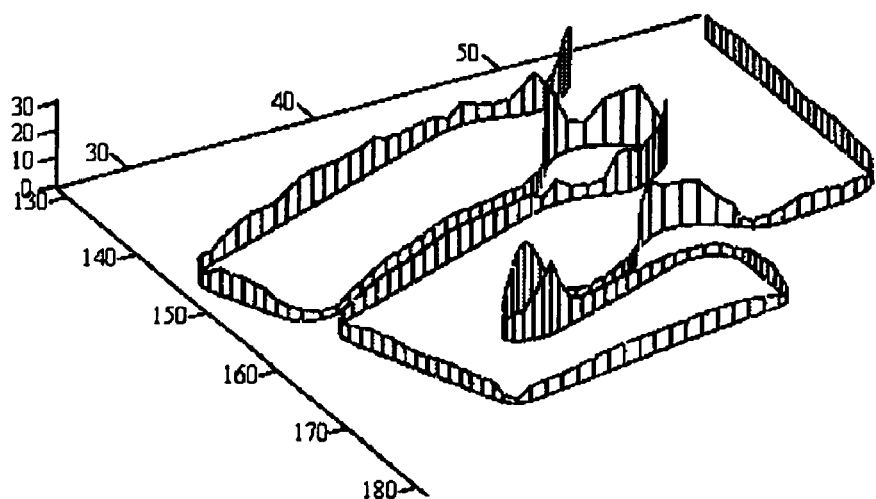
FIg. 53 is a second view of a plot of the peeling stress per unit of length at the adhesive joint in the right part of the airbag.

FIG. 52 and FIG. 53 show the same results as plots.

The tables and the plots presented above demonstrate clearly that the peeling stress at rectilinear or slightly curved segments of the contour varies smoothly, and the magnitudes of it are well-conditioned. In areas where the contour is drastically curvilinear, the plot of the peeling stress has a saw-like shape and contains a lot of high-magnitude peaks.

The maximum stress is reached at the point 69 of the right fragment of the airbag, being 28.583 kg/cm². With this intensity of the peeling stress, the film 0.02 cm thick cannot be strong enough. The required thickness δ of the film can be calculated by the formula:

$$\delta \geq \frac{k_s \cdot \psi}{[\sigma]} = \frac{1.1 \cdot 28.583}{1125} = 0.028 \text{ cm}; \tag{7}$$

where $k_s$ is the safety factor;

$[\sigma]$ is the stress limit (1125 kg/cm²);

$\psi$ is the peeling stress.

6. COMPARISON WITH APPROXIMATE ANALYTICAL RESULTS

Figure 54:
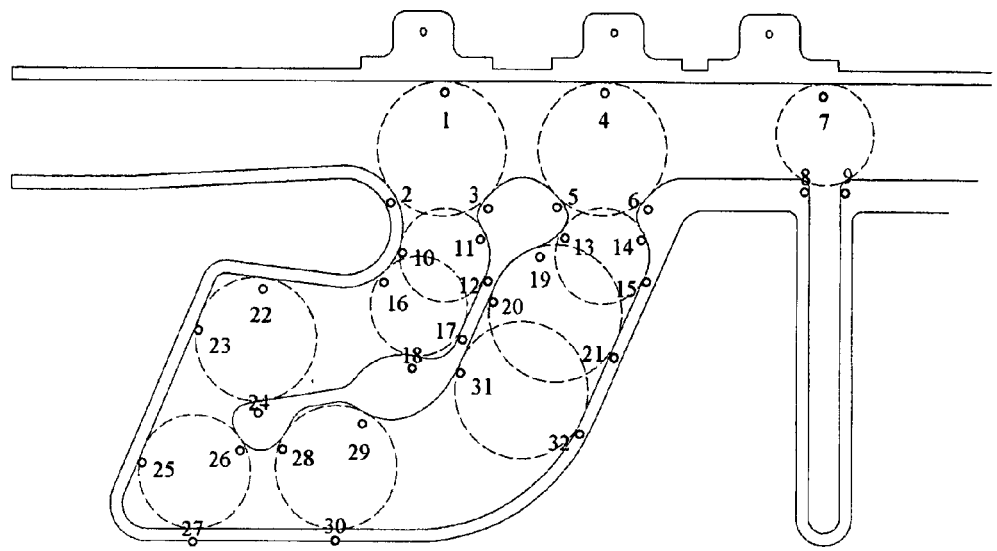
FIGS. 54 and 55 show circles and numbered points in which peeling stress has been determined.
Figure 55:
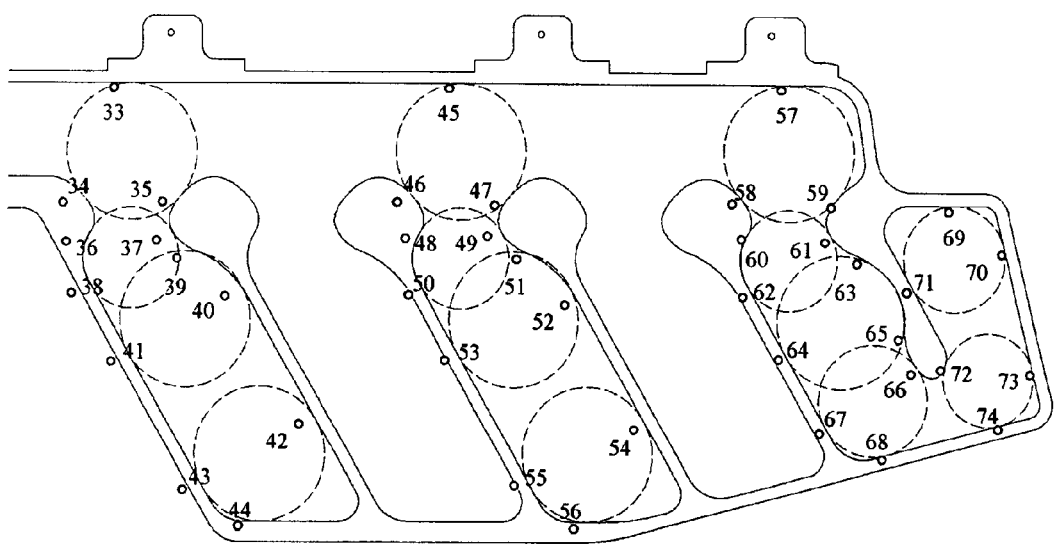

In the report [3], the same airbag was analyzed by an approximate method of inscribed circles. FIG. 54 and FIG. 55 show the circles and numbered points in which the peeling stress was determined by this approximate technique.

To establish the correspondence between the numbers of the points in FIG. 54 and FIG. 55, on one hand, and in FIG. 46 and FIG. 51, on the other hand, the same inscribed circles are shown in respective couples of figures.

Table 5 gives a comparison between the numerical and approximate analytical results. It uses these designations:
  $\Psi_r$ is the peeling stress calculated by the inscribed circles technique;
  $\Psi_f$ is the peeling stress calculated by the finite element method.

The leftmost column contains numbers of points from the report [3], and the rightmost one those introduced in the current report.

Table 5. A comparison between the numerical and approximate analytical results

| Point No. (FIG. [[11]] 54; FIG. [[12]] 55) | d cm | r cm | $k_l$ | $\Psi_r$ kg/cm | $\Psi_f$ kg/cm | Point No. (FIG. [[3]] 46; FIG. [[8]] 51) |
|---|---|---|---|---|---|---|
| 1 | 5.27 | ∞ | 1.00 | 9,39 | 8.726 | 1\|25 |
| 2 | 5.27 | 4.80 | 1.20 | 21,17 | 17.418 | 2\|04 |
| 3 | 5.27 | 8.98 | 1.40 | 19,33 | 17.610 | 0\|67 |
| 4 | 5.23 | ∞ | 1.00 | 9,32 | 7.973 | 1\|15 |
| 5 | 5.23 | 8.98 | 1.40 | 19,13 | 17.610 | 0\|76 |
| 6 | 5.23 | 8.98 | 1.40 | 19,13 | 11.200 | 2\|94 |
| 7 | 4.40 | ∞ | 1.00 | 7,84 | 7.005 | 1\|00 |
| 8 | 4.40 | 3.00 | 1.00 | 17,05 | 20.309 | 2\|106 |
| 10 | 3.70 | 4.80 | 1.20 | 12,80 | 8.710 | 2\|08 |
| 11 | 3.70 | 2.71 | 1.40 | 19,32 | 4.284 | 0\|61 |
| 12 | 3.70 | ∞ | 1.00 | 6,60 | 4.168 | 0\|58 |
| 13 | 3.82 | 2.97 | 1.40 | 19,34 | 21.337 | 0\|79 |
| 14 | 3.82 | 2.97 | 1.40 | 19,34 | 5.203 | 2\|88 |
| 15 | 3.82 | ∞ | 1.00 | 6,81 | 5.522 | 2\|85 |
| 16 | 3.95 | 4.80 | 1.20 | 14,01 | 12.583 | 2\|10 |
| 17 | 3.95 | ∞ | 1.00 | 7,04 | 8.861 | 0\|54 |
| 18 | 3.95 | 5.00 | 1.20 | 13,79 | 3.005 | 0\|49 |
| 19 | 5.43 | 10.19 | 1.40 | 19,33 | 5.132 | 0\|81 |
| 20 | 5.43 | ∞ | 1.00 | 9,68 | 6.785 | 0\|00 |
| 21 | 5.43 | ∞ | 1.00 | 9,68 | 11.258 | 2\|80 |
| 22 | 4.88 | ∞ | 1.00 | 8,70 | 5.556 | 2\|18 |
| 23 | 4.88 | ∞ | 1.00 | 8,70 | 7.543 | 2\|25 |
| 24 | 4.88 | 6.03 | 1.40 | 20,06 | 8.590 | 0\|38 |
| 25 | 4.53 | ∞ | 1.00 | 8,07 | 6.406 | 2\|34 |
| 26 | 4.53 | 4.68 | 1.40 | 20,06 | 13.626 | 0\|31 |
| 27 | 4.53 | ∞ | 1.00 | 8,07 | 7.079 | 2\|27 |
| 28 | 4.93 | 6.25 | 1.40 | 20,07 | 23.162 | 0\|25 |
| 29 | 4.93 | 6.25 | 1.40 | 20,07 | 1.739 | 0\|16 |
| 30 | 4.93 | ∞ | 1.00 | 8,79 | 7.839 | 2\|55 |
| 31 | 5.43 | 15.20 | 1.40 | 17,42 | 13.024 | 0\|07 |
| 32 | 5.43 | −15.00 | 1.00 | 6,88 | 10.742 | 2\|74 |
| 57 | 5.41 | ∞ | 1.00 | 9,64 | 8.882 | 217 |
| 58 | 5.41 | 8.91 | 1.40 | 20,06 | 16.002 | 82 |
| 59 | 5.41 | 8.91 | 1.40 | 20,06 | 15.546 | 199 |
| 60 | 3.99 | 3.15 | 1.40 | 20,05 | 5.722 | 87 |
| 61 | 3.99 | 3.15 | 1.40 | 20,05 | 20.157 | 196 |
| 62 | 3.99 | ∞ | 1.00 | 7,11 | 5.722 | 92 |
| 63 | 5.28 | 8.08 | 1.20 | 17,20 | 4.124 | 192 |
| 64 | 5.28 | ∞ | 1.00 | 9,41 | 11.039 | 99 |
| 65 | 5.28 | 8.08 | 1.20 | 17,20 | 5.075 | 185 |
| 66 | 4.50 | 4.58 | 1.40 | 20,06 | 21.215 | 177 |
| 67 | 4.50 | ∞ | 1.00 | 8,02 | 7.290 | 106 |
| 68 | 4.50 | ∞ | 1.00 | 8,02 | 7.551 | 112 |
| 69 | 4.19 | ∞ | 1.00 | 7,47 | 7.571 | 148 |
| 70 | 4.19 | ∞ | 1.00 | 7,47 | 7.841 | 140 |
| 71 | 4.19 | ∞ | 1.00 | 7,47 | 6.979 | 162 |
| 72 | 3.74 | 2.60 | 1.40 | 20,07 | 16.309 | 170 |
| 73 | 3.74 | ∞ | 1.00 | 6,67 | 6.207 | 130 |
| 74 | 3.74 | ∞ | 1.00 | 6,67 | 6.046 | 122 |

The comparison shows that the data obtained by the finite element analysis are sometimes greater than those obtained by the approximate technique. Ten instances can be found in Table 5. The greatest discrepancy is 26%.

The approximate values in areas where the stress varies smoothly are close to those calculated by the finite element method. In areas of stress peaks the approximate method gives lower results, as a rule.

The maximum peeling stress calculated by the approximate technique is 21.17 kg/cm. This value was exceeded at 16 points by data of the finite element analysis. These cases are red-colored in Table 1 to Table 4. The maximum stress obtained by the finite element analysis is 28.583 kg/cm. This is greater by 35% than that of the approximate method.

This comparison makes us believe that the approximate technique of inscribed circles can be used for estimating the level of the peeling stress. The estimated level should be used with the safety factor of 1.5.

7. CONCLUSION

The finite element analysis that has been performed shows that the side impact airbag for the "Saturn" car contains fragments of the glued contour where the peeling stress at the gauge pressure of 2.8 kg/cm² reaches as high as 30 kg/cm or greater. It is higher than we expected. We should check if there is a glue or welding technology available that is able to ensure the appropriate strength of the joint.

Plots of the stresses show that the said fragments are localized within small areas. A bit of correction made to the shape of the joint's contour will probably let us reduce the peeling stress at those fragments 1.5 times or even lower. More rational shapes of the joints should be sought for.

The thickness of the nylon film obtained by the analysis and required to ensure the proper strength is about 0.3 mm which is pretty (or too) much. A stronger material should be considered.

A comparison between the approximate analytical technique suggested in [2] and the finite element analysis shows that the former gives underrated results in places where a sharp stress concentration arises. Consequently, the approximate method can be used to make a general estimation of the peeling stress, but one has to use a safety factor of 1.5 or so with the result thus obtained.

There is a serious doubt whether the airbag can or should be inflated at the pressure of 2.8 kg/cm². This pressure is higher than that in the car tire. We should investigate the amortization properties of the airbag at a pressure 2 to 3 times lower than this one. If the investigation is successful, we will be able to deal with a film 0.1–0.15 mm thick and a glue that provides the strength of 10–15 kg/cm against peeling.

8. REFERENCES

[1]. V.Gordeyev. Updated drawings of the Head Protector for Saturn car, May 2004.
[2]. V.Gordeyev. A method of inscribed circles to determine the peeling stress in mattress-like protection airbags, December 2002.
[3]. V.Gordeyev. Approximate analysis of an improved airbag protector for Saturn car at a high pressure, May 2004.
[4]. V.Gordeyev. Appendix to technical report "Approximate analysis of an improved airbag protector for Saturn car for high pressure". Taking into account a safety factor, May 2004.
[5]. V.Gordeyev. Finite element analysis of a side head protector film airbag, November 2002.

I claim:

1. A steering wheel assembly for a vehicle, comprising:
a steering column including an inner shaft adapted to be attached to a fixed part of the vehicle and an outer shaft arranged around said inner shaft and being rotatable relative to said inner shaft, said outer shaft being adapted to connect with a steering mechanism which causes turning of tires of the vehicle, said outer shaft being the outermost part of said steering column;
a steering wheel connected to and for rotation with said outer shaft;
a supporting bracket for mounting said steering column to the vehicle, said supporting bracket including a passage through which said outer shaft passes;
bearings arranged between said outer shaft and said supporting bracket for rotatably supporting said outer shaft on said supporting bracket; and
an airbag module including an airbag connected to said inner shaft such that said airbag module does not rotate upon rotation of said outer shaft and said steering wheel.

2. The assembly of claim 1, wherein said inner shaft passes through said passage of said supporting bracket.

3. The assembly of claim 1, wherein said bearings are in contact with said outer shaft.

4. The assembly of claim 1, further comprising additional bearings interposed between said inner and outer shafts for rotatably supporting said outer shaft on said inner shaft.

5. The assembly of claim 1, wherein said steering wheel has a central cavity centered about a rotation axis of said steering wheel, said airbag module being arranged in said cavity.

6. A vehicle including a chassis and at least one tire, comprising:
a steering mechanism which causes turning of the tire;
a steering column including an inner shaft attached to a stationary part of the chassis and an outer shaft arranged around said inner shaft and being rotatable relative to said inner shaft, said outer shaft being connected to said steering mechanism and being the outermost part of said steering column;
a steering wheel connected to and for rotation with said outer shaft;
a supporting bracket for mounting said steering column to the vehicle, said supporting bracket including a passage through which said outer shaft passes;
bearings arranged between said outer shaft and said supporting bracket for rotatably supporting said outer shaft on said supporting bracket; and
an airbag module including an airbag connected to said inner shaft such that said airbag module does not rotate upon rotation of said outer shaft and said steering wheel.

7. The vehicle of claim 6, further comprising:
a firewall, said supporting bracket mounting said steering column to said firewall.

8. The vehicle of claim 6, wherein said inner shafts passes through said passage of said supporting bracket.

9. The vehicle of claim 6, further comprising additional bearings interposed between said inner and outer shafts for rotatably supporting said outer shaft on said inner shaft.

10. The vehicle of claim 6, wherein said steering wheel has a central cavity centered about a rotation axis of said steering wheel, said airbag module being arranged in said cavity.

11. A steering wheel assembly for a vehicle, comprising:
a steering column having a first end and a second opposite end movable relative to said first end, said first end of said steering column being adapted to be mounted to the vehicle, said steering column having a first part defining said first end and a second part defining said second end, said steering column including an actuating mechanism for moving said second part relative to said first part;
a steering wheel mounted at said second end of said steering column; and
an airbag mounted at said second end of said steering column and arranged to protect a driver of the vehicle in the event of a crash involving the vehicle,
said actuating mechanism being arranged to move said second part relative to said first part based on morphology of the driver.

12. The assembly of claim 11, wherein said steering column further comprises a joint pivotally connecting said first and second parts to enable pivotal movement of said second part relative to said first part about said joint via said actuating mechanism.

13. The assembly of claim 11, wherein said actuating mechanism is arranged to receive a signal from a crash sensor system indicative of an impending or actual crash and pivot said second part to adjust a position of said steering wheel such that said steering wheel is re- positioned during the crash.

14. A vehicle, comprising:
a steering mechanism which causes a tire of the vehicle to turn;
a steering column having a first end and a second opposite end movable relative to said first end, said first end of said steering column being coupled to said steering mechanism, said steering column having a first part defining said first end and a second part defining said second end, said steering column including an actuating mechanism for moving said second part relative to said first part;
a steering wheel mounted at said second end of said steering column;
an airbag mounted at said second end of said steering column arranged to protect a driver of the vehicle in the event of a crash involving the vehicle; and
an occupant position and monitoring system arranged to obtain information about the driver,
said actuating mechanism coupled to said occupant position and monitoring system and being arranged to move said second part relative to said first part based on at least one of the position and morphology of the driver as determined by said occupant position and monitoring system.

15. The vehicle of claim 14, wherein said steering column further comprises a joint pivotally connecting said first and second parts to enable pivotable movement of said second part relative to said first part about said joint via said actuating mechanism.

16. The vehicle of claim 14, further comprising a crash sensor system arranged to generate a signal indicative of an impending crash, said actuating mechanism being arranged to receive the signal from said crash sensor system indicative of the impending crash and move said second part to adjust a position of said steering wheel.

17. The vehicle of claim 14, further comprising a crash sensor system arranged to generate a signal indicative of an actual crash, said actuating mechanism being arranged to receive the signal from said crash sensor system indicative of the actual crash and move said second part to adjust a position of said steering wheel such that said steering wheel is re-positioned during the crash.

18. The vehicle of claim 14, wherein said actuating mechanism moves said second part relative to said first part based on the morphology of the driver as determined by said occupant position and monitoring system.

19. The vehicle of claim 14, wherein said actuating mechanism moves said second part relative to said first part based on the position of the driver as determined by said occupant position and monitoring system.

* * * * *